US012560655B2

(12) United States Patent
Hasegawa et al.

(10) Patent No.: US 12,560,655 B2
(45) Date of Patent: Feb. 24, 2026

(54) VOLTAGE DETECTION UNIT AND POWER STORAGE DEVICE

(71) Applicants:YAZAKI CORPORATION, Tokyo (JP); TOYOTA JIDOSHA KABUSHIKI KAISHA, Aichi-ken (JP); KABUSHIKI KAISHA TOYOTA JIDOSHOKKI, Aichi-ken (JP)

(72) Inventors: Hirotaka Hasegawa, Shizuoka (JP); Norihiro Ogishima, Shizuoka (JP); Shinichi Yanagihara, Shizuoka (JP); Hideki Inoue, Shizuoka (JP); Satoshi Morioka, Aichi-ken (JP); Motoyoshi Okumura, Aichi-ken (JP); Hiroyuki Kaiya, Aichi-ken (JP); Hiromi Ueda, Aichi-ken (JP); Shinpei Mune, Aichi-ken (JP); Naoto Morisaku, Aichi-ken (JP); Yutaro Kawabata, Aichi-ken (JP)

(73) Assignees: YAZAKI CORPORATION, Tokyo (JP); TOYOTA JIDOSHA KABUSHIKI KAISHA, Aichi-ken (JP); KABUSHIKI KAISHA TOYOTA JIDOSHOKKI, Aichi-ken (JP)

( * ) Notice: Subject to any disclaimer, the term of this patent is extended or adjusted under 35 U.S.C. 154(b) by 181 days.

(21) Appl. No.: 18/667,482

(22) Filed: May 17, 2024

(65) Prior Publication Data

US 2024/0402256 A1     Dec. 5, 2024

(30) Foreign Application Priority Data

May 29, 2023    (JP) ................................. 2023-088038

(51) Int. Cl.
*G01R 31/3835* (2019.01)

(52) U.S. Cl.
CPC ................................ *G01R 31/3835* (2019.01)

(58) Field of Classification Search
CPC ...... G01R 31/00; G01R 31/36; G01R 31/382; G01R 31/3835; Y02E 60/00; Y02E 60/10
(Continued)

(56) References Cited

U.S. PATENT DOCUMENTS 11,892,480 B2 * 2/2024 Okazaki ............... G01R 31/364

FOREIGN PATENT DOCUMENTS

DE       102022110543 A1 * 11/2022    ........... G01R 31/364
JP       2020-161340 A     10/2020
(Continued)

*Primary Examiner* — Hoai-An D. Nguyen
(74) *Attorney, Agent, or Firm* — Sughrue Mion, PLLC

(57)        ABSTRACT

A voltage detection unit includes a voltage detection terminal having a first location being conductively connected to a detection target, a board-shaped housing having a terminal accommodating recess in which the voltage detection terminal is accommodated, a cover locked to the housing at a first temporary locking position where the first location of the voltage detection terminal accommodated in the terminal accommodating recess is not covered and a final locking position where the first location is covered, and an electric wire conductively connected to a second location of the voltage detection terminal and drawn out toward the outside of the housing. The housing includes a guide portion guiding the cover from the outside toward the first temporary locking position, and a first wall abutting on the cover when the cover is positioned at the first temporary locking position in a moving direction in which the cover is guided.

4 Claims, 90 Drawing Sheets

(58) Field of Classification Search
USPC .................................................. 324/425, 426
See application file for complete search history.

(56)                       References Cited

FOREIGN PATENT DOCUMENTS

| JP | 2022171439 A | * | 11/2022 | .......... | H01M 50/569 |
| JP | 2023156922 A | * | 10/2023 | ............. | G01R 19/00 |

* cited by examiner

UPPER

LEFT ← → RIGHT

LOWER

UPPER

LEFT ← → RIGHT

LOWER

UPPER

LEFT — FRONT

REAR — RIGHT

LOWER

UPPER

LEFT ← → RIGHT

LOWER

UPPER

LEFT ← → RIGHT

LOWER

UPPER

LEFT ←→ RIGHT

LOWER

UPPER

LEFT ←→ RIGHT

LOWER (331)
333

333a          333b

330

334
(331)

332

335

346 { 347
      348

341a

347

335

341(341a)      313      340

380          345          310

312a(312)

311a(311)                    343

307a 347
(354)

351                          353

352

355(354)

348a

341b

353

352

349      320      307b      356

441
(441a)

440

457

456

476

470

452

447

441b

453

448

448a

441a

446

451

453

449   452   454

455

407a

420

407b

FRONT

LEFT ←→ RIGHT

REAR

UPPER
LEFT — FRONT
REAR — RIGHT
LOWER

UPPER

LEFT ←——→ RIGHT

LOWER

UPPER

LEFT ←——→ RIGHT

LOWER (531)
533

533a        533b

530

534
(531)

532

535

535

535

541(541a)        545        513        540

510

512a(512)

543

544

511a(511)

547

551

552        553

548a        548        546

541b

541a 551        547

553

552        549        520

UPPER

LEFT   FRONT

REAR   RIGHT

LOWER

UPPER

LEFT  ←→  RIGHT

LOWER

820

810
812a
812
811a
811
813

840

846
848
847
847
844
842(842a)
843
841c
853
851
851
853
852
841(841a)
849
851
853
852
841b
835
830b
835
832
833a
830a
833
833
834
831
830

840

830

841c  857  856

843

810(812a)

810(811a)

844

820 d2 d3 d4 d5

841a 854  830b b1 b2 b3 b4  b5

833a  830a

833

835

832

835

858

855

841b

820

REAR

RIGHT ← → LEFT

FRONT

930

956    957    951(946)

940

936

920

UPPER

LEFT ◄───┼───► RIGHT

LOWER

REAR

LEFT ← → RIGHT

FRONT 1010
1032
1036
1055

VOLTAGE DETECTION UNIT AND POWER STORAGE DEVICE

CROSS-REFERENCE TO RELATED APPLICATIONS

This application is based on and claims priority under 35 USC 119 from Japanese Patent Application No. 2023-088038 filed on May 29, 2023, the contents of which are incorporated herein by reference.

TECHNICAL FIELD

The present invention relates to a voltage detection unit configured such that a voltage detection terminal to be conductively connected to a detection target is accommodated in a board-shaped housing, and a power storage device using the voltage detection unit.

BACKGROUND ART

The related art has proposed a stacked power storage device in which a plurality of chargeable and dischargeable thin power storage modules are connected in series via conductive boards by alternately arranging and repeatedly stacking the board-shaped power storage modules and the conductive boards. The power storage modules used in this type of power storage device generally have a structure in which a plurality of battery cells are incorporated, and function as one battery capable of charging and discharging. In one of the power storage devices of the related arts, in order to monitor the output state of each power storage module (that is, the potential of the output face of each power storage module relative to the zero potential as a reference; hereinafter, simply referred to as "voltage of the power storage module"), a detection terminal such as a bus bar is connected to the conductive board in contact with the output face of the power storage module, and the voltage of the power storage module is measured through the detection terminal (for example, see Patent Literature 1).

CITATION LIST

Patent Literature

Patent Literature 1: JP2020-161340A

SUMMARY OF INVENTION

However, when actually connecting the bus bar or the like to the conductive board in the power storage device having the above-described structure, since the power storage modules and the conductive boards have a thin plate shape, it is difficult to secure a space for installing the other components for connection (for example, bolts for bolt fastening or the like). Therefore, the power storage device of the related art described above is provided with an insertion hole for inserting the detection terminal in the side edge of each conductive board. The detection terminal is inserted into the insertion hole of the conductive board from the lateral side of the stacked body in which the power storage modules and the conductive boards are stacked, thereby connecting the conductive board and the detection terminal. However, according to this connection method of the related art, the positioning between the insertion hole of the conductive board and the detection terminal is complicated when inserting the detection terminal, which makes it difficult to improve the workability of connection work.

An object of the present invention is to provide a voltage detection unit excellent in workability in a conductive connection with a detection target, and a power storage device using the voltage detection unit.

In order to achieve the object described above, a voltage detection unit and a power storage device according to the present invention is characterized as follows.

A voltage detection unit of the present invention includes a voltage detection terminal that has a first location being conductively connected to a detection target, a board-shaped housing that has a terminal accommodating recess in which the voltage detection terminal is accommodated, a cover that is locked to the housing at a first temporary locking position where the first location of the voltage detection terminal accommodated in the terminal accommodating recess is not covered and a final locking position where the first location is covered, and an electric wire that is conductively connected to a second location of the voltage detection terminal and drawn out toward the outside of the housing. The housing includes a guide portion that guides the cover from the outside toward the first temporary locking position, and a first wall that comes into contact with the cover when the cover is positioned at the first temporary locking position in a moving direction in which the cover is guided and moves toward the first temporary locking position.

A power storage device of the present invention includes a board-shaped conductive module that includes the voltage detection unit according to claim 1 and a conductive board as the detection target to which the voltage detection terminal is conductively connected, and a power storage module that is charged and discharged, on which the conductive module is stacked.

According to the voltage detection unit according to the present invention, the cover can be locked to the housing while accommodating the voltage detection terminal whose second location is connected to the electric wire in the terminal accommodating recess of the housing and exposing the first location of the voltage detection terminal. Therefore, when the voltage detection unit is electrically connected to a detection target (for example, a conductive board or the like used in a stacked power storage device), for example, after the voltage detection unit is assembled to the detection target, the exposed first location of the voltage detection terminal can be fixed to the detection target using a method such as ultrasonic joining or welding. This does not require another component for connection as compared to typical bolt fastening or the like, and can easily align the two components and reduce the contact resistance at the contact point as compared to the connection methods of the related art described above. Further, by disposing the cover at the final locking position after the detection target and the voltage detection terminal are connected, the first location of the voltage detection terminal (that is, the contact point therebetween) can be covered and protected by the cover.

To attach the cover to the housing, in the above-described voltage detection unit, for example, the cover can be moved from the outside of the housing toward the first temporary locking position via the guide portion to be locked at the first temporary locking position, and the detection target and the voltage detection terminal are connected in a state in which the cover is at the first temporary locking position. Thereafter, the cover can be moved to the final locking position. Here, when the cover is guided by the guide portion and moves toward the first temporary locking position, the cover is to come into contact with the first wall when the cover reaches the first temporary locking position. The cover comes into contact with the first wall of the housing, which prevents excessive movement of the cover beyond the first temporary locking position. As a result, for example, it is possible to prevent the cover to be arranged at the first temporary locking position from being erroneously moved to another position (for example, the final locking position), thereby preventing the cover from interfering with the connection between the detection target and the voltage detection terminal.

Further, the above-described stacked power storage device can be manufactured by stacking conductive modules in which the conductive board as the detection target is attached with the voltage detection unit and the chargeable and dischargeable power storage modules.

Accordingly, the voltage detection unit and the power storage device according to the present invention is excellent in workability for conductively connecting to the detection target. Furthermore, the voltage detection unit and the power storage device according to the present invention is less likely to cause variation in contact resistance at the contact point between the detection target and the voltage detection terminal due to the manufacturing tolerance thereof, and thus is also excellent in voltage detection accuracy, as compared to the above-described power storage device of the related art.

The present invention has been briefly described above. Further, details of the present invention can be clarified by reading modes (hereinafter, referred to as "embodiments"; in particular, an eighth embodiment described below) for carrying out the invention to be described below with reference to the accompanying drawings.

BRIEF DESCRIPTION OF DRAWINGS

FIG. 79 is an exploded perspective view of a battery stack plate having a connection terminal illustrated in FIG. 78;

FIG. 83A is a main part enlarged plan view illustrating a state in which the insulating housing illustrated in FIG. 80 is completely assembled to the conductive plate;

FIG. 83B is a cross-sectional view taken along a line 11C-11C in FIG. 83A;

FIG. 106 is a horizontal cross-sectional view illustrating the electric wires accommodated in an electric wire accommodating portion of the battery stack plate illustrated in FIG. 103;

DESCRIPTION OF EMBODIMENTS

First Embodiment

The invention embodied as a first embodiment relates to a temperature detection unit and a power storage device including the temperature detection unit. Hereinafter, a temperature detection unit (that is, a facing unit 106) according to a first embodiment and a voltage detection unit 105 used together with the facing unit 106 will be described with reference to FIGS. 1 to 8.

Figure 1:
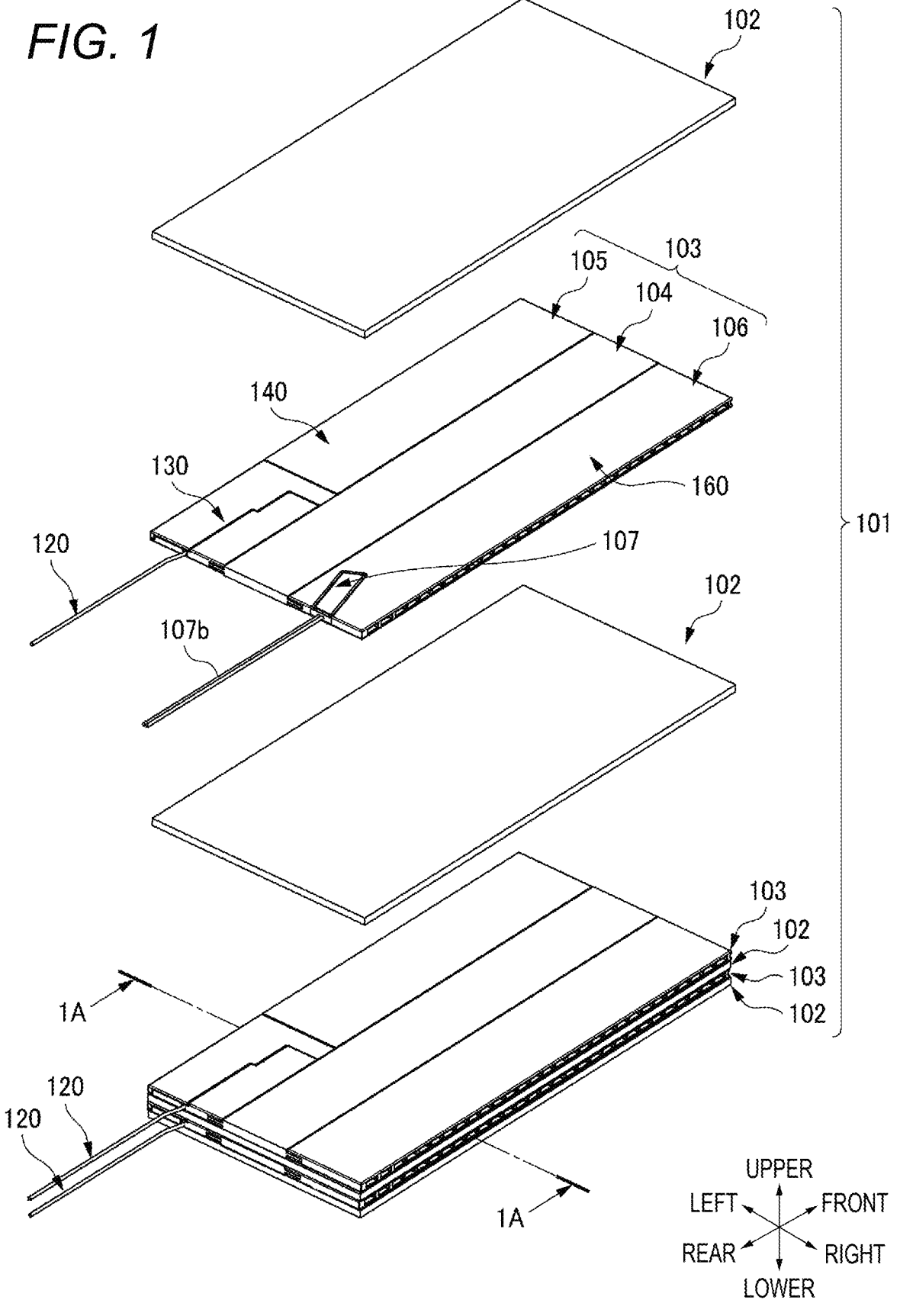
FIG. 1 is a partially exploded perspective view illustrating a stacked power storage device including a voltage detection unit according to a first embodiment.

Hereinafter, for convenience of description, "front", "rear", "left", "right", "upper", and "lower" are defined as illustrated in FIG. 1. The "front-rear direction", the "left-right direction", and the "upper-lower direction" are orthogonal to one another. The left-right direction corresponds to a direction in which a board side face of the housing faces. The front-rear direction corresponds to the "intersecting direction".

The voltage detection unit 105 is typically used in a stacked power storage device 101 illustrated in FIG. 1. The power storage device 101 is formed by alternately stacking, in the upper-lower direction, thin rectangular board-shaped power storage modules 102 capable of charging and discharging and rectangular thin board-shaped conductive modules 103 capable of electrically connecting adjacent power storage modules 102. In the power storage device 101, a plurality of power storage modules 102 are electrically connected in series via the conductive modules 103. Each power storage module 102 has a structure in which a plurality of battery cells (not illustrated) are incorporated, and the power storage modules 102 as a whole function as one battery capable of charging and discharging.

Figure 2:
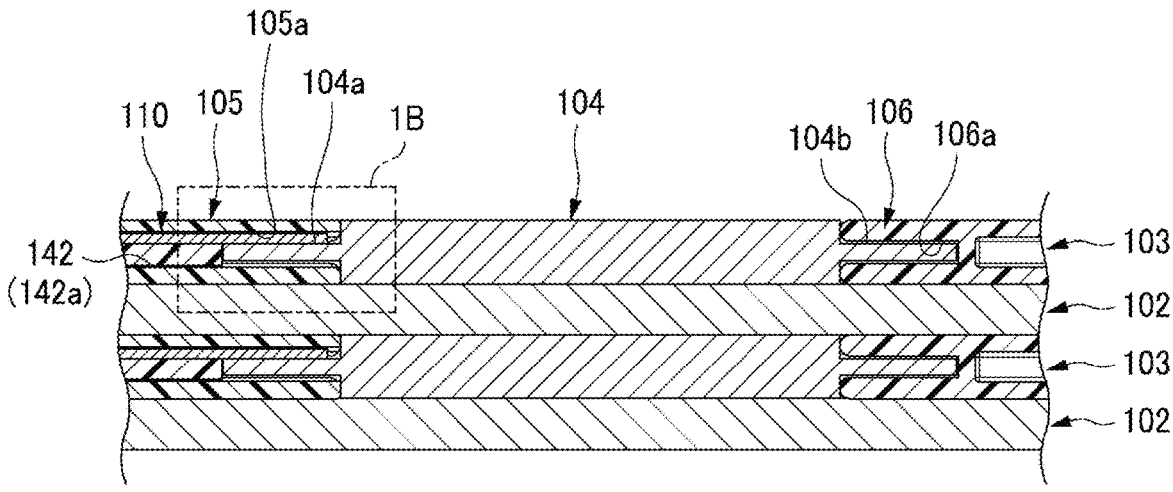
FIG. 2 is a cross-sectional view taken along a line 1A-1A in FIG. 1.
Figure 2:
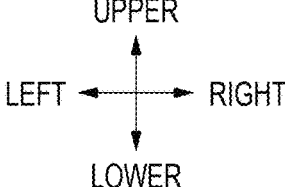
Figure 3:
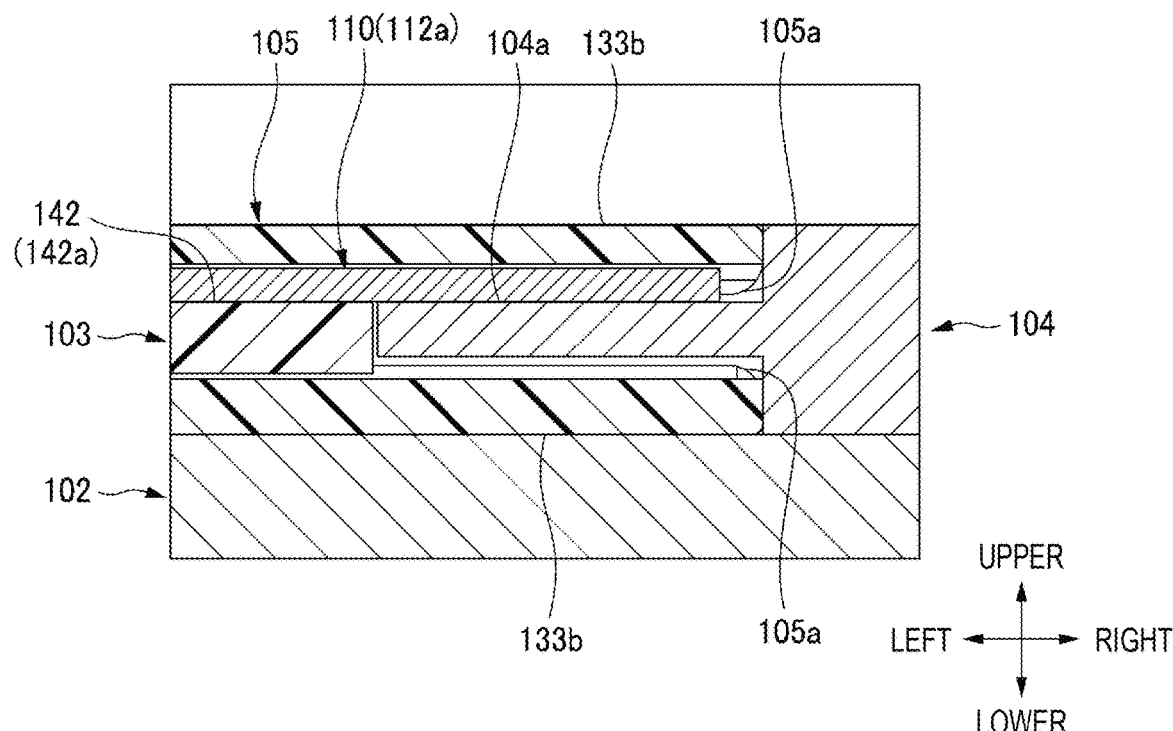
FIG. 3 is an enlarged view of a portion 1B in FIG. 2.

As illustrated in FIG. 1, each conductive module 103 is formed to have a rectangular thin board shape as a whole by a rectangular thin board-shaped conductive board 104 (the conductive board 104 also functions as a heat sink as described later), the rectangular thin board-shaped voltage detection unit 105 coupled to the left side of the conductive board 104, and a rectangular thin board-shaped facing unit 106 coupled to the right side of the conductive board 104. As illustrated in FIGS. 1 and 2, the conductive board 104 and the voltage detection unit 105 are coupled to each other by fitting a flange 104a into a recess 105a. The flange 104a is provided on the left end face of the conductive board 104 and extends in the front-rear direction. The recess 105a is provided on the right end face of the voltage detection unit 105 and extends in the front-rear direction. The conductive board 104 and the facing unit 106 are coupled to each other by fitting a flange 104b into a recess 106a. The flange 104b is provided on the right end face of the conductive board 104 and extends in the front-rear direction. The recess 106a is provided on the left end face of the facing unit 106 and extends in the front-rear direction.

In each of the conductive modules 103 positioned between the power storage modules 102 adjacent to each other in the upper-lower direction, the conductive board 104 is in direct contact with the upper and lower power storage modules 102 as illustrated in FIG. 2. Thus, the conductive board 104 functions to perform conduction between a lower face of the upper power storage module 102 and an upper face of the lower power storage module 102, and functions as a heat sink that releases heat generated from the upper and lower power storage modules 102 to the outside.

In each of the conductive modules 103 located between the power storage modules 102 adjacent to each other in the upper-lower direction, the voltage detection unit 105 includes a voltage detection terminal 110 (see FIG. 2, etc.) in contact with the conductive board 104, which is to be described later. The voltage detection unit 105 has a function of outputting a signal indicating a voltage between the upper and lower power storage modules 102 (specifically, the potential of the upper face (output face) of the lower power storage module 102 relative to the zero potential as a reference) via a voltage wire 120 (see FIG. 1, etc.) connected to the voltage detection terminal 110. The voltage detection unit 105 is disposed to the left of the conductive board 104 in FIGS. 1 to 3, but a voltage detection unit having the same function as the voltage detection unit 105 may be disposed to the right of the conductive board 104. In this case, a voltage detection unit obtained by reversing the entire configuration of the voltage detection unit 105 in the left-right direction (that is, a mirror component of the voltage detection unit 105) is used as the voltage detection unit having the same function as that of the voltage detection unit 105.

Any one of a voltage detection unit, a dummy unit, and a temperature detection unit, which will be described later, is applied as the facing unit 106 to each of the conductive modules 103 positioned between the power storage modules 102 adjacent to each other in the upper-lower direction, according to the specification of the power storage device 101.

If the facing unit 106 is a voltage detection unit, a voltage detection unit obtained by reversing the entire configuration of the voltage detection unit 105 in the left-right direction (that is, a mirror component of the voltage detection unit 105 described above) is used as the facing unit 106. In this case, the voltage detection unit 105 is disposed to the left of the conductive board 104, and the mirror component of the voltage detection unit 105 is disposed to the right of the conductive board 104. The facing unit 106 (a mirror component of the voltage detection unit 105) has the same function as that of the voltage detection unit 105.

If the facing unit 106 is a dummy unit, as illustrated in FIG. 1, a simple resin board having the recess 106*a* extending in the front-rear direction is used as the facing unit 106. In this case, the facing unit 106 performs only the function of filling the gap between the upper and lower power storage modules 102.

If the facing unit 106 is a temperature detection unit, as illustrated in FIG. 1, a structure obtained by incorporating a temperature detection sensor 107 (thermistor) in a resin board used as a dummy unit is used as the facing unit 106 (this will be described later). In this case, the facing unit 106 has a function of outputting a signal indicating the temperature of the upper and lower power storage modules 102 via a temperature wire 107*b* (see FIG. 1) connected to the temperature detection sensor 107.

Figure 4:
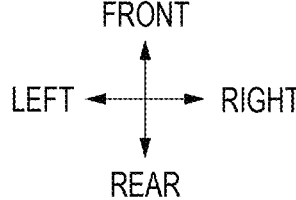
FIG. 4 is a top view illustrating a cover and a housing accommodating a voltage detection terminal and a voltage wire.

Hereinafter, the specific configuration of the voltage detection unit 105 according to the first embodiment will be described. As illustrated in FIG. 4, the voltage detection unit 105 includes a housing 140, a voltage detection terminal 110 accommodated in the housing 140, a voltage wire 120 connected to the voltage detection terminal 110 and accommodated in the housing 140, and a cover 130 mounted to the housing 140.

The voltage detection terminal 110 is accommodated in a terminal accommodating recess (reference sign omitted) formed in the housing 140. The voltage wire 120 is accommodated in an electric wire accommodating recess 146 (see FIG. 4) formed in the housing 140, which is to be described later. The cover 130 is mounted in a cover mounting recess 141 (see FIG. 4) formed in the housing 140, which is to be described later. Hereinafter, the members constituting the voltage detection unit 105 will be described in order.

First, the voltage detection terminal 110 will be described. The voltage detection terminal 110 made of metal is formed by one metal board being subjected to processing such as a pressing process. The voltage detection terminal 110 is accommodated in the terminal accommodating recess of the housing 140 from above. As illustrated in FIG. 4, the voltage detection terminal 110 includes a rectangular flat plate-shaped first portion 111 extending in the front-rear direction and a rectangular flat plate-shaped second portion 112 extending rightward from the front end of the first portion 111, and has a substantially L-shaped flat plate shape as a whole when viewed in the upper-lower direction.

One end of the voltage wire 120 is fixed and electrically connected to the lower face of the tip portion 111*a* of the first portion 111 (that is, the end closer to the rear end). The other end of the voltage wire 120 is to be connected to a voltage measuring device (not illustrated) outside the power storage device 101. A part of the flange 104*a* of the conductive board 104 is to be fixed to the lower face of a tip portion 112*a* of the second portion 112 (that is, the end closer to the right end) by a method such as ultrasonic joining or welding (see FIG. 3).

The front end edge of the second portion 112 is formed with a projection 113 projecting forward. When the voltage detection terminal 110 is accommodated in the housing 140, the projection 113 is to be locked in a locking groove 145 (see FIG. 4) formed in the housing 140.

Next, the cover 130 will be described. The cover 130 is a resin molded article and is mounted to the cover mounting recess 141 of the housing 140 from the left. The cover 130 includes a facing portion 131 and an extension portion 132 extending rearward from the facing portion 131. The facing portion 131 mainly functions to cover and protect the voltage detection terminal 110, and the extension portion 132 mainly functions to cover and protect the voltage wire 120.

The facing portion 131 includes a pair of flat plates 133 having the same shape and facing each other at an interval in the upper-lower direction, and a coupling portion 134 that couples the left end edges of the pair of flat plates 133 extending in the front-rear direction in the upper-lower direction over the entire region in the front-rear direction. The facing portion 131 has a substantially U-shape opening rightward when viewed in the front-rear direction. Each flat plate 133 includes a substantially square flat plate-shaped a base 133*a* continuous from the coupling portion 134, and a rectangular flat plate-shaped extension portion 133*b* extending rightward from the front end of the base 133*a*, and has a substantially L shape as a whole when viewed in the upper-lower direction. The extension portion 132 extends rearward from the rear end edge of the upper flat plate 133 (more specifically, the upper base 133*a*) of the pair of flat plates 133 constituting the facing portion 131 in a flush and continuous manner, and has a substantially rectangular flat plate shape.

The extension portion 132 is integrally formed with two electric wire holding pieces 135 extending in the left-right direction, which are arranged at an interval in the front-rear direction. Each electric wire holding piece 135 protrudes downward from the lower face of the extension portion 132 and extends in the left-right direction, so as to project further rightward from the left end edge of the extension portion 132. When the cover 130 is mounted to the housing 140, the electric wire holding pieces 135 hold the voltage wire 120 accommodated in the housing 140.

The lower flat plate 133 (more specifically, the lower base 133*a*) of the pair of flat plates 133 constituting the facing portion 131 is formed with a locking portion (not illustrated) projecting upward toward the upper flat plate 133 at a predetermined location. The locking portion functions to lock the cover 130 to a temporary locking position and a final locking position in cooperation with a temporary locked portion (not illustrated) and a final locked portion (not illustrated) provided in the housing 140.

Next, the housing 140 will be described. The housing 140 is a resin molded article and has a substantially thin rectangular board shape extending in the front-rear direction as illustrated in FIG. 1, etc. The right end face of the housing 140 is formed with a recess 105*a* recessed leftward and extending in the front-rear direction. The flange 104*a* of the conductive board 104 is to be fitted into the recess 105*a* (see FIGS. 2, 3, etc.).

The locations on the upper and lower faces of the housing 140 where the cover 130 is mounted are each formed with the cover mounting recess 141 recessed into a shape corresponding to the entire shape of the cover 130 (see FIG. 4). The recess depth (depth in the upper-lower direction) of the cover mounting recess 141 is equal to the plate thickness of the resin material constituting the cover 130 (the facing portion 131+the extension portion 132). Thus, when the cover 130 is mounted to the housing 140, the face of the housing 140 is flush with the face of the cover 130 (see FIG. 1).

The location where the voltage detection terminal 110 is accommodated on a bottom face 141*a* of the cover mounting recess 141 in the upper face of the housing 140 is formed with a terminal accommodating recess further recessed into a shape corresponding to the entire shape of the voltage detection terminal 110. The recess depth (depth in the upper-lower direction) of the terminal accommodating recess is equal to the plate thickness of the voltage detection terminal 110. Thus, when the voltage detection terminal 110 is mounted to the housing 140, the upper face of the voltage detection terminal 110 is flush with the bottom face 141a of the cover mounting recess 141.

The position in the front-rear direction in the right end edge of the housing 140 where the tip portion 112a of the voltage detection terminal 110 is disposed is formed with a notch 143 recessed leftward into a substantially rectangular shape when viewed in the upper-lower direction. The recess 105a extending in the front-rear direction in the right end face of the housing 140 is divided by the notch 143. When the voltage detection terminal 110 is accommodated in the housing 140, the upper and lower faces of the tip portion 112a of the voltage detection terminal 110 are to be exposed by the notch 143.

The location in the terminal accommodating recess where the tip portion 111a of the voltage detection terminal 110 is disposed is formed with a through hole 144 extending in the front-rear direction and penetrating in the upper-lower direction. When the voltage detection terminal 110 is accommodated in the housing 140, the one end (contact point) of the voltage wire 120 connected to the voltage detection terminal 110 enters the through hole 144. In other words, the through hole 144 functions as a clearance for avoiding interference between the bottom face of the terminal accommodating recess and the one end of the voltage wire 120.

The inner wall face of the location in the terminal accommodating recess where the projection 113 (see FIG. 4) of the voltage detection terminal 110 is disposed is formed with a locking groove 145 recessed forward and communicating with the recess 105a, so as to correspond to the projection 113 (see FIG. 4).

The location on the upper face of the housing 140 where the voltage wire 120 is accommodated is formed with an electric wire accommodating recess 146 having a shape corresponding to the wiring form of the voltage wire 120 when the voltage wire 120 is accommodated (see FIG. 4). The electric wire accommodating recess 146 is a continuous groove including a pair of straight portions 147 extending linearly in the front-rear direction and arranged at an interval in the front-rear direction, and a bent portion 148 connecting the pair of straight portions 147 and extending while being bent to project leftward. The right groove side wall (the wall facing the left) and the left groove side wall (the wall facing the right) in the electric wire accommodating recess 146 (the pair of straight portions 147+the bent portion 148) extend upward from the groove bottom wall of the electric wire accommodating recess 146 in parallel to the upper-lower direction.

The front end of the front straight portion 147 of the pair of straight portions 147 communicates with the terminal accommodating recess, and the rear end of the rear straight portion 147 of the pair of straight portions 147 constitutes an electric wire outlet 149 from which the voltage wire 120 extends from the rear end edge of the housing 140. In this way, since the electric wire accommodating recess 146 has the bent portion 148, as compared with a case where the electric wire accommodating recess 146 is formed of only the straight portions 147, even if an unintended external force is applied to the voltage wire 120 drawn out from the housing 140, the voltage wire 120 can resist the external force due to the friction between the bent portion 148 and the voltage wire 120. Thus, a large external force is hardly applied to the contact point between the voltage detection terminal 110 and the voltage wire 120.

The location in each of the pair of straight portions 147 near the boundary with the bent portion 148 is provided with a narrow recess 151, which is a recess having a width (interval in the left-right direction) narrower than that of the straight portion 147. The width of the narrow recess 151 is slightly smaller than the outer diameter of the voltage wire 120. Thus, the voltage wire 120 is pinched while being pressed in the left-right direction. By pinching the voltage wire 120 between the pair of narrow recesses 151, even if an unintended external force is applied to the voltage wire 120 drawn out from the housing 140, it is possible to resist the external force by the friction between the narrow recesses 151 and the voltage wire 120. Thus, a large external force is hardly applied to the contact point between the voltage detection terminal 110 and the voltage wire 120. Further, it is possible to strongly prevent the voltage wire 120 from being wired in a manner coming out of the bent portion 148 and straddling the bent portion 148 (that is, shortcutting the bent portion 148).

As illustrated in FIG. 4, the locations on the bottom face 141a of the cover mounting recess 141 in the upper face of the housing 140 at which the pair of electric wire holding pieces 135 of the cover 130 are arranged are formed with a pair of electric wire holding piece recesses 152 extending in the left-right direction at an interval in the front-rear direction, so as to correspond to the pair of electric wire holding pieces 135. The pair of electric wire holding piece recesses 152 sandwich a bending vertex 148a (see FIG. 4) of the bent portion 148 of the electric wire accommodating recess 146 in the front-rear direction. The bottom faces of the pair of electric wire holding piece recesses 152 are located above the bottom face of the electric wire accommodating recess 146.

The electric wire holding piece recesses 152 extend in the left-right direction from the right end edge of the upper face of the housing 140 to the right inner wall 141b (see FIG. 4) of the cover mounting recess 141 across the electric wire accommodating recess 146. Each of the locations on the right inner wall 141b of the cover mounting recess 141 where the pair of electric wire holding piece recesses 152 are connected is formed with a storage hole 153 recessed rightward (see FIG. 4). When the cover 130 is mounted to the housing 140, the extension ends (that is, the right end) of the pair of electric wire holding pieces 135 of the cover 130 are to be inserted and stored in the pair of storage holes 153.

The same position in the front-rear direction as the location where the locking portion of the cover 130 is disposed on the bottom face 141a of the cover mounting recess 141 on the lower face side of the housing 140 is formed with a temporary locked portion and a final locked portion, which are recesses recessed upward, in this order at an interval from the left to the right. The members constituting the voltage detection unit 105 have been described above.

Next, a procedure for assembling the voltage detection terminal 110 and the cover 130 to the housing 140 will be described. First, the voltage detection terminal 110, which is connected to the voltage wire 120 in advance by a method such as ultrasonic joining or welding, is accommodated in the terminal accommodating recess of the housing 140. Thus, the voltage detection terminal 110 is fitted into the terminal accommodating recess of the housing 140 from above such that the projection 113 enters the locking groove 145 and the one end (contact point) of the voltage wire 120 enters the through hole 144. In a state in which the voltage detection terminal 110 is completely accommodated in the housing 140, the upper and lower faces of the tip portion 112*a* of the voltage detection terminal 110 are exposed by the notch 143.

Next, the voltage wire 120 extending from the voltage detection terminal 110 accommodated in the housing 140 is accommodated in the electric wire accommodating recess 146 (the pair of straight portions 147+the bent portion 148) of the housing 140. Thus, the voltage wire 120 is fitted from above along the electric wire accommodating recess 146 constituted by the pair of straight portions 147 and the bent portion 148. At this time, a pair of portions of the voltage wire 120 positioned at the upper portions of the pair of narrow recesses 151 are pushed downward, so that the pair of portions of the voltage wire 120 are accommodated in the pair of narrow recesses 151. In a state in which the voltage wire 120 is completely accommodated in the housing 140, the voltage wire 120 extends rearward from the electric wire outlet 149 to the outside of the housing 140.

Next, the cover 130 is mounted to the housing 140. Thus, the cover 130 is mounted in the cover mounting recess 141 of the housing 140 from the left side, such that the facing portion 131 of the cover 130 sandwiches the cover mounting recesses 141 in the upper and lower faces of the housing 140 in the upper-lower direction, the extension portion 132 of the cover 130 covers the cover mounting recesses 141 in the upper face of the housing 140, and the pair of electric wire holding pieces 135 of the cover 130 are accommodated in the pair of electric wire holding piece recesses 152 of the housing 140.

In the process of mounting the cover 130 to the housing 140, the locking portion of the cover 130 first slides on the housing 140 to enter the inside of the temporary locked portion and engage with the temporary locked portion, and is pressed against the right side face of the temporary locked portion. Accordingly, the cover 130 is locked to the housing 140 at the temporary locking position, and the cover 130 is completely mounted to the housing 140 to obtain the voltage detection unit 105. As described later, the voltage detection unit 105 obtained after the cover 130 is completely mounted to the housing 140 (in a state in which the cover 130 is locked at the temporary locking position) is to be used for assembling the conductive module 103 (see FIG. 1).

In a state in which the cover 130 is locked at the temporary locking position, the facing portion 131 of the cover 130 (more specifically, the pair of upper and lower extension portions 133*b*) does not cover the tip portion 112*a* of the voltage detection terminal 110. Thus, the upper and lower faces of the tip portion 112*a* of the voltage detection terminal 110 are also exposed by the notch 143.

Further, the pair of electric wire holding pieces 135 of the cover 130 are arranged above the opening of a part of the straight portions 147 and the bent portion 148 of the electric wire accommodating recess 146. This prevents the voltage wire 120 from coming out of the electric wire accommodating recess 146. Further, the extension ends of the pair of electric wire holding pieces 135 are received in the pair of storage holes 153. Accordingly, it is possible to prevent unintended deformation such as misalignment of the pair of electric wire holding pieces 135 or separation of the pair of electric wire holding pieces 135 from the electric wire accommodating recess 146. Further, the extension portion 132 of the cover 130 is disposed above the opening of the bending vertex 148*a* of the bent portion 148 of the electric wire accommodating recess 146. Accordingly, it is possible to strongly prevent the voltage wire 120 from being wired in a manner coming out of the electric wire accommodating recess 146 and straddling the bent portion 148 (that is, shortcutting the bent portion 148). In this way, it is possible to reduce the possibility of occurrence of a specific failure caused by the voltage wire 120 coming out of the bent portion 148 of the electric wire accommodating recess 146.

When the cover 130 is further pushed leftward relative to the housing 140 in a state in which the cover 130 is locked at the temporary locking position, the extension ends of the pair of electric wire holding pieces 135 of the cover 130 further enter and are stored in the pair of storage holes 153. Simultaneously, the locking portion of the cover 130 goes beyond the temporary locked portion and then enters the inside of the final locked portion and is engaged with final locked portion. Thus, the cover 130 is locked to the housing 140 at the final locking position.

In a state in which the cover 130 is locked at the final locking position, the entire cover mounting recess 141 is covered with the cover 130, and thus the entire electric wire accommodating recess 146 is covered with the extension portion 132 of the cover 130. This prevents the voltage wire 120 from coming out of the electric wire accommodating recess 146. Further, the facing portion 131 of the cover 130 (more specifically, the pair of upper and lower extension portions 133*b*) covers the upper and lower faces of the tip portion 112*a* of the voltage detection terminal 110. Accordingly, the entire voltage detection terminal 110 is covered with the facing portion 131 of the cover 130, so that the voltage detection terminal 110 can be reliably protected.

Hereinafter, the specific configuration in a case where the facing unit 106 according to the first embodiment is a temperature detection unit will be described. As illustrated in FIG. 1, the facing unit 106 includes a housing 160, a temperature detection sensor 107 accommodated in the housing 160, and a temperature wire 107*b* connected to the temperature detection sensor 107. The temperature detection sensor 107 is accommodated in a sensor accommodating recess 161 (see FIGS. 5 and 6) formed in the housing 160, which is to be described later. Hereinafter, the members constituting the facing unit 106 as the temperature detection unit will be described in order.

First, the housing 160 will be described. The housing 160 is a resin molded article and has a substantially thin rectangular board shape extending in the front-rear direction as illustrated in FIG. 1, etc. The left end face of the housing 160 is formed with a recess 106*a* recessed rightward and extending in the front-rear direction. The flange 104*b* of the conductive board 104 is to be fitted into the recess 106*a* (see FIG. 5).

Figure 6:
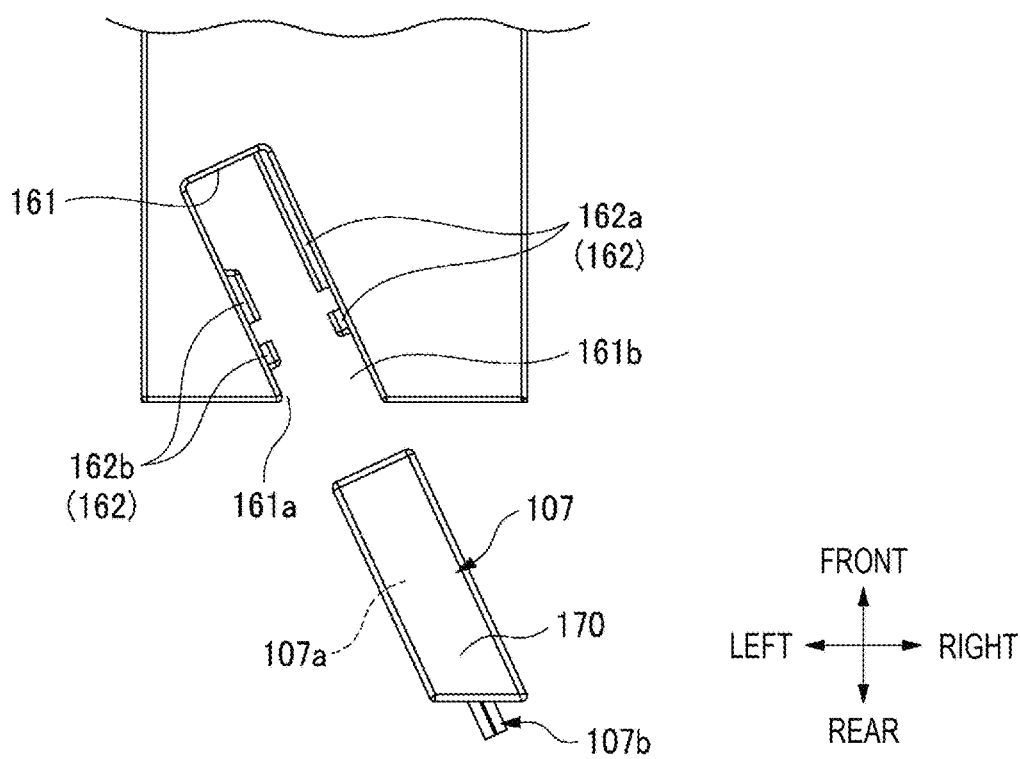
FIG. 6 is a top view illustrating a housing and a temperature detection sensor.

The central portion of the rear end face of the housing 160 in the left-right direction is formed with a sensor accommodating recess 161 extending obliquely forward and leftward (so as to approach the conductive board 104 forward from the rear) and recessed in a rectangular parallelepiped shape, so as to correspond to the overall shape of a casing 170 of the temperature detection sensor 107 (see FIG. 6). The sensor accommodating recess 161 penetrates in the upper-lower direction. The sensor accommodating recess 161 includes a first opening 161*a* that opens rearward and second openings 161*b* that open upward and downward (see FIG. 6).

The pair of inner wall faces facing each other in the left-right direction of the sensor accommodating recess 161 are formed with a plurality of projecting strips 162 (162*a*, 162*b*) projecting inward in the left-right direction (toward each other) and extending in the front-rear direction (see FIG. 6). The projecting strips 162 are to be inserted into a pair of grooves 171 to be described later (see FIG. 5) of the temperature detection sensor 107.

Next, the temperature detection sensor 107 will be described. The temperature detection sensor 107 is typically a thermistor. The temperature detection sensor 107 has a rectangular parallelepiped casing 170 extending in the front-rear direction. A sensor element 107a (see FIGS. 5 and 8) is accommodated in an element accommodating portion 172 provided in the casing 170, and a temperature wire 107b connected to the sensor element 107a extends rearward from the rear end of the casing 170. The temperature detection sensor 107 is accommodated in the sensor accommodating recess 161 of the housing 160 from the rear. The extension end of the temperature wire 107b is to be connected to a temperature measuring device (not illustrated) outside the power storage device 101.

Figure 5:
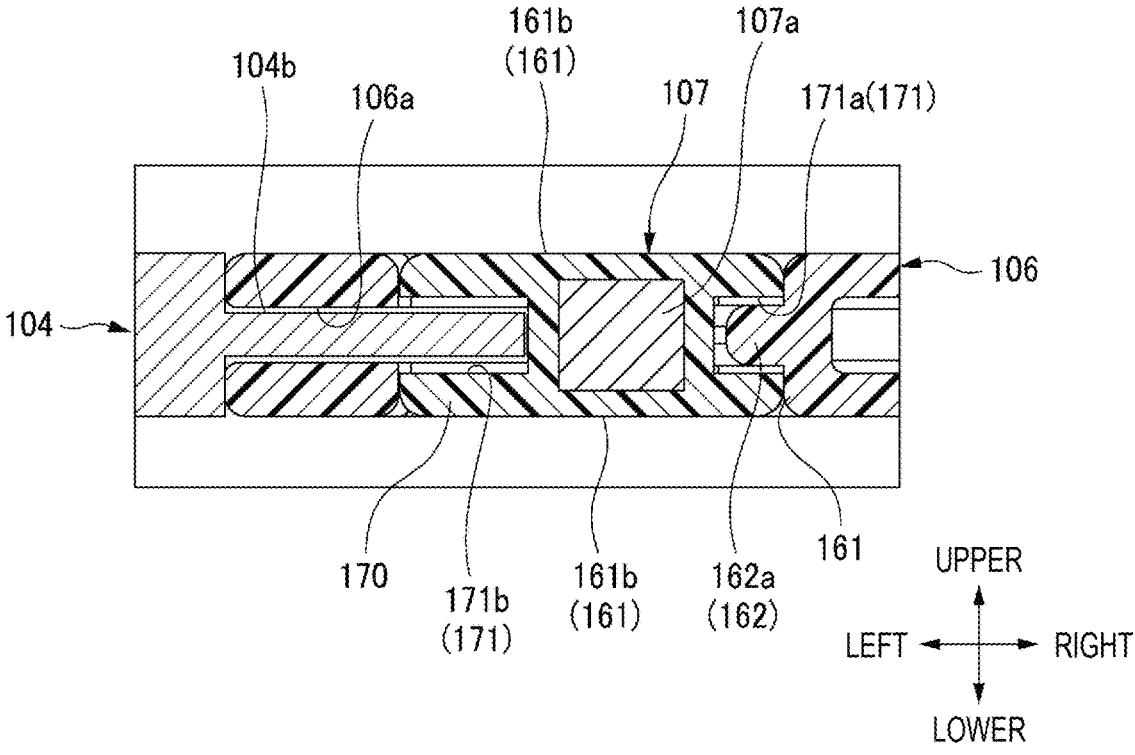
FIG. 5 is an enlarged cross-sectional view of the main part of the temperature detection unit, and corresponds to FIG. 2.
Figure 7:
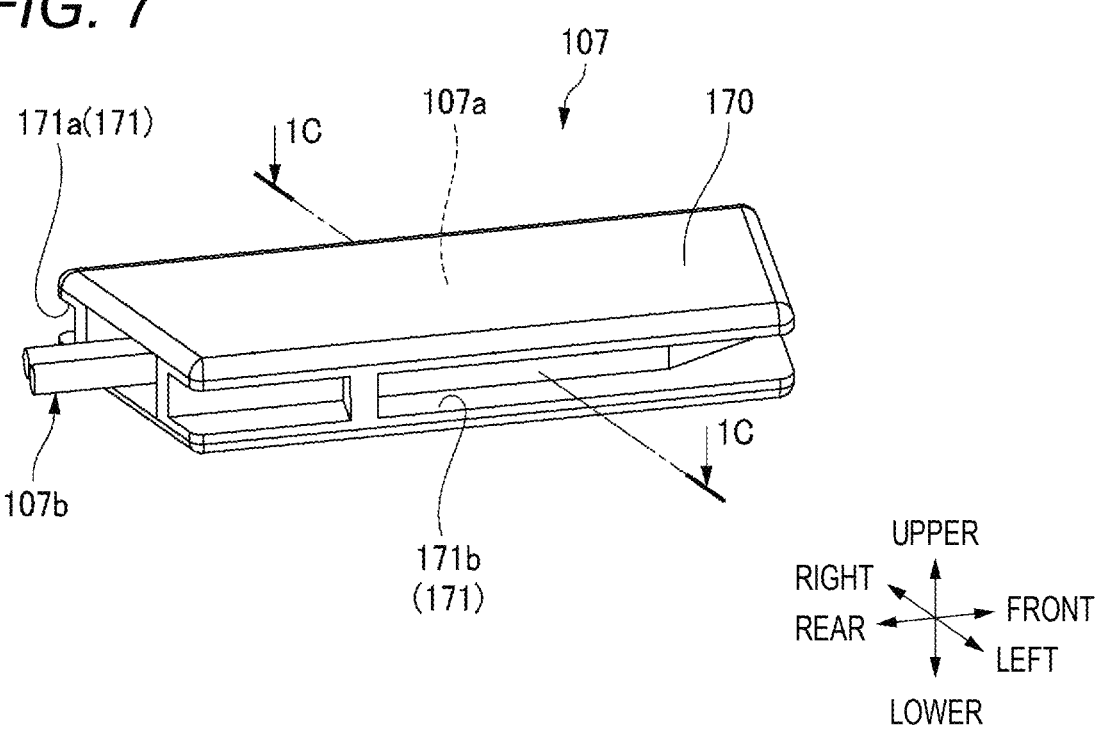
FIG. 7 is a perspective view of the temperature detection sensor.
Figure 8:
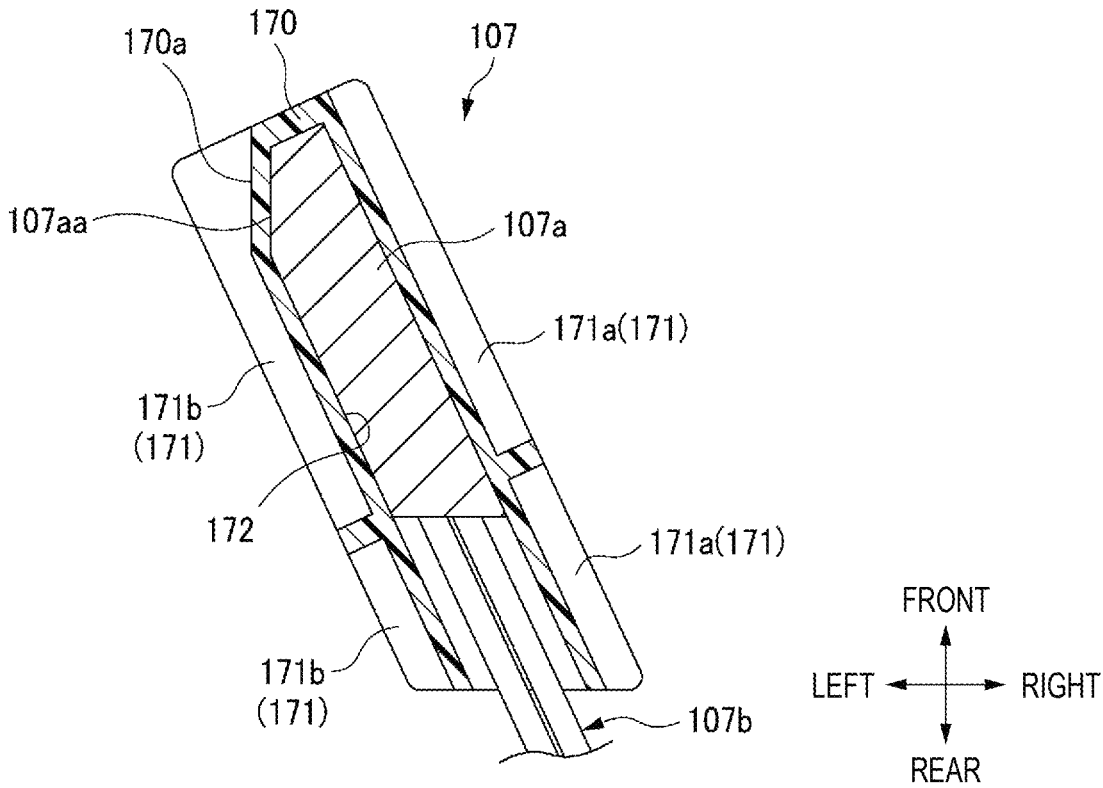
FIG. 8 is a cross-sectional view taken along a line 1C-1C in FIG. 7.

The pair of left and right end faces extending in the front-rear direction of the casing 170 are formed with a pair of grooves 171 (171a and 171b) penetrating in the front-rear direction, so as to correspond to the pair of projecting strips 162 of the sensor accommodating recess 161 (see FIGS. 5 and 7 to 8). The left groove 171b is formed to communicate with the recess 106a in the front-rear direction, and the left groove 171b is to be fitted with the flange 104b of the conductive board 104 (see FIG. 5).

The thickness in the upper-lower direction of the casing 170 is equal to the plate thickness of the substantially thin rectangular board-shaped housing 160. Accordingly, when the temperature detection sensor 107 is mounted to the housing 160, the face of the housing 160 is flush with the face of the temperature detection sensor 107 (see FIG. 5).

The front end of the bottom face of the left groove 171b (that is, the front left corner of the element accommodating portion 172) is formed with an inclined portion 170a (see FIG. 8) inclined rightward from the rear toward the front. In other words, the inclined portion 170a has a shape obtained by chamfering (so-called C-chamfering) the front left corner of the element accommodating portion 172. Accordingly, when the temperature detection sensor 107 is mounted to the sensor accommodating recess 161, the inclined portion 170a is to extend along the front-rear direction. In the sensor element 107a as well, the front left corner is also formed with an inclined portion 107aa so as to correspond to the inclined portion 170a (see FIG. 8). The members constituting the facing unit 106 as the temperature detection unit have been described above.

Next, a procedure for assembling the temperature detection sensor 107 to the housing 160 will be described. In order to mount the temperature detection sensor 107 to the housing 160, the temperature detection sensor 107 is inserted into the sensor accommodating recess 161 of the housing 160 from the rear side, so that the pair of projecting strips 162 provided in the sensor accommodating recess 161 are inserted into the pair of grooves 171 provided in the casing 170 of the temperature detection sensor 107. In a state in which the temperature detection sensor 107 is completely mounted to the housing 160, the temperature wire 107b extends rearward from the first opening 161a of the sensor accommodating recess 161 to the outside of the housing 160 (see FIG. 1). The upper and lower faces (flat faces) of the casing 170 are exposed to the outside from the upper and lower second openings 161b of the sensor accommodating recess 161 (see FIG. 5). When the temperature detection sensor 107 is completely mounted to the housing 160, the recess 106a and the left groove 171b communicate with each other in the front-rear direction (see FIG. 5).

Next, the assembly of the conductive module 103 and the power storage device 101 (see FIG. 1) will be described. As described above, the voltage detection unit 105 obtained after the cover 130 is completely mounted to the housing 140 (in a state in which the cover 130 is locked at the temporary locking position) is used for assembling the conductive module 103 (see FIG. 1). Specifically, first, the flange 104a of the conductive board 104 is fitted into the recess 105a of the voltage detection unit 105, so that the voltage detection unit 105 is coupled to the left side of the conductive board 104.

In this state, a part of the flange 104a of the conductive board 104 overlaps the lower side of the tip portion 112a of the voltage detection terminal 110 (see FIG. 3), and the upper face of the tip portion 112a of the voltage detection terminal 110 is exposed upward and the lower face of a part of the flange 104a of the conductive board 104 is exposed downward due to the presence of the notch 143 of the housing 140.

Next, the upper face of the tip portion 112a of the voltage detection terminal 110 exposed upward and the lower face of a part of the flange 104a of the conductive board 104 exposed downward are used to fix the tip portion 112a of the voltage detection terminal 110 and the part of the flange 104a of the conductive board 104 by a method such as ultrasonic joining or welding. Thereafter, the cover 130 is moved from the temporary locking position to the final locking position, and the voltage detection unit 105 is completely assembled to the conductive board 104.

Next, the flange 104b of the conductive board 104 is fitted into the recess 106a of the facing unit 106 and the groove 171b of the temperature detection sensor 107 (see FIG. 5), so that the facing unit 106 is coupled to the right side of the conductive board 104 to which the voltage detection unit 105 is assembled (see FIG. 2, etc.). Thus, the conductive module 103 is completely assembled.

The conductive module 103 thus obtained is used for assembling the power storage device 101 illustrated in FIG. 1. Specifically, the power storage modules 102 and the conductive modules 103 are alternately stacked in the upper-lower direction, and the stacked body is fixed by a predetermined fitting or the like, thereby obtaining the power storage device 101.

According to the first embodiment, the sensor accommodating recess 161 extends obliquely forward from the rear to approach the conductive board 104. Accordingly, the front end of the temperature detection sensor 107 (that is, the inclined portion 170a) is to be disposed closer to the conductive board 104 compared to the related art. That is, according to the first embodiment, since the temperature detection sensor 107 is closer to the heat source (in particular, the center portion of the power storage modules 102 (the conductive board 104)), the temperature measurement performance is excellent compared to the related art.

Further, according to the first embodiment, the groove 171b, which communicates with the recess 106a of the housing 160 and is fitted with the flange 104b of the conductive board 104, is provided in the casing 170. Thus, the conductive board 104 (flange 104b) is directly stacked on the temperature detection sensor 107. That is, according to the first embodiment, since the heat conductivity to the temperature detection sensor 107 is improved, the temperature measurement performance is excellent compared to the related art.

Further, according to the first embodiment, the casing 170 is provided with the inclined portion 170a, the sensor element 107a is provided with the inclined portion 107aa, and the inclined portions 170a and 107aa extend substantially in parallel to the flange 104b when the facing unit 106 (temperature detection unit) is coupled to the conductive board 104. Accordingly, since the area of the sensor element 107a facing the flange 104b is increased, the temperature measurement performance is excellent compared to the related art.

The invention embodied as the first embodiment is not limited to the first embodiment, and various modifications can be adopted within the scope of the invention. For example, the present invention is not limited to the first embodiment, and modifications, improvements, and the like can be made appropriately. In addition, materials, shapes, sizes, numbers, arrangement positions, and the like of components in the first embodiment described above are freely selected and are not limited as long as the present invention can be implemented.

Here, features of the embodiment of the temperature detection unit and the power storage device described above are briefly summarized and listed in the following [1-1] to [1-4].

[1-1]

A temperature detection unit (facing unit 106) including:
a board-shaped housing (160) having a board side face (left end face) provided with a recess (106a) configured to be fitted with a side edge (flange 104b) of a conductive board (104) disposed between a plurality of stacked power storage modules (102); and
a temperature detection sensor (107) mounted on the housing (160) and configured to measure a temperature of the power storage modules (102), in which
the housing (160) is provided with a sensor accommodating recess (161) accommodating the temperature detection sensor (107),
a plate end face (rear end face) on one side facing an intersecting direction (front-rear direction) with a direction that the board side face of the housing (160) faces (left-right direction) is provided with an opening (first opening 161a) configured to allow a temperature wire (107b) connected to the temperature detection sensor (107) to extend toward the outside, and
the sensor accommodating recess (161) extends obliquely to approach the conductive board (104) from one side (rear) toward the other side (front) in the intersecting direction.

According to the configuration of the above [1-1], the sensor accommodating recess accommodating the temperature detection sensor extends obliquely from the one side to the other side in the intersecting direction to approach the conductive board. Accordingly, the other end of the temperature detection sensor in the intersecting direction is to be disposed closer to the conductive board compared to the related art. That is, according to the above configuration, since the temperature detection sensor is closer to the heat source (in particular, the center portion of the power storage modules (the conductive board)), the temperature measurement performance is excellent compared to the related art.

[1-2]

The temperature detection unit (facing unit 106) according to the above [1-1], in which
the temperature detection sensor (107) includes
a sensor element (107a) connected to the temperature wire (107b), and
a casing (170) provided with an element accommodating portion (172) accommodating the sensor element (107a) and a groove (171b) communicating with the recess (106a) and configured to be fitted with the side edge (flange 104b).

According to the configuration of the above [1-2], the casing provided with the element accommodating portion accommodating the sensor element is provided with the groove communicating with the recess of the housing and to be fitted with the side edge of the conductive board. Thus, the conductive board (side edge) is directly stacked on the temperature detection sensor. That is, according to the above configuration, the heat is easily transferred to the temperature detection sensor, and thus the temperature measurement performance is excellent compared to the related art.

[1-3]

The temperature detection unit (facing unit 106) according to the above [1-2], in which
a corner on the other side of the element accommodating portion (172) at an end on the other side on the bottom face of the groove (171) is provided with a first inclined portion (inclined portion 170a) extending obliquely away from the conductive board (104) from the one side toward the other side,
the first inclined portion (inclined portion 170a) extends substantially in parallel to the side edge (flange 104b) when the temperature detection unit (facing unit 106) is coupled to the conductive board (104), and
a corner on the other side of the sensor element (107a) is provided with a second inclined portion (inclined portion 107aa), so as to correspond to the first inclined portion (inclined portion 170a).

According to the configuration of the above [1-3], the casing is provided with the first inclined portion, the sensor element is provided with the second inclined portion, and the first inclined portion and the second inclined portion extend substantially in parallel to the side edge when the temperature detection unit is coupled to the conductive board. Accordingly, since the area of the sensor element facing the side edge increases, the temperature measurement performance is excellent compared to the related art.

[1-4]

A power storage device (101) including:
a conductive module (103) including the temperature detection unit (facing unit 106) according to any one of the above [1-1] to [1-3] and the conductive board (104); and
the power storage modules (102).

According to the configuration of the above [1-4], the same effect as that of the above [1-1] is achieved.

Second Embodiment

The invention embodied as a second embodiment relates to a voltage detection unit. Hereinafter, a voltage detection unit 205 according to the second embodiment will be described with reference to FIGS. 9 to 17.

The voltage detection unit according to the second embodiment has the following features.

A voltage detection unit including:
a board-shaped housing having a board side face provided with a recess configured to be fitted with a side edge of a conductive board disposed between a plurality of stacked power storage modules;
a voltage detection terminal accommodated in the housing and configured to be conductively connected to the power storage modules; and a temperature detection sensor mounted to the housing and configured to measure a temperature of the power storage modules, in which the housing is provided with a sensor assembly portion to which the temperature detection sensor is assembled and a terminal accommodating recess communicating with the sensor assembly portion and accommodating the voltage detection terminal, and the temperature detection sensor includes a sensor element, a heat collecting board connected to the sensor element, and a pressing portion configured to press a part of the voltage detection terminal against the heat collecting board in a state in which the voltage detection terminal is completely accommodated in the terminal accommodating recess.

According to the second embodiment, in the state in which the voltage detection terminal is completely accommodated in the terminal accommodating recess, a part of the voltage detection terminal is to be pressed against the heat collecting board connected to the sensor element by the pressing portion. Thus, heat generated from the power storage modules is transferred to the temperature detection sensor via the voltage detection terminal and the heat collecting board. That is, according to the second embodiment, since the heat conductivity to the temperature detection sensor is excellent, the temperature measurement performance is excellent compared to the related art.

Figure 9:
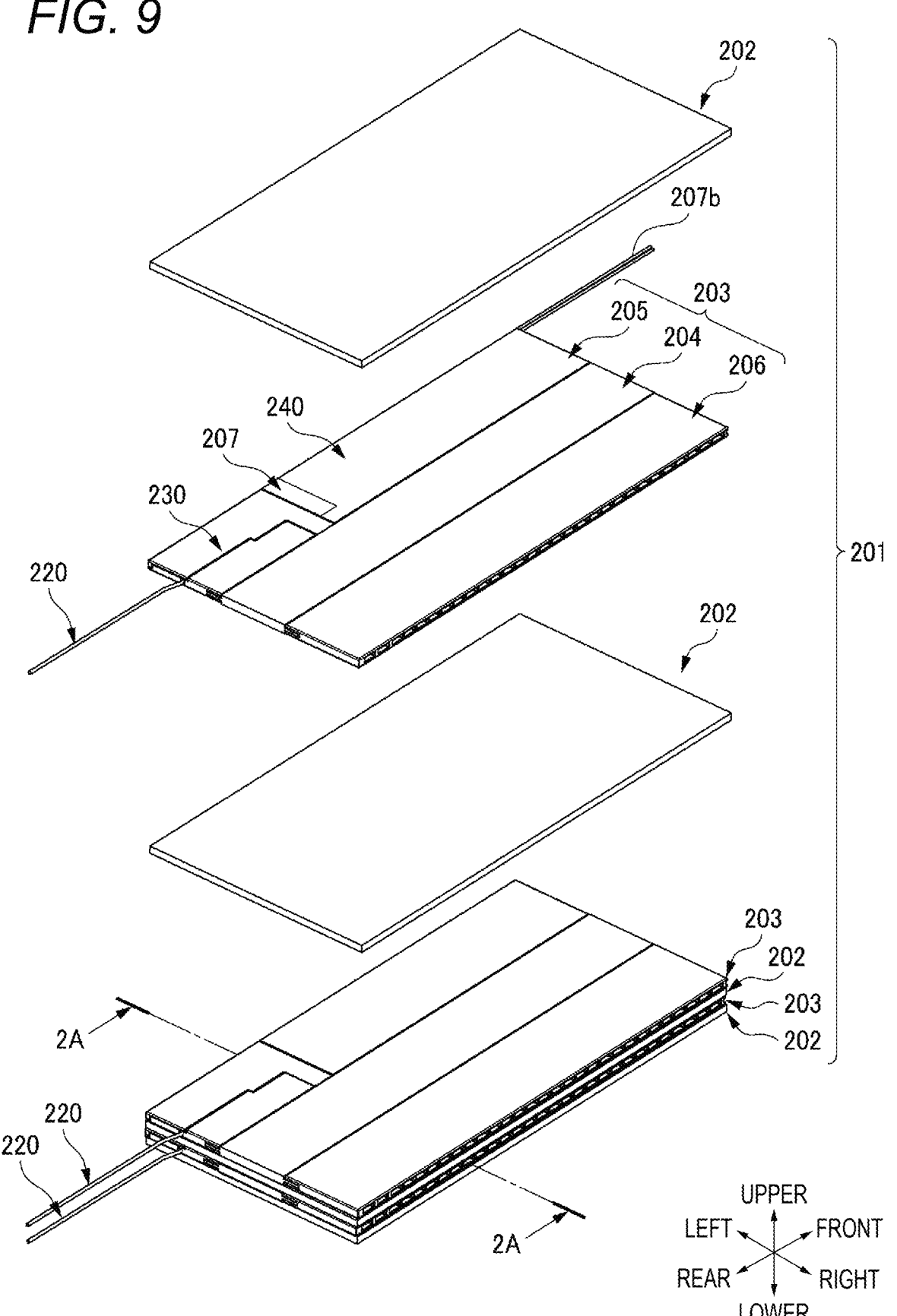
FIG. 9 is a partially exploded perspective view illustrating a stacked power storage device including a voltage detection unit according to a second embodiment.

Hereinafter, for convenience of description, "front", "rear", "left", "right", "upper", and "lower" are defined as illustrated in FIG. 9. The "front-rear direction", the "left-right direction", and the "upper-lower direction" are orthogonal to one another.

The voltage detection unit 205 is typically used in a stacked power storage device 201 illustrated in FIG. 9. The power storage device 201 is formed by alternately stacking, in the upper-lower direction, thin rectangular board-shaped power storage modules 202 capable of charging and discharging and rectangular thin board-shaped conductive modules 203 capable of electrically connecting adjacent power storage modules 202. In the power storage device 201, a plurality of power storage modules 202 are electrically connected in series via the conductive modules 203. Each power storage module 202 has a structure in which a plurality of battery cells (not illustrated) are incorporated, and the power storage modules 202 as a whole function as one battery capable of charging and discharging.

Figure 10:
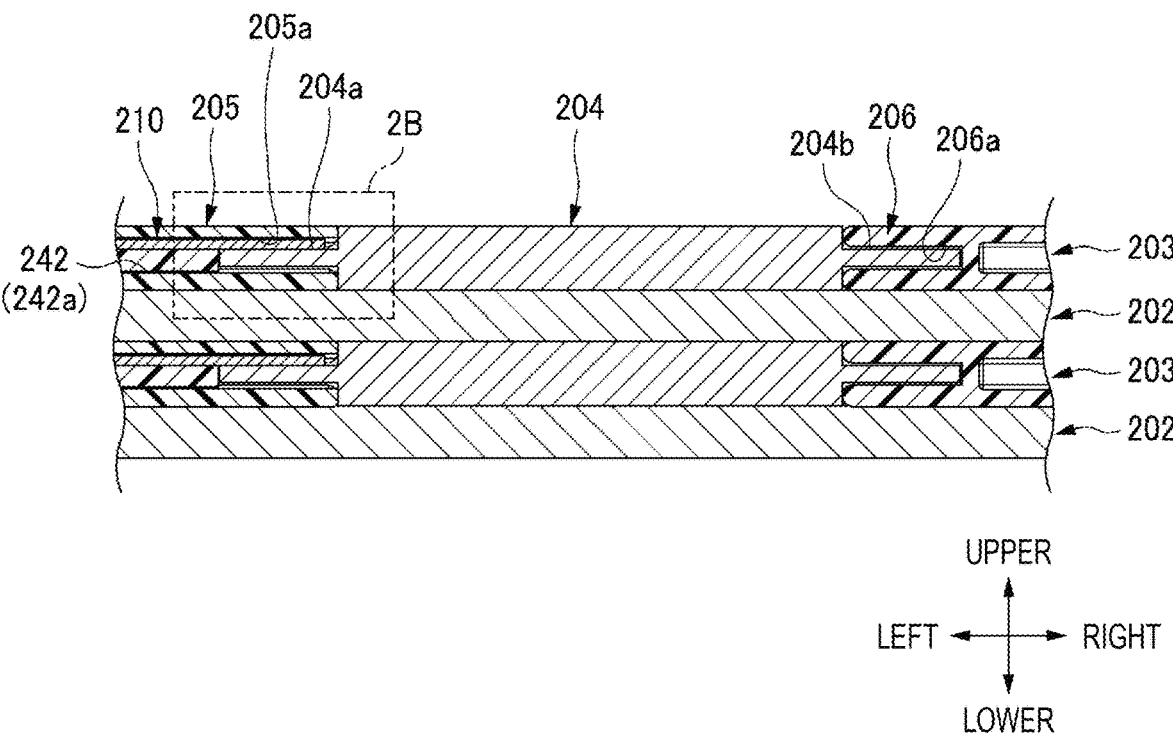
FIG. 10 is a cross-sectional view taken along a line 2A-2A in FIG. 9.
Figure 11:
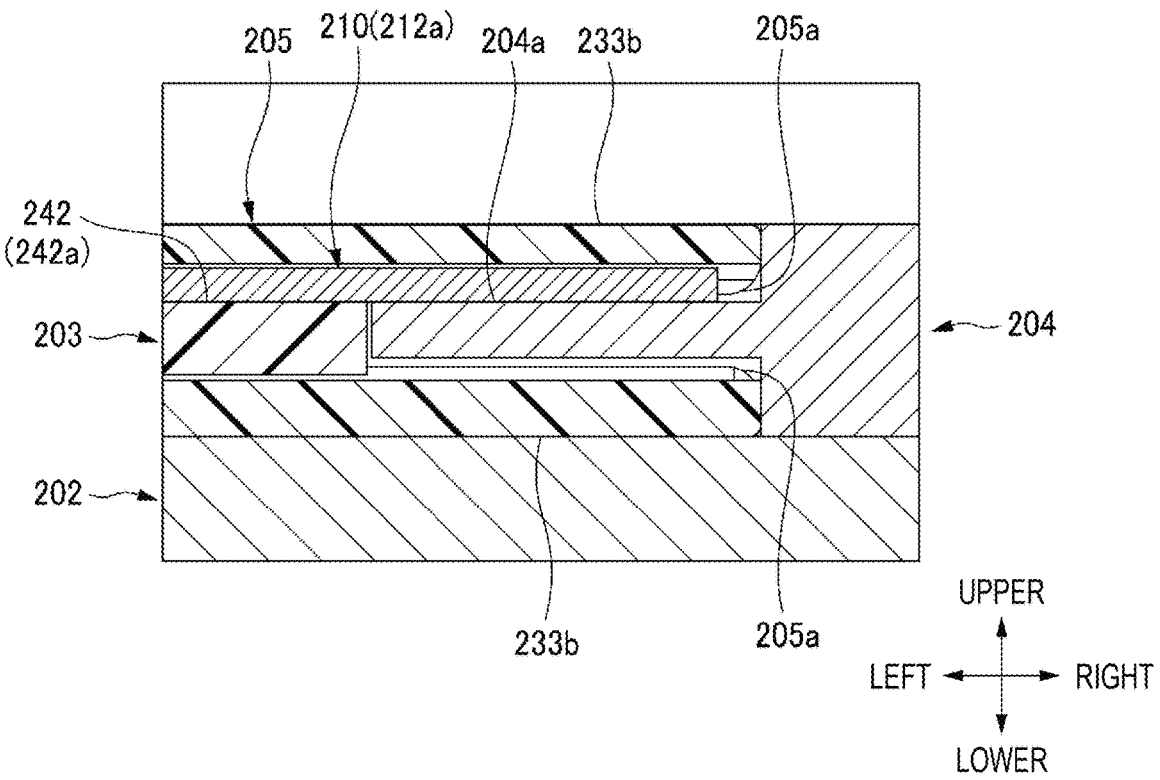
FIG. 11 is an enlarged view of a portion 2B in FIG. 10.

As illustrated in FIG. 9, each conductive module 203 is formed to have a rectangular thin board shape as a whole by a rectangular thin board-shaped conductive board 204 (the conductive board 204 also functions as a heat sink as described later), the rectangular thin board-shaped voltage detection unit 205 coupled to the left side of the conductive board 204, and a rectangular thin board-shaped facing unit 206 coupled to the right side of the conductive board 204. As illustrated in FIGS. 9 and 10, the conductive board 204 and the voltage detection unit 205 are coupled to each other by fitting a flange 204a into a recess 205a. The flange 204a is provided on the left end face of the conductive board 204 and extends in the front-rear direction. The recess 205a is provided on the right end face of the voltage detection unit 205 and extends in the front-rear direction. The conductive board 204 and the facing unit 206 are coupled to each other by fitting a flange 204b into a recess 206a. The flange 204b is provided on the right end face of the conductive board 204 and extends in the front-rear direction. The recess 206a is provided on the left end face of the facing unit 206 and extends in the front-rear direction.

In each of the conductive modules 203 positioned between the power storage modules 202 adjacent to each other in the upper-lower direction, the conductive board 204 is in direct contact with the upper and lower power storage modules 202 as illustrated in FIG. 10. Thus, the conductive board 204 functions to perform conduction between a lower face of the upper power storage module 202 and an upper face of the lower power storage module 202, and functions as a heat sink that releases heat generated from the upper and lower power storage modules 202 to the outside.

In each of the conductive modules 203 located between the power storage modules 202 adjacent to each other in the upper-lower direction, the voltage detection unit 205 includes a voltage detection terminal 210 (see FIG. 10, etc.) in contact with the conductive board 204, which is to be described later. The voltage detection unit 205 has a function of outputting a signal indicating a voltage between the upper and lower power storage modules 202 (specifically, the potential of the upper face (output face) of the lower power storage module 202 relative to the zero potential as a reference) via a voltage wire 220 (see FIG. 9, etc.) connected to the voltage detection terminal 210. The voltage detection unit 205 is disposed to the left of the conductive board 204 in FIGS. 9 to 11, but a voltage detection unit having the same function as the voltage detection unit 205 may be disposed to the right of the conductive board 204. In this case, a voltage detection unit obtained by reversing the entire configuration of the voltage detection unit 205 in the left-right direction (that is, a mirror component of the voltage detection unit 205) is used as the voltage detection unit having the same function as that of the voltage detection unit 205.

Any one of a voltage detection unit, a dummy unit, and a temperature detection unit, which will be described later, is applied as the facing unit 206 to each of the conductive modules 203 positioned between the power storage modules 202 adjacent to each other in the upper-lower direction, according to the specification of the power storage device 201.

If the facing unit 206 is a voltage detection unit, a voltage detection unit obtained by reversing the entire configuration of the voltage detection unit 205 in the left-right direction (that is, a mirror component of the voltage detection unit 205 described above) is used as the facing unit 206. In this case, the voltage detection unit 205 is disposed to the left of the conductive board 204, and the mirror component of the voltage detection unit 205 is disposed to the right of the conductive board 204. The facing unit 206 (a mirror component of the voltage detection unit 205) has the same function as that of the voltage detection unit 205.

If the facing unit 206 is a dummy unit, as illustrated in FIG. 9, a simple resin board having the recess 206a extending in the front-rear direction is used as the facing unit 206. In this case, the facing unit 206 performs only the function of filling the gap between the upper and lower power storage modules 202.

If the facing unit 206 is a temperature detection unit, the facing unit 206 has a structure in which a temperature detection sensor (thermistor) is incorporated in a resin board used as a dummy unit as illustrated in FIG. 9. In this case, the facing unit 206 has a function of outputting a signal indicating the temperature of the upper and lower power storage modules 202 via a temperature wire connected to the temperature detection sensor.

Figure 12:
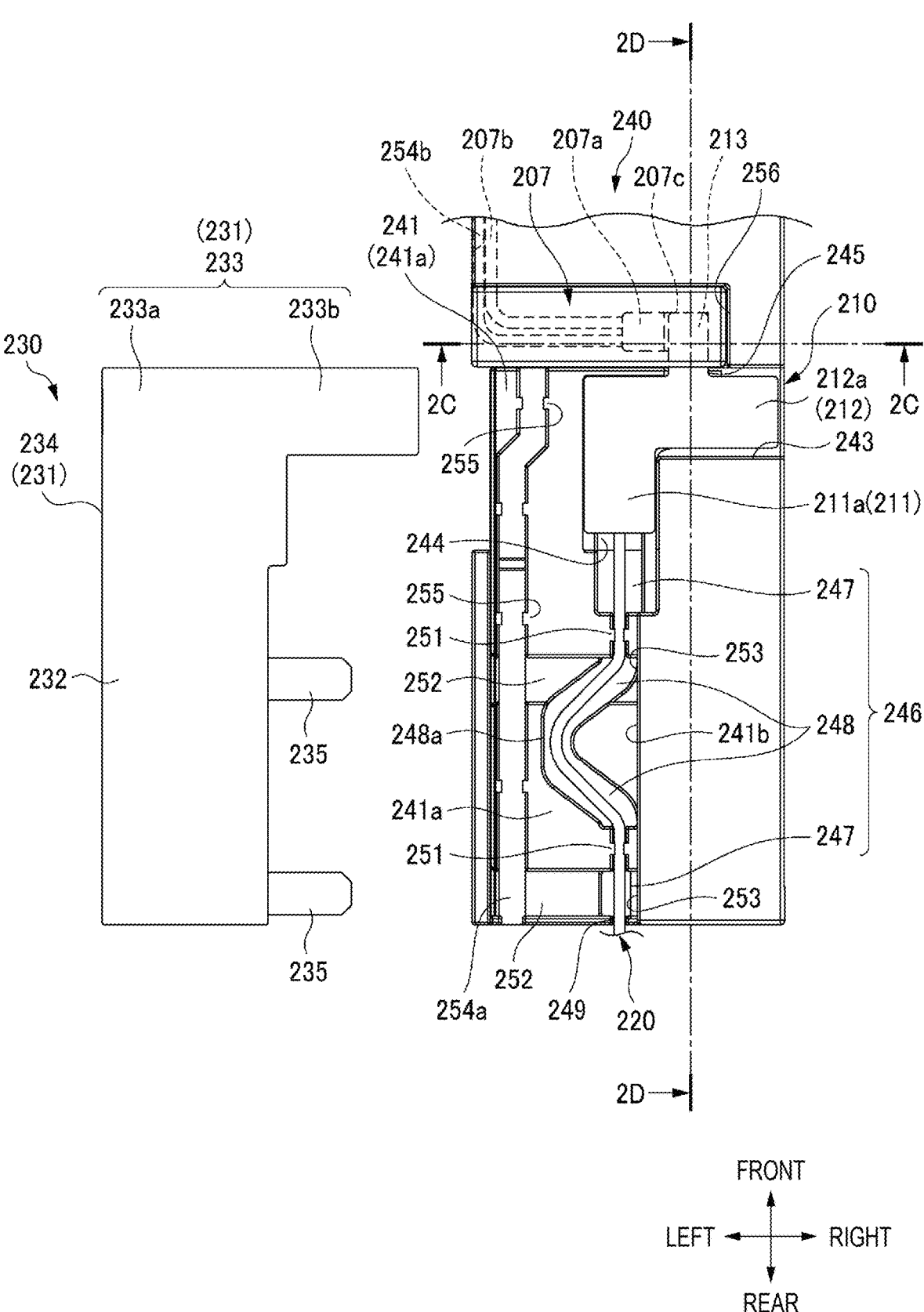
FIG. 12 is a top view illustrating the cover and the housing accommodating the voltage detection terminal, the voltage wire, and the temperature detection sensor.

Hereinafter, the specific configuration of the voltage detection unit 205 according to the second embodiment will be described. As illustrated in FIG. 12, the voltage detection unit 205 includes a housing 240, a voltage detection terminal 210 accommodated in the housing 240, a voltage wire 220 connected to the voltage detection terminal 210 and accommodated in the housing 240, a temperature detection sensor 207 assembled to the housing 240 and connected to the voltage detection terminal 210, a temperature wire 207*b* connected to a sensor element 207*a* of the temperature detection sensor 207 and accommodated in the housing 240, and a cover 230 mounted to the housing 240.

The voltage detection terminal 210 is accommodated in a terminal accommodating recess (reference sign omitted) formed in the housing 240. The voltage wire 220 is accommodated in a voltage wire accommodating recess 246 (see FIG. 12) formed in the housing 240, which is to be described later. The temperature detection sensor 207 is assembled to a sensor assembly portion 256 (see FIG. 12) formed in the housing 240, which is to be described later. The temperature wire 207*b* is accommodated in a temperature wire accommodating recess 254 (see FIG. 12) formed in the housing 240, which is to be described later. The cover 230 is mounted in a cover mounting recess 241 (see FIG. 12) formed in the housing 240, which is to be described later. Hereinafter, the members constituting the voltage detection unit 205 will be described in order.

First, the voltage detection terminal 210 will be described. The voltage detection terminal 210 made of metal is formed by one metal board being subjected to processing such as a pressing process. The voltage detection terminal 210 is accommodated in the terminal accommodating recess of the housing 240 from above. As illustrated in FIG. 12, the voltage detection terminal 210 includes a rectangular flat plate-shaped first portion 211 extending in the front-rear direction and a rectangular flat plate-shaped second portion 212 extending rightward from the front end of the first portion 211, and has a substantially L-shaped flat plate shape as a whole when viewed in the upper-lower direction.

One end of the voltage wire 220 is fixed and electrically connected to the lower face of the tip portion 211*a* of the first portion 211 (that is, the end closer to the rear end). The other end of the voltage wire 220 is to be connected to a voltage measuring device (not illustrated) outside the power storage device 201.

The front end edge of the second portion 212 is formed with a projection 213 projecting forward. When the voltage detection terminal 210 is accommodated in the housing 240, the projection 213 is inserted into a second box 272 of the temperature detection sensor 207 assembled to the housing 240, which is to be described later, and is press-fitted between the press fitting projection 274 and the heat collecting board 207*c* (see FIG. 14).

Next, the cover 230 will be described. The cover 230 is a resin molded article and is mounted to the cover mounting recess 241 of the housing 240 from the left. The cover 230 includes a facing portion 231 and an extension portion 232 extending rearward from the facing portion 231. The facing portion 231 mainly functions to cover and protect the voltage detection terminal 210, and the extension portion 232 mainly functions to cover and protect the voltage wire 220.

The facing portion 231 includes a pair of flat plates 233 having the same shape and facing each other at an interval in the upper-lower direction, and a coupling portion 234 that couples the left end edges of the pair of flat plates 233 extending in the front-rear direction in the upper-lower direction over the entire region in the front-rear direction. The facing portion 231 has a substantially U-shape opening rightward when viewed in the front-rear direction. Each flat plate 233 includes a substantially square flat plate-shaped base 233*a* continuous from the coupling portion 234, and a rectangular flat plate-shaped extension portion 233*b* extending rightward from the front end of the base 233*a*, and has a substantially L shape as a whole when viewed in the upper-lower direction. The extension portion 232 extends rearward from the rear end edge of the upper flat plate 233 (more specifically, the upper base 233*a*) of the pair of flat plates 233 constituting the facing portion 231 in a flush and continuous manner, and has a substantially rectangular flat plate shape.

The extension portion 232 is integrally formed with two electric wire holding pieces 235 extending in the left-right direction, which are arranged at an interval in the front-rear direction. Each electric wire holding piece 235 protrudes downward from the lower face of the extension portion 232 and extends in the left-right direction, so as to project further rightward from the left end edge of the extension portion 232. When the cover 230 is mounted to the housing 240, the electric wire holding pieces 235 hold the voltage wire 220 and the temperature wire 207*b* accommodated in the housing 240.

The lower flat plate 233 (more specifically, the lower base 233*a*) of the pair of flat plates 233 constituting the facing portion 231 is formed with a locking portion (not illustrated) projecting upward toward the upper flat plate 233 at a predetermined location. The locking portion functions to lock the cover 230 to a temporary locking position and a final locking position in cooperation with a temporary locked portion (not illustrated) and a final locked portion (not illustrated) provided in the housing 240.

Next, the housing 240 will be described. The housing 240 is a resin molded article and has a substantially thin rectangular board shape extending in the front-rear direction as illustrated in FIG. 9, etc. The right end face of the housing 240 is formed with a recess 205*a* recessed leftward and extending in the front-rear direction. The flange 204*a* of the conductive board 204 is to be fitted into the recess 205*a* (see FIG. 10, etc.).

The locations on the upper and lower faces of the housing 240 where the cover 230 is mounted are each formed with the cover mounting recess 241 recessed into a shape corresponding to the entire shape of the cover 230 (see FIG. 12). The recess depth (depth in the upper-lower direction) of the cover mounting recess 241 is equal to the plate thickness of the resin material constituting the cover 230 (the facing portion 231+the extension portion 232). Thus, when the cover 230 is mounted to the housing 240, the face of the housing 240 is flush with the face of the cover 230 (see FIG. 9).

The location where the voltage detection terminal 210 is accommodated on a bottom face 241*a* of the cover mounting recess 241 in the upper face of the housing 240 is formed with a terminal accommodating recess further recessed into a shape corresponding to the entire shape of the voltage detection terminal 210 (see FIG. 12). The recess depth (depth in the upper-lower direction) of the terminal accommodating recess is equal to the plate thickness of the voltage detection terminal 210. Thus, when the voltage detection terminal 210 is mounted to the housing 240, the upper face of the voltage detection terminal 210 is flush with the bottom face 241*a* of the cover mounting recess 241.

The position in the front-rear direction in the right end edge of the housing 240 where a tip portion 212*a* of the voltage detection terminal 210 is disposed is formed with a notch 243 recessed leftward into a substantially rectangular shape when viewed in the upper-lower direction. The recess 205*a* extending in the front-rear direction in the left end face of the housing 240 is divided by the notch 243. When the voltage detection terminal 210 is accommodated in the housing 240, the upper and lower faces of the tip portion 212*a* of the voltage detection terminal 210 are exposed by the notch 243.

The location in the terminal accommodating recess where the tip portion 211*a* of the voltage detection terminal 210 is disposed is formed with a through hole 244 extending in the front-rear direction and penetrating in the upper-lower direction. When the voltage detection terminal 210 is accommodated in the housing 240, the one end (contact point) of the voltage wire 220 connected to the voltage detection terminal 210 enters the through hole 244. In other words, the through hole 244 functions as a clearance for avoiding interference between the bottom face of the terminal accommodating recess and the one end of the voltage wire 220.

The location in the front-rear direction in the left end edge of the housing 240 where the temperature detection sensor 207 is disposed is formed with the sensor assembly portion 256, which has a shape corresponding to the overall shape of the temperature detection sensor 207 and is recessed rightward into a substantially rectangular shape when viewed in the upper-lower direction (see FIG. 12). The sensor assembly portion 256 is formed to communicate with the recess 205*a* and the terminal accommodating recess.

The location on the upper face of the housing 240 where the voltage wire 220 is accommodated is formed with a voltage wire accommodating recess 246 having a shape corresponding to the wiring form of the voltage wire 220 when the voltage wire 220 is accommodated (see FIG. 12). The voltage wire accommodating recess 246 is a continuous groove including a pair of straight portions 247 extending linearly in the front-rear direction and arranged at an interval in the front-rear direction, and a bent portion 248 connecting the pair of straight portions 247 and extending while being bent to project leftward. The right groove side wall (the wall facing the left) and the left groove side wall (the wall facing the right) in the voltage wire accommodating recess 246 (the pair of straight portions 247+the bent portion 248) extend upward from the groove bottom wall of the voltage wire accommodating recess 246 in parallel to the upper-lower direction.

The front end of the front straight portion 247 of the pair of straight portions 247 communicates with the terminal accommodating recess, and the rear end of the rear straight portion 247 of the pair of straight portions 247 constitutes an electric wire outlet 249 from which the voltage wire 220 extends from the rear end edge of the housing 240. In this way, since the voltage wire accommodating recess 246 has the bent portion 248, as compared with a case where the voltage wire accommodating recess 246 is formed of only the straight portions 247, even if an unintended external force is applied to the voltage wire 220 drawn out from the housing 240, the voltage wire 220 can resist the external force due to the friction between the bent portion 248 and the voltage wire 220. Thus, a large external force is hardly applied to the contact point between the voltage detection terminal 210 and the voltage wire 220.

The location in each of the pair of straight portions 247 near the boundary with the bent portion 248 is provided with a narrow recess 251, which is a recess having a width (interval in the left-right direction) narrower than that of the straight portion 247. The width of the narrow recess 251 is slightly smaller than the outer diameter of the voltage wire 220. Thus, the voltage wire 220 is pinched while being pressed in the left-right direction. By pinching the voltage wire 220 between the pair of narrow recesses 251, even if an unintended external force is applied to the voltage wire 220 drawn out from the housing 240, it is possible to resist the external force by the friction between the narrow recesses 251 and the voltage wire 220. Thus, a large external force is hardly applied to the contact point between the voltage detection terminal 210 and the voltage wire 220. Further, it is possible to strongly prevent the voltage wire 220 from being wired in a manner coming out of the bent portion 248 and straddling the bent portion 248 (that is, shortcutting the bent portion 248).

In a region behind the sensor assembly portion 256, the location on the upper face of the housing 240 where the temperature wire 207*b* is accommodated is formed with a temperature wire accommodating recess 254*a* having a shape corresponding to the wiring form of the temperature wire 207*b* when the temperature wire 207*b* is accommodated (see FIG. 12). The temperature wire accommodating recess 254*a* is a groove located to the left of the voltage wire accommodating recess 246 and extending in the front-rear direction. The right groove side wall (the wall facing the left) and the left groove side wall (the wall facing the right) in the temperature wire accommodating recess 254*a* extend upward from the groove bottom wall of the temperature wire accommodating recess 254 parallel to the upper-lower direction.

The temperature wire accommodating recess 254*a* is provided with a plurality of narrow recesses 255 that are recesses having a width (interval in the left-right direction) narrower than that of the temperature wire accommodating recess 254*a*. The width of the narrow recess 255 is slightly smaller than the outer diameter of the temperature wire 207*b*. Thus, the temperature wire 207*b* is pinched while being pressed in the left-right direction.

Figure 17:
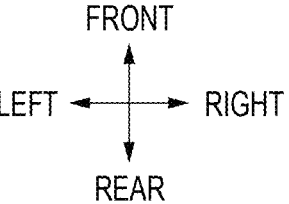
FIG. 17 is a view illustrating a modification of the routing method of the temperature wire, and corresponds to FIG. 12.

Further, in a region in front of the sensor assembly portion 256, the left end face of the housing 240 is formed with a temperature wire accommodating recess 254*b* recessed rightward and extending in the front-rear direction (see FIGS. 12 and 17). The pair of inner wall faces facing each other in the upper-lower direction of the temperature wire accommodating recess 254*b* may be formed with holding ribs projecting inward in the upper-lower direction (toward each other) and extending in the front-rear direction.

As illustrated in FIG. 12, the locations on the bottom face 241*a* of the cover mounting recess 241 in the upper face of the housing 240 at which the pair of electric wire holding pieces 235 of the cover 230 are arranged are formed with a pair of electric wire holding piece recesses 252 extending in the left-right direction at an interval in the front-rear direction, so as to correspond to the pair of electric wire holding pieces 235. The pair of electric wire holding piece recesses 252 sandwich a bending vertex 248*a* (see FIG. 12) of the bent portion 248 of the voltage wire accommodating recess 246 in the front-rear direction. The bottom faces of the pair of electric wire holding piece recesses 252 are located above the bottom faces of the voltage wire accommodating recess 246 and the temperature wire accommodating recess 254*a*.

The electric wire holding piece recesses 252 extend in the left-right direction from the right end edge of the upper face of the housing 240 to the right inner wall 241*b* (see FIG. 12) of the cover mounting recess 241 across the voltage wire accommodating recess 246 and the temperature wire accommodating recess 254*a*. Each of the locations on the right inner wall 241*b* of the cover mounting recess 241 where the pair of electric wire holding piece recesses 252 are connected is formed with a storage hole 253 recessed rightward (see FIG. 12). When the cover 230 is mounted to the housing 240, the extension ends (that is, the right end) of the pair of electric wire holding pieces 235 of the cover 230 are inserted and stored in the pair of storage holes 253.

The same position in the front-rear direction as the location where the locking portion of the cover 230 is disposed on the bottom face 241*a* of the cover mounting recess 241 on the lower face side of the housing 240 is formed with a temporary locked portion and a final locked portion, which are recesses recessed upward, in this order at an interval from the left to the right.

Figure 13:
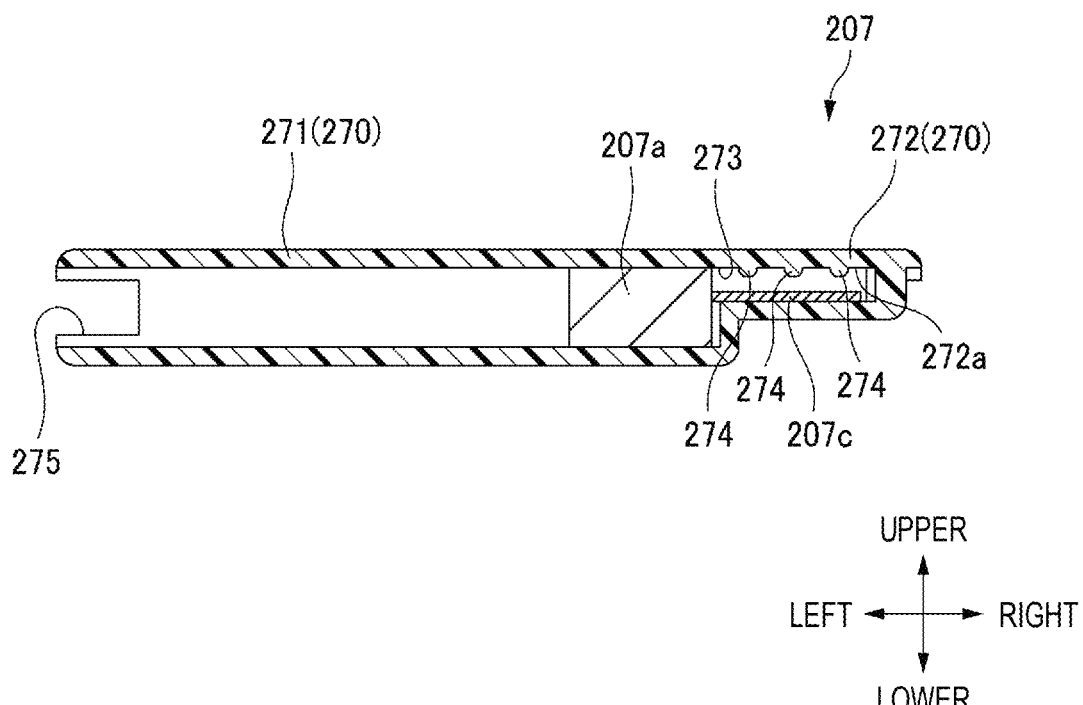
FIG. 13 is a cross-sectional view of the temperature detection sensor, and is a cross-sectional view taken along a line 2C-2C in FIG. 12.
Figure 14:
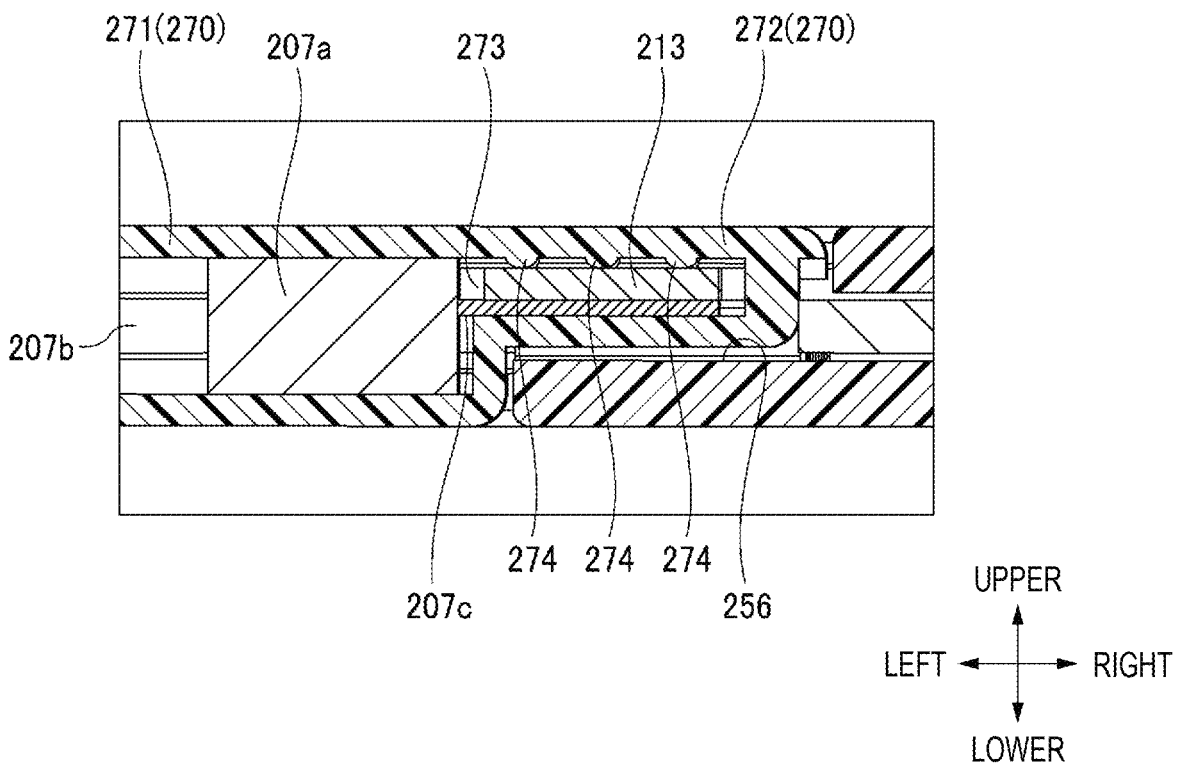
FIG. 14 is a view corresponding to FIG. 13 in the housing accommodating the temperature detection sensor.
Figure 15:
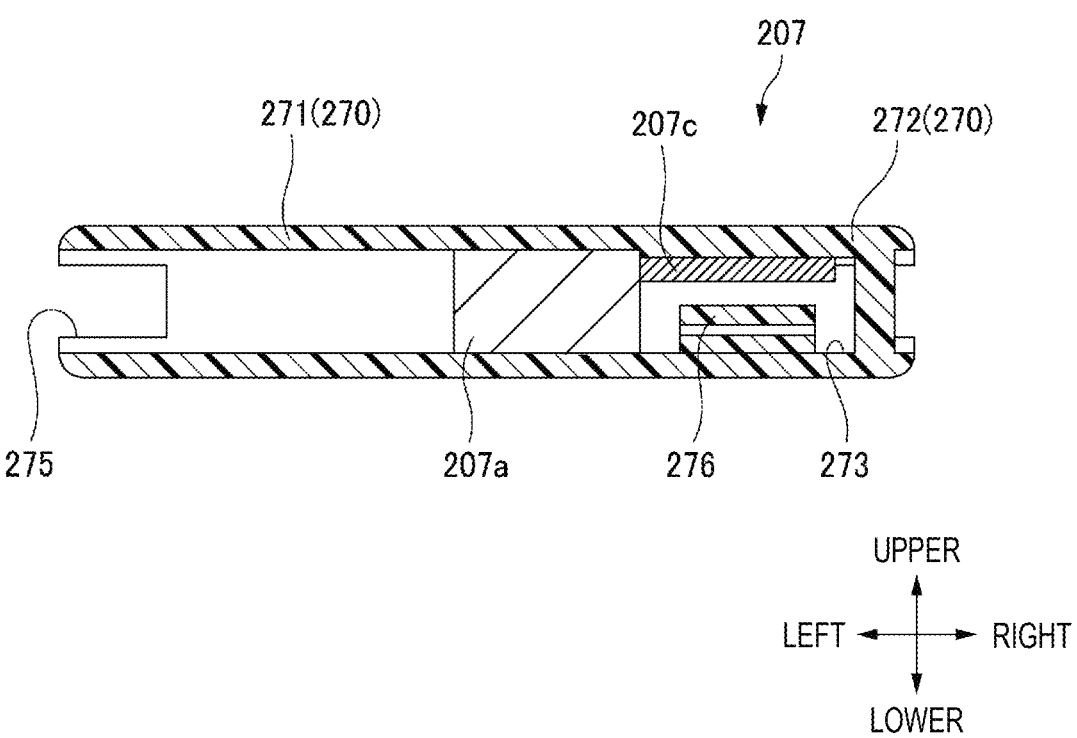
FIG. 15 is a diagram illustrating a modification of the temperature detection sensor, and corresponds to FIG. 13.
Figure 16:
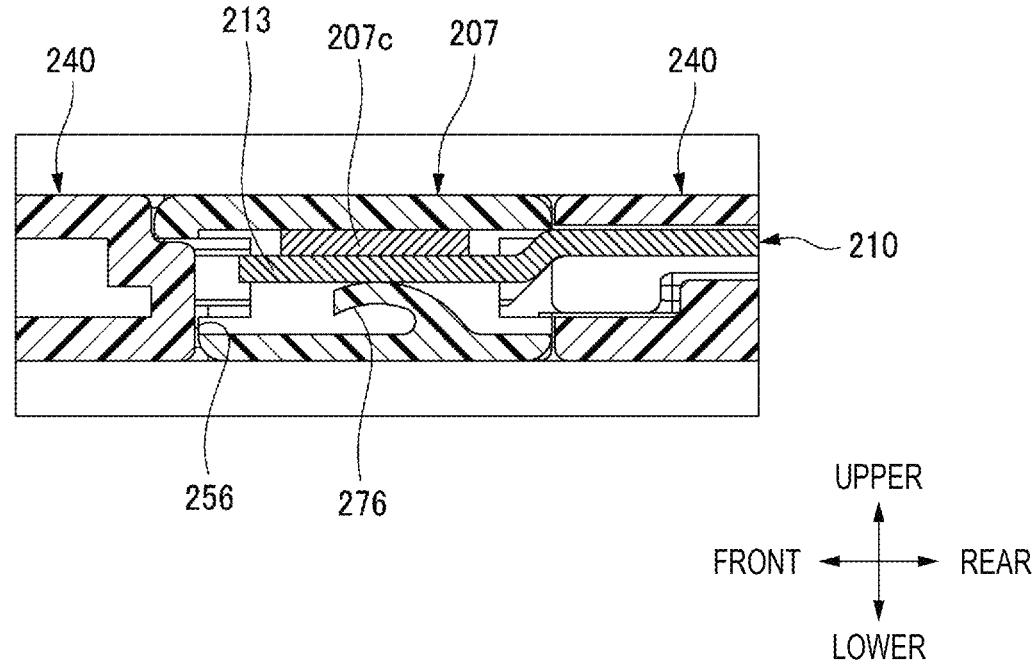
FIG. 16 is a cross-sectional view of the temperature detection sensor illustrated in FIG. 15, and is a cross-sectional view taken along a line 2D-2D in FIG. 12.

Next, the temperature detection sensor 207 will be described. The temperature detection sensor 207 is typically a thermistor. As illustrated in FIG. 13, the temperature detection sensor 207 includes a rectangular parallelepiped casing 270 extending in the left-right direction. In the casing 270, a first box 271 accommodating the sensor element 207*a* and a second box 272 projecting rightward from the upper region of the right end wall of the first box 271 are constituted integrally. The second box 272 has a thickness in the upper-lower direction smaller than that of the first box 271, and is formed to open rearward. A heat collecting board 207*c* is placed on the lower inner wall of the second box 272 so as to be in contact with (or connected to) the sensor element 207*a*, and the upper inner wall 273 of the second box is formed with a press fitting projection 274 projecting downward. The front and rear end faces in the left region of the casing 270 (specifically, the first box 271) are each formed with a temperature wire insertion port 275 penetrating in the front-rear direction, and the temperature wire 207*b* connected to the sensor element 207*a* extends forward (see FIG. 12) or rearward (see FIG. 17) from the temperature wire insertion port 275 (see FIG. 12). The temperature detection sensor 207 is assembled to the sensor assembly portion 256 of the housing 240 from the left. The extension end of the temperature wire 207*b* is to be connected to a temperature measuring device (not illustrated) outside the power storage device 201. The members constituting the voltage detection unit 205 have been described above.

Next, a procedure for assembling the voltage detection terminal 210 and the cover 230 to the housing 240 will be described. First, the temperature detection sensor 207 is assembled to the sensor assembly portion 256 from the left. Then, the temperature wire 207*b* previously connected to the sensor element 207*a* by a method such as ultrasonic joining or welding is fitted into the temperature wire accommodating recess 254*a* or 254*b* (see FIGS. 12 and 17). In a state in which the temperature wire 207*b* is completely accommodated in the housing 240, the temperature wire 207*b* extends forward or rearward to the outside of the housing 240. The drawing direction of the temperature wire 207*b* may be determined appropriately.

Then, the voltage detection terminal 210, which is connected to the voltage wire 220 in advance by a method such as ultrasonic joining or welding, is accommodated in the terminal accommodating recess of the housing 240. Thus, the voltage detection terminal 210 is fitted into the terminal accommodating recess of the housing 240 from above such that the projection 213 enters the second box 272 and the one end (contact point) of the voltage wire 220 enters the through hole 244. In a state in which the voltage detection terminal 210 is completely accommodated in the housing 240, the upper and lower faces of the tip portion 212*a* of the voltage detection terminal 210 are exposed by the notch 243. Further, in this state, the projection 213 is press-fitted between the press fitting projection 274 and the heat collecting board 207*c*, and is brought into direct contact with the heat collecting board 207*c* by the press fitting projection 274 (see FIG. 14).

Next, the voltage wire 220 extending from the voltage detection terminal 210 accommodated in the housing 240 is accommodated in the voltage wire accommodating recess 246 (the pair of straight portions 247+the bent portion 248) of the housing 240. Thus, the voltage wire 220 is fitted from above along the voltage wire accommodating recess 246 constituted by the pair of straight portions 247 and the bent portion 248. At this time, a pair of portions of the voltage wire 220 positioned at the upper portions of the pair of narrow recesses 251 are pushed downward, so that the pair of portions of the voltage wire 220 are accommodated in the pair of narrow recesses 251. In a state in which the voltage wire 220 is completely accommodated in the housing 240, the voltage wire 220 extends rearward from the electric wire outlet 249 to the outside of the housing 240.

Next, the cover 230 is mounted to the housing 240. Thus, the cover 230 is mounted in the cover mounting recess 241 of the housing 240 from the left side, such that the facing portion 231 of the cover 230 sandwiches the cover mounting recesses 241 in the upper and lower faces of the housing 240 in the upper-lower direction, the extension portion 232 of the cover 230 covers the cover mounting recesses 241 in the upper face of the housing 240, and the pair of electric wire holding pieces 235 of the cover 230 are accommodated in the pair of electric wire holding piece recesses 252 of the housing 240.

In the process of mounting the cover 230 to the housing 240, the locking portion of the cover 230 first slides on the housing 240 to enter the inside of the temporary locked portion and engage with the temporary locked portion, and is pressed against the right side face of the temporary locked portion. Accordingly, the cover 230 is locked to the housing 240 at the temporary locking position, and the cover 230 is completely mounted to the housing 240 to obtain the voltage detection unit 205. As described later, the voltage detection unit 205 obtained after the cover 230 is completely mounted to the housing 240 (in a state in which the cover 230 is locked at the temporary locking position) is used for assembling the conductive module 203 (see FIG. 9).

In a state in which the cover 230 is locked at the temporary locking position, the facing portion 231 of the cover 230 (more specifically, the pair of upper and lower extension portions 233*b*) does not cover the tip portion 212*a* of the voltage detection terminal 210. Thus, the upper and lower faces of the tip portion 212*a* of the voltage detection terminal 210 are also exposed by the notch 243.

Further, the pair of electric wire holding pieces 235 of the cover 230 are arranged above the opening of the straight portions 247 and the bent portion 248 of the voltage wire accommodating recess 246 and the temperature wire accommodating recess 254*a*. This prevents the voltage wire 220 from coming out of the voltage wire accommodating recess 246 (prevents the temperature wire 207*b* from coming out of the temperature wire accommodating recess 254). Further, the extension ends of the pair of electric wire holding pieces 235 are received in the pair of storage holes 253. Accordingly, it is possible to prevent unintended deformation such as misalignment of the pair of electric wire holding pieces 235 or separation of the pair of electric wire holding pieces 235 from the voltage wire accommodating recess 246 and the temperature wire accommodating recess 254*a*. Further, the extension portion 232 of the cover 230 is disposed above the opening of the bending vertex 248*a* of the bent portion 248 of the voltage wire accommodating recess 246. Accordingly, it is possible to strongly prevent the voltage wire 220 from being wired in a manner coming out of the voltage wire accommodating recess 246 and straddling the bent portion 248 (that is, shortcutting the bent portion 248). In this way, it is possible to reduce the possibility of occurrence of a specific failure caused by the voltage wire 220 coming out of the bent portion 248 of the voltage wire accommodating recess 246.

When the cover 230 is further pushed leftward relative to the housing 240 in a state in which the cover 230 is locked at the temporary locking position, the extension ends of the pair of electric wire holding pieces 235 of the cover 230 further enter and are stored in the pair of storage holes 253. Simultaneously, the locking portion of the cover 230 goes beyond the temporary locked portion and then enters the inside of the final locked portion and is engaged with the final locked portion. Thus, the cover 230 is locked to the housing 240 at the final locking position.

In a state in which the cover 230 is locked at the final locking position, the entire cover mounting recess 241 is covered with the cover 230, and thus the entire voltage wire accommodating recess 246 and temperature wire accommodating recess 254a are covered with the extension portion 232 of the cover 230. This prevents the voltage wire 220 from coming out of the voltage wire accommodating recess 246 (prevents the temperature wire 207b from coming out of the temperature wire accommodating recess 254). Further, the facing portion 231 of the cover 230 (more specifically, the pair of upper and lower extension portions 233b) covers the upper and lower faces of the tip portion 212a of the voltage detection terminal 210. Accordingly, the entire voltage detection terminal 210 is covered with the facing portion 231 of the cover 230, so that the voltage detection terminal 210 can be reliably protected.

Next, the assembly of the conductive module 203 and the power storage device 201 (see FIG. 9) will be described. As described above, the voltage detection unit 205 obtained after the cover 230 is completely mounted to the housing 240 (in a state in which the cover 230 is locked at the temporary locking position) is used for assembling the conductive module 203 (see FIG. 9). Specifically, first, the flange 204a of the conductive board 204 is fitted into the recess 205a of the voltage detection unit 205, so that the voltage detection unit 205 is coupled to the left side of the conductive board 204.

In this state, a part of the flange 204a of the conductive board 204 overlaps the lower side of the tip portion 212a of the voltage detection terminal 210 (see FIG. 11), and the upper face of the tip portion 212a of the voltage detection terminal 210 is exposed upward and the lower face of a part of the flange 204a of the conductive board 204 is exposed downward due to the presence of the notch 243 of the housing 240.

Next, the upper face of the tip portion 212a of the voltage detection terminal 210 exposed upward and the lower face of a part of the flange 204a of the conductive board 204 exposed downward are used to fix the tip portion 212a of the voltage detection terminal 210 and the part of the flange 204a of the conductive board 204 by a method such as ultrasonic joining or welding. Thereafter, the cover 230 is moved from the temporary locking position to the final locking position, and the voltage detection unit 205 is completely assembled to the conductive board 204.

Next, the flange 204b of the conductive board 204 is fitted into the recess 206a of the facing unit 206, so that the facing unit 206 is coupled to the right side of the conductive board 204 to which the voltage detection unit 205 is assembled (see FIG. 10, etc.). Thus, the conductive module 203 is completely assembled.

The conductive module 203 thus obtained is used for assembling the power storage device 201 illustrated in FIG. 9. Specifically, the power storage modules 202 and the conductive modules 203 are alternately stacked in the upper-lower direction, and the stacked body is fixed by a predetermined fitting or the like, thereby obtaining the power storage device 201.

(Modification of Temperature Detection Sensor)

Hereinafter, a modification of the temperature detection sensor 207 will be described. In a modification of the temperature detection sensor 207, the thickness of the second box 272 in the upper-lower direction is equal to that of the first box 271, and a spring 276 is provided instead of the press fitting projection 274 (see FIG. 15). That is, in a state in which the voltage detection terminal 210 is completely accommodated in the housing 240, the projection 213 is inserted between the spring 276 and the heat collecting board 207c, and is brought into direct contact with the heat collecting board 207c by the elastic force of the spring 276 (see FIG. 16).

According to the second embodiment, in the state in which the voltage detection terminal 210 is completely accommodated in the terminal accommodating recess, the projection 213 is pressed against the heat collecting board 207c connected to the sensor element 207a by the press fitting projection 274 (or the spring 276). Thus, heat generated from the power storage modules 202 is transferred to the temperature detection sensor 207 via the voltage detection terminal 210 and the heat collecting board 207c. That is, according to the second embodiment, since the heat conductivity to the temperature detection sensor 207 is excellent, the temperature measurement performance is excellent compared to the related art.

Further, according to the second embodiment, since the temperature wire accommodating recesses 254a and 254b are provided, the temperature wire 207b can be drawn out from both directions in the front-rear direction.

The invention embodied as the second embodiment is not limited to the second embodiment, and various modifications can be adopted within the scope of the invention. For example, the present invention is not limited to the second embodiment, and modifications, improvements, and the like can be made appropriately. In addition, materials, shapes, sizes, numbers, arrangement positions, and the like of components in the second embodiment described above are freely selected and are not limited as long as the present invention can be implemented.

Here, features of the embodiment of the voltage detection unit according to the present invention described above are briefly summarized and listed in the following [2-1].

[2-1]

A voltage detection unit (205) including:

a board-shaped housing (240) having a board side face provided with a recess (205a) configured to be fitted with a side edge (flange 204a) of a conductive board (204) disposed between a plurality of stacked power storage modules (202);

a voltage detection terminal (210) accommodated in the housing (240) and configured to be conductively connected to the power storage modules (202); and a temperature detection sensor (207) mounted to the housing (240) and configured to measure a temperature of the power storage modules (202), in which the housing (240) is provided with a sensor assembly portion (256) to which the temperature detection sensor (207) is assembled, and a terminal accommodating recess communicating with the sensor assembly portion (256) and accommodating the voltage detection terminal (210), and the temperature detection sensor (207) includes a sensor element (207a), a heat collecting board (207c) connected to the sensor element (207a), and a pressing portion (press fitting projection 274, spring 276) configured to press a part (projection 213) of the voltage detection terminal (210) against the heat collecting board (207c) in a state in which the voltage detection terminal (210) is completely accommodated in the terminal accommodating recess.

According to the configuration of the above [2-1], in the state in which the voltage detection terminal is completely accommodated in the terminal accommodating recess, a part of the voltage detection terminal is pressed against the heat collecting board connected to the sensor element by the pressing portion. Thus, heat generated from the power storage modules is transferred to the temperature detection sensor via the voltage detection terminal and the heat collecting board. That is, according to the above configuration, since the heat conductivity to the temperature detection sensor is excellent, the temperature measurement performance is excellent compared to the related art.

Third Embodiment

The invention embodied as a third embodiment relates to a voltage detection unit. Hereinafter, a voltage detection unit 305 according to the third embodiment will be described with reference to FIGS. 18 to 21.

The voltage detection unit according to the third embodiment has the following features.

A voltage detection unit including:

a board-shaped housing having one side face in a short direction provided with a recess configured to be fitted with a side edge of a conductive board disposed between a plurality of stacked power storage modules;

a voltage detection terminal accommodated in the housing and configured to be conductively connected to the power storage modules via the conductive board; and a voltage wire conductively connected to the voltage detection terminal, in which the voltage detection unit further includes a temperature detection sensor conductively connected to the voltage detection terminal, and a temperature wire conductively connected to the temperature detection sensor.

According to the third embodiment, the temperature detection sensor (including the temperature wire) is connected to the voltage detection terminal to be conductively connected to the power storage modules via the conductive board. Accordingly, the temperature detection sensor can measure the temperature through the voltage detection terminal, which has high heat conductivity. That is, according to the third embodiment, since the heat conductivity to the temperature detection sensor is excellent, the temperature measurement performance is excellent compared to the related art.

Further, according to the third embodiment, since the temperature detection sensor is connected to the voltage detection terminal, the voltage and the temperature can be detected by one module.

Figure 18:
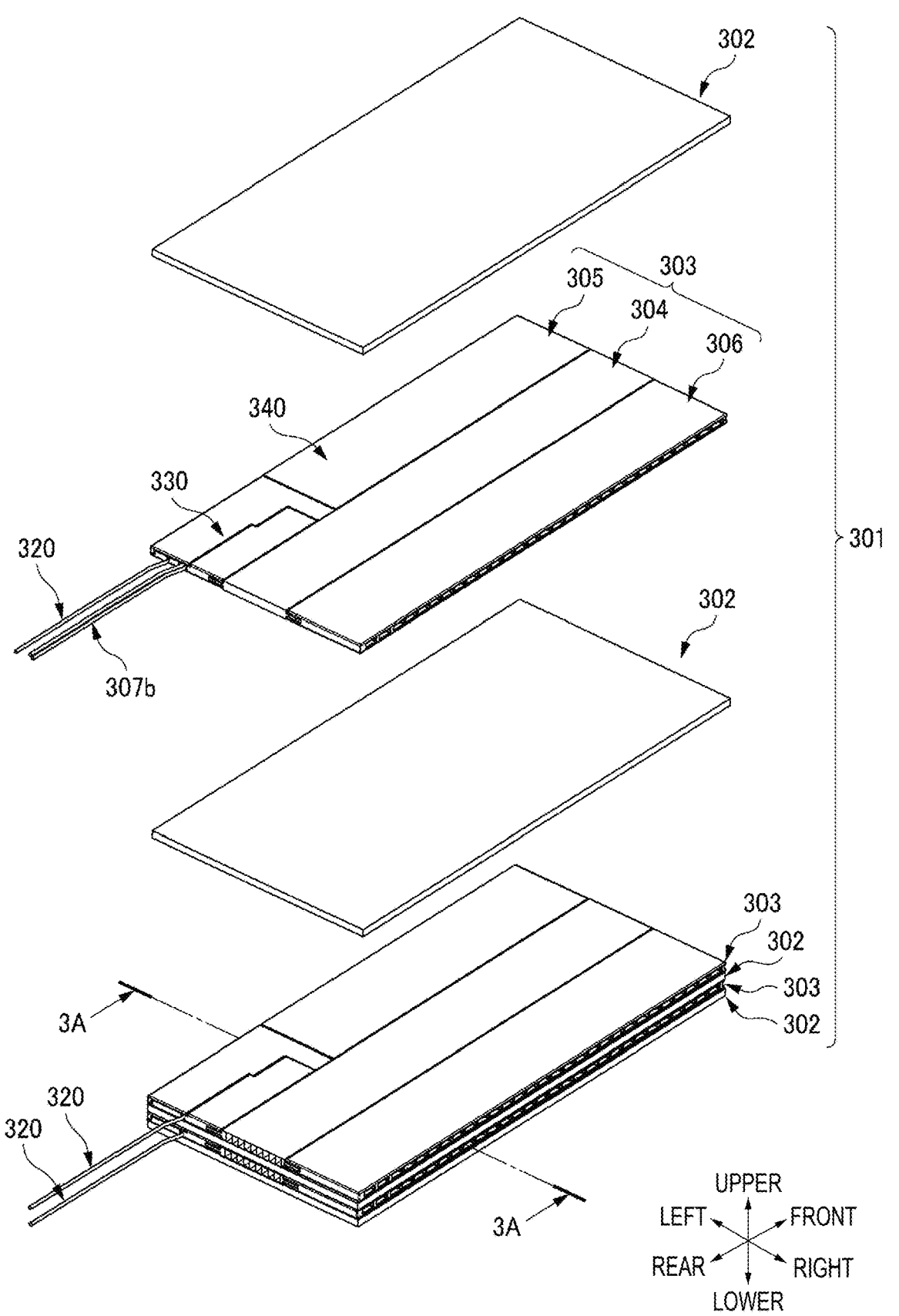
FIG. 18 is a partially exploded perspective view illustrating a stacked power storage device including a voltage detection unit according to a third embodiment.

Hereinafter, for convenience of description, "front", "rear", "left", "right", "upper", and "lower" are defined as illustrated in FIG. 18. The "front-rear direction", the "left-right direction", and the "upper-lower direction" are orthogonal to one another.

The voltage detection unit 305 is typically used in a stacked power storage device 301 illustrated in FIG. 18. The power storage device 301 is formed by alternately stacking, in the upper-lower direction, thin rectangular board-shaped power storage modules 302 capable of charging and discharging and rectangular thin board-shaped conductive modules 303 capable of electrically connecting adjacent power storage modules 302. In the power storage device 301, a plurality of power storage modules 302 are electrically connected in series via the conductive modules 303. Each power storage module 302 has a structure in which a plurality of battery cells (not illustrated) are incorporated, and the power storage modules 302 as a whole function as one battery capable of charging and discharging.

Figure 19:
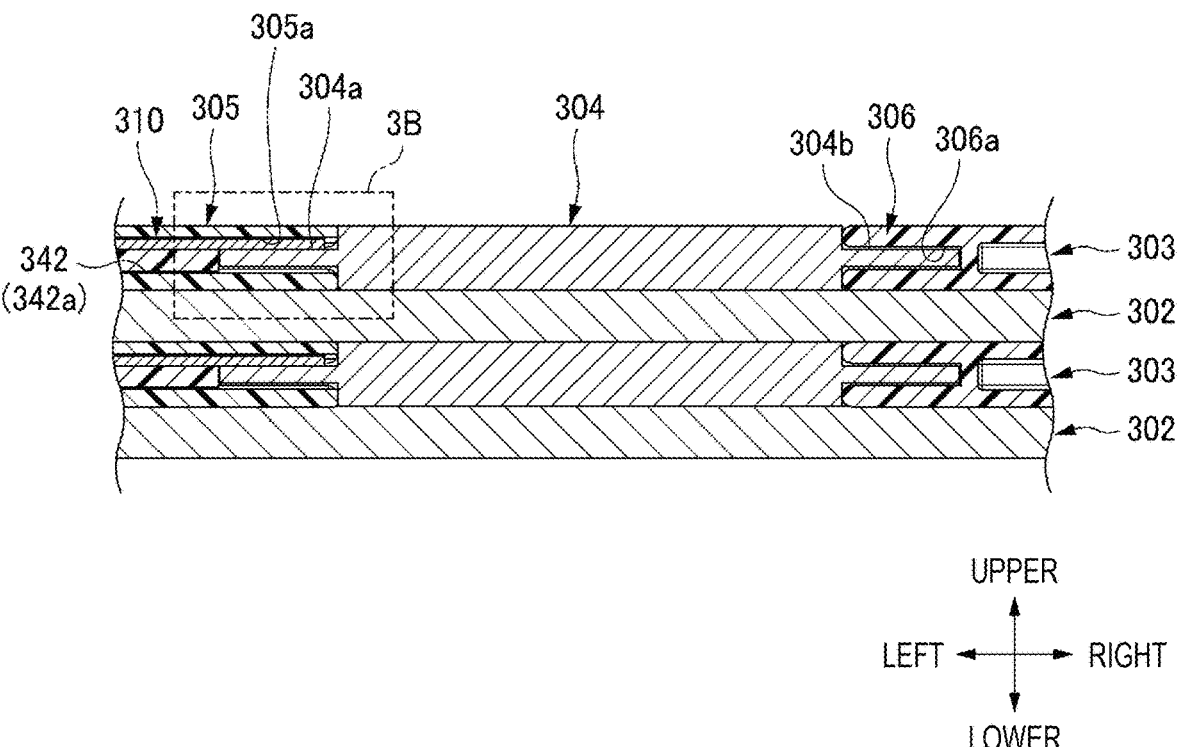
FIG. 19 is a cross-sectional view taken along a line 3A-3A in FIG. 18.

As illustrated in FIG. 18, each conductive module 303 is formed to have a rectangular thin board shape as a whole by a rectangular thin board-shaped conductive board 304 (the conductive board 304 also functions as a heat sink as described later), the rectangular thin board-shaped voltage detection unit 305 coupled to the left side of the conductive board 304, and a rectangular thin board-shaped facing unit 306 coupled to the right side of the conductive board 304. As illustrated in FIGS. 18 and 19, the conductive board 304 and the voltage detection unit 305 are coupled to each other by fitting a flange 304a into a recess 305a. The flange 304a is provided on the left end face of the conductive board 304 and extends in the front-rear direction. The recess 305a is provided on the right end face of the voltage detection unit 305 and extends in the front-rear direction. The conductive board 304 and the facing unit 306 are coupled to each other by fitting a flange 304b into a recess 306a. The flange 304b is provided on the right end face of the conductive board 304 and extends in the front-rear direction. The recess 306a is provided on the left end face of the facing unit 306 and extends in the front-rear direction.

In each of the conductive modules 303 positioned between the power storage modules 302 adjacent to each other in the upper-lower direction, the conductive board 304 is in direct contact with the upper and lower power storage modules 302 as illustrated in FIG. 19. Thus, the conductive board 304 functions to perform conduction between a lower face of the upper power storage module 302 and an upper face of the lower power storage module 302, and functions as a heat sink that releases heat generated from the upper and lower power storage modules 302 to the outside.

In each of the conductive modules 303 located between the power storage modules 302 adjacent to each other in the upper-lower direction, the voltage detection unit 305 includes a voltage detection terminal 310 (see FIG. 19, etc.) in contact with the conductive board 304, which is to be described later. The voltage detection unit 305 has a function of outputting a signal indicating a voltage between the upper and lower power storage modules 302 (specifically, the potential of the upper face (output face) of the lower power storage module 302 relative to the zero potential as a reference) via a voltage wire 320 (see FIG. 18, etc.) connected to the voltage detection terminal 310. The voltage detection unit 305 is disposed to the left of the conductive board 304 in FIGS. 18 to 20, but a voltage detection unit having the same function as the voltage detection unit 305 may be disposed to the right of the conductive board 304. In this case, a voltage detection unit obtained by reversing the entire configuration of the voltage detection unit 305 in the left-right direction (that is, a mirror component of the voltage detection unit 305) is used as the voltage detection unit having the same function as that of the voltage detection unit 305.

Any one of a voltage detection unit, a dummy unit, and a temperature detection unit, which will be described later, is applied as the facing unit 306 to each of the conductive modules 303 positioned between the power storage modules 302 adjacent to each other in the upper-lower direction, according to the specification of the power storage device 301.

If the facing unit 306 is a voltage detection unit, a voltage detection unit obtained by reversing the entire configuration of the voltage detection unit 305 in the left-right direction (that is, a mirror component of the voltage detection unit 305 described above) is used as the facing unit 306. In this case, the voltage detection unit 305 is disposed to the left of the conductive board 304, and the mirror component of the voltage detection unit 305 is disposed to the right of the conductive board 304. The facing unit 306 (a mirror component of the voltage detection unit 305) has the same function as that of the voltage detection unit 305.

If the facing unit 306 is a dummy unit, as illustrated in FIG. 18, a simple resin board having the recess 306*a* extending in the front-rear direction is used as the facing unit 306. In this case, the facing unit 306 performs only the function of filling the gap between the upper and lower power storage modules 302.

If the facing unit 306 is a temperature detection unit, the facing unit 306 has a structure in which a temperature detection sensor (thermistor) is incorporated in a resin board used as a dummy unit as illustrated in FIG. 18. In this case, the facing unit 306 has a function of outputting a signal indicating the temperature of the upper and lower power storage modules 302 via a temperature wire 307*b* (see FIG. 18) connected to the temperature detection sensor.

Figure 21:
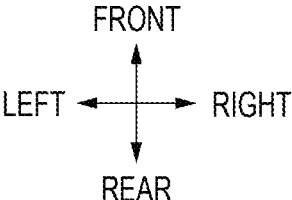
FIG. 21 is a top view illustrating the cover and the housing accommodating the voltage detection terminal and the voltage wire.

Hereinafter, the specific configuration of the voltage detection unit 305 according to the third embodiment will be described. As illustrated in FIG. 21, the voltage detection unit 305 includes a housing 340, a voltage detection terminal 310 accommodated in the housing 340, a voltage wire 320 connected to the voltage detection terminal 310 and accommodated in the housing 340, a sensor element 307*a* (a temperature detection sensor, for example, an element such as a thermistor) connected to the voltage detection terminal 310, a temperature wire 307*b* connected to the sensor element 307*a* and accommodated in the housing 340, and a cover 330 mounted to the housing 340.

The voltage detection terminal 310 is accommodated in a terminal accommodating recess (reference sign omitted) formed in the housing 340. The voltage wire 320 is accommodated in a voltage wire accommodating recess 346 (see FIG. 21) formed in the housing 340, which is to be described later. The sensor element 307*a* (see FIG. 21) is connected to a tip portion 311*a* of a first portion 311 of the voltage detection terminal 310, which is to be described later. The temperature wire 307*b* is accommodated in a temperature wire accommodating recess 354 (see FIG. 21) formed in the housing 340, which is to be described later. The cover 330 is mounted in a cover mounting recess 341 (see FIG. 21) formed in the housing 340, which is to be described later.

Hereinafter, the members constituting the voltage detection unit 305 will be described in order.

First, the voltage detection terminal 310 will be described. The voltage detection terminal 310 made of metal is formed by one metal board being subjected to processing such as a pressing process. The voltage detection terminal 310 is accommodated in the terminal accommodating recess of the housing 340 from above. As illustrated in FIG. 21, the voltage detection terminal 310 includes a rectangular flat plate-shaped first portion 311 extending in the front-rear direction and a rectangular flat plate-shaped second portion 312 extending rightward from the front end of the first portion 311, and has a substantially L-shaped flat plate shape as a whole when viewed in the upper-lower direction.

The sensor element 307*a* connected to one end of the voltage wire 320 and one end of the temperature wire 307*b* is fixed and electrically connected to the upper face of the tip portion 311*a* of the first portion 311 (that is, the end closer to the rear end). The one end of the voltage wire 320 and the sensor element 307*a* are sealed integrally by a sealing member 380. The other end of the voltage wire 320 is to be connected to a voltage measuring device (not illustrated) outside the power storage device 301. The other end of the temperature wire 307*b* is to be connected to a temperature measuring device (not illustrated) outside the power storage device 301. The sealing member 380 may be, for example, a resin mold or a potting material.

Figure 20:
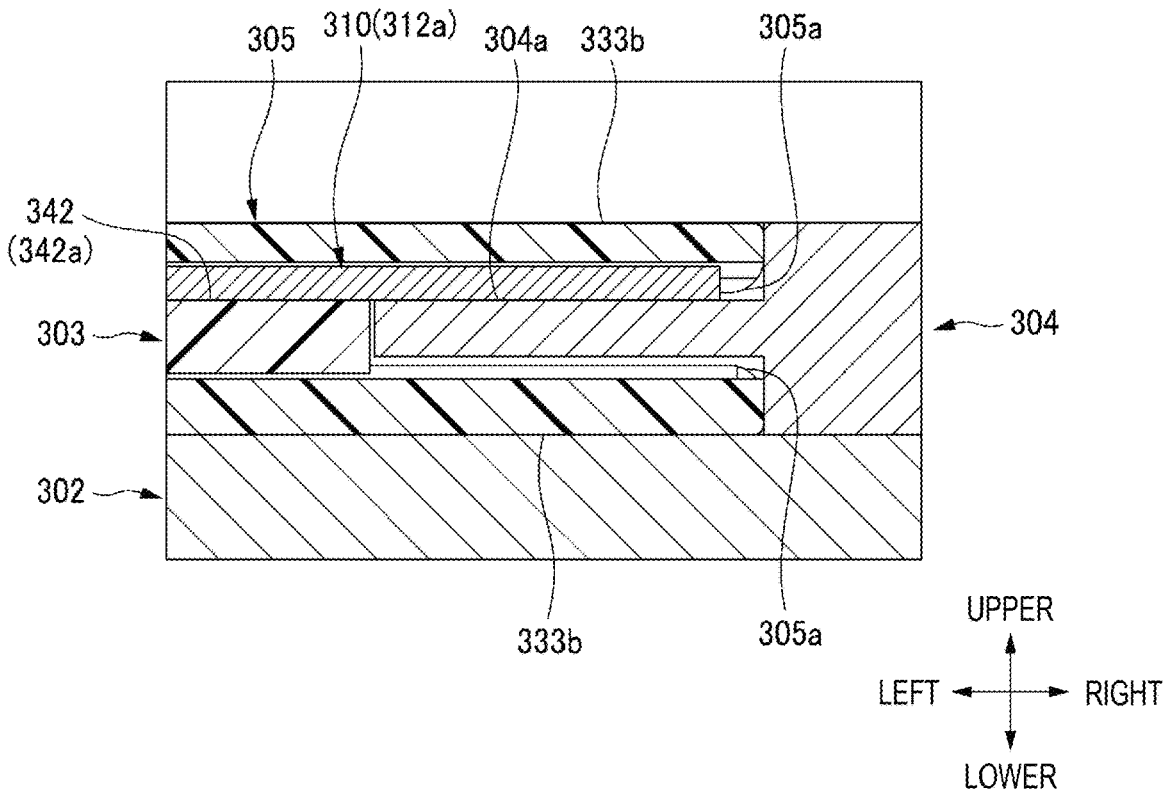
FIG. 20 is an enlarged view of a portion 3B in FIG. 19.

A part of the flange 304*a* of the conductive board 304 is to be fixed to the lower face of a tip portion 312*a* of the second portion 312 (that is, the end closer to the right end) by a method such as ultrasonic joining or welding (see FIG. 20).

The front end edge of the second portion 312 is formed with a projection 313 projecting forward. When the voltage detection terminal 310 is accommodated in the housing 340, the projection 313 is locked in a locking groove 345 (see FIG. 21) formed in the housing 340.

Next, the cover 330 will be described. The cover 330 is a resin molded article and is mounted to the cover mounting recess 341 of the housing 340 from the left. The cover 330 includes a facing portion 331 and an extension portion 332 extending rearward from the facing portion 331. The facing portion 331 mainly functions to cover and protect the voltage detection terminal 310, and the extension portion 332 mainly functions to cover and protect the voltage wire 320.

The facing portion 331 includes a pair of flat plates 333 having the same shape and facing each other at an interval in the upper-lower direction, and a coupling portion 334 that couples the left end edges of the pair of flat plates 333 extending in the front-rear direction in the upper-lower direction over the entire region in the front-rear direction. The facing portion 331 has a substantially U-shape opening rightward when viewed in the front-rear direction. Each flat plate 333 includes a substantially square flat plate-shaped a base 333*a* continuous from the coupling portion 334, and a rectangular flat plate-shaped extension portion 333*b* extending rightward from the front end of the base 333*a*, and has a substantially L shape as a whole when viewed in the upper-lower direction. The extension portion 332 extends rearward from the rear end edge of the upper flat plate 333 (more specifically, the upper base 333*a*) of the pair of flat plates 333 constituting the facing portion 331 in a flush and continuous manner, and has a substantially rectangular flat plate shape.

The extension portion 332 is integrally formed with two electric wire holding pieces 335 extending in the left-right direction, which are arranged at an interval in the front-rear direction. Each electric wire holding piece 335 protrudes downward from the lower face of the extension portion 332 and extends in the left-right direction, so as to project further rightward from the left end edge of the extension portion 332. When the cover 330 is mounted to the housing 340, the electric wire holding pieces 335 hold the voltage wire 320 and the temperature wire 307*b* accommodated in the housing 340.

The lower flat plate 333 (more specifically, the lower base 333*a*) of the pair of flat plates 333 constituting the facing portion 331 is formed with a locking portion (not illustrated) projecting upward toward the upper flat plate 333 at a predetermined location. The locking portion functions to lock the cover 330 to a temporary locking position and a final locking position in cooperation with a temporary locked portion (not illustrated) and a final locked portion (not illustrated) provided in the housing 340.

Next, the housing 340 will be described. The housing 340 is a resin molded article and has a substantially thin rectangular board shape extending in the front-rear direction as illustrated in FIG. 18 and the like. The right end face of the housing 340 is formed with a recess 305*a* recessed leftward and extending in the front-rear direction. The flange 304*a* of the conductive board 304 is to be fitted into the recess 305*a* (see FIGS. 19, 20, etc.).

The locations on the upper and lower faces of the housing 340 where the cover 330 is mounted are each formed with the cover mounting recess 341 recessed into a shape corresponding to the entire shape of the cover 330 (see FIG. 21). The recess depth (depth in the upper-lower direction) of the cover mounting recess 341 is equal to the plate thickness of the resin material constituting the cover 330 (the facing portion 331+the extension portion 332). Thus, when the cover 330 is mounted to the housing 340, the face of the housing 340 is flush with the face of the cover 330 (see FIG. 18).

The location where the voltage detection terminal 310 is accommodated on a bottom face 341*a* of the cover mounting recess 341 in the upper face of the housing 340 is formed with a terminal accommodating recess further recessed into a shape corresponding to the entire shape of the voltage detection terminal 310. The recess depth (depth in the upper-lower direction) of the terminal accommodating recess is equal to the plate thickness of the voltage detection terminal 310. Thus, when the voltage detection terminal 310 is mounted to the housing 340, the upper face of the voltage detection terminal 310 is flush with the bottom face 341*a* of the cover mounting recess 341.

The position in the front-rear direction in the right end edge of the housing 340 where the tip portion 312*a* of the voltage detection terminal 310 is disposed is formed with a notch 343 recessed leftward into a substantially rectangular shape when viewed in the upper-lower direction. The recess 305*a* extending in the front-rear direction in the right end face of the housing 340 is divided by the notch 343. When the voltage detection terminal 310 is accommodated in the housing 340, the upper and lower faces of the tip portion 312*a* of the voltage detection terminal 310 are exposed by the notch 343.

The inner wall face of the location in the terminal accommodating recess where the projection 313 (see FIG. 21) of the voltage detection terminal 310 is disposed is formed with a locking groove 345 recessed forward and communicating with the recess 305*a*, so as to correspond to the projection 313 (see FIG. 21).

The location on the upper face of the housing 340 where the voltage wire 320 is accommodated is formed with a voltage wire accommodating recess 346 having a shape corresponding to the wiring form of the voltage wire 320 when the voltage wire 320 is accommodated (see FIG. 21). The voltage wire accommodating recess 346 is a continuous groove including a pair of straight portions 347 extending linearly in the front-rear direction and arranged at an interval in the front-rear direction, and a bent portion 348 connecting the pair of straight portions 347 and extending while being bent to project leftward. The right groove side wall (the wall facing the left) and the left groove side wall (the wall facing the right) in the voltage wire accommodating recess 346 (the pair of straight portions 347+the bent portion 348) extend upward from the groove bottom wall of the voltage wire accommodating recess 346 in parallel to the upper-lower direction.

The front end of the front straight portion 347 of the pair of straight portions 347 communicates with the terminal accommodating recess, and the rear end of the rear straight portion 347 of the pair of straight portions 347 constitutes an electric wire outlet 349 from which the voltage wire 320 extends from the rear end edge of the housing 340. The front straight portion 347 of the pair of straight portions 347 is wider in the left-right direction than the rear straight portion 347. In this way, since the voltage wire accommodating recess 346 has the bent portion 348, as compared with a case where the voltage wire accommodating recess 346 is formed of only the straight portions 347, even if an unintended external force is applied to the voltage wire 320 drawn out from the housing 340, the voltage wire 320 can resist the external force due to the friction between the bent portion 348 and the voltage wire 320. Thus, a large external force is hardly applied to the contact point between the voltage detection terminal 310 and the voltage wire 320.

The location in each of the pair of straight portions 347 near the boundary with the bent portion 348 is provided with a narrow recess 351, which is a recess having a width (interval in the left-right direction) narrower than that of the straight portion 347. The width of the narrow recess 351 is slightly smaller than the outer diameter of the voltage wire 320. Thus, the voltage wire 320 is pinched while being pressed in the left-right direction. By pinching the voltage wire 320 between the pair of narrow recesses 351, even if an unintended external force is applied to the voltage wire 320 drawn out from the housing 340, it is possible to resist the external force by the friction between the narrow recesses 351 and the voltage wire 320. Thus, a large external force is hardly applied to the contact point between the voltage detection terminal 310 and the voltage wire 320. Further, it is possible to strongly prevent the voltage wire 320 from being wired in a manner coming out of the bent portion 348 and straddling the bent portion 348 (that is, shortcutting the bent portion 348).

The location on the upper face of the housing 340 where the temperature wire 307*b* is accommodated is formed with a temperature wire accommodating recess 354 having a shape corresponding to the wiring form of the temperature wire 307*b* when the temperature wire 307*b* is accommodated (see FIG. 21). The temperature wire accommodating recess 354 is a continuous groove constituted by the front straight portion 347 of the pair of straight portions 347 and the second straight portion 355 positioned to the right of the voltage wire accommodating recess 346 and linearly extending in the front-rear direction from the rear side of the front straight portion 347 of the pair of straight portions 347, so as to correspond to the sensor element 307*a*. The right groove side wall (the wall facing the left) and the left groove side wall (the wall facing the right) in the temperature wire accommodating recess 354 (the front straight portion 347+ the second straight portion 355 of the pair of straight portions 347) extend upward from the groove bottom wall of the temperature wire accommodating recess 354 in parallel to the upper-lower direction.

The front end of the second straight portion 355 communicates with the front straight portion 347 of the pair of straight portions 347, and the rear end of the second straight portion 355 constitutes an electric wire outlet 356 from which the temperature wire 307b extends from the rear end edge of the housing 340. The second straight portion 355 is located to the right of, and is separated in the left-right direction from, the rear straight portion 347 and the bent portion 348 of the pair of straight portions 347 in the voltage wire accommodating recess 346.

As illustrated in FIG. 21, the locations on the bottom face 341a of the cover mounting recess 341 in the upper face of the housing 340 at which the pair of electric wire holding pieces 335 of the cover 330 are arranged are formed with a pair of electric wire holding piece recesses 352 extending in the left-right direction at an interval in the front-rear direction, so as to correspond to the pair of electric wire holding pieces 335. The pair of electric wire holding piece recesses 352 sandwich a bending vertex 348a (see FIG. 21) of the bent portion 348 of the voltage wire accommodating recess 346 in the front-rear direction. The bottom faces of the pair of electric wire holding piece recesses 352 are located above the bottom faces of the voltage wire accommodating recess 346 and the temperature wire accommodating recess 354.

The electric wire holding piece recesses 352 extend in the left-right direction from the right end edge of the upper face of the housing 340 to the right inner wall 341b (see FIG. 21) of the cover mounting recess 341 across the voltage wire accommodating recess 346 and the temperature wire accommodating recess 354. Each of the locations on the right inner wall 341b of the cover mounting recess 341 where the pair of electric wire holding piece recesses 352 are connected is formed with a storage hole 353 recessed rightward (see FIG. 21). When the cover 330 is mounted to the housing 340, the extension ends (that is, the right end) of the pair of electric wire holding pieces 335 of the cover 330 are inserted and stored in the pair of storage holes 353.

The same position in the front-rear direction as the location where the locking portion of the cover 330 is disposed on the bottom face 341a of the cover mounting recess 341 on the lower face side of the housing 340 is formed with a temporary locked portion and a final locked portion, which are recesses recessed upward, in this order at an interval from the left to the right. The members constituting the voltage detection unit 305 have been described above.

Next, a procedure for assembling the voltage detection terminal 310 and the cover 330 to the housing 340 will be described. First, the sensor element 307a connected to the voltage wire 320 and the temperature wire 307b is connected to the voltage detection terminal 310 by a method such as ultrasonic joining or welding, and then is sealed integrally by the sealing member 380. Then, the voltage detection terminal 310 is accommodated in the terminal accommodating recess of the housing 340. Thus, the voltage detection terminal 310 is fitted into the terminal accommodating recess of the housing 340 from above such that the projection 313 enters the locking groove 345. In a state in which the voltage detection terminal 310 is completely accommodated in the housing 340, the upper and lower faces of the tip portion 312a of the voltage detection terminal 310 are exposed by the notch 343.

Next, the voltage wire 320 extending from the voltage detection terminal 310 accommodated in the housing 340 is accommodated in the voltage wire accommodating recess 346 (the pair of straight portions 347+the bent portion 348) of the housing 340. Thus, the voltage wire 320 is fitted from above along the voltage wire accommodating recess 346 constituted by the pair of straight portions 347 and the bent portion 348. At this time, a pair of portions of the voltage wire 320 positioned at the upper portions of the pair of narrow recesses 351 are pushed downward, so that the pair of portions of the voltage wire 320 are accommodated in the pair of narrow recesses 351. In a state in which the voltage wire 320 is completely accommodated in the housing 340, the voltage wire 320 extends rearward from the electric wire outlet 349 to the outside of the housing 340.

Similarly, the temperature wire 307b extending from the voltage detection terminal 310 (specifically, the sensor element 307a) accommodated in the housing 340 is accommodated in the temperature wire accommodating recess 354 (the front straight portion 347 of the pair of straight portions 347+the second straight portion 355) of the housing 340. Thus, the temperature wire 307b is fitted along the temperature wire accommodating recess 354 constituted by the front straight portion 347 and the second straight portion 355 of the pair of straight portions 347 from above. In a state in which the temperature wire 307b is completely accommodated in the housing 340, the temperature wire 307b extends rearward from the electric wire outlet 356 to the outside of the housing 340.

Next, the cover 330 is mounted to the housing 340. Thus, the cover 330 is mounted in the cover mounting recess 341 of the housing 340 from the left side, such that the facing portion 331 of the cover 330 sandwiches the cover mounting recesses 341 in the upper and lower faces of the housing 340 in the upper-lower direction, the extension portion 332 of the cover 330 covers the cover mounting recesses 341 in the upper face of the housing 340, and the pair of electric wire holding pieces 335 of the cover 330 are accommodated in the pair of electric wire holding piece recesses 352 of the housing 340.

In the process of mounting the cover 330 to the housing 340, the locking portion of the cover 330 first slides on the housing 340 to enter the inside of the temporary locked portion and engage with the temporary locked portion, and is pressed against the right side face of the temporary locked portion. Accordingly, the cover 330 is locked to the housing 340 at the temporary locking position, and the cover 330 is completely mounted to the housing 340 to obtain the voltage detection unit 305. As described later, the voltage detection unit 305 obtained after the cover 330 is completely mounted to the housing 340 (in a state in which the cover 330 is locked at the temporary locking position) is used for assembling the conductive module 303 (see FIG. 18).

In a state in which the cover 330 is locked at the temporary locking position, the facing portion 331 of the cover 330 (more specifically, the pair of upper and lower extension portions 333b) does not cover the tip portion 312a of the voltage detection terminal 310. Thus, the upper and lower faces of the tip portion 312a of the voltage detection terminal 310 are also exposed by the notch 343.

Further, the pair of electric wire holding pieces 335 of the cover 330 are arranged above the opening of a part of on the straight portions 347 and the bent portion 348 of the voltage wire accommodating recess 346 and the second straight portion 355 of the temperature wire accommodating recess 354. This prevents the voltage wire 320 from coming out of the voltage wire accommodating recess 346 and prevents the temperature wire 307b from coming out of the temperature wire accommodating recess 354. Further, the extension ends of the pair of electric wire holding pieces 335 are received in the pair of storage holes 353. Accordingly, it is possible to prevent unintended deformation such as misalignment of the pair of electric wire holding pieces 335 or separation of the pair of electric wire holding pieces 335 from the voltage wire accommodating recess 346 and the temperature wire accommodating recess 354. Further, the extension portion 332 of the cover 330 is disposed above the opening of the bending vertex 348a of the bent portion 348 of the voltage wire accommodating recess 346. Accordingly, it is possible to strongly prevent the voltage wire 320 from being wired in a manner coming out of the voltage wire accommodating recess 346 and straddling the bent portion 348 (that is, shortcutting the bent portion 348). In this way, it is possible to reduce the possibility of occurrence of a specific failure caused by the voltage wire 320 coming out of the bent portion 348 of the voltage wire accommodating recess 346.

When the cover 330 is further pushed leftward relative to the housing 340 in a state in which the cover 330 is locked at the temporary locking position, the extension ends of the pair of electric wire holding pieces 335 of the cover 330 further enter and are stored in the pair of storage holes 353. Simultaneously, the locking portion of the cover 330 goes beyond the temporary locked portion and then enters the inside of the final locked portion and is engaged with the final locked portion. Thus, the cover 330 is locked to the housing 340 at the final locking position.

In a state in which the cover 330 is locked at the final locking position, the entire cover mounting recess 341 is covered with the cover 330, and thus the entire voltage wire accommodating recess 346 and temperature wire accommodating recess 354 are covered with the extension portion 332 of the cover 330. This prevents the voltage wire 320 from coming out of the voltage wire accommodating recess 346 and prevents the temperature wire 307b from coming out of the temperature wire accommodating recess 354. Further, the facing portion 331 of the cover 330 (more specifically, the pair of upper and lower extension portions 333b) covers the upper and lower faces of the tip portion 312a of the voltage detection terminal 310. Accordingly, the entire voltage detection terminal 310 is covered with the facing portion 331 of the cover 330, so that the voltage detection terminal 310 can be reliably protected.

Next, the assembly of the conductive module 303 and the power storage device 301 (see FIG. 18) will be described. As described above, the voltage detection unit 305 obtained after the cover 330 is completely mounted to the housing 340 (in a state in which the cover 330 is locked at the temporary locking position) is used for assembling the conductive module 303 (see FIG. 18). Specifically, first, the flange 304a of the conductive board 304 is fitted into the recess 305a of the voltage detection unit 305, so that the voltage detection unit 305 is coupled to the left side of the conductive board 304.

In this state, a part of the flange 304a of the conductive board 304 overlaps the lower side of the tip portion 312a of the voltage detection terminal 310 (see FIG. 20), and the upper face of the tip portion 312a of the voltage detection terminal 310 is exposed upward and the lower face of a part of the flange 304a of the conductive board 304 is exposed downward due to the presence of the notch 343 of the housing 340.

Next, the upper face of the tip portion 312a of the voltage detection terminal 310 exposed upward and the lower face of a part of the flange 304a of the conductive board 304 exposed downward are used to fix the tip portion 312a of the voltage detection terminal 310 and the part of the flange 304a of the conductive board 304 by a method such as ultrasonic joining or welding. Thereafter, the cover 330 is moved from the temporary locking position to the final locking position, and the voltage detection unit 305 is completely assembled to the conductive board 304.

Next, the flange 304b of the conductive board 304 is fitted into the recess 306a of the facing unit 306, so that the facing unit 306 is coupled to the right side of the conductive board 304 to which the voltage detection unit 305 is assembled (see FIG. 19, etc.). Thus, the conductive module 303 is completely assembled.

The conductive module 303 thus obtained is used for assembling the power storage device 301 illustrated in FIG. 18. Specifically, the power storage modules 302 and the conductive modules 303 are alternately stacked in the upper-lower direction, and the stacked body is fixed by a predetermined fitting or the like, thereby obtaining the power storage device 301.

According to the third embodiment, the sensor element 307a (including the temperature wire 307b), which is a temperature detection sensor, is connected to the voltage detection terminal 310 to be conductively connected to the power storage modules 302 via the conductive board 304. Thus, the sensor element 307a can measure the temperature through the voltage detection terminal 310, which has high heat conductivity. That is, according to the third embodiment, since the heat conductivity to the sensor element 307a (temperature detection sensor) is excellent, the temperature measurement performance is excellent compared to the related art.

Further, according to the third embodiment, since the sensor element 307a is connected to the voltage detection terminal 310, the voltage and the temperature can be detected by one module.

Further, according to the third embodiment, the voltage wire 320 and the sensor element 307a conductively connected to the voltage detection terminal 310 are sealed integrally by the sealing member 380, so that the voltage wire 320 and the temperature wire 307b are integrated. Accordingly, the tensile strength of the two electric wires is excellent compared to a case where the two electric wires are not integrated.

The invention embodied as the third embodiment is not limited to the third embodiment, and various modifications can be adopted within the scope of the invention. For example, the present invention is not limited to the third embodiment, and modifications, improvements, and the like can be made appropriately. In addition, materials, shapes, sizes, numbers, arrangement positions, and the like of components in the third embodiment are freely selected and are not limited as long as the present invention can be implemented.

Here, features of the embodiment of the voltage detection unit according to the present invention described above are briefly summarized and listed in the following [3-1] to [3-2].
[3-1]
A voltage detection unit (305) including:
a board-shaped housing (340) having one side face in a short direction provided with a recess (305a) configured to be fitted with a side edge (flange 304b) of a conductive board (304) disposed between a plurality of stacked power storage modules (302);

a voltage detection terminal (310) accommodated in the housing (340) and configured to be conductively connected to the power storage modules (302) via the conductive board (304); and a voltage wire (320) conductively connected to the voltage detection terminal (310), in which the voltage detection unit (305) further includes a temperature detection sensor (sensor element 307*a*) conductively connected to the voltage detection terminal (310), and a temperature wire (307*b*) conductively connected to the temperature detection sensor (sensor element 307*a*).

According to the configuration of the above [3-1], the temperature detection sensor (including the temperature wire) is connected to the voltage detection terminal to be conductively connected to the power storage modules via the conductive board. Accordingly, the temperature detection sensor can measure the temperature through the voltage detection terminal, which has high heat conductivity. That is, according to the above configuration, since the heat conductivity to the temperature detection sensor is excellent, the temperature measurement performance is excellent compared to the related art.

Further, according to the above configuration, since the temperature detection sensor is connected to the voltage detection terminal, the voltage and the temperature can be detected by one module.

[3-2]

The voltage detection unit (305) according to the above [3-1], in which the voltage wire (320) and the temperature detection sensor (sensor element 307*a*) conductively connected to the voltage detection terminal (310) are sealed integrally by a sealing member (380).

According to the configuration of the above [3-2], the voltage wire and the temperature detection sensor conductively connected to the voltage detection terminal are sealed integrally by the sealing member, so that the voltage wire and the temperature wire are integrated. Accordingly, the tensile strength of the two electric wires is excellent compared to a case where the two electric wires are not integrated.

Fourth Embodiment

The invention embodied as a fourth embodiment relates to a voltage detection unit and a conductive module. Hereinafter, a voltage detection unit 405 and a conductive module 403 according to the fourth embodiment will be described with reference to FIGS. 22 to 26B.

The voltage detection unit according to the fourth embodiment has the following features.

A voltage detection unit including:

a board-shaped housing having a board side face provided with a recess configured to be fitted with a side edge of a conductive board disposed between a plurality of stacked power storage modules;

a voltage wire configured to detect a voltage of the power storage modules;

a temperature detection sensor configured to measure a temperature of the power storage modules; and a temperature wire connected to the temperature detection sensor, in which the temperature detection sensor includes a heat-conductive casing assembled to a sensor assembly portion of the housing and provided with a recess configured to be fitted with the side edge, and a sensor element accommodated in the casing and connected to the temperature wire, and the casing is provided with an extended joint connected to the voltage wire.

Furthermore, the conductive module according to the fourth embodiment has the following features.

A conductive module including the voltage detection unit and the conductive board, in which the side edge of the conductive board is provided with a contact projection in contact with an inner wall of the recess in the casing.

According to the fourth embodiment, since the side edge of the conductive board is fitted into the recess provided in the casing of the temperature detection sensor, the temperature can be measured through the heat-conductive casing. That is, according to the fourth embodiment, since the heat conductivity to the temperature detection sensor is excellent, the temperature measurement performance is excellent compared to the related art.

In addition, according to the fourth embodiment, since the voltage wire is connected to the extended joint provided in the casing, the voltage and the temperature can be detected by one module.

Figure 22:
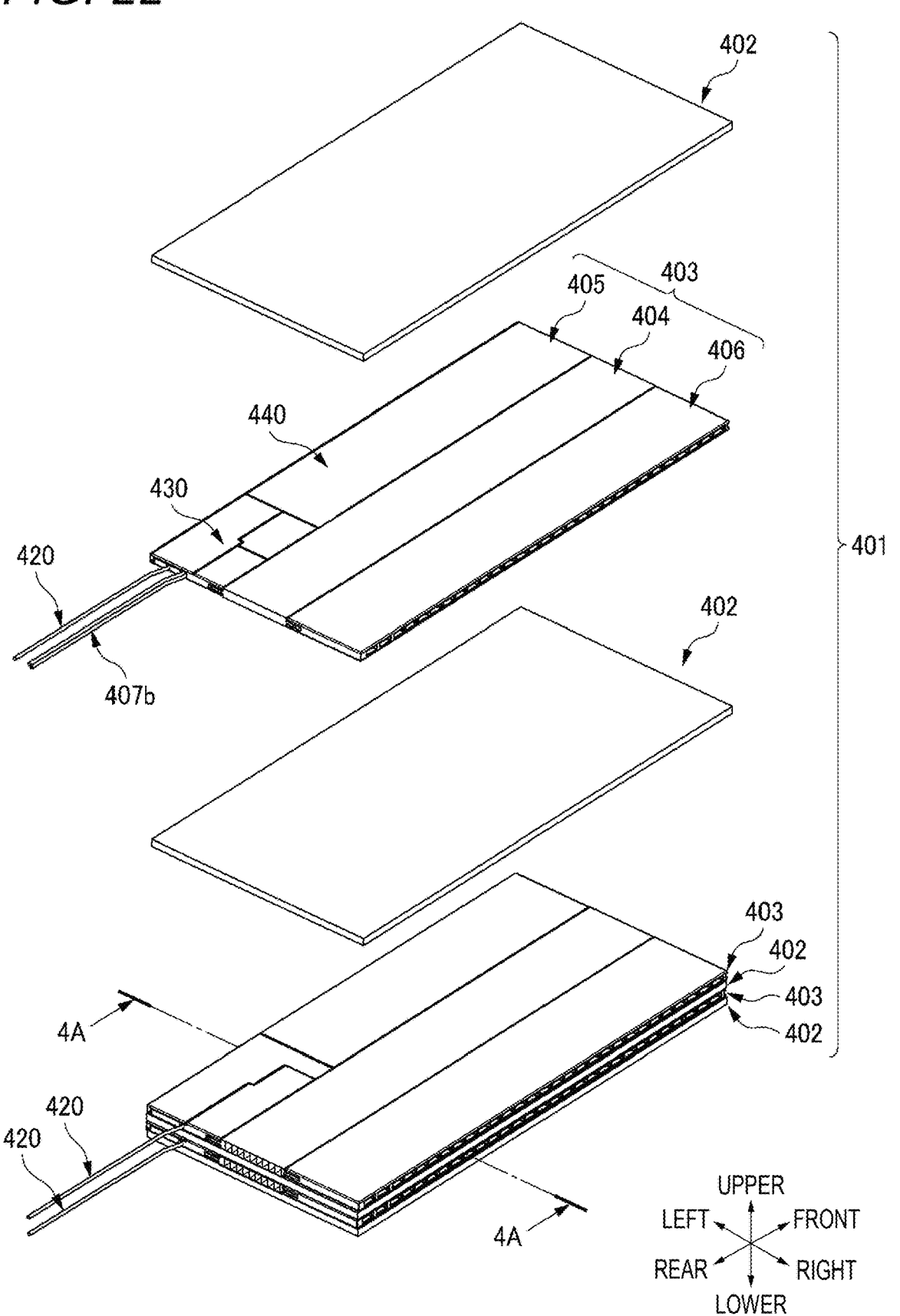
FIG. 22 is a partially exploded perspective view illustrating a stacked power storage device including a voltage detection unit according to a fourth embodiment.

Hereinafter, for convenience of description, "front", "rear", "left", "right", "upper", and "lower" are defined as illustrated in FIG. 22. The "front-rear direction", the "left-right direction", and the "upper-lower direction" are orthogonal to one another.

The voltage detection unit 405 is typically used in a stacked power storage device 401 illustrated in FIG. 22. The power storage device 401 is formed by alternately stacking, in the upper-lower direction, thin rectangular board-shaped power storage modules 402 capable of charging and discharging and rectangular thin board-shaped conductive modules 403 capable of electrically connecting adjacent power storage modules 402. In the power storage device 401, a plurality of power storage modules 402 are electrically connected in series via the conductive modules 403. Each power storage module 402 has a structure in which a plurality of battery cells (not illustrated) are incorporated, and the power storage modules 402 as a whole function as one battery capable of charging and discharging.

Figure 23:
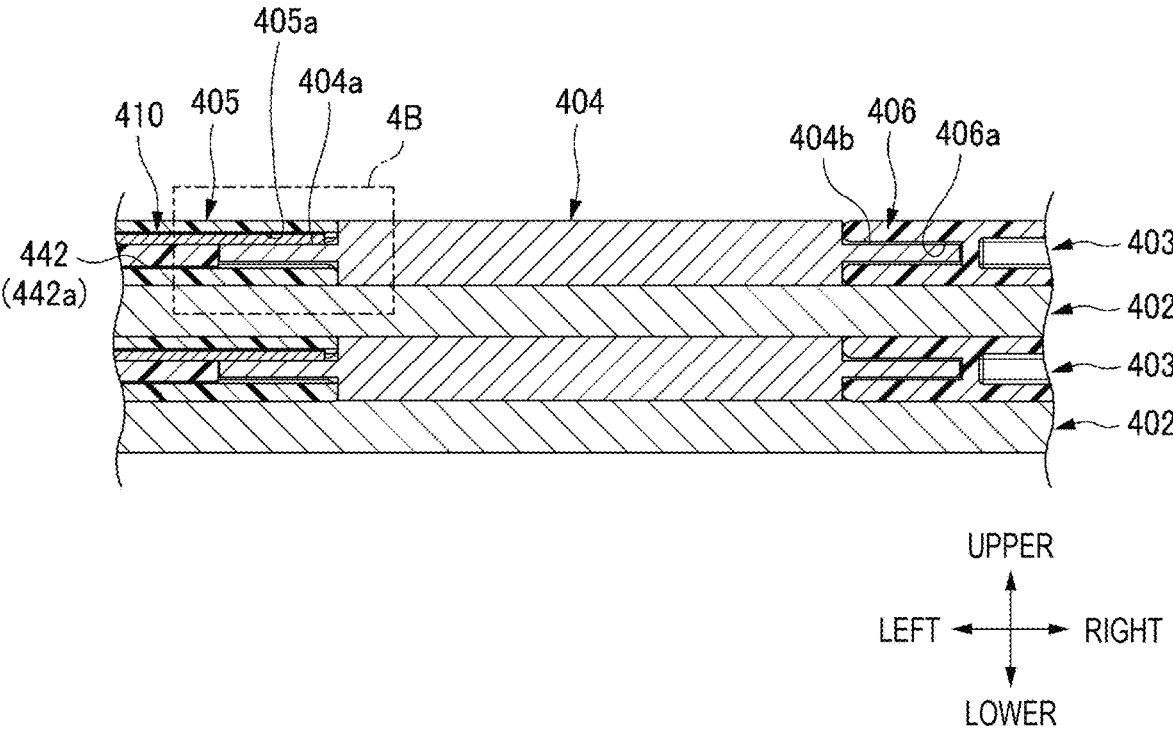
FIG. 23 is a cross-sectional view taken along a line 4A-4A in FIG. 22.
Figure 24:
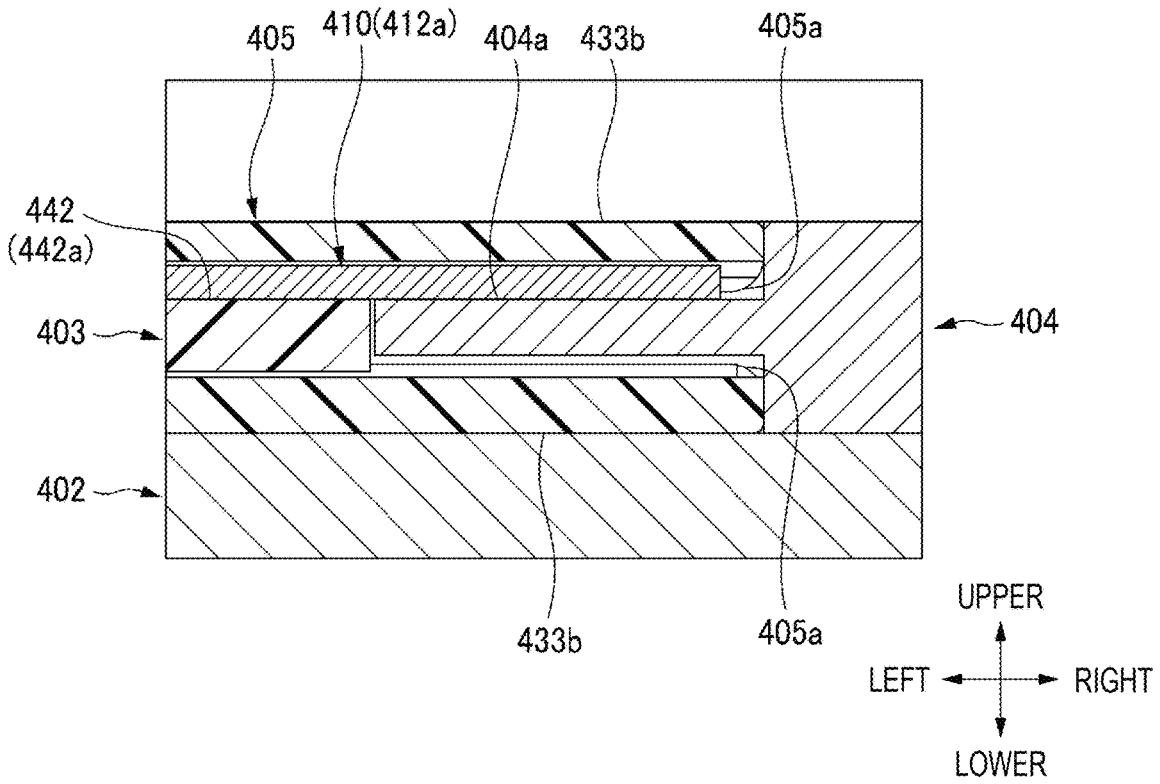
FIG. 24 is an enlarged view of a portion 4B in FIG. 23.

As illustrated in FIG. 22, each conductive module 403 is formed to have a rectangular thin board shape as a whole by a rectangular thin board-shaped conductive board 404 (the conductive board 404 also functions as a heat sink as described later), the rectangular thin board-shaped voltage detection unit 405 coupled to the left side of the conductive board 404, and a rectangular thin board-shaped facing unit 406 coupled to the right side of the conductive board 404. As illustrated in FIGS. 22 and 23, the conductive board 404 and the voltage detection unit 405 are coupled to each other by fitting a flange 404*a* into a recess 405*a*. The flange 404*a* is provided on the left end face of the conductive board 404 and extends in the front-rear direction. The recess 405*a* is provided on the right end face of the voltage detection unit 405 and extends in the front-rear direction. The conductive board 404 and the facing unit 406 are coupled to each other by fitting a flange 404*b* into a recess 406*a*. The flange 404*b* is provided on the right end face of the conductive board 404 and extends in the front-rear direction. The recess 406*a* is provided on the left end face of the facing unit 406 and extends in the front-rear direction.

In each of the conductive modules 403 positioned between the power storage modules 402 adjacent to each other in the upper-lower direction, the conductive board 404 is in direct contact with the upper and lower power storage modules 402 as illustrated in FIG. 23. Thus, the conductive board 404 functions to perform conduction between a lower face of the upper power storage module 402 and an upper face of the lower power storage module 402, and functions as a heat sink that releases heat generated from the upper and lower power storage modules 402 to the outside.

In each of the conductive modules 403 located between the power storage modules 402 adjacent to each other in the upper-lower direction, the voltage detection unit 405 includes a casing 470 (see FIG. 23, etc.) of the temperature detection sensor 407 in contact with the conductive board 404. The voltage detection unit 405 has a function of outputting a signal indicating a voltage between the upper and lower power storage modules 402 (specifically, the potential of the upper face (output face) of the lower power storage module 402 relative to the zero potential as a reference) via a voltage wire 420 (see FIG. 22, etc.) connected to the casing 470. The voltage detection unit 405 is disposed to the left of the conductive board 404 in FIGS. 22 to 24, but a voltage detection unit having the same function as the voltage detection unit 405 may be disposed to the right of the conductive board 404. In this case, a voltage detection unit obtained by reversing the entire configuration of the voltage detection unit 405 in the left-right direction (that is, a mirror component of the voltage detection unit 405) is used as the voltage detection unit having the same function as that of the voltage detection unit 405.

Any one of a voltage detection unit, a dummy unit, and a temperature detection unit, which will be described later, is applied as the facing unit 406 to each of the conductive modules 403 positioned between the power storage modules 402 adjacent to each other in the upper-lower direction, according to the specification of the power storage device 401.

If the facing unit 406 is a voltage detection unit, a voltage detection unit obtained by reversing the entire configuration of the voltage detection unit 405 in the left-right direction (that is, a mirror component of the voltage detection unit 405 described above) is used as the facing unit 406. In this case, the voltage detection unit 405 is disposed to the left of the conductive board 404, and the mirror component of the voltage detection unit 405 is disposed to the right of the conductive board 404. The facing unit 406 (a mirror component of the voltage detection unit 405) has the same function as that of the voltage detection unit 405.

If the facing unit 406 is a dummy unit, as illustrated in FIG. 22, a simple resin board having the recess 406a extending in the front-rear direction is used as the facing unit 406. In this case, the facing unit 406 performs only the function of filling the gap between the upper and lower power storage modules 402.

If the facing unit 406 is a temperature detection unit, the facing unit 406 has a structure in which a temperature detection sensor (thermistor) is incorporated in a resin board used as a dummy unit as illustrated in FIG. 22. In this case, the facing unit 406 has a function of outputting a signal indicating the temperature of the upper and lower power storage modules 402 via a temperature wire connected to the temperature detection sensor.

Figure 25A:
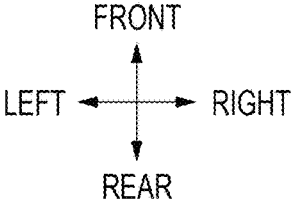
FIG. 25A is a top view illustrating the cover and the housing accommodating the voltage detection terminal, the voltage wire, and the temperature detection sensor.
Figure 25B:
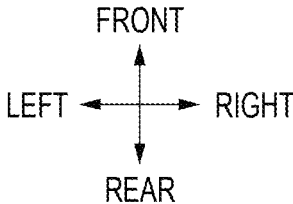
FIG. 25B is a top view illustrating the temperature detection sensor and the housing accommodating the voltage detection terminal and the voltage wire.

Hereinafter, the specific configuration of the voltage detection unit 405 according to the fourth embodiment will be described. As illustrated in FIGS. 25A and 25B, the voltage detection unit 405 includes a housing 440, a temperature detection sensor 407 assembled to the housing 440, a voltage wire 420 connected to an extended joint 476 of the casing 470 (described later) of the temperature detection sensor 407 and accommodated in the housing 440, a temperature wire 407b connected to a sensor element 407a of the temperature detection sensor 407 and accommodated in the housing 440, and a cover 430 mounted to the housing 440.

The temperature detection sensor 407 is assembled to a sensor assembly portion 456 (see FIG. 25B) formed in the housing 440, which is to be described later. The voltage wire 420 is accommodated in a voltage wire accommodating recess 446 (see FIGS. 25A and 25B) formed in the housing 440, which is to be described later. The temperature wire 407b is accommodated in a temperature wire accommodating recess 454 (see FIGS. 25A and 25B) formed in the housing 440, which is to be described later. The cover 430 is mounted to a cover mounting recess 441 (see FIGS. 25A and 25B) formed in the housing 440, which is to be described later. Hereinafter, the members constituting the voltage detection unit 405 will be described in order.

First, the temperature detection sensor 407 will be described. The temperature detection sensor 407 is typically a thermistor. The temperature detection sensor 407 includes a rectangular parallelepiped casing 470 which is made of a material having high heat conductivity such as metal and extends in the front-rear direction. The sensor element 407a (see FIG. 25B) is accommodated in the casing 470, and a temperature wire 407b connected to the sensor element 407a extends rearward from the rear end of the casing 470. The temperature detection sensor 407 is assembled to the sensor assembly portion 456 (see FIG. 25B) of the housing 440. The extension end of the temperature wire 407b is to be connected to a temperature measuring device (not illustrated) outside the power storage device 401.

The right end face of the casing 470 is formed with a recess 471 that is recessed to the left and extends in the front-rear direction, so as to correspond to a recess 405a of the housing 440, which is to be described later. The flange 404a of the conductive board 404 is to be fitted into the recess 471 (see FIG. 26A).

The front end face of the casing 470 is formed with a locking recess (not illustrated) recessed rearward, so as to correspond to a locking projection 457 of the housing 440, which is to be described later.

The temperature detection sensor 407 is formed with the extended joint 476 projecting leftward from the left end face of the casing 470 (see FIG. 25B). The extended joint 476 is formed in a plate shape extending in the front-rear direction corresponding to the casing 470. One end of the voltage wire 420 is fixed and electrically connected to the extended joint 476. The other end of the voltage wire 420 is to be connected to a voltage measuring device (not illustrated) outside the power storage device 401.

The thickness in the upper-lower direction of the casing 470 is equal to the plate thickness of the substantially thin rectangular board-shaped housing 440. Accordingly, when the temperature detection sensor 407 is mounted to the housing 440, the face of the housing 440 is flush with the face of the temperature detection sensor 407 (see FIG. 26A).

Next, the cover 430 will be described. The cover 430 is a resin molded article and is mounted to the cover mounting recess 441 of the housing 440 from the left. The cover 430 includes a facing portion 431 and an extension portion 432 extending rearward from the facing portion 431. The facing portion 431 mainly functions to cover and protect the extended joint 476 of the temperature detection sensor 407, and the extension portion 432 mainly functions to cover and protect the voltage wire 420.

The facing portion 431 includes a pair of flat plates 433 having the same shape and facing each other at an interval in the upper-lower direction, and a coupling portion 434 that couples the left end edges of the pair of flat plates 433 extending in the front-rear direction in the upper-lower direction over the entire region in the front-rear direction. The facing portion 431 has a substantially U-shape opening rightward when viewed in the front-rear direction. Each flat plate 433 is formed in a substantially rectangular flat plate shape continuous from the coupling portion 434. The extension portion 432 extends rearward from the rear end edge of the upper flat plate 433 of the pair of flat plates 433 constituting the facing portion 431 in a flush and continuous manner, and has a substantially rectangular flat plate shape.

The extension portion 432 is integrally formed with two electric wire holding pieces 435 extending in the left-right direction, which are arranged at an interval in the front-rear direction. Each electric wire holding piece 435 protrudes downward from the lower face of the extension portion 432 and extends in the left-right direction, so as to project further rightward from the left end edge of the extension portion 432. When the cover 430 is mounted to the housing 440, the electric wire holding pieces 435 hold the voltage wire 420 and the temperature wire 407b accommodated in the housing 440.

The lower flat plate 433 of the pair of flat plates 433 constituting the facing portion 431 is formed with a locking portion (not illustrated) projecting upward toward the upper flat plate 433 at a predetermined location. The locking portion functions to lock the cover 430 to the final locking position in cooperation with a final locked portion (not illustrated) provided in the housing 440.

Next, the housing 440 will be described. The housing 440 is a resin molded article and has a substantially thin rectangular board shape extending in the front-rear direction as illustrated in FIG. 22, etc. The right end face of the housing 440 is formed with a recess 405a recessed leftward and extending in the front-rear direction. The flange 404a of the conductive board 404 is to be fitted into the recess 405a (see FIGS. 23, 24, etc.).

The locations on the upper and lower faces of the housing 440 where the cover 430 is mounted are each formed with the cover mounting recess 441 recessed into a shape corresponding to the entire shape of the cover 430 (see FIGS. 25A and 25B). The recess depth (depth in the upper-lower direction) of the cover mounting recess 441 is equal to the plate thickness of the resin material constituting the cover 430 (the facing portion 431+the extension portion 432). Thus, when the cover 430 is mounted to the housing 440, the face of the housing 440 is flush with the face of the cover 430 (see FIGS. 22 and 26A).

The location in the front-rear direction in the right end edge of the housing 440 where the temperature detection sensor 407 is disposed is formed with a sensor assembly portion 456, which has a shape corresponding to the overall shape of the temperature detection sensor 407 and is recessed leftward into a substantially rectangular shape when viewed in the upper-lower direction (see FIG. 25B). The front end edge of the sensor assembly portion 456 is formed with a locking projection 457 projecting rearward. The recess 405a extending in the front-rear direction in the right end face of the housing 440 is divided by the sensor assembly portion 456. When the temperature detection sensor 407 is assembled to the housing 440, the recess 405a and the recess 471 communicate with each other in the front-rear direction.

The location on the upper face of the housing 440 where the voltage wire 420 is accommodated is formed with a voltage wire accommodating recess 446 having a shape corresponding to the wiring form of the voltage wire 420 when the voltage wire 420 is accommodated (see FIGS. 25A and 25B). The voltage wire accommodating recess 446 is a continuous groove including a pair of straight portions 447 extending linearly in the front-rear direction and arranged at an interval in the front-rear direction, and a bent portion 448 connecting the pair of straight portions 447 and extending while being bent to project leftward. The right groove side wall (the wall facing the left) and the left groove side wall (the wall facing the right) in the voltage wire accommodating recess 446 (the pair of straight portions 447+the bent portion 448) extend upward from the groove bottom wall of the voltage wire accommodating recess 446 in parallel to the upper-lower direction.

The front end of the front straight portion 447 of the pair of straight portions 447 communicates with the sensor assembly portion 456, and the rear end of the rear straight portion 447 of the pair of straight portions 447 constitutes an electric wire outlet 449 from which the voltage wire 420 extends from the rear end edge of the housing 440. In this way, since the voltage wire accommodating recess 446 has the bent portion 448, as compared with a case where the voltage wire accommodating recess 446 is formed of only the straight portions 447, even if an unintended external force is applied to the voltage wire 420 drawn out from the housing 440, the voltage wire 420 can resist the external force due to the friction between the bent portion 448 and the voltage wire 420. Thus, a large external force is hardly applied to the contact point between the temperature detection sensor 407 and the voltage wire 420.

The location in each of the pair of straight portions 447 near the boundary with the bent portion 448 is provided with a narrow recess 451, which is a recess having a width (interval in the left-right direction) narrower than that of the straight portion 447. The width of the narrow recess 451 is slightly smaller than the outer diameter of the voltage wire 420. Thus, the voltage wire 420 is pinched while being pressed in the left-right direction. By pinching the voltage wire 420 between the pair of narrow recesses 451, even if an unintended external force is applied to the voltage wire 420 drawn out from the housing 440, it is possible to resist the external force by the friction between the narrow recesses 451 and the voltage wire 420. Thus, a large external force is hardly applied to the contact point between the extended joint 476 of the casing 470 and the voltage wire 420. Further, it is possible to strongly prevent the voltage wire 420 from being wired in a manner coming out of the bent portion 448 and straddling the bent portion 448 (that is, shortcutting the bent portion 448).

The location on the upper face of the housing 440 where the temperature wire 407b is accommodated is formed with a temperature wire accommodating recess 454 having a shape corresponding to the wiring form of the temperature wire 407b when the temperature wire 407b is accommodated (see FIGS. 25A and 25B). The temperature wire accommodating recess 454 is a groove extending in a straight line in the front-rear direction. The right groove side wall (the wall facing the left) and the left groove side wall (the wall facing the right) in the temperature wire accommodating recess 454 extend upward from the groove bottom wall of the temperature wire accommodating recess 454 parallel to the upper-lower direction.

The front end of the temperature wire accommodating recess 454 communicates with the sensor assembly portion 456, and the rear end of the temperature wire accommodating recess 454 constitutes an electric wire outlet 455 from which the temperature wire 407*b* extends from the rear end edge of the housing 440. The temperature wire accommodating recess 454 is disposed to the right of, and is separated from, the voltage wire accommodating recess 446, and is substantially parallel to the pair of straight portions 447 in the left-right direction.

As illustrated in FIGS. 25A and 25B, the locations on a bottom face 441*a* of the cover mounting recess 441 in the upper face of the housing 440 at which the pair of electric wire holding pieces 435 of the cover 430 are arranged are formed with a pair of electric wire holding piece recesses 452 extending in the left-right direction at an interval in the front-rear direction, so as to correspond to the pair of electric wire holding pieces 435. The pair of electric wire holding piece recesses 452 sandwich a bending vertex 448*a* (see FIGS. 25A and 25B) of the bent portion 448 of the voltage wire accommodating recess 446 in the front-rear direction. The bottom faces of the pair of electric wire holding piece recesses 452 are located above the bottom faces of the voltage wire accommodating recess 446 and the temperature wire accommodating recess 454.

The electric wire holding piece recesses 452 extend in the left-right direction from the right end edge of the upper face of the housing 440 to the right inner wall 441*b* (see FIGS. 25A and 25B) of the cover mounting recess 441 across the voltage wire accommodating recess 446 and the temperature wire accommodating recess 454. Each of the locations on the right inner wall 441*b* of the cover mounting recess 441 where the pair of electric wire holding piece recesses 452 are connected is formed with a storage hole 453 recessed rightward (see FIGS. 26A and 26B). When the cover 430 is mounted to the housing 440, the extension ends (that is, the right end) of the pair of electric wire holding pieces 435 of the cover 430 are to be inserted and stored in the pair of storage holes 453.

The same position in the front-rear direction as the location where the locking portion of the cover 430 is disposed on the bottom face 441*a* of the cover mounting recess 441 on the lower face side of the housing 440 is formed with a final locked portion, which is a recess recessed upward. The members constituting the voltage detection unit 405 have been described above.

Next, a procedure for assembling the temperature detection sensor 407 and the cover 430 to the housing 440 will be described. First, the voltage wire 420 is connected to the extended joint 476 of the temperature detection sensor 407 by a method such as ultrasonic joining or welding, and then the temperature detection sensor 407 is assembled to the sensor assembly portion 456 of the housing 440. Thus, the temperature detection sensor 407 is assembled to the sensor assembly portion 456 of the housing 440 so that the locking recess (not illustrated) of the temperature detection sensor 407 is locked to the locking projection 457 of the housing 440. When the temperature detection sensor 407 is completely assembled to the housing 440, the recess 471 of the temperature detection sensor 407 communicates with the recess 405*a* in the front-rear direction.

Next, the voltage wire 420 extending from the temperature detection sensor 407 assembled in the housing 440 is accommodated in the voltage wire accommodating recess 446 (the pair of straight portions 447+the bent portion 448)

of the housing 440. Thus, the voltage wire 420 is fitted from above along the voltage wire accommodating recess 446 constituted by the pair of straight portions 447 and the bent portion 448. At this time, a pair of portions of the voltage wire 420 positioned at the upper portions of the pair of narrow recesses 451 are pushed downward, so that the pair of portions of the voltage wire 420 are accommodated in the pair of narrow recesses 451. In a state in which the voltage wire 420 is completely accommodated in the housing 440, the voltage wire 420 extends rearward from the electric wire outlet 449 to the outside of the housing 440.

Similarly, the temperature wire 407*b* extending from the temperature detection sensor 407 (specifically, the sensor element 407*a*) assembled to the housing 440 is accommodated in the temperature wire accommodating recess 454 of the housing 440. Thus, the temperature wire 407*b* is fitted along the temperature wire accommodating recess 454 from above. In a state in which the temperature wire 407*b* is completely accommodated in the housing 440, the temperature wire 407*b* extends rearward from the electric wire outlet 455 to the outside of the housing 440.

Next, the cover 430 is mounted to the housing 440. Thus, the cover 430 is mounted in the cover mounting recess 441 of the housing 440 from the left side, such that the facing portion 431 of the cover 430 sandwiches the cover mounting recesses 441 in the upper and lower faces of the housing 440 in the upper-lower direction, the extension portion 432 of the cover 430 covers the cover mounting recesses 441 in the upper face of the housing 440, and the pair of electric wire holding pieces 435 of the cover 430 are accommodated in the pair of electric wire holding piece recesses 452 of the housing 440.

In the process of mounting the cover 430 to the housing 440, when the extension ends of the pair of electric wire holding pieces 435 of the cover 430 further enter and are stored in the pair of storage holes 453. Simultaneously, the locking portion of the cover 430 first enters the inside of the final locked portion while sliding on the housing 440, and is pressed against the right side face of the final locked portion while being engaged with the final locked portion. Accordingly, the cover 430 is locked to the housing 440 at the final locking position, and the cover 430 is completely mounted to the housing 440 to obtain the voltage detection unit 405. As described later, the voltage detection unit 405 obtained after the cover 430 is completely mounted to the housing 440 is to be used for assembling the conductive module 403 (see FIG. 22).

In a state in which the cover 430 is locked at the final locking position, the entire cover mounting recess 441 is covered with the cover 430, and thus the entire voltage wire accommodating recess 446 and temperature wire accommodating recess 454 are covered with the extension portion 432 of the cover 430. This prevents the voltage wire 420 from coming out of the voltage wire accommodating recess 446 and prevents the temperature wire 407*b* from coming out of the temperature wire accommodating recess 454. Further, the facing portion 431 of the cover 430 covers the upper face of the extended joint 476 of the temperature detection sensor 407 (see FIG. 26A). Accordingly, the voltage wire 420 is reliably covered by the facing portion 431 of the cover 430. In this state, the temperature detection sensor 407 is exposed to the outside except for the extended joint 476.

Next, the assembly of the conductive module 403 and the power storage device 401 (see FIG. 22) will be described. As described above, the voltage detection unit 405 obtained after the cover 430 is completely mounted to the housing 440 is used for assembling the conductive module 403 (see FIG. 22). Specifically, first, the flange 404a of the conductive board 404 is fitted into the recess 405a of the voltage detection unit 405, so that the voltage detection unit 405 is coupled to the left side of the conductive board 404, and the voltage detection unit 405 is completely assembled to the conductive board 404. In this state, the flange 404a of the conductive board 404 is fitted into the recess 471 of the temperature detection sensor 407.

Next, the flange 404b of the conductive board 404 is fitted into the recess 406a of the facing unit 406, so that the facing unit 406 is coupled to the right side of the conductive board 404 to which the voltage detection unit 405 is assembled (see FIG. 23, etc.). Thus, the conductive module 403 is completely assembled.

The conductive module 403 thus obtained is used for assembling the power storage device 401 illustrated in FIG. 22. Specifically, the power storage modules 402 and the conductive modules 403 are alternately stacked in the upper-lower direction, and the stacked body is fixed by a predetermined fitting or the like, thereby obtaining the power storage device 401.

According to the fourth embodiment, since the flange 404b of the conductive board 404 is fitted into the recess 471 provided in the casing 470 of the temperature detection sensor 407, the temperature can be measured through the heat-conductive casing 470. That is, according to the fourth embodiment, since the heat conductivity to the temperature detection sensor 407 is excellent, the temperature measurement performance is excellent compared to the related art.

Further, according to the fourth embodiment, since the voltage wire 420 is connected to the extended joint 476 provided in the casing 470, the voltage and the temperature can be detected by one module.

The invention embodied as the fourth embodiment is not limited to the fourth embodiment, and various modifications can be adopted within the scope of the invention. For example, the present invention is not limited to the fourth embodiment, and modifications, improvements, and the like can be made appropriately. In addition, materials, shapes, sizes, numbers, arrangement positions, and the like of components in the fourth embodiment are freely selected and are not limited as long as the present invention can be implemented.

Modification

Figure 26A:
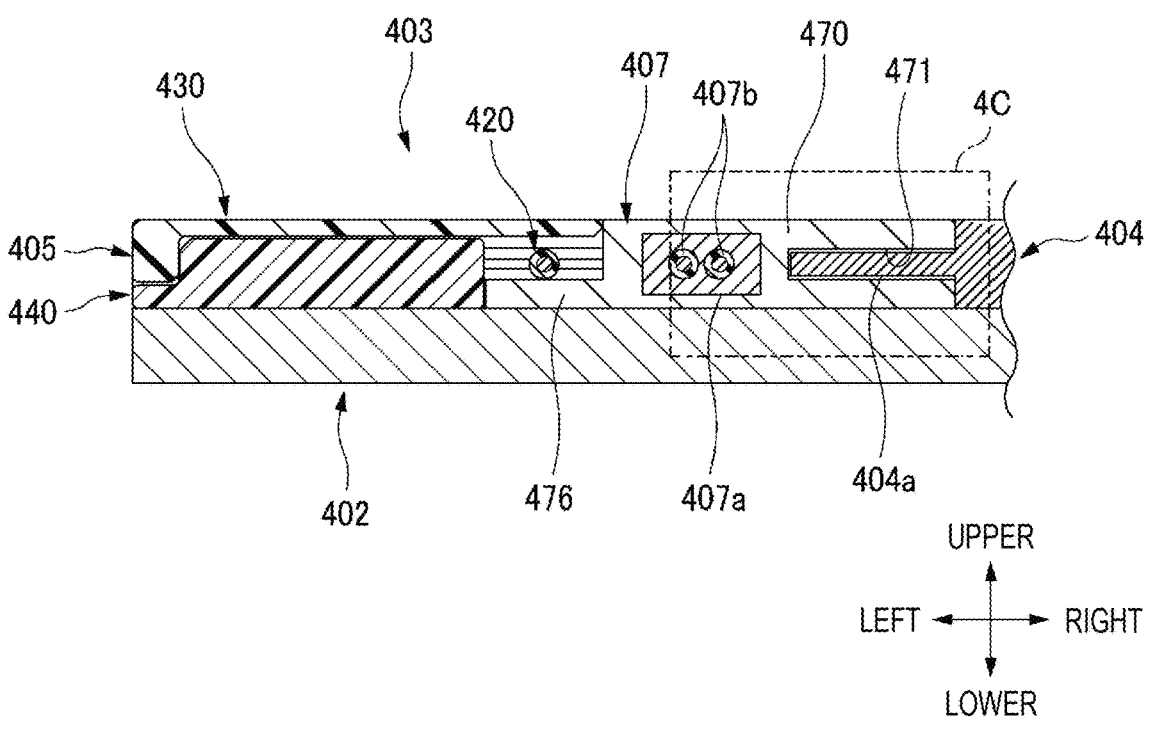
FIG. 26A is a diagram corresponding to FIG. 23 in the voltage detection unit including the temperature detection sensor.
Figure 26B:
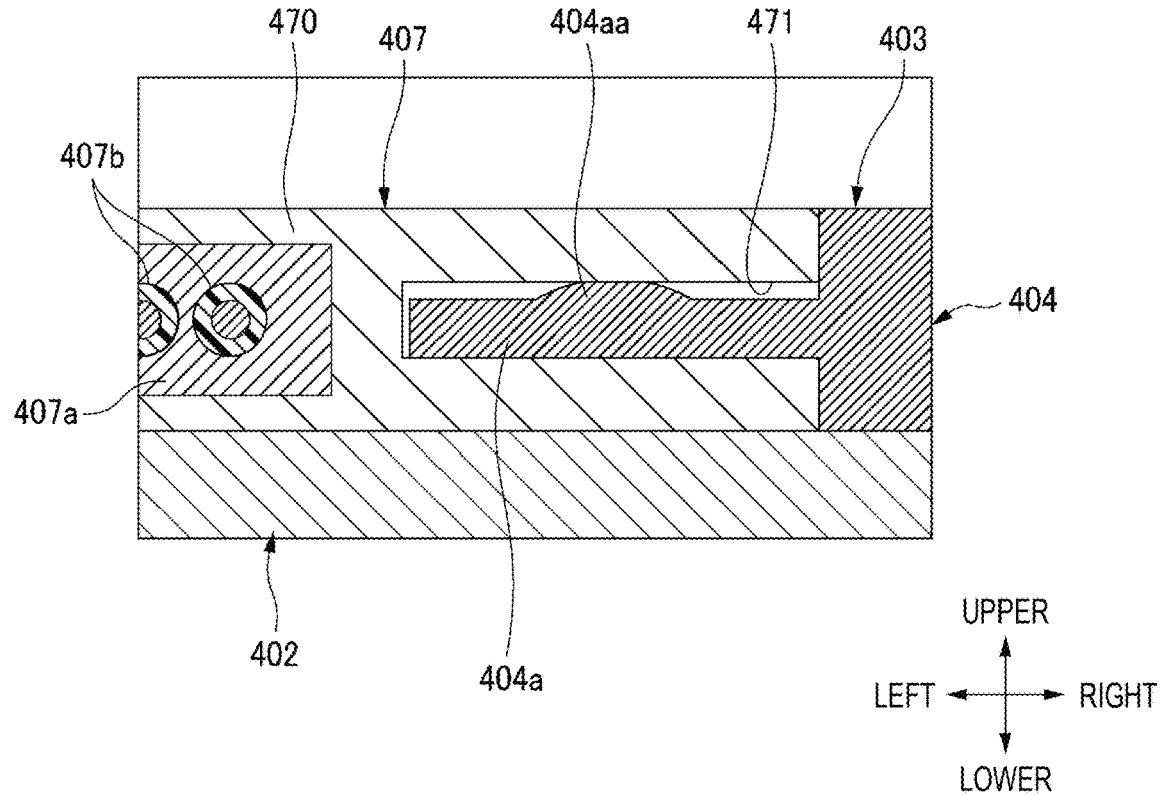
FIG. 26B is a view illustrating a modification of a flange in a conductive board, and is an enlarged view of a part 4C in FIG. 26A.

In the fourth embodiment, the flange 404b of the conductive board 404 is pressed and fitted into the recess 471 of the casing 470, but as illustrated in FIG. 26B, the flange 404b may be provided with a contact projection 404aa and fitted with the inner wall of the recess 471 by bringing the contact projection 404aa into contact with the inner wall.

Here, features of the embodiment of the voltage detection unit and the conductive module described above are briefly summarized and listed in the following [4-1] to [4-2].

[4-1]

A voltage detection unit (405) including:

a board-shaped housing (440) having a board side face provided with a recess (405a) configured to be fitted with a side edge (flange 404b) of a conductive board (404) disposed between a plurality of stacked power storage modules (402);

a voltage wire (420) configured to detect a voltage of the power storage modules (402);

a temperature detection sensor (407) configured to measure a temperature of the power storage modules (402); and a temperature wire (407b) connected to the temperature detection sensor (407), in which the temperature detection sensor (407) includes a heat-conductive casing (470) assembled to a sensor assembly portion (456) of the housing (440) and provided with a recess (471) configured to be fitted with the side edge (flange 404b), and a sensor element (407a) accommodated in the casing (470) and connected to the temperature wire (407b), and the casing (470) is provided with an extended joint (476) connected to the voltage wire (420).

According to the configuration of the above [4-1], since the side edge of the conductive board is fitted into the recess provided in the casing of the temperature detection sensor, the temperature can be measured through the heat-conductive casing. That is, according to the above configuration, since the heat conductivity to the temperature detection sensor is excellent, the temperature measurement performance is excellent compared to the related art.

In addition, according to the above configuration, since the voltage wire is connected to the extended joint provided in the casing, the voltage and the temperature can be detected by one module.

[4-2]

A conductive module (403) including the voltage detection unit (405) according to the above [4-1] and the conductive board (404), in which the side edge (flange 404b) of the conductive board (404) is provided with a contact projection (404aa) in contact with an inner wall of the recess (471) in the casing (470).

According to the configuration of the above [4-2], the same effect as that of the above [4-1] can be obtained.

Fifth Embodiment

The invention embodied as a fifth embodiment relates to a conductive module. Hereinafter, a conductive module 503 according to the fifth embodiment will be described with reference to FIGS. 27 to 31.

The conductive module according to the fifth embodiment has the following features.

A conductive module including:

a board-shaped conductive board disposed between a plurality of stacked power storage modules;

a temperature detection sensor configured to measure a temperature of the power storage modules; and a temperature wire conductively connected to the temperature detection sensor, in which at least one side face of the conductive board in a first direction intersecting a plate thickness direction is provided with a plurality of sensor accommodating portions configured to accommodate the temperature detection sensor, and the plurality of sensor accommodating portions extend in the first direction and are arranged in parallel in a second direction intersecting the plate thickness direction and the first direction.

According to the fifth embodiment, the temperature detection sensor is configured to be accommodated in the plurality of sensor accommodating portions provided in the conductive board. Thus, the temperature detection sensor can directly measure the temperature of the heat generated from the power storage modules and transferred to the conductive board from the conductive board. That is, according to the fifth embodiment, since the heat conductivity to the temperature detection sensor is excellent and the temperature detection sensor is closer to the heat source, that is, the central portion of the power storage modules (the conductive board), the temperature measurement performance is excellent compared to the related art.

Figure 27:
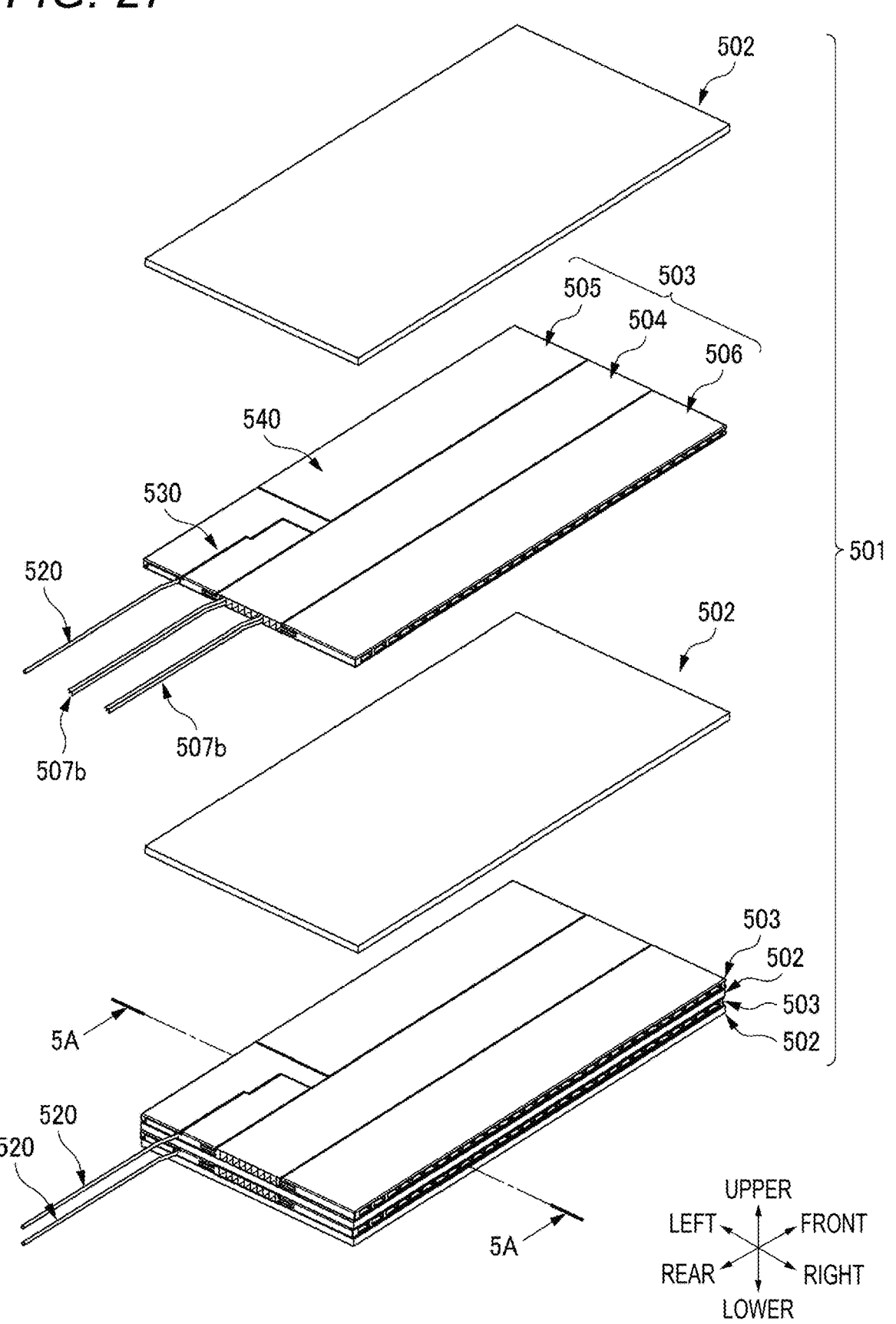
FIG. 27 is a partially exploded perspective view illustrating a stacked power storage device including a voltage detection unit according to a fifth embodiment.

Hereinafter, for convenience of description, "front", "rear", "left", "right", "upper", and "lower" are defined as illustrated in FIG. 27. The "front-rear direction", the "left-right direction", and the "upper-lower direction" are orthogonal to one another. The front-rear direction corresponds to the "plate thickness direction". The front-rear direction corresponds to the "first direction". The left-right direction corresponds to the "second direction".

The voltage detection unit 505 is typically used in a stacked power storage device 501 illustrated in FIG. 27. The power storage device 501 is formed by alternately stacking, in the upper-lower direction, thin rectangular board-shaped power storage modules 502 capable of charging and discharging and rectangular thin board-shaped conductive modules 503 capable of electrically connecting adjacent power storage modules 502. In the power storage device 501, a plurality of power storage modules 502 are electrically connected in series via the conductive modules 503. Each power storage module 502 has a structure in which a plurality of battery cells (not illustrated) are incorporated, and the power storage modules 502 as a whole function as one battery capable of charging and discharging.

Figure 28:
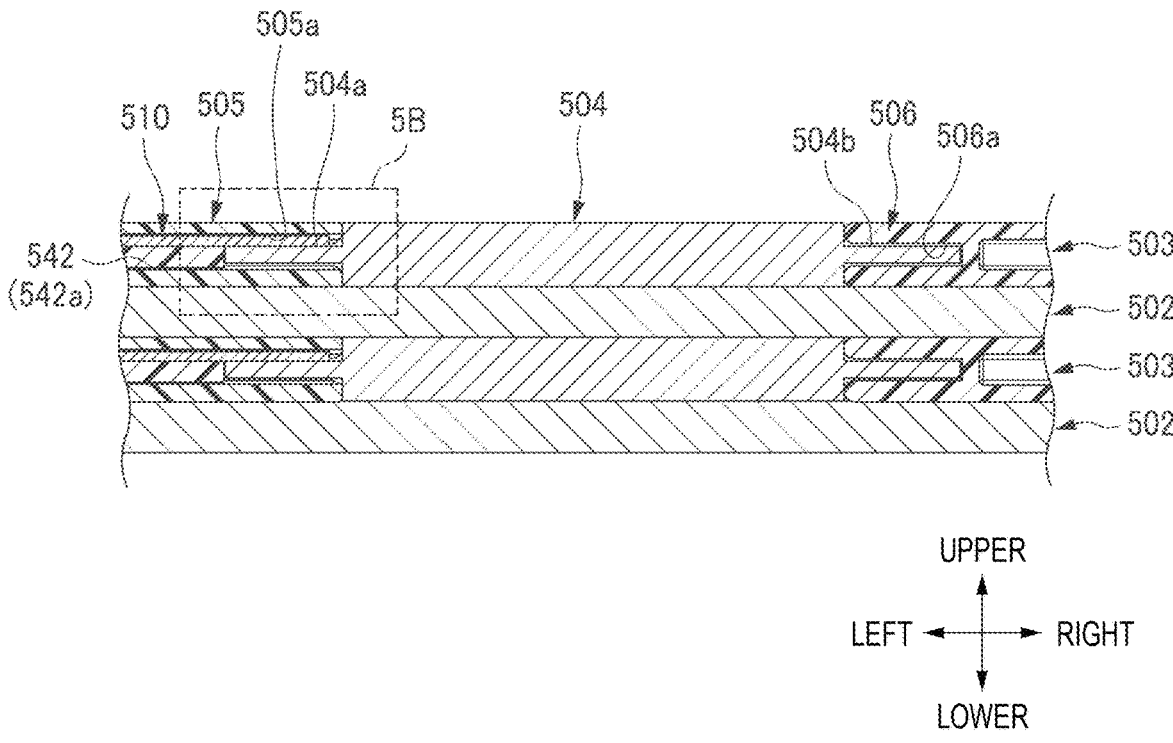
FIG. 28 is a cross-sectional view taken along a line 5A-5A in FIG. 27.

As illustrated in FIG. 27, each conductive module 503 is formed to have a rectangular thin board shape as a whole by a rectangular thin board-shaped conductive board 504 (the conductive board 504 also functions as a heat sink as described later), the rectangular thin board-shaped voltage detection unit 505 coupled to the left side of the conductive board 504, and a rectangular thin board-shaped facing unit 506 coupled to the right side of the conductive board 504. As illustrated in FIGS. 27 and 28, the conductive board 504 and the voltage detection unit 505 are coupled to each other by fitting a flange 504a into a recess 505a. The flange 504a is provided on the left end face of the conductive board 504 and extends in the front-rear direction. The recess 505a is provided on the right end face of the voltage detection unit 505 and extends in the front-rear direction. The conductive board 504 and the facing unit 506 are coupled to each other by fitting a flange 504b into a recess 506a. The flange 504b is provided on the right end face of the conductive board 504 and extends in the front-rear direction. The recess 506a is provided on the left end face of the facing unit 506 and extends in the front-rear direction.

In each of the conductive modules 503 positioned between the power storage modules 502 adjacent to each other in the upper-lower direction, the conductive board 504 is in direct contact with the upper and lower power storage modules 502 as illustrated in FIG. 28. Thus, the conductive board 504 functions to perform conduction between a lower face of the upper power storage module 502 and an upper face of the lower power storage module 502, and functions as a heat sink that releases heat generated from the upper and lower power storage modules 502 to the outside.

In each of the conductive modules 503 located between the power storage modules 502 adjacent to each other in the upper-lower direction, the voltage detection unit 505 includes a voltage detection terminal 510 (see FIG. 28, etc.) in contact with the conductive board 504, which is to be described later. The voltage detection unit 505 has a function of outputting a signal indicating a voltage between the upper and lower power storage modules 502 (specifically, the potential of the upper face (output face) of the lower power storage module 502 relative to the zero potential as a reference) via a voltage wire 520 (see FIG. 28, etc.) connected to the voltage detection terminal 510. The voltage detection unit 505 is disposed to the left of the conductive board 504 in FIGS. 27 and 28, but a voltage detection unit having the same function as the voltage detection unit 505 may be disposed to the right of the conductive board 504. In this case, a voltage detection unit obtained by reversing the entire configuration of the voltage detection unit 505 in the left-right direction (that is, a mirror component of the voltage detection unit 505) is used as the voltage detection unit having the same function as that of the voltage detection unit 505.

Any one of a voltage detection unit, a dummy unit, and a temperature detection unit, which will be described later, is applied as the facing unit 506 to each of the conductive modules 503 positioned between the power storage modules 502 adjacent to each other in the upper-lower direction, according to the specification of the power storage device 501.

If the facing unit 506 is a voltage detection unit, a voltage detection unit obtained by reversing the entire configuration of the voltage detection unit 505 in the left-right direction (that is, a mirror component of the voltage detection unit 505 described above) is used as the facing unit 506. In this case, the voltage detection unit 505 is disposed to the left of the conductive board 504, and the mirror component of the voltage detection unit 505 is disposed to the right of the conductive board 504. The facing unit 506 (a mirror component of the voltage detection unit 505) has the same function as that of the voltage detection unit 505.

If the facing unit 506 is a dummy unit, as illustrated in FIG. 27, a simple resin board having the recess 506a extending in the front-rear direction is used as the facing unit 506. In this case, the facing unit 506 performs only the function of filling the gap between the upper and lower power storage modules 502.

If the facing unit 506 is a temperature detection unit, the facing unit 506 has a structure in which a temperature detection sensor (not illustrated; for example, a thermistor) is incorporated in a resin board used as a dummy unit as illustrated in FIG. 27. In this case, the facing unit 506 has a function of outputting a signal indicating the temperature of the upper and lower power storage modules 502 via a temperature wire connected to the temperature detection sensor.

Figure 29:
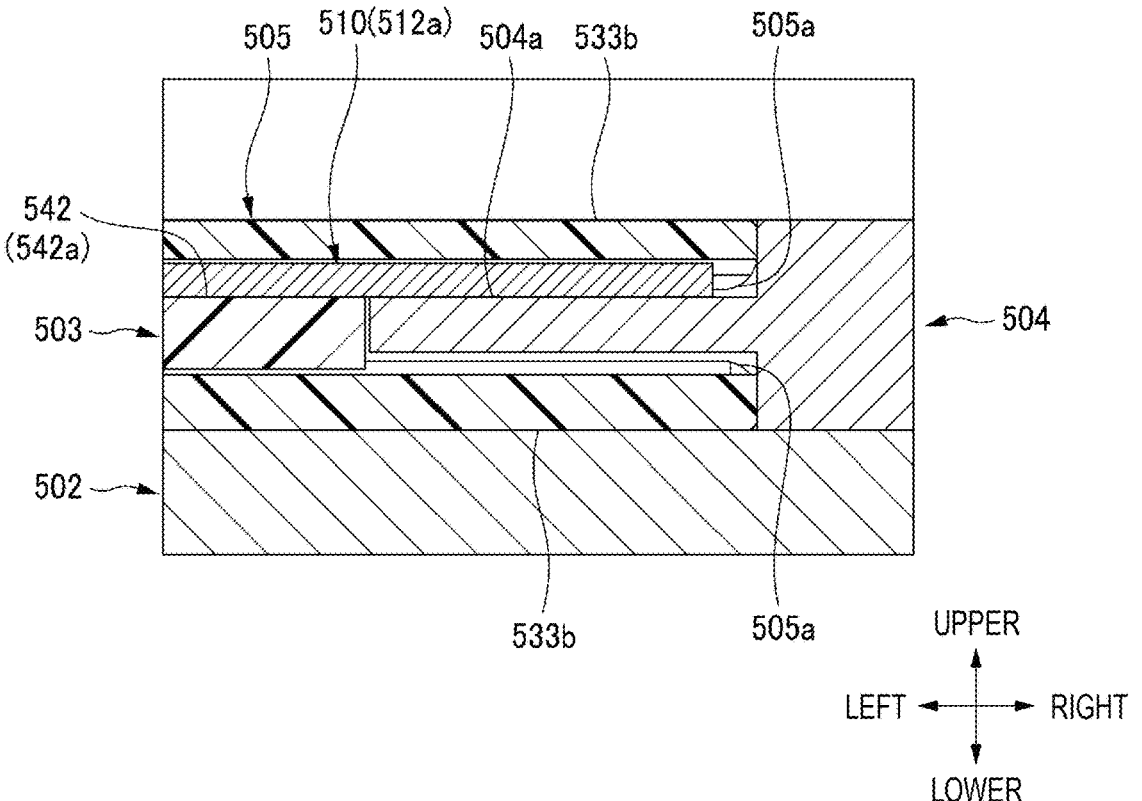
FIG. 29 is an enlarged view of a portion 5B in FIG. 28.

Hereinafter, the specific configuration of the voltage detection unit 505 according to the fifth embodiment will be described. As illustrated in FIG. 29, the voltage detection unit 505 includes a housing 540, a voltage detection terminal 510 accommodated in the housing 540, a voltage wire 520 connected to the voltage detection terminal 510 and accommodated in the housing 540, and a cover 530 mounted to the housing 540.

The voltage detection terminal 510 is accommodated in a terminal accommodating recess (reference sign omitted) formed in the housing 540. The voltage wire 520 is accommodated in an electric wire accommodating recess 546 (see FIG. 30) formed in the housing 540, which is to be described later. The cover 530 is mounted in a cover mounting recess 541 (see FIG. 30) formed in the housing 540, which is to be described later. Hereinafter, the members constituting the voltage detection unit 505 will be described in order.

Figure 30:
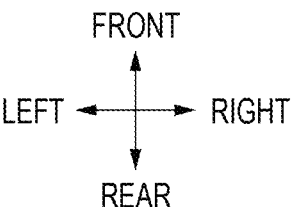
FIG. 30 is a top view illustrating the cover and the housing accommodating the voltage detection terminal.
Figure 31:
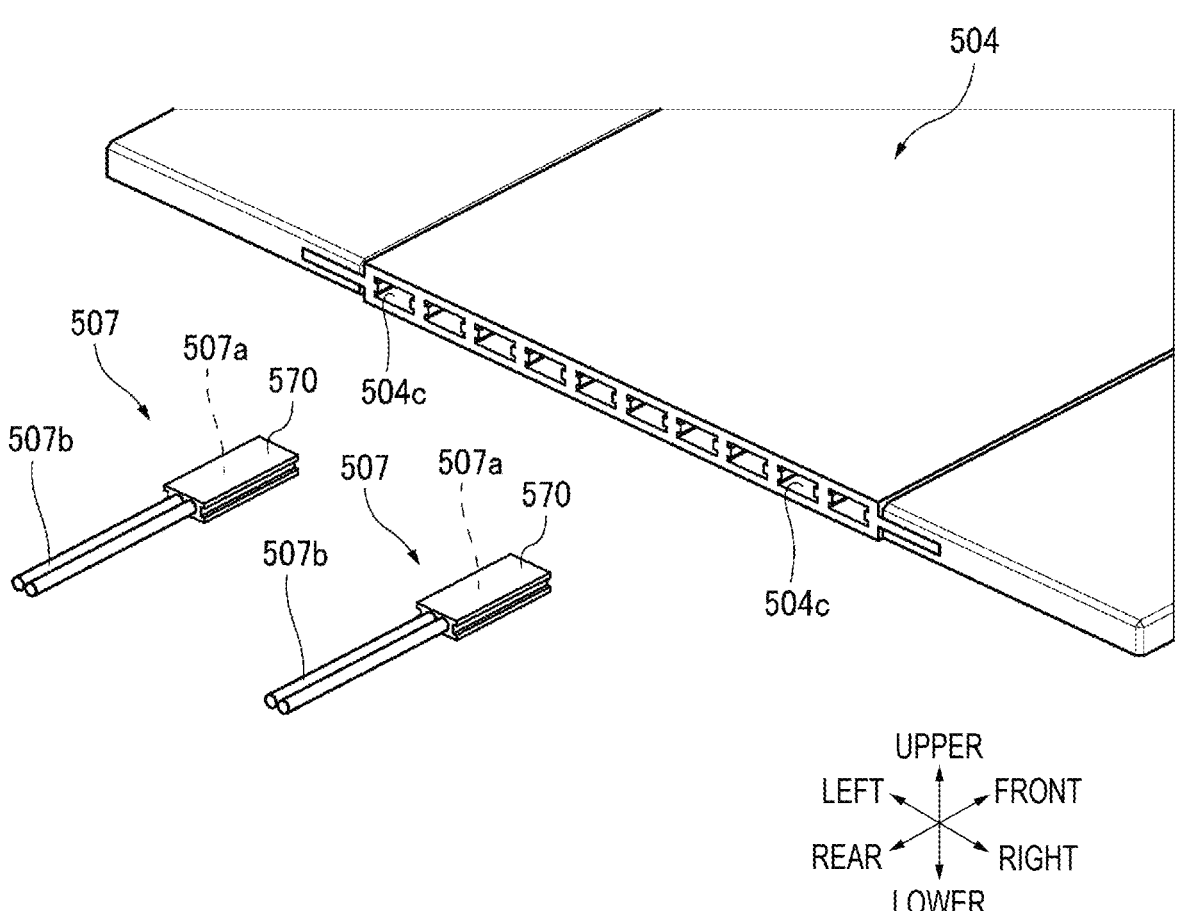
FIG. 31 is a perspective view illustrating the conductive board and the temperature detection sensor.

First, the voltage detection terminal 510 will be described. The voltage detection terminal 510 made of metal is formed by one metal board being subjected to processing such as a pressing process. The voltage detection terminal 510 is accommodated in the terminal accommodating recess of the housing 540 from above. As illustrated in FIG. 30, the voltage detection terminal 510 includes a rectangular flat plate-shaped first portion 511 extending in the front-rear direction and a rectangular flat plate-shaped second portion 512 extending rightward from the front end of the first portion 511, and has a substantially L-shaped flat plate shape as a whole when viewed in the upper-lower direction.

One end of the voltage wire 520 is fixed and electrically connected to the lower face of the tip portion 511a of the first portion 511 (that is, the end closer to the rear end). The other end of the voltage wire 520 is to be connected to a voltage measuring device (not illustrated) outside the power storage device 501. A part of the flange 504a of the conductive board 504 is to be fixed to the lower face of a tip portion 512a of the second portion 512 (that is, the end closer to the right end) by a method such as ultrasonic joining or welding (see FIG. 29).

The front end edge of the second portion 512 is formed with a projection 513 projecting forward. When the voltage detection terminal 510 is accommodated in the housing 540, the projection 513 is locked in a locking groove 545 (see FIG. 30) formed in the housing 540.

Next, the cover 530 will be described. The cover 530 is a resin molded article and is mounted to the cover mounting recess 541 of the housing 540 from the left. The cover 530 includes a facing portion 531 and an extension portion 532 extending rearward from the facing portion 531. The facing portion 531 mainly functions to cover and protect the voltage detection terminal 510, and the extension portion 532 mainly functions to cover and protect the voltage wire 520.

The facing portion 531 includes a pair of flat plates 533 having the same shape and facing each other at an interval in the upper-lower direction, and a coupling portion 534 that couples the left end edges of the pair of flat plates 533 extending in the front-rear direction in the upper-lower direction over the entire region in the front-rear direction. The facing portion 531 has a substantially U-shape opening rightward when viewed in the front-rear direction. Each flat plate 533 includes a substantially square flat plate-shaped a base 533a continuous from the coupling portion 534, and a rectangular flat plate-shaped extension portion 533b extending rightward from the front end of the base 533a, and has a substantially L shape as a whole when viewed in the upper-lower direction. The extension portion 532 extends rearward from the rear end edge of the upper flat plate 533 (more specifically, the upper base 533a) of the pair of flat plates 533 constituting the facing portion 531 in a flush and continuous manner, and has a substantially rectangular flat plate shape.

The extension portion 532 is integrally formed with two electric wire holding pieces 535 extending in the left-right direction, which are arranged at an interval in the front-rear direction. Each electric wire holding piece 535 protrudes downward from the lower face of the extension portion 532 and extends in the left-right direction, so as to project further rightward from the left end edge of the extension portion 532. When the cover 530 is mounted to the housing 540, the electric wire holding pieces 535 hold the voltage wire 520 accommodated in the housing 540.

The lower flat plate 533 (more specifically, the lower base 533a) of the pair of flat plates 533 constituting the facing portion 531 is formed with a locking portion (not illustrated) projecting upward toward the upper flat plate 533 at a predetermined location. The locking portion functions to lock the cover 530 to a temporary locking position and a final locking position in cooperation with a temporary locked portion (not illustrated) and a final locked portion (not illustrated) provided in the housing 540.

Next, the housing 540 will be described. The housing 540 is a resin molded article and has a substantially thin rect-angular board shape extending in the front-rear direction as illustrated in FIG. 27, etc. The right end face of the housing 540 is formed with a recess 505a recessed leftward and extending in the front-rear direction. The flange 504a of the conductive board 504 is to be fitted into the recess 505a (see FIG. 29, etc.).

The locations on the upper and lower faces of the housing 540 where the cover 530 is mounted are each formed with the cover mounting recess 541 recessed into a shape corre-sponding to the entire shape of the cover 530 (see FIG. 30). The recess depth (depth in the upper-lower direction) of the cover mounting recess 541 is equal to the plate thickness of the resin material constituting the cover 530 (the facing portion 531+the extension portion 532). Thus, when the cover 530 is mounted to the housing 540, the face of the housing 540 is flush with the face of the cover 530 (see FIG. 27).

The location where the voltage detection terminal 510 is accommodated on a bottom face 541a of the cover mounting recess 541 in the upper face of the housing 540 is formed with a terminal accommodating recess further recessed into a shape corresponding to the entire shape of the voltage detection terminal 510 (see FIG. 30). The recess depth (depth in the upper-lower direction) of the terminal accom-modating recess is equal to the plate thickness of the voltage detection terminal 510. Thus, when the voltage detection terminal 510 is mounted to the housing 540, the upper face of the voltage detection terminal 510 is flush with the bottom face 541a of the cover mounting recess 541.

The position in the front-rear direction in the right end edge of the housing 540 where the tip portion 512a of the voltage detection terminal 510 is disposed is formed with a notch 543 recessed leftward into a substantially rectangular shape when viewed in the upper-lower direction. The recess 505a extending in the front-rear direction in the right end face of the housing 540 is divided by the notch 543. When the voltage detection terminal 510 is accommodated in the housing 540, the upper and lower faces of the tip portion 512a of the voltage detection terminal 510 are to be exposed by the notch 543.

The location in the terminal accommodating recess where the tip portion 511a of the voltage detection terminal 510 is disposed is formed with a through hole 544 extending in the front-rear direction and penetrating in the upper-lower direc-tion. When the voltage detection terminal 510 is accommo-dated in the housing 540, the one end (contact point) of the voltage wire 520 connected to the voltage detection terminal 510 enters the through hole 544. In other words, the through hole 544 functions as a clearance for avoiding interference between the bottom face of the terminal accommodating recess and the one end of the voltage wire 520.

The inner wall face of the location in the terminal accom-modating recess where the projection 513 (see FIG. 30) of the voltage detection terminal 510 is disposed is formed with a locking groove 545 recessed forward and communicating with the recess 505a, so as to correspond to the projection 513 (see FIG. 30).

The location on the upper face of the housing 540 where the voltage wire 520 is accommodated is formed with an electric wire accommodating recess 546 having a shape corresponding to the wiring form of the voltage wire 520 when the voltage wire 520 is accommodated (see FIG. 30). The electric wire accommodating recess 546 is a continuous groove including a pair of straight portions 547 extending linearly in the front-rear direction and arranged at an interval in the front-rear direction, and a bent portion 548 connecting the pair of straight portions 547 and extending while being bent to project leftward. The right groove side wall (the wall facing the left) and the left groove side wall (the wall facing the right) in the electric wire accommodating recess 546 (the pair of straight portions 547+the bent portion 548) extend upward from the groove bottom wall of the electric wire accommodating recess 546 in parallel to the upper-lower direction.

The front end of the front straight portion 547 of the pair of straight portions 547 communicates with the terminal accommodating recess, and the rear end of the rear straight portion 547 of the pair of straight portions 547 constitutes an electric wire outlet 549 from which the voltage wire 520 extends from the rear end edge of the housing 540. In this way, since the electric wire accommodating recess 546 has the bent portion 548, as compared with a case where the electric wire accommodating recess 546 is formed of only the straight portions 547, even if an unintended external force is applied to the voltage wire 520 drawn out from the housing 540, the voltage wire 520 can resist the external force due to the friction between the bent portion 548 and the voltage wire 520. Thus, a large external force is hardly applied to the contact point between the voltage detection terminal 510 and the voltage wire 520.

The location in each of the pair of straight portions 547 near the boundary with the bent portion 548 is provided with a narrow recess 551, which is a recess having a width (interval in the left-right direction) narrower than that of the straight portion 547. The width of the narrow recess 551 is slightly smaller than the outer diameter of the voltage wire 520. Thus, the voltage wire 520 is pinched while being pressed in the left-right direction. By pinching the voltage wire 520 between the pair of narrow recesses 551, even if an unintended external force is applied to the voltage wire 520 drawn out from the housing 540, it is possible to resist the external force by the friction between the narrow recesses 551 and the voltage wire 520. Thus, a large external force is hardly applied to the contact point between the voltage detection terminal 510 and the voltage wire 520. Further, it is possible to strongly prevent the voltage wire 520 from being wired in a manner coming out of the bent portion 548 and straddling the bent portion 548 (that is, shortcutting the bent portion 548).

As illustrated in FIG. 30, the locations on the bottom face 541*a* of the cover mounting recess 541 in the upper face of the housing 540 at which the pair of electric wire holding pieces 535 of the cover 530 are arranged are formed with a pair of electric wire holding piece recesses 552 extending in the left-right direction at an interval in the front-rear direction, so as to correspond to the pair of electric wire holding pieces 535. The pair of electric wire holding piece recesses 552 sandwich a bending vertex 548*a* (see FIG. 30) of the bent portion 548 of the electric wire accommodating recess 546 in the front-rear direction. The bottom faces of the pair of electric wire holding piece recesses 552 are located above the bottom face of the electric wire accommodating recess 546.

The electric wire holding piece recesses 552 extend in the left-right direction from the right end edge of the upper face of the housing 540 to the right inner wall 541*b* (see FIG. 30) of the cover mounting recess 541 across the electric wire accommodating recess 546. Each of the locations on the right inner wall 541*b* of the cover mounting recess 541 where the pair of electric wire holding piece recesses 552 are connected is formed with a storage hole 553 recessed rightward (see FIG. 30). When the cover 530 is mounted to the housing 540, the extension ends (that is, the right end) of the pair of electric wire holding pieces 535 of the cover 530 are to be inserted and stored in the pair of storage holes 553.

The same position in the front-rear direction as the location where the locking portion of the cover 530 is disposed on the bottom face 541*a* of the cover mounting recess 541 on the lower face side of the housing 540 is formed with a temporary locked portion and a final locked portion, which are recesses recessed upward, in this order at an interval from the left to the right. The members constituting the voltage detection unit 505 have been described above.

Next, a procedure for assembling the voltage detection terminal 510 and the cover 530 to the housing 540 will be described. First, the voltage detection terminal 510, which is connected to the voltage wire 520 in advance by a method such as ultrasonic joining or welding, is accommodated in the terminal accommodating recess of the housing 540. Thus, the voltage detection terminal 510 is fitted into the terminal accommodating recess of the housing 540 from above such that the projection 513 enters the locking groove 545 and the one end (contact point) of the voltage wire 520 enters the through hole 544. In a state in which the voltage detection terminal 510 is completely accommodated in the housing 540, the upper and lower faces of the tip portion 512*a* of the voltage detection terminal 510 are exposed by the notch 543.

Next, the voltage wire 520 extending from the voltage detection terminal 510 accommodated in the housing 540 is accommodated in the electric wire accommodating recess 546 (the pair of straight portions 547+the bent portion 548) of the housing 540. Thus, the voltage wire 520 is fitted from above along the electric wire accommodating recess 546 constituted by the pair of straight portions 547 and the bent portion 548. At this time, a pair of portions of the voltage wire 520 positioned at the upper portions of the pair of narrow recesses 551 are pushed downward, so that the pair of portions of the voltage wire 520 are accommodated in the pair of narrow recesses 551. In a state in which the voltage wire 520 is completely accommodated in the housing 540, the voltage wire 520 extends rearward from the electric wire outlet 549 to the outside of the housing 540.

Next, the cover 530 is mounted to the housing 540. Thus, the cover 530 is mounted in the cover mounting recess 541 of the housing 540 from the left side, such that the facing portion 531 of the cover 530 sandwiches the cover mounting recesses 541 in the upper and lower faces of the housing 540 in the upper-lower direction, the extension portion 532 of the cover 530 covers the cover mounting recesses 541 in the upper face of the housing 540, and the pair of electric wire holding pieces 535 of the cover 530 are accommodated in the pair of electric wire holding piece recesses 552 of the housing 540.

In the process of mounting the cover 530 to the housing 540, the locking portion of the cover 530 first slides on the housing 540 to enter the inside of the temporary locked portion and engage with the temporary locked portion, and is pressed against the right side face of the temporary locked portion. Accordingly, the cover 530 is locked to the housing 540 at the temporary locking position, and the cover 530 is completely mounted to the housing 540 to obtain the voltage detection unit 505. As described later, the voltage detection unit 505 obtained after the cover 530 is completely mounted to the housing 540 (in a state in which the cover 530 is locked at the temporary locking position) is to be used for assembling the conductive module 503 (see FIG. 28).

In a state in which the cover 530 is locked at the temporary locking position, the facing portion 531 of the cover 530 (more specifically, the pair of upper and lower extension portions 533b) does not cover the tip portion 512a of the voltage detection terminal 510. Thus, the upper and lower faces of the tip portion 512a of the voltage detection terminal 510 are also exposed by the notch 543.

Further, the pair of electric wire holding pieces 535 of the cover 530 are arranged above the opening of a part of the straight portions 547 and the bent portion 548 of the electric wire accommodating recess 546. This prevents the voltage wire 520 from coming out of the electric wire accommodating recess 546. Further, the extension ends of the pair of electric wire holding pieces 535 are received in the pair of storage holes 553. Accordingly, it is possible to prevent unintended deformation such as misalignment of the pair of electric wire holding pieces 535 or separation of the pair of electric wire holding pieces 535 from the electric wire accommodating recess 546. Further, the extension portion 532 of the cover 530 is disposed above the opening of the bending vertex 548a of the bent portion 548 of the electric wire accommodating recess 546. Accordingly, it is possible to strongly prevent the voltage wire 520 from being wired in a manner coming out of the electric wire accommodating recess 546 and straddling the bent portion 548 (that is, shortcutting the bent portion 548). In this way, it is possible to reduce the possibility of occurrence of a specific failure caused by the voltage wire 520 coming out of the bent portion 548 of the electric wire accommodating recess 546.

When the cover 530 is further pushed leftward relative to the housing 540 in a state in which the cover 530 is locked at the temporary locking position, the extension ends of the pair of electric wire holding pieces 535 of the cover 530 further enter and are stored in the pair of storage holes 553. Simultaneously, the locking portion of the cover 530 goes beyond the temporary locked portion and then enters the inside of the final locked portion and is engaged with the final locked portion. Thus, the cover 530 is locked to the housing 540 at the final locking position.

In a state in which the cover 530 is locked at the final locking position, the entire cover mounting recess 541 is covered with the cover 530, and thus the entire electric wire accommodating recess 546 is covered with the extension portion 532 of the cover 530. This prevents the voltage wire 520 from coming out of the electric wire accommodating recess 546. Further, the facing portion 531 of the cover 530 (more specifically, the pair of upper and lower extension portions 533b) covers the upper and lower faces of the tip portion 512a of the voltage detection terminal 510. Accordingly, the entire voltage detection terminal 510 is covered with the facing portion 531 of the cover 530, so that the voltage detection terminal 510 can be reliably protected.

Next, temperature detection sensors 507 accommodated in the conductive board 504 according to the fifth embodiment will be described. First, sensor accommodating portions 504c of the conductive board 504 will be described. The rear end face of the conductive board 504 is provided with a plurality of sensor accommodating portions 504c capable of accommodating the temperature detection sensors 507 (see FIG. 31). The plurality of sensor accommodating portions 504c extend linearly in the front-rear direction and are arranged in parallel in the left-right direction. The plurality of sensor accommodating portions 504c may be formed in a through hole shape extending from the rear end face to the front end face of the conductive board 504, or may be formed in a groove shape recessed forward from the rear end face of the conductive board 504. The inner peripheral shape of the plurality of sensor accommodating portions 504c is formed to correspond to the outer periphery shape of the casings 570 of the temperature detection sensors 507.

Next, the temperature detection sensors 507 will be described. The temperature detection sensors 507 are typically thermistors. The temperature detection sensors 507 each have a rectangular parallelepiped casing 570 extending in the front-rear direction (see FIG. 31), a sensor element 507a is accommodated in the casing 570, and a temperature wire 507b connected to the sensor element 507a extends rearward from the rear end of the casing 570. The temperature detection sensors 507 are accommodated in the sensor accommodating portions 504c of the conductive board 504 from the rear. The extension end of the temperature wire 507b is to be connected to a temperature measuring device (not illustrated) outside the power storage device 501. The temperature detection sensors 507 have been described above.

Next, the assembly of the conductive module 503 and the power storage device 501 (see FIG. 27) will be described. As described above, the voltage detection unit 505 obtained after the cover 530 is completely mounted to the housing 540 (in a state in which the cover 530 is locked at the temporary locking position) is used for assembling the conductive module 503 (see FIG. 27). Specifically, first, the flange 504a of the conductive board 504 is fitted into the recess 505a of the voltage detection unit 505, so that the voltage detection unit 505 is coupled to the left side of the conductive board 504.

In this state, a part of the flange 504a of the conductive board 504 overlaps the lower side of the tip portion 512a of the voltage detection terminal 510 (see FIG. 29), and the upper face of the tip portion 512a of the voltage detection terminal 510 is exposed upward and the lower face of a part of the flange 504a of the conductive board 504 is exposed downward due to the presence of the notch 543 of the housing 540.

Next, the upper face of the tip portion 512a of the voltage detection terminal 510 exposed upward and the lower face of a part of the flange 504a of the conductive board 504 exposed downward are used to fix the tip portion 512a of the voltage detection terminal 510 and the part of the flange 504a of the conductive board 504 by a method such as ultrasonic joining or welding. Thereafter, the cover 530 is moved from the temporary locking position to the final locking position, and the voltage detection unit 505 is completely assembled to the conductive board 504.

Next, the flange 504b of the conductive board 504 is fitted into the recess 506a of the facing unit 506, so that the facing unit 506 is coupled to the right side of the conductive board 504 to which the voltage detection unit 505 is assembled (see FIG. 27, etc.).

Next, the temperature detection sensors 507 are press-fitted into the sensor accommodating portions 504c of the conductive board 504 from the rear side, so that the temperature detection sensors 507 are accommodated in the sensor accommodating portions 504c. The number of the temperature detection sensors 507 may be determined appropriately, and the positions of the sensor accommodating portions 504c accommodating the temperature detection sensors 507 may also be determined appropriately.

The conductive module 503 thus obtained is used for assembling the power storage device 501 illustrated in FIG. 27. Specifically, the power storage modules 502 and the conductive modules 503 are alternately stacked in the upper-lower direction, and the stacked body is fixed by a predetermined fitting or the like, thereby obtaining the power storage device 501.

According to the fifth embodiment, the temperature detection sensor 507 is configured to be accommodated in the plurality of sensor accommodating portions 504*c* provided in the conductive board 504. Thus, the temperature detection sensor 507 can directly measure the temperature of the heat generated from the power storage modules 502 and transferred to the conductive board 504 from the conductive board 504. That is, according to the fifth embodiment, since the heat conductivity to the temperature detection sensor 507 is excellent and the temperature detection sensor 507 is closer to the heat source, that is, the central portion of the power storage modules 502 (the conductive board 504), the temperature measurement performance is excellent compared to the related art.

The invention embodied as the fifth embodiment is not limited to the fifth embodiment, and various modifications can be adopted within the scope of the invention. For example, the present invention is not limited to the fifth embodiment, and modifications, improvements, and the like can be made appropriately. In addition, materials, shapes, sizes, numbers, arrangement positions, and the like of components in the fifth embodiment are freely selected and are not limited as long as the present invention can be implemented.

Here, features of the embodiment of the conductive module to the present invention described above are briefly summarized and listed in the following [5-1] to [5-2].

[5-1]

A conductive module (503) including:

a board-shaped conductive board (504) configured to be disposed between a plurality of stacked power storage modules (502);

a temperature detection sensor (507) configured to measure a temperature of the power storage modules (502); and a temperature wire (507*b*) conductively connected to the temperature detection sensor (507), in which at least one side face of the conductive board (504) in a first direction intersecting a plate thickness direction is provided with a plurality of sensor accommodating portions (504*c*) configured to accommodate the temperature detection sensor (507), and the plurality of sensor accommodating portions (504*c*) extend in the first direction and are arranged in parallel in a second direction intersecting the plate thickness direction and the first direction.

According to the configuration of the above [1-5], the temperature detection sensor is configured to be accommodated in the plurality of sensor accommodating portions provided in the conductive board. Thus, the temperature detection sensor can directly measure the temperature of the heat generated from the power storage modules and transferred to the conductive board from the conductive board. That is, according to the above configuration, since the heat conductivity to the temperature detection sensor is excellent and the temperature detection sensor is closer to the heat source, that is, the central portion of the power storage modules (the conductive board), the temperature measurement performance is excellent compared to the related art.

[5-2]

The conductive module (503) according to the above [5-1], in which at least one side edge of the conductive board (504) in the second direction is provided with a flange (504*a*, 504*b*) configured to fit with a mating unit.

According to the configuration of the above [5-2], since the conductive board is formed with the flange, the mating unit such as the voltage detection unit or the temperature detection unit can be coupled to the conductive board by the flange.

Sixth Embodiment

The invention embodied as a sixth embodiment relates to a conductive module. Hereinafter, a conductive module 603 according to the sixth embodiment will be described with reference to FIGS. 32 to 37.

The conductive module according to the sixth embodiment has the following features.

A conductive module including:

a board-shaped conductive board configured to be disposed between a plurality of stacked power storage modules;

a board-shaped temperature detection unit coupled to a side edge of the conductive board, the temperature detection unit including a temperature detection sensor configured to measure a temperature of the power storage modules; and a heat conductive sheet located between the conductive board and the temperature detection unit, and the power storage modules, in which the heat conductive sheet is attached to board faces of the conductive board and the temperature detection unit in a manner straddling the conductive board and the temperature detection unit.

According to the sixth embodiment, the heat conductive sheet is positioned between the conductive board and the temperature detection unit, and the power storage modules, and is attached to the board faces of the conductive board and the temperature detection unit in a manner straddling the conductive board and the temperature detection unit. Accordingly, heat generated from the power storage modules is transferred to the temperature detection sensor of the temperature detection unit via the heat conductive sheet. That is, according to the sixth embodiment, since the heat conductivity to the temperature detection sensor is excellent, the temperature measurement performance is excellent compared to the related art.

Figure 32:
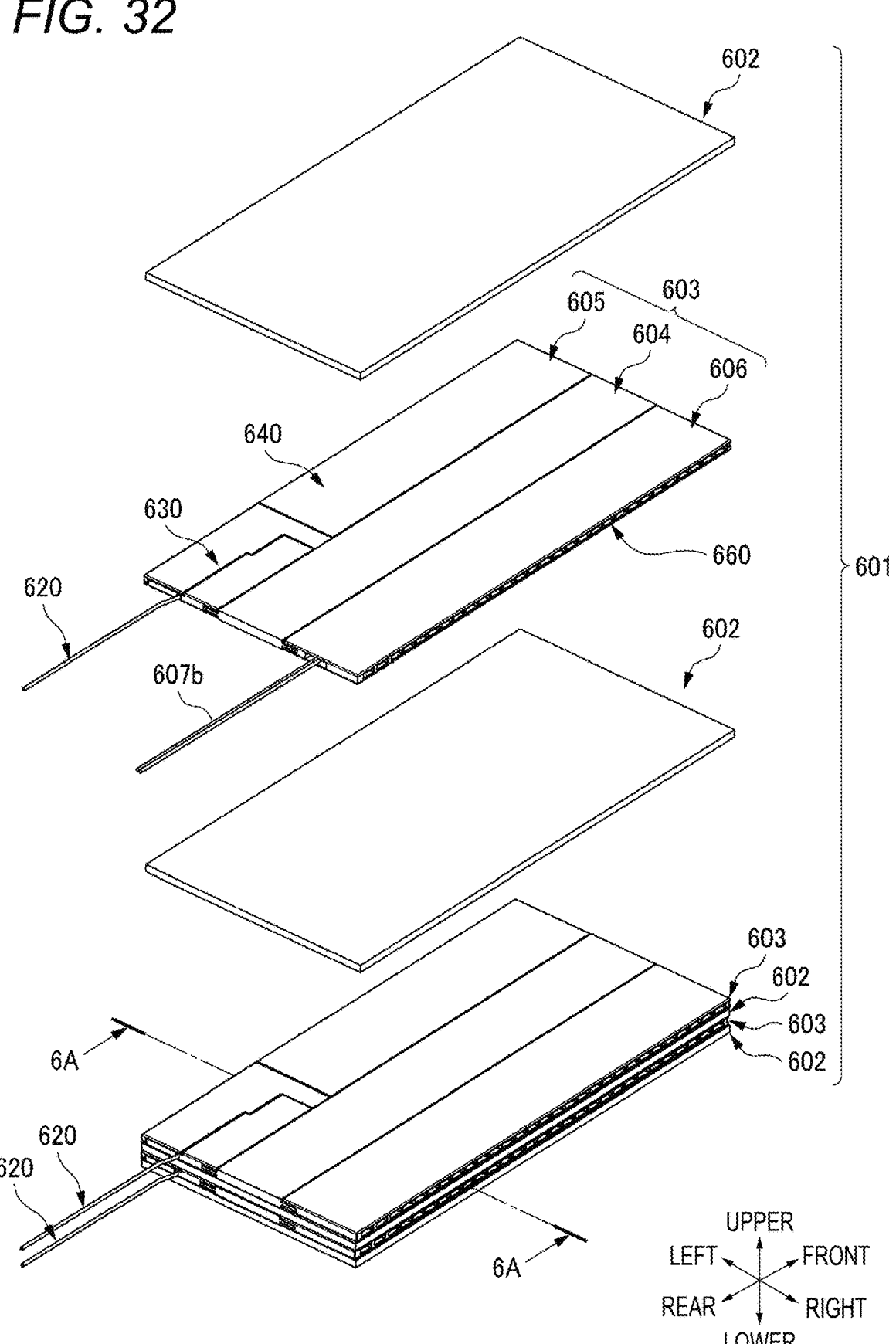
FIG. 32 is a partially exploded perspective view illustrating a stacked power storage device including a voltage detection unit according to a sixth embodiment.

Hereinafter, for convenience of description, "front", "rear", "left", "right", "upper", and "lower" are defined as illustrated in FIG. 32. The "front-rear direction", the "left-right direction", and the "upper-lower direction" are orthogonal to one another.

The voltage detection unit 605 is typically used in a stacked power storage device 601 illustrated in FIG. 32. The power storage device 601 is formed by alternately stacking, in the upper-lower direction, thin rectangular board-shaped power storage modules 602 capable of charging and discharging and rectangular thin board-shaped conductive modules 603 capable of electrically connecting adjacent power storage modules 602. In the power storage device 601, a plurality of power storage modules 602 are electrically connected in series via the conductive modules 603. Each power storage module 602 has a structure in which a plurality of battery cells (not illustrated) are incorporated, and the power storage modules 602 as a whole function as one battery capable of charging and discharging.

Figure 34:
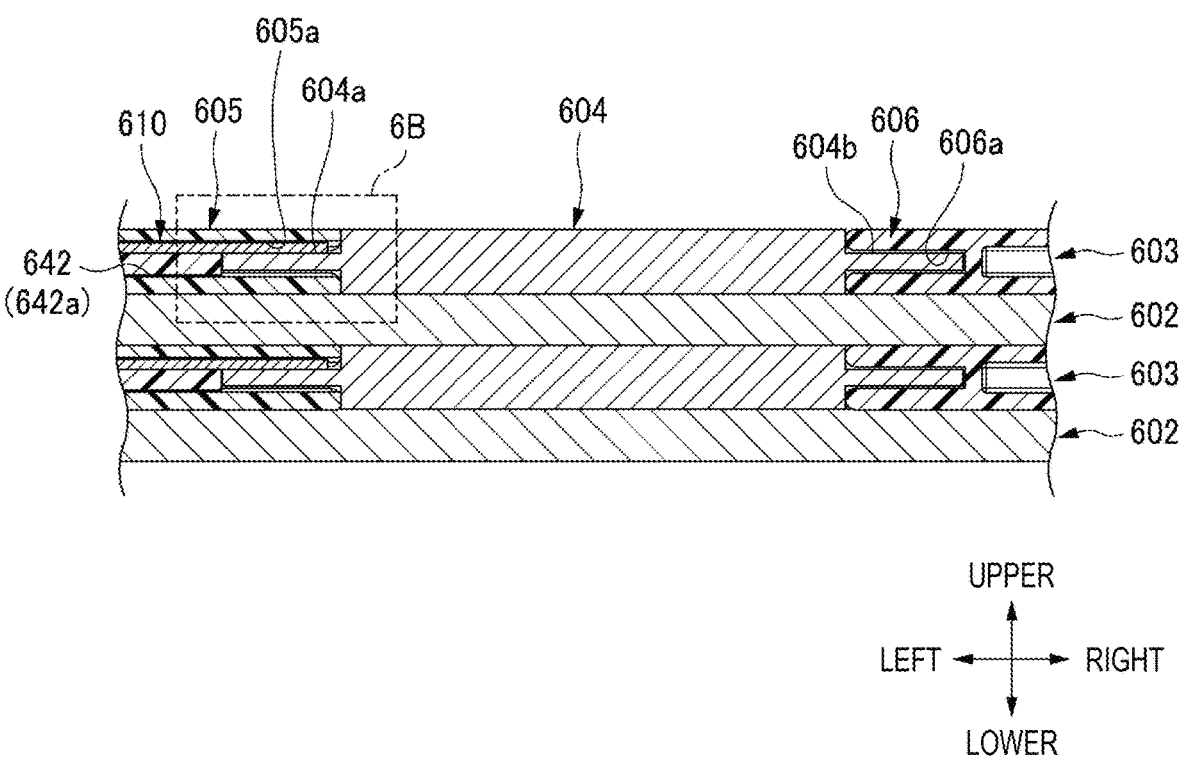
FIG. 34 is a cross-sectional view taken along a line 6A-6A in FIG. 32.

As illustrated in FIG. 32, each conductive module 603 is formed to have a rectangular thin board shape as a whole by a rectangular thin board-shaped conductive board 604 (the conductive board 604 also functions as a heat sink as described later), the rectangular thin board-shaped voltage detection unit 605 coupled to the left side of the conductive board 604, and a rectangular thin board-shaped facing unit 606 coupled to the right side of the conductive board 604. As illustrated in FIGS. 32 and 34, the conductive board 604 and the voltage detection unit 605 are coupled to each other by fitting a flange 604a into a recess 605a. The flange 604a is provided on the left end face of the conductive board 604 and extends in the front-rear direction. The recess 605a is provided on the right end face of the voltage detection unit 605 and extends in the front-rear direction. The conductive board 604 and the facing unit 606 are coupled to each other by fitting a flange 604b into a recess 606a. The flange 604b is provided on the right end face of the conductive board 604 and extends in the front-rear direction. The recess 606a is provided on the left end face of the facing unit 606 and extends in the front-rear direction.

In each of the conductive modules 603 positioned between the power storage modules 602 adjacent to each other in the upper-lower direction, the conductive board 604 is in direct contact with the upper and lower power storage modules 602 as illustrated in FIG. 34. Thus, the conductive board 604 functions to perform conduction between a lower face of the upper power storage module 602 and an upper face of the lower power storage module 602, and functions as a heat sink that releases heat generated from the upper and lower power storage modules 602 to the outside.

In each of the conductive modules 603 located between the power storage modules 602 adjacent to each other in the upper-lower direction, the voltage detection unit 605 includes a voltage detection terminal 610 (see FIG. 33, etc.) in contact with the conductive board 604, which is to be described later. The voltage detection unit 605 has a function of outputting a signal indicating a voltage between the upper and lower power storage modules 602 (specifically, the potential of the upper face (output face) of the lower power storage module 602 relative to the zero potential as a reference) via a voltage wire 620 (see FIG. 32, etc.) connected to the voltage detection terminal 610. The voltage detection unit 605 is disposed to the left of the conductive board 604 in FIGS. 32 to 34, but a voltage detection unit having the same function as the voltage detection unit 605 may be disposed to the right of the conductive board 604. In this case, a voltage detection unit obtained by reversing the entire configuration of the voltage detection unit 605 in the left-right direction (that is, a mirror component of the voltage detection unit 605) is used as the voltage detection unit having the same function as that of the voltage detection unit 605.

Any one of a voltage detection unit, a dummy unit, and a temperature detection unit, which will be described later, is applied as the facing unit 606 to each of the conductive modules 603 positioned between the power storage modules 602 adjacent to each other in the upper-lower direction, according to the specification of the power storage device 601.

If the facing unit 606 is a voltage detection unit, a voltage detection unit obtained by reversing the entire configuration of the voltage detection unit 605 in the left-right direction (that is, a mirror component of the voltage detection unit 605 described above) is used as the facing unit 606. In this case, the voltage detection unit 605 is disposed to the left of the conductive board 604, and the mirror component of the voltage detection unit 605 is disposed to the right of the conductive board 604. The facing unit 606 (a mirror component of the voltage detection unit 605) has the same function as that of the voltage detection unit 605.

If the facing unit 606 is a dummy unit, as illustrated in FIG. 32, a simple resin board having the recess 606a extending in the front-rear direction is used as the facing unit 606. In this case, the facing unit 606 performs only the function of filling the gap between the upper and lower power storage modules 602.

If the facing unit 606 is a temperature detection unit, as illustrated in FIG. 32, a structure obtained by incorporating a temperature detection sensor 607 (thermistor) in a resin board used as a dummy unit is used as the facing unit 606 (this will be described later). In this case, the facing unit 606 has a function of outputting a signal indicating the temperature of the upper and lower power storage modules 602 via a temperature wire 607b (see FIG. 32) connected to the temperature detection sensor 607.

Figure 33:
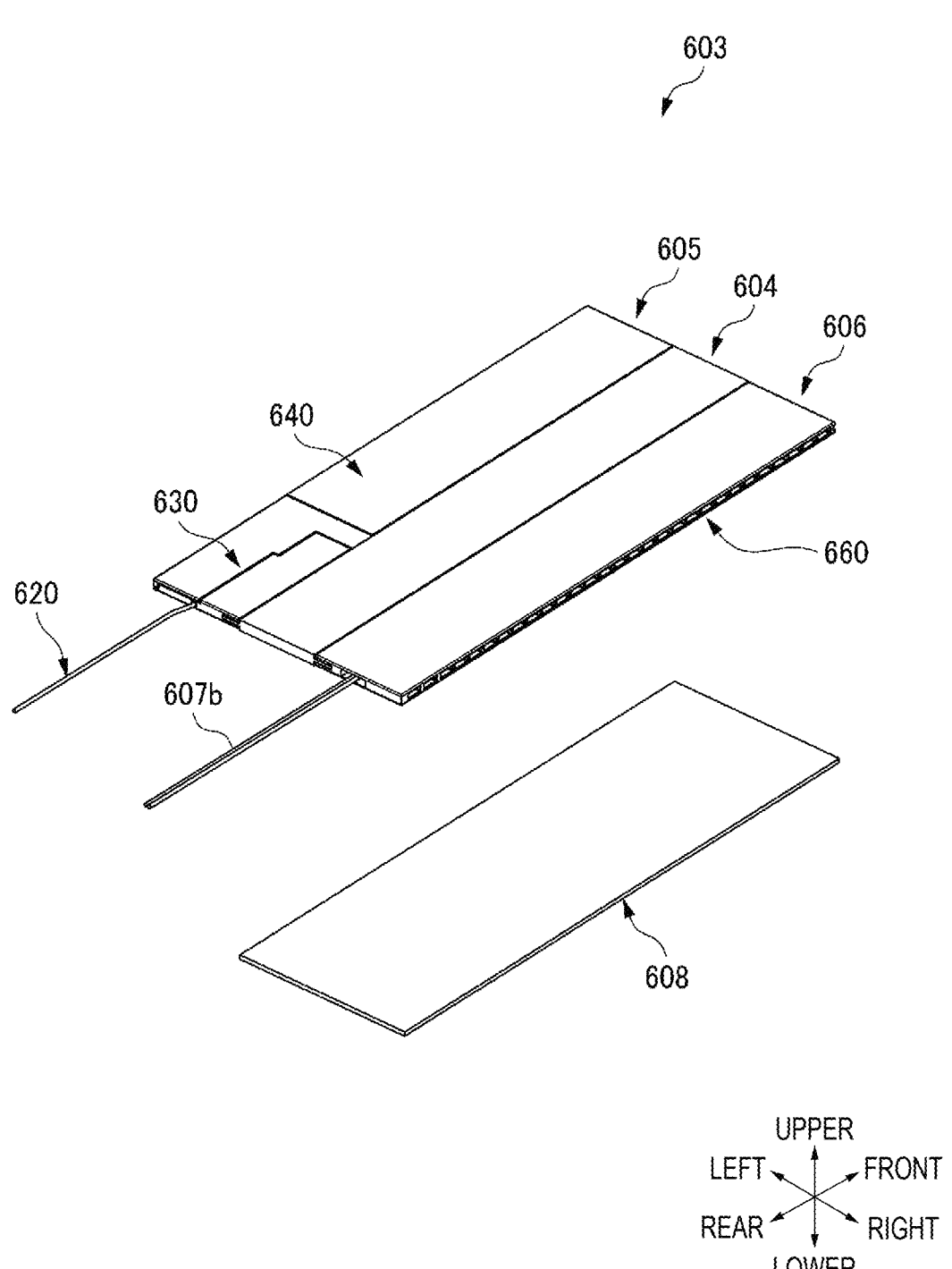
FIG. 33 is a perspective view illustrating the voltage detection unit and a heat conductive sheet.

In each of the conductive modules 603 located between the power storage modules 602 adjacent to each other in the upper-lower direction, if the facing unit 606 is a temperature detection unit, as illustrated in FIG. 33, the conductive module 603 includes a heat conductive sheet 608 located between the conductive board 604 and the facing unit 606, and the power storage modules 602. The heat conductive sheet 608 is a known heat conductive sheet obtained by blending a metal filler or the like in a resin such as silicon or acrylic, and is attached to the lower end faces of the conductive board 604 and the facing unit 606 in a manner straddling the conductive board 604 and the facing unit 606. In other words, the heat conductive sheet 608 fills the gaps between the conductive board 604 and the facing unit 606, and the power storage modules 602. Thus, the heat conductive sheet 608 is preferably in close contact with the conductive board 604, the facing unit 606, and the power storage modules 602, and is preferably formed to follow the face shape (minute unevenness or the like) thereof.

Figure 36:
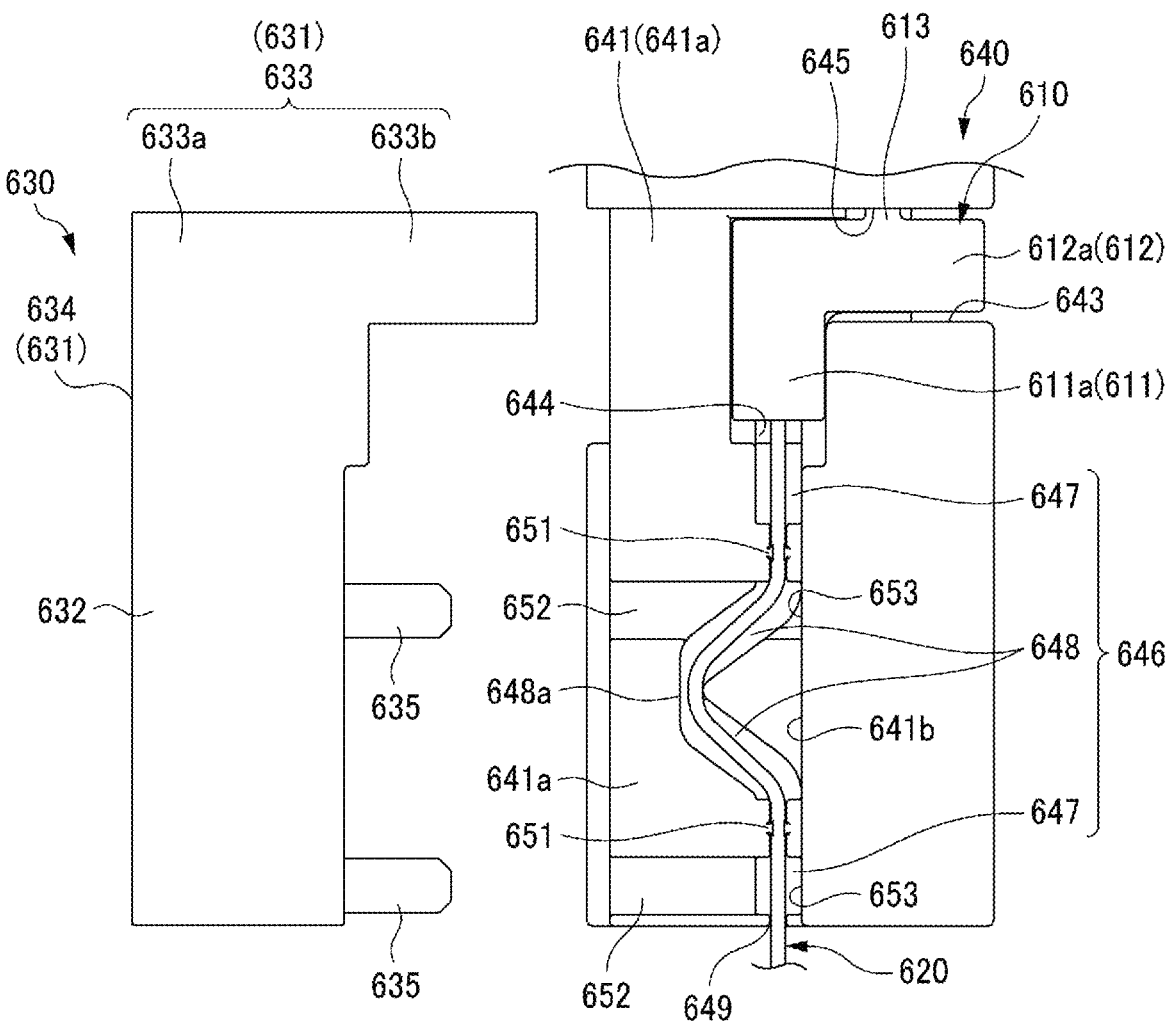
FIG. 36 is a top view illustrating the cover and the housing accommodating the voltage detection terminal and the voltage wire.
Figure 36:
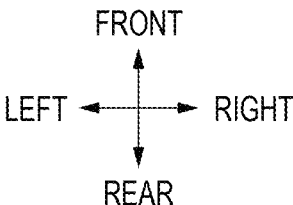
Figure 37:
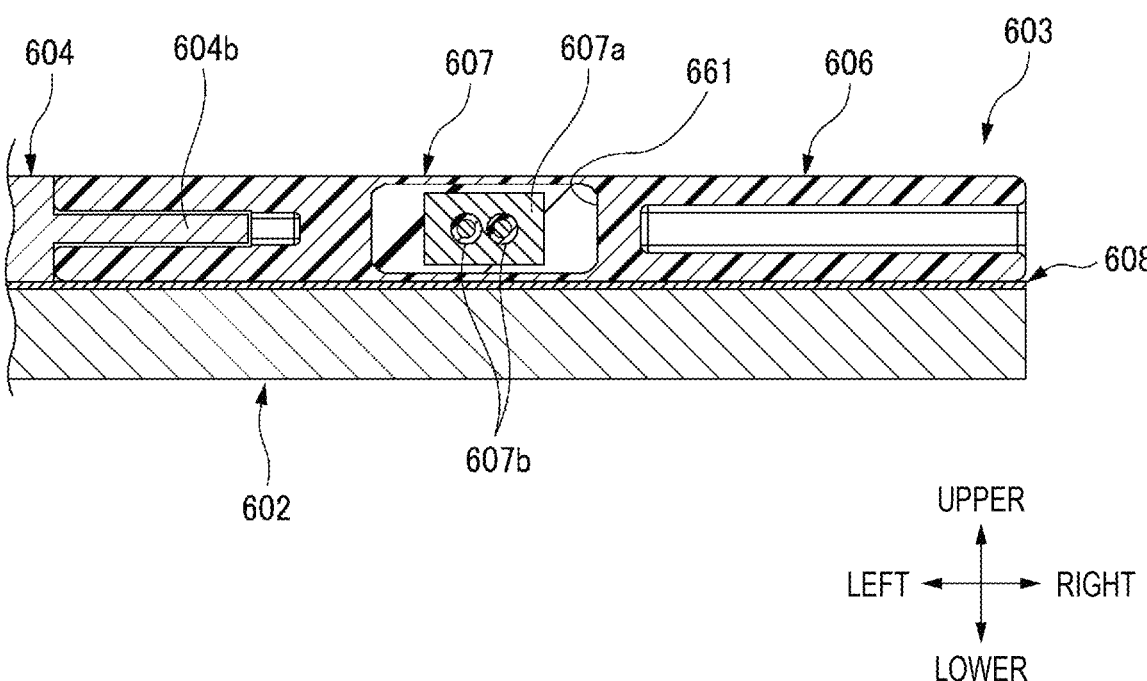
FIG. 37 is an enlarged cross-sectional view of the main part of the temperature detection unit, and corresponds to FIG. 34.

Hereinafter, the specific configuration of the voltage detection unit 605 according to the sixth embodiment will be described. As illustrated in FIG. 36, the voltage detection unit 605 includes a housing 640, a voltage detection terminal 610 accommodated in the housing 640, a voltage wire 620 connected to the voltage detection terminal 610 and accommodated in the housing 640, and a cover 630 mounted to the housing 640.

The voltage detection terminal 610 is accommodated in a terminal accommodating recess (reference sign omitted) formed in the housing 640. The voltage wire 620 is accommodated in an electric wire accommodating recess 646 (see FIG. 36) formed in the housing 640, which is to be described later. The cover 630 is mounted in a cover mounting recess 641 (see FIG. 36) formed in the housing 640, which is to be described later. Hereinafter, the members constituting the voltage detection unit 605 will be described in order.

First, the voltage detection terminal 610 will be described. The voltage detection terminal 610 made of metal is formed by one metal board being subjected to processing such as a pressing process. The voltage detection terminal 610 is accommodated in the terminal accommodating recess of the housing 640 from above. As illustrated in FIG. 36, the voltage detection terminal 610 includes a rectangular flat plate-shaped first portion 611 extending in the front-rear direction and a rectangular flat plate-shaped second portion 612 extending rightward from the front end of the first portion 611, and has a substantially L-shaped flat plate shape as a whole when viewed in the upper-lower direction.

One end of the voltage wire 620 is fixed and electrically connected to the lower face of the tip portion 611*a* of the first portion 611 (that is, the end closer to the rear end). The other end of the voltage wire 620 is to be connected to a voltage measuring device (not illustrated) outside the power storage device 601. Apart of the flange 604*a* of the conductive board 604 is to be fixed to the lower face of a tip portion 612*a* of the second portion 612 (that is, the end closer to the right end) by a method such as ultrasonic joining or welding (see FIG. 34).

The front end edge of the second portion 612 is formed with a projection 613 projecting forward. When the voltage detection terminal 610 is accommodated in the housing 640, the projection 613 is locked in a locking groove 645 (see FIG. 35) formed in the housing 640.

Next, the cover 630 will be described. The cover 630 is a resin molded article and is mounted to the cover mounting recess 641 of the housing 640 from the left. The cover 630 includes a facing portion 631 and an extension portion 632 extending rearward from the facing portion 631. The facing portion 631 mainly functions to cover and protect the voltage detection terminal 610, and the extension portion 632 mainly functions to cover and protect the voltage wire 620.

The facing portion 631 includes a pair of flat plates 633 having the same shape and facing each other at an interval in the upper-lower direction, and a coupling portion 634 that couples the left end edges of the pair of flat plates 633 extending in the front-rear direction in the upper-lower direction over the entire region in the front-rear direction. The facing portion 631 has a substantially U-shape opening rightward when viewed in the front-rear direction. Each flat plate 633 includes a substantially square flat plate-shaped a base 633*a* continuous from the coupling portion 634, and a rectangular flat plate-shaped extension portion 633*b* extending rightward from the front end of the base 633*a*, and has a substantially L shape as a whole when viewed in the upper-lower direction. The extension portion 632 extends rearward from the rear end edge of the upper flat plate 633 (more specifically, the upper base 633*a*) of the pair of flat plates 633 constituting the facing portion 631 in a flush and continuous manner, and has a substantially rectangular flat plate shape.

The extension portion 632 is integrally formed with two electric wire holding pieces 635 extending in the left-right direction, which are arranged at an interval in the front-rear direction. Each electric wire holding piece 635 protrudes downward from the lower face of the extension portion 632 and extends in the left-right direction, so as to project further rightward from the left end edge of the extension portion 632. When the cover 630 is mounted to the housing 640, the electric wire holding pieces 635 hold the voltage wire 620 accommodated in the housing 640.

The lower flat plate 633 (more specifically, the lower base 633*a*) of the pair of flat plates 633 constituting the facing portion 631 is formed with a locking portion (not illustrated) projecting upward toward the upper flat plate 633 at a predetermined location. The locking portion functions to lock the cover 630 to a temporary locking position and a final locking position in cooperation with a temporary locked portion (not illustrated) and a final locked portion (not illustrated) provided in the housing 640.

Next, the housing 640 will be described. The housing 640 is a resin molded article and has a substantially thin rectangular board shape extending in the front-rear direction as illustrated in FIG. 32, etc. The right end face of the housing 640 is formed with a recess 605*a* recessed leftward and extending in the front-rear direction. The flange 604*a* of the conductive board 604 is to be fitted into the recess 605*a* (see FIGS. 34, 35, etc.).

The locations on the upper and lower faces of the housing 640 where the cover 630 is mounted are each formed with the cover mounting recess 641 recessed into a shape corresponding to the entire shape of the cover 630 (see FIG. 36). The recess depth (depth in the upper-lower direction) of the cover mounting recess 641 is equal to the plate thickness of the resin material constituting the cover 630 (the facing portion 631+the extension portion 632). Thus, when the cover 630 is mounted to the housing 640, the face of the housing 640 is flush with the face of the cover 630 (see FIG. 32).

The location where the voltage detection terminal 610 is accommodated on a bottom face 641*a* of the cover mounting recess 641 in the upper face of the housing 640 is formed with a terminal accommodating recess further recessed into a shape corresponding to the entire shape of the voltage detection terminal 610 (see FIG. 36). The recess depth (depth in the upper-lower direction) of the terminal accommodating recess is equal to the plate thickness of the voltage detection terminal 610. Thus, when the voltage detection terminal 610 is mounted to the housing 640, the upper face of the voltage detection terminal 610 is flush with the bottom face 641*a* of the cover mounting recess 641.

The position in the front-rear direction in the right end edge of the housing 640 where the tip portion 612*a* of the voltage detection terminal 610 is disposed is formed with a notch 643 recessed leftward into a substantially rectangular shape when viewed in the upper-lower direction. The recess 605*a* extending in the front-rear direction in the right end face of the housing 640 is divided by the notch 643. When the voltage detection terminal 610 is accommodated in the housing 640, the upper and lower faces of the tip portion 612*a* of the voltage detection terminal 610 are to be exposed by the notch 643.

The location in the terminal accommodating recess where the tip portion 611*a* of the voltage detection terminal 610 is disposed is formed with a through hole 644 extending in the front-rear direction and penetrating in the upper-lower direction. When the voltage detection terminal 610 is accommodated in the housing 640, the one end (contact point) of the voltage wire 620 connected to the voltage detection terminal 610 enters the through hole 644. In other words, the through hole 644 functions as a clearance for avoiding interference between the bottom face of the terminal accommodating recess and the one end of the voltage wire 620.

Figure 35:
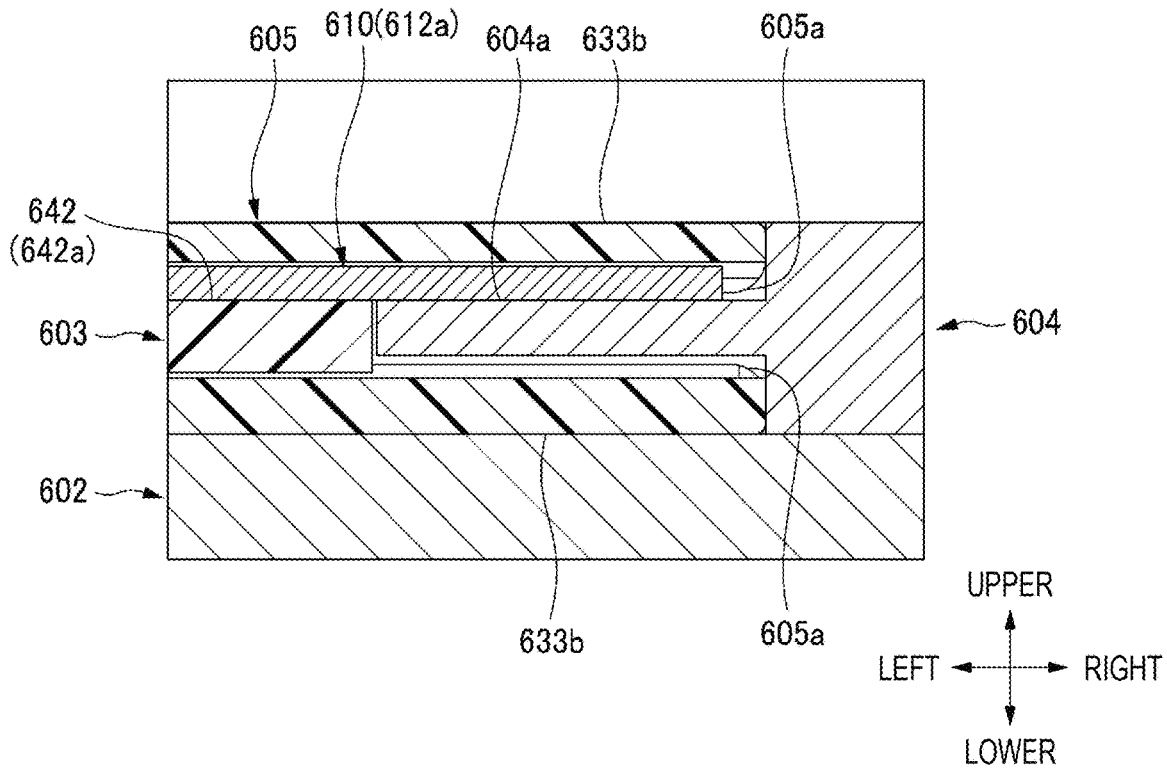
FIG. 35 is an enlarged view of a portion 6B in FIG. 33.

The inner wall face of the location in the terminal accommodating recess where the projection 613 (see FIG. 36) of the voltage detection terminal 610 is disposed is formed with a locking groove 645 recessed forward and communicating with the recess 605*a*, so as to correspond to the projection 613 (see FIG. 35).

The location on the upper face of the housing 640 where the voltage wire 620 is accommodated is formed with an electric wire accommodating recess 646 having a shape corresponding to the wiring form of the voltage wire 620 when the voltage wire 620 is accommodated (see FIG. 36). The electric wire accommodating recess 646 is a continuous groove including a pair of straight portions 647 extending linearly in the front-rear direction and arranged at an interval in the front-rear direction, and a bent portion 648 connecting the pair of straight portions 647 and extending while being bent to project leftward. The right groove side wall (the wall facing the left) and the left groove side wall (the wall facing the right) in the electric wire accommodating recess 646 (the pair of straight portions 647+the bent portion 648) extend upward from the groove bottom wall of the electric wire accommodating recess 646 in parallel to the upper-lower direction.

The front end of the front straight portion 647 of the pair of straight portions 647 communicates with the terminal accommodating recess, and the rear end of the rear straight portion 647 of the pair of straight portions 647 constitutes an electric wire outlet 649 from which the voltage wire 620 extends from the rear end edge of the housing 640. In this way, since the electric wire accommodating recess 646 has the bent portion 648, as compared with a case where the electric wire accommodating recess 646 is formed of only the straight portions 647, even if an unintended external force is applied to the voltage wire 620 drawn out from the housing 640, the voltage wire 620 can resist the external force due to the friction between the bent portion 648 and the voltage wire 620. Thus, a large external force is hardly applied to the contact point between the voltage detection terminal 610 and the voltage wire 620.

The location in each of the pair of straight portions 647 near the boundary with the bent portion 648 is provided with a narrow recess 651, which is a recess having a width (interval in the left-right direction) narrower than that of the straight portion 647. The width of the narrow recess 651 is slightly smaller than the outer diameter of the voltage wire 620. Thus, the voltage wire 620 is pinched while being pressed in the left-right direction. By pinching the voltage wire 620 between the pair of narrow recesses 651, even if an unintended external force is applied to the voltage wire 620 drawn out from the housing 640, it is possible to resist the external force by the friction between the narrow recesses 651 and the voltage wire 620. Thus, a large external force is hardly applied to the contact point between the voltage detection terminal 610 and the voltage wire 620. Further, it is possible to strongly prevent the voltage wire 620 from being wired in a manner coming out of the bent portion 648 and straddling the bent portion 648 (that is, shortcutting the bent portion 648).

As illustrated in FIG. 35, the locations on the bottom face 641a of the cover mounting recess 641 in the upper face of the housing 640 at which the pair of electric wire holding pieces 635 of the cover 630 are arranged are formed with a pair of electric wire holding piece recesses 652 extending in the left-right direction at an interval in the front-rear direction, so as to correspond to the pair of electric wire holding pieces 635. The pair of electric wire holding piece recesses 652 sandwich a bending vertex 648a (see FIG. 36) of the bent portion 648 of the electric wire accommodating recess 646 in the front-rear direction. The bottom faces of the pair of electric wire holding piece recesses 652 are located above the bottom face of the electric wire accommodating recess 646.

The electric wire holding piece recesses 652 extend in the left-right direction from the right end edge of the upper face of the housing 640 to the right inner wall 641b (see FIG. 36) of the cover mounting recess 641 across the electric wire accommodating recess 646. Each of the locations on the right inner wall 641b of the cover mounting recess 641 where the pair of electric wire holding piece recesses 652 are connected is formed with a storage hole 653 recessed rightward (see FIG. 36). When the cover 630 is mounted to the housing 640, the extension ends (that is, the right end) of the pair of electric wire holding pieces 635 of the cover 630 are to be inserted and stored in the pair of storage holes 653.

The same position in the front-rear direction as the location where the locking portion of the cover 630 is disposed on the bottom face 641a of the cover mounting recess 641 on the lower face side of the housing 640 is formed with a temporary locked portion and a final locked portion, which are recesses recessed upward, in this order at an interval from the left to the right. The members constituting the voltage detection unit 605 have been described above.

Next, a procedure for assembling the voltage detection terminal 610 and the cover 630 to the housing 640 will be described. First, the voltage detection terminal 610, which is connected to the voltage wire 620 in advance by a method such as ultrasonic joining or welding, is accommodated in the terminal accommodating recess of the housing 640. Thus, the voltage detection terminal 610 is fitted into the terminal accommodating recess of the housing 640 from above such that the projection 613 enters the locking groove 645 and the one end (contact point) of the voltage wire 620 enters the through hole 644. In a state in which the voltage detection terminal 610 is completely accommodated in the housing 640, the upper and lower faces of the tip portion 612a of the voltage detection terminal 610 are exposed by the notch 643.

Next, the voltage wire 620 extending from the voltage detection terminal 610 accommodated in the housing 640 is accommodated in the electric wire accommodating recess 646 (the pair of straight portions 647+the bent portion 648) of the housing 640. Thus, the voltage wire 620 is fitted from above along the electric wire accommodating recess 646 constituted by the pair of straight portions 647 and the bent portion 648. At this time, a pair of portions of the voltage wire 620 positioned at the upper portions of the pair of narrow recesses 651 are pushed downward, so that the pair of portions of the voltage wire 620 are accommodated in the pair of narrow recesses 651. In a state in which the voltage wire 620 is completely accommodated in the housing 640, the voltage wire 620 extends rearward from the electric wire outlet 649 to the outside of the housing 640.

Next, the cover 630 is mounted to the housing 640. Thus, the cover 630 is mounted in the cover mounting recess 641 of the housing 640 from the left side, such that the facing portion 631 of the cover 630 sandwiches the cover mounting recesses 641 in the upper and lower faces of the housing 640 in the upper-lower direction, the extension portion 632 of the cover 630 covers the cover mounting recesses 641 in the upper face of the housing 640, and the pair of electric wire holding pieces 635 of the cover 630 are accommodated in the pair of electric wire holding piece recesses 652 of the housing 640.

In the process of mounting the cover 630 to the housing 640, the locking portion of the cover 630 first slides on the housing 640 to enter the inside of the temporary locked portion and engage with the temporary locked portion, and is pressed against the right side face of the temporary locked portion. Accordingly, the cover 630 is locked to the housing 640 at the temporary locking position, and the cover 630 is completely mounted to the housing 640 to obtain the voltage detection unit 605. As described later, the voltage detection unit 605 obtained after the cover 630 is completely mounted to the housing 640 (in a state in which the cover 630 is locked at the temporary locking position) is to be used for assembling the conductive module 603 (see FIG. 32).

In a state in which the cover 630 is locked at the temporary locking position, the facing portion 631 of the cover 630 (more specifically, the pair of upper and lower extension portions 633b) does not cover the tip portion 612a of the voltage detection terminal 610. Thus, the upper and lower faces of the tip portion 612a of the voltage detection terminal 610 are also exposed by the notch 643.

Further, the pair of electric wire holding pieces 635 of the cover 630 are arranged above the opening of a part of the straight portions 647 and the bent portion 648 of the electric wire accommodating recess 646. This prevents the voltage wire 620 from coming out of the electric wire accommodating recess 646. Further, the extension ends of the pair of electric wire holding pieces 635 are received in the pair of storage holes 653. Accordingly, it is possible to prevent unintended deformation such as misalignment of the pair of electric wire holding pieces 635 or separation of the pair of electric wire holding pieces 635 from the electric wire accommodating recess 646. Further, the extension portion 632 of the cover 630 is disposed above the opening of the bending vertex 648a of the bent portion 648 of the electric wire accommodating recess 646. Accordingly, it is possible to strongly prevent the voltage wire 620 from being wired in a manner coming out of the electric wire accommodating recess 646 and straddling the bent portion 648 (that is, shortcutting the bent portion 648). In this way, it is possible to reduce the possibility of occurrence of a specific failure caused by the voltage wire 620 coming out of the bent portion 648 of the electric wire accommodating recess 646.

When the cover 630 is further pushed leftward relative to the housing 640 in a state in which the cover 630 is locked at the temporary locking position, the extension ends of the pair of electric wire holding pieces 635 of the cover 630 further enter and are stored in the pair of storage holes 653. Simultaneously, the locking portion of the cover 630 goes beyond the temporary locked portion and then enters the inside of the final locked portion and is engaged with the final locked portion. Thus, the cover 630 is locked to the housing 640 at the final locking position.

In a state in which the cover 630 is locked at the final locking position, the entire cover mounting recess 641 is covered with the cover 630, and thus the entire electric wire accommodating recess 646 is covered with the extension portion 632 of the cover 630. This prevents the voltage wire 620 from coming out of the electric wire accommodating recess 646. Further, the facing portion 631 of the cover 630 (more specifically, the pair of upper and lower extension portions 633b) covers the upper and lower faces of the tip portion 612a of the voltage detection terminal 610. Accordingly, the entire voltage detection terminal 610 is covered with the facing portion 631 of the cover 630, so that the voltage detection terminal 610 can be reliably protected.

Hereinafter, the specific configuration in a case where the facing unit 606 according to the sixth embodiment is a temperature detection unit will be described. As illustrated in FIG. 32, the facing unit 606 includes a housing 660, a temperature detection sensor 607 accommodated in the housing 660, and a temperature wire 607b connected to the temperature detection sensor 607. The temperature detection sensor 607 is accommodated in a sensor accommodating recess 661 (see FIG. 37) formed in the housing 660, which is to be described later. Hereinafter, the members constituting the facing unit 606 as the temperature detection unit will be described in order.

First, the housing 660 will be described. The housing 660 is a resin molded article and has a substantially thin rectangular board shape extending in the front-rear direction as illustrated in FIG. 32, etc. The central portion in the left-right direction of the rear end face of the housing 660 is formed with a sensor accommodating recess 661, which is recessed forward in a rectangular parallelepiped shape extending in the front-rear direction, so as to correspond to the overall shape of the casing of the temperature detection sensor 607.

Next, the temperature detection sensor 607 will be described. The temperature detection sensor 607 is typically a thermistor. The temperature detection sensor 607 has a rectangular parallelepiped casing extending in the front-rear direction, a sensor element 607a (see FIG. 37) is accommodated in the casing and a temperature wire 607b connected to the sensor element 607a extends rearward from the rear end of the casing. The temperature detection sensor 607 is accommodated in the sensor accommodating recess 661 of the housing 660 from the rear. The extension end of the temperature wire 607b is to be connected to a temperature measuring device (not illustrated) outside the power storage device 601. The members constituting the facing unit 606 as the temperature detection unit have been described above.

Next, a procedure for assembling the temperature detection sensor 607 to the housing 660 will be described. In order to mount the temperature detection sensor 607 to the housing 660, the temperature detection sensor 607 is inserted into the sensor accommodating recess 661 of the housing 660 from the rear.

Next, the assembly of the conductive module 603 and the power storage device 601 (see FIG. 32) will be described. As described above, the voltage detection unit 605 obtained after the cover 630 is completely mounted to the housing 640 (in a state in which the cover 630 is locked at the temporary locking position) is used for assembling the conductive module 603 (see FIG. 32). Specifically, first, the flange 604a of the conductive board 604 is fitted into the recess 605a of the voltage detection unit 605, so that the voltage detection unit 605 is coupled to the left side of the conductive board 604.

In this state, a part of the flange 604a of the conductive board 604 overlaps the lower side of the tip portion 612a of the voltage detection terminal 610 (see FIG. 35), and the upper face of the tip portion 612a of the voltage detection terminal 610 is exposed upward and the lower face of a part of the flange 604a of the conductive board 604 is exposed downward due to the presence of the notch 643 of the housing 640.

Next, the upper face of the tip portion 612a of the voltage detection terminal 610 exposed upward and the lower face of a part of the flange 604a of the conductive board 604 exposed downward are used to fix the tip portion 612a of the voltage detection terminal 610 and the part of the flange 604a of the conductive board 604 by a method such as ultrasonic joining or welding. Thereafter, the cover 630 is moved from the temporary locking position to the final locking position, and the voltage detection unit 605 is completely assembled to the conductive board 604.

Next, the flange 604b of the conductive board 604 is fitted into the recess 606a of the facing unit 606, so that the facing unit 606 is coupled to the right side of the conductive board 604 to which the voltage detection unit 605 is assembled (see FIG. 34, etc.).

Next, the heat conductive sheet 608 is attached to the lower end face of the facing unit 606 in a manner straddling the conductive board 604 and the facing unit 606 as the temperature detection unit. Thus, the conductive module 603 is completely assembled.

The conductive module 603 thus obtained is used for assembling the power storage device 601 illustrated in FIG. 32. Specifically, the power storage modules 602 and the conductive modules 603 are alternately stacked in the upper-lower direction, and the stacked body is fixed by a predetermined fitting or the like, thereby obtaining the power storage device 601.

In this state, the heat conductive sheet 608 is positioned between the conductive board 604 and the facing unit 606 as the temperature detection unit, and the power storage modules 602, and heat generated from the power storage modules 602 is transferred to the temperature detection sensor 607.

According to the sixth embodiment, the heat conductive sheet 608 is positioned between the conductive board 604 and the facing unit 606 as the temperature detection unit, and the power storage modules 602, and is attached to the board face of the conductive board 604 and the facing unit 606 as the temperature detection unit in a manner straddling the conductive board 604 and the facing unit 606. Accordingly, heat generated from the power storage modules 602 is transferred to the temperature detection sensor 607 of the facing unit 606 as the temperature detection unit via the conductive board 604 and the heat conductive sheet 608. That is, according to the above configuration, since the heat conductivity to the temperature detection sensor 607 is excellent, the temperature measurement performance is excellent compared to the related art.

The invention embodied as the sixth embodiment is not limited to the sixth embodiment, and various modifications can be adopted within the scope of the invention. For example, the present invention is not limited to the sixth embodiment, and modifications, improvements, and the like can be made appropriately. In addition, materials, shapes, sizes, numbers, arrangement positions, and the like of components in the sixth embodiment are freely selected and are not limited as long as the present invention can be implemented.

Here, features of the embodiment of the conductive module to the present invention described above are briefly summarized and listed in the following [6-1] to [6-2].

[6-1]

A conductive module (603) including:

a board-shaped conductive board (604) configured to be disposed between a plurality of stacked power storage modules (602);

a board-shaped temperature detection unit (facing unit 606) coupled to a side edge (flange 604*b*) of the conductive board (604), the temperature detection unit including a temperature detection sensor (607) configured to measure a temperature of the power storage modules (602); and a heat conductive sheet (608) located between the conductive board (604) and the temperature detection unit (facing unit 606), and the power storage modules (602), in which the heat conductive sheet (608) is attached to board faces of the conductive board (604) and the temperature detection unit (facing unit 606) in a manner straddling the conductive board (604) and the temperature detection unit (facing unit 606).

According to the configuration of the above [6-1], the heat conductive sheet is positioned between the conductive board and the temperature detection unit, and the power storage modules, and is attached to the board faces of the conductive board and the temperature detection unit in a manner straddling the conductive board and the temperature detection unit. Accordingly, heat generated from the power storage modules is transferred to the temperature detection sensor of the temperature detection unit via the heat conductive sheet. That is, according to the above configuration, since the heat conductivity to the temperature detection sensor is excellent, the temperature measurement performance is excellent compared to the related art.

[6-2]

The conductive module (603) according to the above [6-1], further including:

a voltage detection unit (605) including a voltage detection terminal (610) configured to be conductively connected to the power storage modules (602) via the conductive board (604).

According to the configuration of the above [6-2], since the conductive module further includes the voltage detection unit, it is possible to detect an abnormal voltage of the power storage modules.

Seventh Embodiment

The invention embodied as a seventh embodiment relates to a temperature detection unit. Hereinafter, a temperature detection unit (for example, a facing unit 706) according to the seventh embodiment will be described with reference to FIGS. 38 to 43.

The temperature detection unit according to the seventh embodiment has the following features.

A temperature detection unit includes:

a long board-shaped housing having one side face in a short direction provided with a recess configured to be fitted with a side edge of a conductive board disposed between a plurality of stacked power storage modules; and a temperature detection sensor mounted on the housing and configured to measure a temperature of the power storage modules, in which a substantially central portion in a longitudinal direction of the housing is provided with a sensor accommodating recess accommodating the temperature detection sensor.

According to the seventh embodiment, the substantially central portion in the longitudinal direction of the housing is provided with the sensor accommodating recess accommodating the temperature detection sensor. Accordingly, the temperature detection sensor is to be disposed closer to the conductive board compared to the related art. That is, according to the above configuration, since the temperature detection sensor is closer to the center portion of the heat source, that is, the power storage modules (the conductive board), the temperature measurement performance is excellent compared to the related art.

Figure 38:
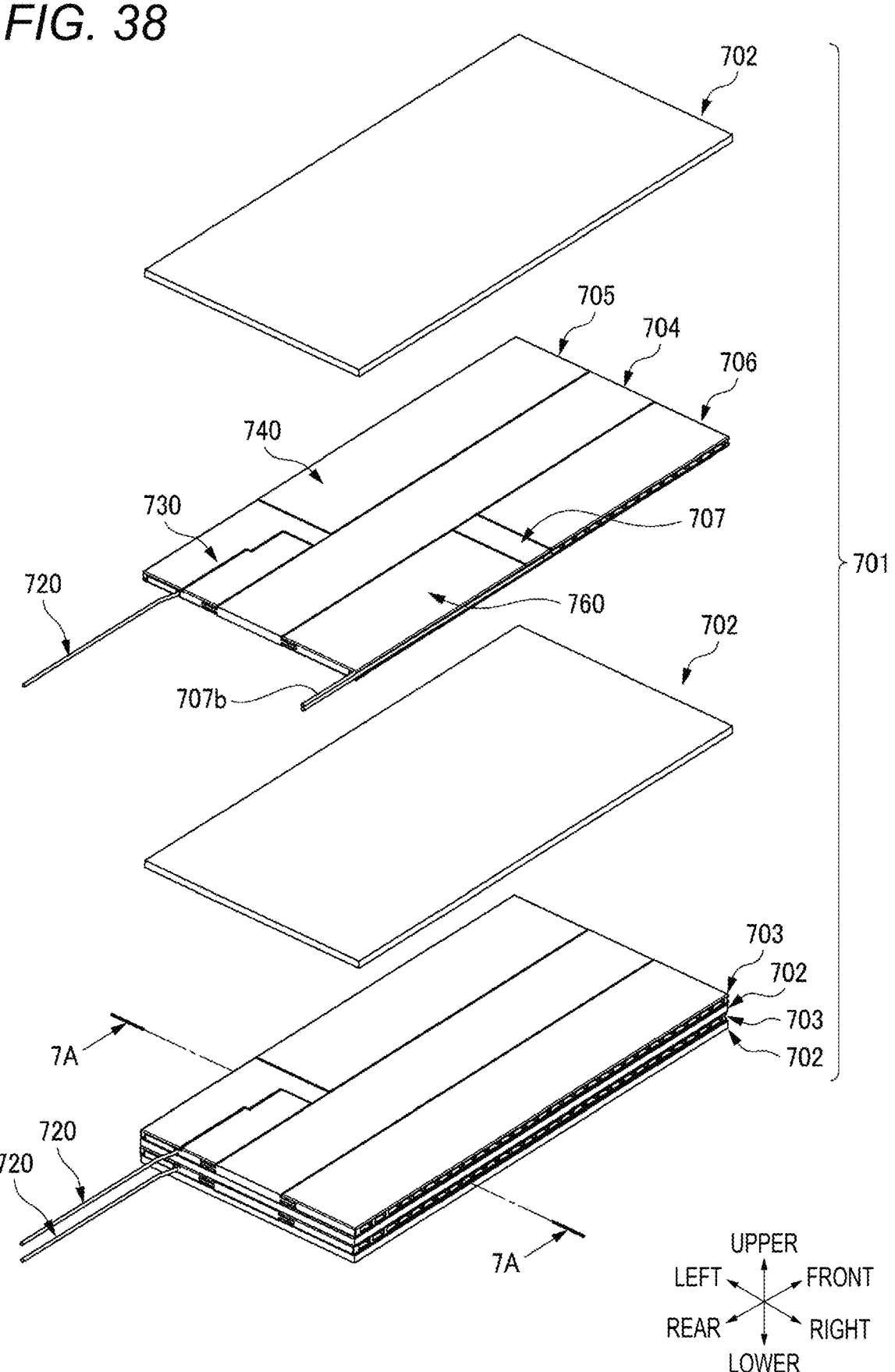
FIG. 38 is a partially exploded perspective view illustrating a stacked power storage device including a voltage detection unit according to a seventh embodiment.

Hereinafter, for convenience of description, "front", "rear", "left", "right", "upper", and "lower" are defined as illustrated in FIG. 38. The "front-rear direction", the "left-right direction", and the "upper-lower direction" are orthogonal to one another. The front-rear direction corresponds to the "longitudinal direction" of the invention embodied in the seventh embodiment. The left-right direction corresponds to the "short direction" of the invention embodied in the seventh embodiment.

The voltage detection unit 705 is typically used in a stacked power storage device 701 illustrated in FIG. 38. The power storage device 701 is formed by alternately stacking, in the upper-lower direction, thin rectangular board-shaped power storage modules 702 capable of charging and discharging and rectangular thin board-shaped conductive modules 703 capable of electrically connecting adjacent power storage modules 702. In the power storage device 701, a plurality of power storage modules 702 are electrically connected in series via the conductive modules 703.

Each power storage module 702 has a structure in which a plurality of battery cells (not illustrated) are incorporated, and the power storage modules 702 as a whole function as one battery capable of charging and discharging.

Figure 39:
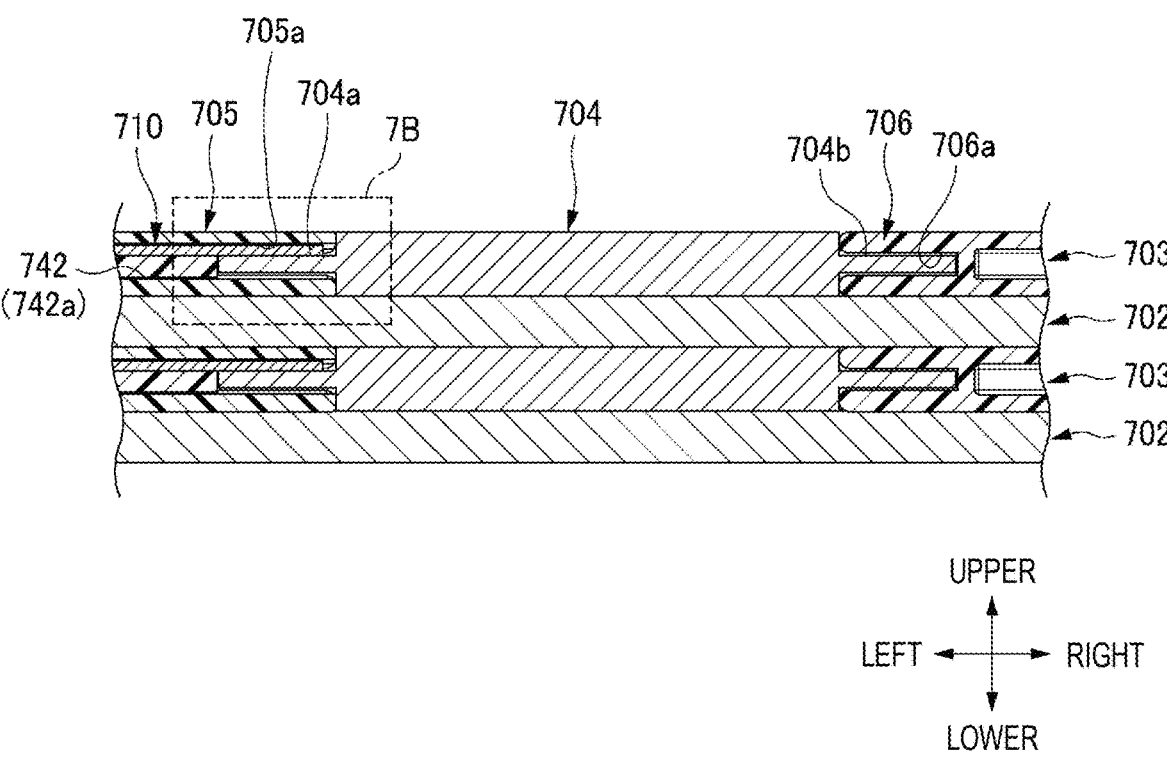
FIG. 39 is a cross-sectional view taken along a line 7A-7A in FIG. 38.
Figure 40:
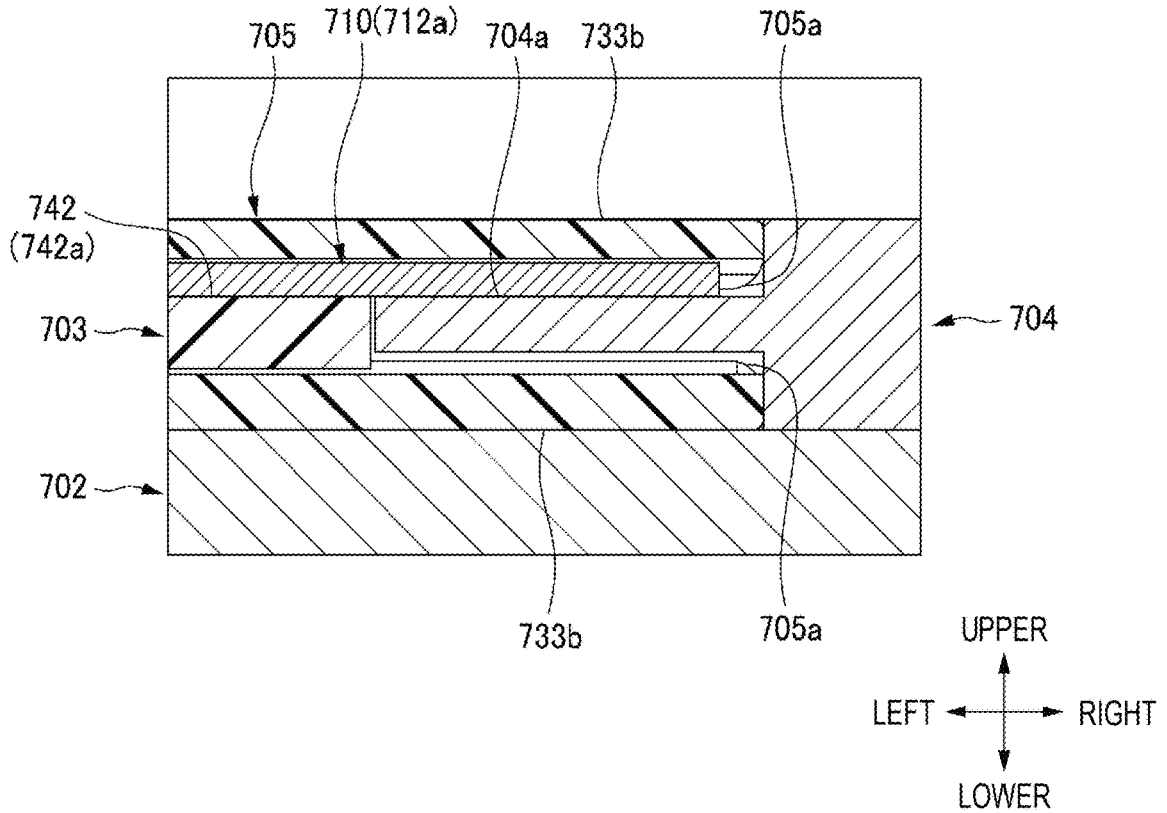
FIG. 40 is an enlarged view of a portion 7B in FIG. 39.

As illustrated in FIG. 38, each conductive module 703 is formed to have a rectangular thin board shape as a whole by a rectangular thin board-shaped conductive board 704 (the conductive board 704 also functions as a heat sink as described later), the rectangular thin board-shaped voltage detection unit 705 coupled to the left side of the conductive board 704, and a rectangular thin board-shaped facing unit 706 coupled to the right side of the conductive board 704. As illustrated in FIGS. 38 and 39, the conductive board 704 and the voltage detection unit 705 are coupled to each other by fitting a flange 704a into a recess 705a. The flange 704a is provided on the left end face of the conductive board 704 and extends in the front-rear direction. The recess 705a is provided on the right end face of the voltage detection unit 705 and extends in the front-rear direction. The conductive board 704 and the facing unit 706 are coupled to each other by fitting a flange 704b into a recess 706a. The flange 704b is provided on the right end face of the conductive board 704 and extends in the front-rear direction. The recess 706a is provided on the left end face of the facing unit 706 and extends in the front-rear direction.

In each of the conductive modules 703 positioned between the power storage modules 702 adjacent to each other in the upper-lower direction, the conductive board 704 is in direct contact with the upper and lower power storage modules 702 as illustrated in FIG. 39. Thus, the conductive board 704 functions to perform conduction between a lower face of the upper power storage module 702 and an upper face of the lower power storage module 702, and functions as a heat sink that releases heat generated from the upper and lower power storage modules 702 to the outside.

In each of the conductive modules 703 located between the power storage modules 702 adjacent to each other in the upper-lower direction, the voltage detection unit 705 includes a voltage detection terminal 710 (see FIG. 39, etc.) in contact with the conductive board 704, which is to be described later. The voltage detection unit 705 has a function of outputting a signal indicating a voltage between the upper and lower power storage modules 702 (specifically, the potential of the upper face (output face) of the lower power storage module 702 relative to the zero potential as a reference) via a voltage wire 720 (see FIG. 38, etc.) connected to the voltage detection terminal 710. The voltage detection unit 705 is disposed to the left of the conductive board 704 in FIGS. 38 to 40, but a voltage detection unit having the same function as the voltage detection unit 705 may be disposed to the right of the conductive board 704. In this case, a voltage detection unit obtained by reversing the entire configuration of the voltage detection unit 705 in the left-right direction (that is, a mirror component of the voltage detection unit 705) is used as the voltage detection unit having the same function as that of the voltage detection unit 705.

Any one of a voltage detection unit, a dummy unit, and a temperature detection unit, which will be described later, is applied as the facing unit 706 to each of the conductive modules 703 positioned between the power storage modules 702 adjacent to each other in the upper-lower direction, according to the specification of the power storage device 701.

If the facing unit 706 is a voltage detection unit, a voltage detection unit obtained by reversing the entire configuration of the voltage detection unit 705 in the left-right direction (that is, a mirror component of the voltage detection unit 705 described above) is used as the facing unit 706. In this case, the voltage detection unit 705 is disposed to the left of the conductive board 704, and the mirror component of the voltage detection unit 705 is disposed to the right of the conductive board 704. The facing unit 706 (a mirror component of the voltage detection unit 705) has the same function as that of the voltage detection unit 705.

If the facing unit 706 is a dummy unit, as illustrated in FIG. 38, a simple resin board having the recess 706a extending in the front-rear direction is used as the facing unit 706. In this case, the facing unit 706 performs only the function of filling the gap between the upper and lower power storage modules 702.

If the facing unit 706 is a temperature detection unit, as illustrated in FIG. 38, a structure obtained by incorporating a temperature detection sensor 707 (thermistor) in a resin board used as a dummy unit is used as the facing unit 706 (this will be described later). In this case, the facing unit 706 has a function of outputting a signal indicating the temperature of the upper and lower power storage modules 702 via a temperature wire 707b (see FIG. 38) connected to the temperature detection sensor 707.

Figure 41:
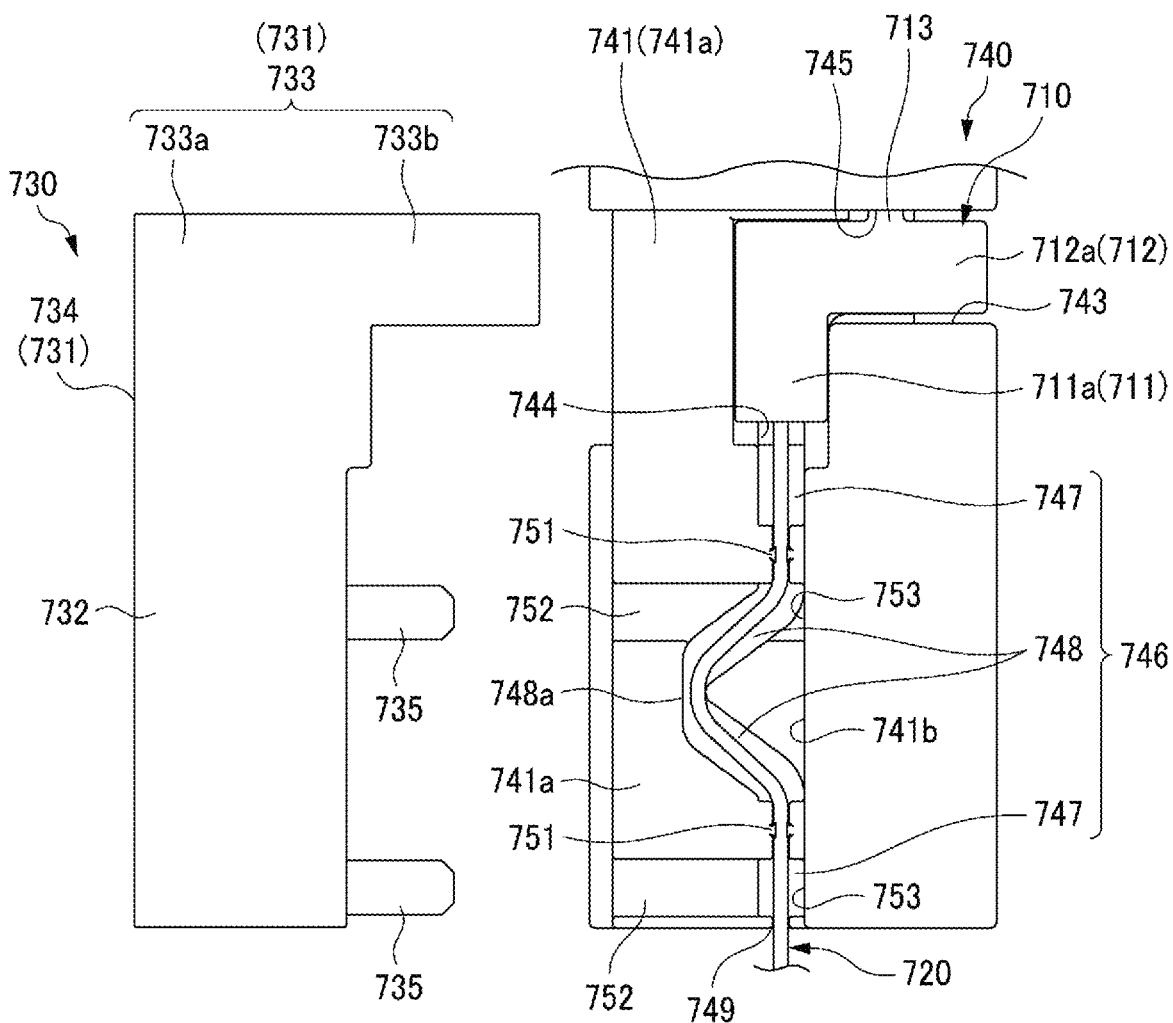
FIG. 41 is a top view illustrating the cover and the housing accommodating the voltage detection terminal and the voltage wire.
Figure 41:
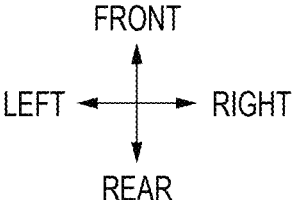

Hereinafter, the specific configuration of the voltage detection unit 705 according to the seventh embodiment will be described. As illustrated in FIG. 41, the voltage detection unit 705 includes a housing 740, a voltage detection terminal 710 accommodated in the housing 740, a voltage wire 720 connected to the voltage detection terminal 710 and accommodated in the housing 740, and a cover 730 mounted to the housing 740.

The voltage detection terminal 710 is accommodated in a terminal accommodating recess (reference sign omitted) formed in the housing 740. The voltage wire 720 is accommodated in an electric wire accommodating recess 746 (see FIG. 41) formed in the housing 740, which is to be described later. The cover 730 is mounted in a cover mounting recess 741 (see FIG. 41) formed in the housing 740, which is to be described later. Hereinafter, the members constituting the voltage detection unit 705 will be described in order.

First, the voltage detection terminal 710 will be described. The voltage detection terminal 710 made of metal is formed by one metal board being subjected to processing such as a pressing process. The voltage detection terminal 710 is accommodated in the terminal accommodating recess of the housing 740 from above. As illustrated in FIG. 41, the voltage detection terminal 710 includes a rectangular flat plate-shaped first portion 711 extending in the front-rear direction and a rectangular flat plate-shaped second portion 712 extending rightward from the front end of the first portion 711, and has a substantially L-shaped flat plate shape as a whole when viewed in the upper-lower direction.

One end of the voltage wire 720 is fixed and electrically connected to the lower face of the tip portion 711a of the first portion 711 (that is, the end closer to the rear end). The other end of the voltage wire 720 is to be connected to a voltage measuring device (not illustrated) outside the power storage device 701. A part of the flange 704a of the conductive board 704 is to be fixed to the lower face of a tip portion 712a of the second portion 712 (that is, the end closer to the right end) by a method such as ultrasonic joining or welding (see FIG. 40).

The front end edge of the second portion 712 is formed with a projection 713 projecting forward. When the voltage detection terminal 710 is accommodated in the housing 740, the projection 713 is to be locked in a locking groove 745 (see FIG. 41) formed in the housing 740.

Next, the cover 730 will be described. The cover 730 is a resin molded article and is mounted to the cover mounting recess 741 of the housing 740 from the left. The cover 730 includes a facing portion 731 and an extension portion 732 extending rearward from the facing portion 731. The facing portion 731 mainly functions to cover and protect the voltage detection terminal 710, and the extension portion 732 mainly functions to cover and protect the voltage wire 720.

The facing portion 731 includes a pair of flat plates 733 having the same shape and facing each other at an interval in the upper-lower direction, and a coupling portion 734 that couples the left end edges of the pair of flat plates 733 extending in the front-rear direction in the upper-lower direction over the entire region in the front-rear direction. The facing portion 731 has a substantially U-shape opening rightward when viewed in the front-rear direction. Each flat plate 733 includes a substantially square flat plate-shaped a base 733a continuous from the coupling portion 734, and a rectangular flat plate-shaped extension portion 733b extending rightward from the front end of the base 733a, and has a substantially L shape as a whole when viewed in the upper-lower direction. The extension portion 732 extends rearward from the rear end edge of the upper flat plate 733 (more specifically, the upper base 733a) of the pair of flat plates 733 constituting the facing portion 731 in a flush and continuous manner, and has a substantially rectangular flat plate shape.

The extension portion 732 is integrally formed with two electric wire holding pieces 735 extending in the left-right direction, which are arranged at an interval in the front-rear direction. Each electric wire holding piece 735 protrudes downward from the lower face of the extension portion 732 and extends in the left-right direction, so as to project further rightward from the left end edge of the extension portion 732. When the cover 730 is mounted to the housing 740, the electric wire holding pieces 735 hold the voltage wire 720 accommodated in the housing 740.

The lower flat plate 733 (more specifically, the lower base 733a) of the pair of flat plates 733 constituting the facing portion 731 is formed with a locking portion (not illustrated) projecting upward toward the upper flat plate 733 at a predetermined location. The locking portion functions to lock the cover 730 to a temporary locking position and a final locking position in cooperation with a temporary locked portion (not illustrated) and a final locked portion (not illustrated) provided in the housing 740.

Next, the housing 740 will be described. The housing 740 is a resin molded article and has a substantially thin rectangular board shape extending in the front-rear direction as illustrated in FIG. 38, etc. The right end face of the housing 740 is formed with a recess 705a recessed leftward and extending in the front-rear direction. The flange 704a of the conductive board 704 is to be fitted into the recess 705a (see FIGS. 39, 40, etc.).

The locations on the upper and lower faces of the housing 740 where the cover 730 is mounted are each formed with the cover mounting recess 741 recessed into a shape corresponding to the entire shape of the cover 730 (see FIG. 41). The recess depth (depth in the upper-lower direction) of the cover mounting recess 741 is equal to the plate thickness of the resin material constituting the cover 730 (the facing portion 731+the extension portion 732). Thus, when the cover 730 is mounted to the housing 740, the face of the housing 740 is flush with the face of the cover 730 (see FIG. 38).

The location where the voltage detection terminal 710 is accommodated on a bottom face 741a of the cover mounting recess 741 in the upper face of the housing 740 is formed with a terminal accommodating recess further recessed into a shape corresponding to the entire shape of the voltage detection terminal 710 (see FIG. 41). The recess depth (depth in the upper-lower direction) of the terminal accommodating recess is equal to the plate thickness of the voltage detection terminal 710. Thus, when the voltage detection terminal 710 is mounted to the housing 740, the upper face of the voltage detection terminal 710 is flush with the bottom face 741a of the cover mounting recess 741.

The position in the front-rear direction in the right end edge of the housing 740 where the tip portion 712a of the voltage detection terminal 710 is disposed is formed with a notch 743 recessed leftward into a substantially rectangular shape when viewed in the upper-lower direction. The recess 705a extending in the front-rear direction in the right end face of the housing 740 is divided by the notch 743. When the voltage detection terminal 710 is accommodated in the housing 740, the upper and lower faces of the tip portion 712a of the voltage detection terminal 710 are to be exposed by the notch 743.

The location in the terminal accommodating recess where the tip portion 711a of the voltage detection terminal 710 is disposed is formed with a through hole 744 extending in the front-rear direction and penetrating in the upper-lower direction. When the voltage detection terminal 710 is accommodated in the housing 740, the one end (contact point) of the voltage wire 720 connected to the voltage detection terminal 710 enters the through hole 744. In other words, the through hole 744 functions as a clearance for avoiding interference between the bottom face of the terminal accommodating recess and the one end of the voltage wire 720.

The inner wall face of the location in the terminal accommodating recess where the projection 713 (see FIG. 41) of the voltage detection terminal 710 is disposed is formed with a locking groove 745 recessed forward and communicating with the recess 705a, so as to correspond to the projection 713 (see FIG. 41).

The location on the upper face of the housing 740 where the voltage wire 720 is accommodated is formed with an electric wire accommodating recess 746 having a shape corresponding to the wiring form of the voltage wire 720 when the voltage wire 720 is accommodated (see FIG. 41). The electric wire accommodating recess 746 is a continuous groove including a pair of straight portions 747 extending linearly in the front-rear direction and arranged at an interval in the front-rear direction, and a bent portion 748 connecting the pair of straight portions 747 and extending while being bent to project leftward. The right groove side wall (the wall facing the left) and the left groove side wall (the wall facing the right) in the electric wire accommodating recess 746 (the pair of straight portions 747+the bent portion 748) extend upward from the groove bottom wall of the electric wire accommodating recess 746 in parallel to the upper-lower direction.

The front end of the front straight portion 747 of the pair of straight portions 747 communicates with the terminal accommodating recess, and the rear end of the rear straight portion 747 of the pair of straight portions 747 constitutes an electric wire outlet 749 from which the voltage wire 720 extends from the rear end edge of the housing 740. In this way, since the electric wire accommodating recess 746 has the bent portion 748, as compared with a case where the electric wire accommodating recess 746 is formed of only the straight portions 747, even if an unintended external force is applied to the voltage wire 720 drawn out from the housing 740, the voltage wire 720 can resist the external force due to the friction between the bent portion 748 and the voltage wire 720. Thus, a large external force is hardly applied to the contact point between the voltage detection terminal 710 and the voltage wire 720.

The location in each of the pair of straight portions 747 near the boundary with the bent portion 748 is provided with a narrow recess 751, which is a recess having a width (interval in the left-right direction) narrower than that of the straight portion 747. The width of the narrow recess 751 is slightly smaller than the outer diameter of the voltage wire 720. Thus, the voltage wire 720 is pinched while being pressed in the left-right direction. By pinching the voltage wire 720 between the pair of narrow recesses 751, even if an unintended external force is applied to the voltage wire 720 drawn out from the housing 740, it is possible to resist the external force by the friction between the narrow recesses 751 and the voltage wire 720. Thus, a large external force is hardly applied to the contact point between the voltage detection terminal 710 and the voltage wire 720. Further, it is possible to strongly prevent the voltage wire 720 from being wired in a manner coming out of the bent portion 748 and straddling the bent portion 748 (that is, shortcutting the bent portion 748).

As illustrated in FIG. 41, the locations on the bottom face 741a of the cover mounting recess 741 in the upper face of the housing 740 at which the pair of electric wire holding pieces 735 of the cover 730 are arranged are formed with a pair of electric wire holding piece recesses 752 extending in the left-right direction at an interval in the front-rear direction, so as to correspond to the pair of electric wire holding pieces 735. The pair of electric wire holding piece recesses 752 sandwich a bending vertex 748a (see FIG. 41) of the bent portion 748 of the electric wire accommodating recess 746 in the front-rear direction. The bottom faces of the pair of electric wire holding piece recesses 752 are located above the bottom face of the electric wire accommodating recess 746.

The electric wire holding piece recesses 752 extend in the left-right direction from the right end edge of the upper face of the housing 740 to the right inner wall 741b (see FIG. 41) of the cover mounting recess 741 across the electric wire accommodating recess 746. Each of the locations on the right inner wall 741b of the cover mounting recess 741 where the pair of electric wire holding piece recesses 752 are connected is formed with a storage hole 753 recessed rightward (see FIG. 41). When the cover 730 is mounted to the housing 740, the extension ends (that is, the right end) of the pair of electric wire holding pieces 735 of the cover 730 are to be inserted and stored in the pair of storage holes 753.

The same position in the front-rear direction as the location where the locking portion of the cover 730 is disposed on the bottom face 741a of the cover mounting recess 741 on the lower face side of the housing 740 is formed with a temporary locked portion and a final locked portion, which are recesses recessed upward, in this order at an interval from the left to the right. The members constituting the voltage detection unit 705 have been described above.

Next, a procedure for assembling the voltage detection terminal 710 and the cover 730 to the housing 740 will be described. First, the voltage detection terminal 710, which is connected to the voltage wire 720 in advance by a method such as ultrasonic joining or welding, is accommodated in the terminal accommodating recess of the housing 740. Thus, the voltage detection terminal 710 is fitted into the terminal accommodating recess of the housing 740 from above such that the projection 713 enters the locking groove 745 and the one end (contact point) of the voltage wire 720 enters the through hole 744. In a state in which the voltage detection terminal 710 is completely accommodated in the housing 740, the upper and lower faces of the tip portion 712a of the voltage detection terminal 710 are exposed by the notch 743.

Next, the voltage wire 720 extending from the voltage detection terminal 710 accommodated in the housing 740 is accommodated in the electric wire accommodating recess 746 (the pair of straight portions 747+the bent portion 748) of the housing 740. Thus, the voltage wire 720 is fitted from above along the electric wire accommodating recess 746 constituted by the pair of straight portions 747 and the bent portion 748. At this time, a pair of portions of the voltage wire 720 positioned at the upper portions of the pair of narrow recesses 751 are pushed downward, so that the pair of portions of the voltage wire 720 are accommodated in the pair of narrow recesses 751. In a state in which the voltage wire 720 is completely accommodated in the housing 740, the voltage wire 720 extends rearward from the electric wire outlet 749 to the outside of the housing 740.

Next, the cover 730 is mounted to the housing 740. Thus, the cover 730 is mounted in the cover mounting recess 741 of the housing 740 from the left side, such that the facing portion 731 of the cover 730 sandwiches the cover mounting recesses 741 in the upper and lower faces of the housing 740 in the upper-lower direction, the extension portion 732 of the cover 730 covers the cover mounting recesses 741 in the upper face of the housing 740, and the pair of electric wire holding pieces 735 of the cover 730 are accommodated in the pair of electric wire holding piece recesses 752 of the housing 740.

In the process of mounting the cover 730 to the housing 740, the locking portion of the cover 730 first slides on the housing 740 to enter the inside of the temporary locked portion and engage with the temporary locked portion, and is pressed against the right side face of the temporary locked portion. Accordingly, the cover 730 is locked to the housing 740 at the temporary locking position, and the cover 730 is completely mounted to the housing 740 to obtain the voltage detection unit 705. As described later, the voltage detection unit 705 obtained after the cover 730 is completely mounted to the housing 740 (in a state in which the cover 730 is locked at the temporary locking position) is to be used for assembling the conductive module 703 (see FIG. 38).

In a state in which the cover 730 is locked at the temporary locking position, the facing portion 731 of the cover 730 (more specifically, the pair of upper and lower extension portions 733b) does not cover the tip portion 712a of the voltage detection terminal 710. Thus, the upper and lower faces of the tip portion 712a of the voltage detection terminal 710 are also exposed by the notch 743.

Further, the pair of electric wire holding pieces 735 of the cover 730 are arranged above the opening of a part of the straight portions 747 and the bent portion 748 of the electric wire accommodating recess 746. This prevents the voltage wire 720 from coming out of the electric wire accommodating recess 746. Further, the extension ends of the pair of electric wire holding pieces 735 are received in the pair of storage holes 753. Accordingly, it is possible to prevent unintended deformation such as misalignment of the pair of electric wire holding pieces 735 or separation of the pair of electric wire holding pieces 735 from the electric wire accommodating recess 746. Further, the extension portion 732 of the cover 730 is disposed above the opening of the bending vertex 748a of the bent portion 748 of the electric wire accommodating recess 746. Accordingly, it is possible to strongly prevent the voltage wire 720 from being wired in a manner coming out of the electric wire accommodating recess 746 and straddling the bent portion 748 (that is, shortcutting the bent portion 748). In this way, it is possible to reduce the possibility of occurrence of a specific failure caused by the voltage wire 720 coming out of the bent portion 748 of the electric wire accommodating recess 746.

When the cover 730 is further pushed leftward relative to the housing 740 in a state in which the cover 730 is locked at the temporary locking position, the extension ends of the pair of electric wire holding pieces 735 of the cover 730 further enter and are stored in the pair of storage holes 753. Simultaneously, the locking portion of the cover 730 goes beyond the temporary locked portion and then enters the inside of the final locked portion and is engaged with the final locked portion. Thus, the cover 730 is locked to the housing 740 at the final locking position.

In a state in which the cover 730 is locked at the final locking position, the entire cover mounting recess 741 is covered with the cover 730, and thus the entire electric wire accommodating recess 746 is covered with the extension portion 732 of the cover 730. This prevents the voltage wire 720 from coming out of the electric wire accommodating recess 746. Further, the facing portion 731 of the cover 730 (more specifically, the pair of upper and lower extension portions 733b) covers the upper and lower faces of the tip portion 712a of the voltage detection terminal 710. Accordingly, the entire voltage detection terminal 710 is covered with the facing portion 731 of the cover 730, so that the voltage detection terminal 710 can be reliably protected.

Hereinafter, the specific configuration in a case where the facing unit 706 according to the seventh embodiment is a temperature detection unit will be described. As illustrated in FIG. 38, the facing unit 706 includes a housing 760, a temperature detection sensor 707 accommodated in the housing 760, and a temperature wire 707b connected to the temperature detection sensor 707. The temperature detection sensor 707 is accommodated in a sensor accommodating recess 761 formed in the housing 760 (see FIG. 42), which is to be described later. Hereinafter, the members constituting the facing unit 706 as the temperature detection unit will be described in order.

First, the housing 760 will be described. The housing 760 is a resin molded article and has a substantially thin rectangular board shape extending in the front-rear direction as illustrated in FIG. 38, etc. The left end face of the housing 760 is formed with a recess 706a recessed rightward and extending in the front-rear direction. The flange 704b of the conductive board 704 is to be fitted into the recess 706a (see FIG. 39).

Figure 42:
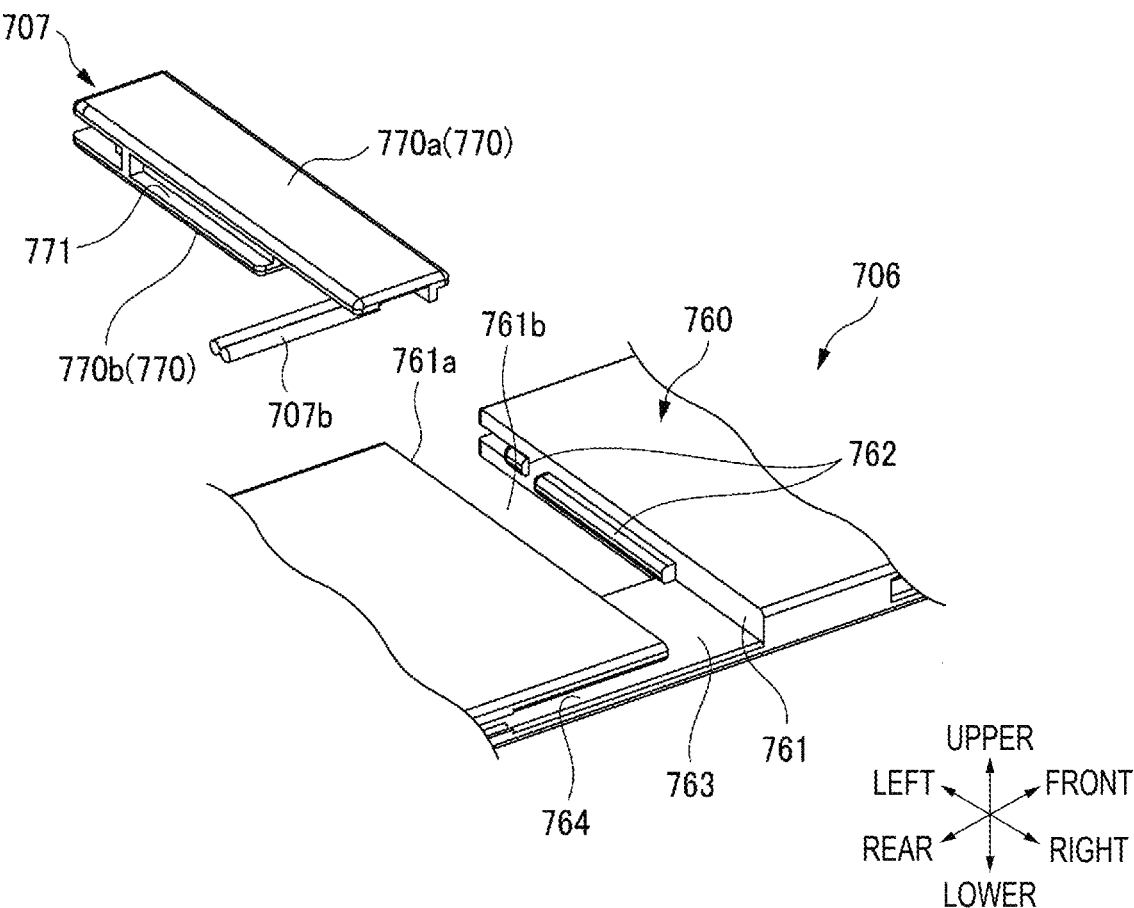
FIG. 42 is a perspective view illustrating the housing and the temperature detection sensor.

The central portion in the front-rear direction of the left end face of the housing 760 is formed with a sensor accommodating recess 761, which is recessed rightward in a rectangular parallelepiped shape extending over the entire area of the housing 760 in the left-right direction, so as to correspond to the overall shape of the casing 770 of the temperature detection sensor 707 (see FIG. 42). The sensor accommodating recess 761 penetrates in the upper-lower direction. The sensor accommodating recess 761 includes an opening 761b that opens upward and downward (see FIG. 42).

The housing 760 is provided with a coupling portion 763 that couples the housing 760 divided into front and rear portions by the sensor accommodating recess 761, at the lower portion of the right region of the sensor accommodating recess 761. In other words, the housing 760 divided into front and rear portions by the sensor accommodating recess 761 is integrated by the coupling portion 763 (that is, the housing 760 is substantially not divided into front and rear portions).

The pair of inner wall faces facing each other in the left-right direction of the sensor accommodating recess 761 are formed with a plurality of projecting strips 762 projecting inward in the front-rear direction (toward each other) and extending in the left-right direction (see FIG. 42). The projecting strips 762 are to be inserted into grooves (reference sign omitted) of the temperature detection sensor 707.

Figure 43:
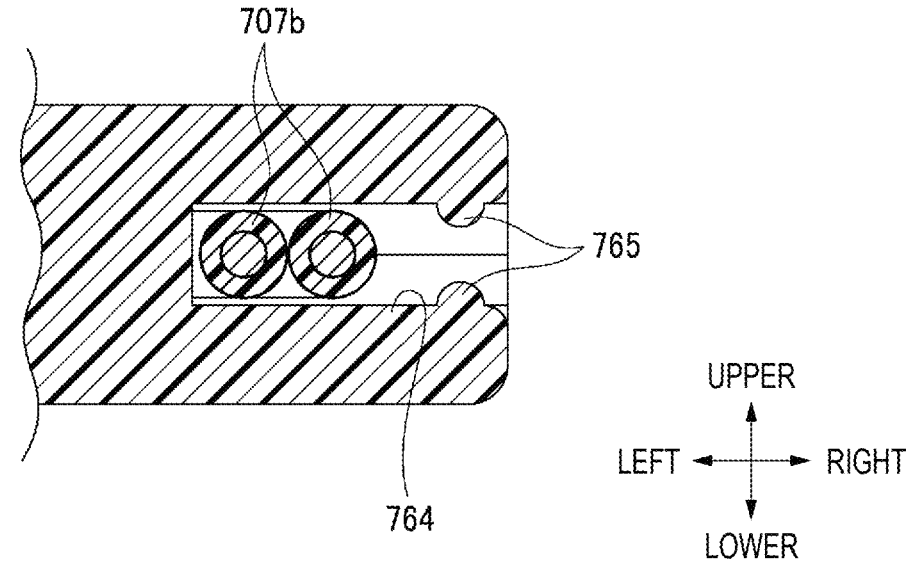
FIG. 43 is a cross-sectional view illustrating a holding structure of the temperature wire in the housing.

The right end face of the housing 760 behind the sensor accommodating recess 761 is formed with an electric wire accommodating recess 764 recessed leftward and extends in the front-rear direction (see FIGS. 42 and 43). The pair of inner wall faces facing each other in the upper-lower direction of the electric wire accommodating recess 764 are formed with holding ribs 765 projecting inward in the upper-lower direction (toward each other) and extending in the front-rear direction (see FIG. 43).

Next, the temperature detection sensor 707 will be described. The temperature detection sensor 707 is typically a thermistor. The temperature detection sensor 707 has a rectangular parallelepiped casing 770 extending in the left-right direction, a sensor element (not illustrated) is accommodated inside the casing 770, and a temperature wire 707b connected to the sensor element extends rearward from the right end of the casing 770. The temperature detection sensor 707 is accommodated in the sensor accommodating recess 761 of the housing 760 from the left. The extension end of the temperature wire 707b is to be connected to a temperature measuring device (not illustrated) outside the power storage device 701.

The lower wall 770b of the casing 770 is formed shorter than the upper wall 770a in the left-right direction, so as to correspond to the coupling portion 763. When the temperature detection sensor 707 is mounted to the sensor accommodating recess 761, the right end face of the lower wall 770b and the left end face of the coupling portion 763 are to abut against each other.

The pair of front and rear end faces extending in the left-right direction of the casing 770 are formed with a pair of grooves 771 penetrating in the left-right direction, so as to correspond to the pair of projecting strips 762 of the sensor accommodating recess 761 (see FIG. 42).

The thickness in the upper-lower direction of the casing 770 is equal to the plate thickness of the substantially thin rectangular board-shaped housing 760. Accordingly, when the temperature detection sensor 707 is mounted to the housing 760, the face of the housing 760 is flush with the face of the temperature detection sensor 707 (see FIG. 38). The members constituting the facing unit 706 as the temperature detection unit have been described above.

Next, a procedure for assembling the temperature detection sensor 707 to the housing 760 will be described. In order to mount the temperature detection sensor 707 to the housing 760, first, the temperature wire 707b is routed in the electric wire accommodating recess 764 of the housing 760. Then, the temperature detection sensor 707 is inserted into the sensor accommodating recess 761 of the housing 760 from the left side, so that the pair of projecting strips 762 provided in the sensor accommodating recess 761 are inserted into the pair of grooves provided in the casing 770 of the temperature detection sensor 707.

In a state in which the temperature detection sensor 707 is completely mounted to the housing 760, the temperature wire 707b is restricted from popping out rightward by the holding ribs 765 of the electric wire accommodating recess 764. The upper and lower faces (flat faces) of the casing 770 are exposed to the outside from the upper and lower openings 761b of the sensor accommodating recess 761 (see FIG. 38).

Next, the assembly of the conductive module 703 and the power storage device 701 (see FIG. 38) will be described. As described above, the voltage detection unit 705 obtained after the cover 730 is completely mounted to the housing 740 (in a state in which the cover 730 is locked at the temporary locking position) is used for assembling the conductive module 703 (see FIG. 38). Specifically, first, the flange 704a of the conductive board 704 is fitted into the recess 705a of the voltage detection unit 705, so that the voltage detection unit 705 is coupled to the left side of the conductive board 704.

In this state, a part of the flange 704a of the conductive board 704 overlaps the lower side of the tip portion 712a of the voltage detection terminal 710 (see FIG. 40), and the upper face of the tip portion 712a of the voltage detection terminal 710 is exposed upward and the lower face of a part of the flange 704a of the conductive board 704 is exposed downward due to the presence of the notch 743 of the housing 740.

Next, the upper face of the tip portion 712a of the voltage detection terminal 710 exposed upward and the lower face of a part of the flange 704a of the conductive board 704 exposed downward are used to fix the tip portion 712a of the voltage detection terminal 710 and the part of the flange 704a of the conductive board 704 by a method such as ultrasonic joining or welding. Thereafter, the cover 730 is moved from the temporary locking position to the final locking position, and the voltage detection unit 705 is completely assembled to the conductive board 704.

Next, the flange 704b of the conductive board 704 is fitted into the recess 706a of the facing unit 706 and the left end recess (reference sign omitted) of the temperature detection sensor 707, so that the facing unit 706 is coupled to the right side of the conductive board 704 to which the voltage detection unit 705 is assembled (see FIG. 39, etc.). Thus, the conductive module 703 is completely assembled.

The conductive module 703 thus obtained is used for assembling the power storage device 701 illustrated in FIG. 38. Specifically, the power storage modules 702 and the conductive modules 703 are alternately stacked in the upper-lower direction, and the stacked body is fixed by a predetermined fitting or the like, thereby obtaining the power storage device 701.

According to the seventh embodiment, the substantially central portion in the front-rear direction of the housing 760 is provided with the sensor accommodating recess 761 accommodating the temperature detection sensor 707. Accordingly, the temperature detection sensor 707 is to be disposed closer to the conductive board 704 compared to the related art. That is, according to the seventh embodiment, since the temperature detection sensor 707 is closer to the center portion of the heat source, that is, the power storage modules 702 (the conductive board 704), the temperature measurement performance is excellent compared to the related art.

Furthermore, according to the seventh embodiment, since the electric wire accommodating recess 764 is provided on the right end face of the housing 760 in a manner extending in the front-rear direction, it is possible to prevent an increase in the size of the facing unit 706 and the power storage device 701 in the left-right direction as compared with a case where the temperature wire 707b extends outward from the left-right direction.

The invention embodied as the seventh embodiment is not limited to the seventh embodiment, and various modifications can be adopted within the scope of the invention. For example, the present invention is not limited to the seventh embodiment, and modifications, improvements, and the like can be made appropriately. In addition, materials, shapes, sizes, numbers, arrangement positions, and the like of components in the seventh embodiment are freely selected and are not limited as long as the present invention can be implemented.

Here, features of the embodiment of the temperature detection unit according to the present invention described above are briefly summarized and listed in the following [7-1] to [7-3].

[7-1]

A temperature detection unit (facing unit 706) includes:

a long board-shaped housing (760) having one side face in a short direction provided with a recess (706a) configured to be fitted with a side edge (flange 704b) of a conductive board (704) disposed between a plurality of stacked power storage modules (702); and a temperature detection sensor (707) mounted on the housing (760) and configured to measure a temperature of the power storage modules (702), in which a substantially central portion in a longitudinal direction of the housing (760) is provided with a sensor accommodating recess (761) accommodating the temperature detection sensor (707).

According to the configuration of the above [7-1], the substantially central portion in the longitudinal direction of the housing is provided with the sensor accommodating recess accommodating the temperature detection sensor. Accordingly, the temperature detection sensor is to be disposed closer to the conductive board compared to the related art. That is, according to the above configuration, since the temperature detection sensor is closer to the center portion of the heat source, that is, the power storage modules (the conductive board), the temperature measurement performance is excellent compared to the related art.

[7-2]

The temperature detection unit (facing unit 706) according to the above [7-1], in which the other side face in the short direction of the housing (760) is provided with an electric wire accommodating recess (764) extending in the longitudinal direction and configured to allow the temperature wire (707b) connected to the temperature detection sensor (707) to extend toward the outside.

According to the configuration of the above [7-2], the electric wire accommodating recess extending in the longitudinal direction and allowing the temperature wire connected to the temperature detection sensor to extend toward the outside is provided in the other side face in the short direction of the housing. Accordingly, it is possible to prevent an increase in the size of the temperature detection unit in the short direction as compared with a case where the temperature wire extends from the short direction toward the outside.

[7-3]

The temperature detection unit (facing unit 706) according to the above [7-2], in which the electric wire accommodating recess (764) is provided with a holding rib (765) configured to hold the temperature wire (707b).

According to the configuration of the above [7-3], since the electric wire accommodating recess is provided with the holding rib, it is possible to restrict the temperature wire from popping out of the electric wire accommodating recess.

Eighth Embodiment

Figure 44:
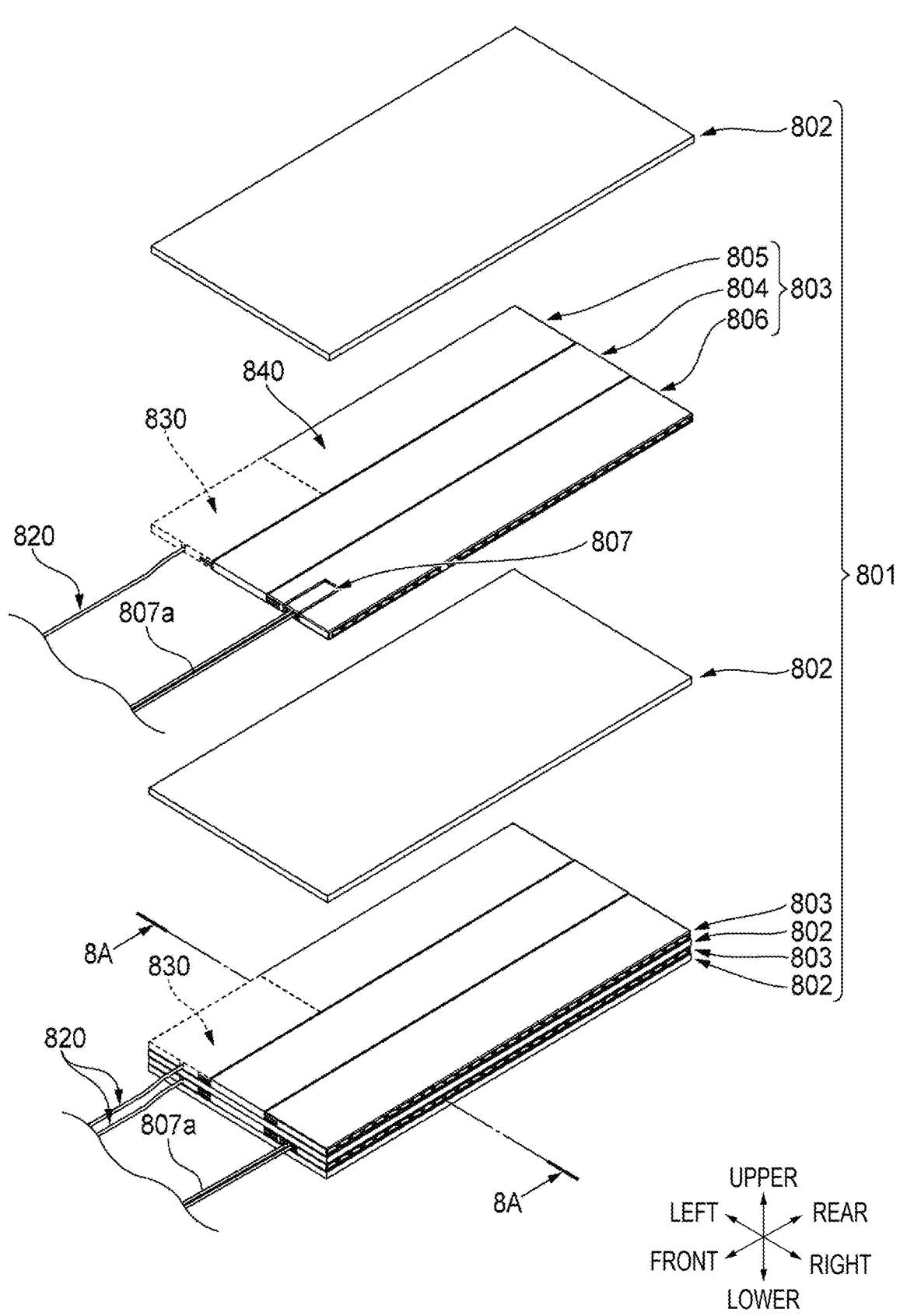
FIG. 44 is a partially exploded perspective view illustrating a stacked power storage device including a voltage detection unit according to an eighth embodiment.

The invention embodied as an eighth embodiment relates to a voltage detection unit and a power storage device configured such that a voltage detection terminal to be conductively connected to a detection target is accommodated in a board-shaped housing. Hereinafter, a voltage detection unit 805 and a power storage device 801 according to the eighth embodiment will be described with reference to FIGS. 44 to 55. Hereinafter, for convenience of description, "front", "rear", "upper", "lower", "left", "right", a "front-rear direction", a "left-right direction", and an "upper-lower direction" are defined as illustrated in FIG. 44. The "front-rear direction", the "left-right direction", and the "upper-lower direction" are orthogonal to one another.

The voltage detection unit 805 is typically used in a stacked power storage device 801 illustrated in FIG. 44. The power storage device 801 is formed by alternately stacking, in the upper-lower direction, thin rectangular board-shaped power storage modules 802 capable of charging and discharging and rectangular thin board-shaped conductive modules 803 capable of electrically connecting adjacent power storage modules 802. In the power storage device 801, a plurality of power storage modules 802 are electrically connected in series via the conductive modules 803. Each power storage module 802 has a structure in which a plurality of battery cells (not illustrated) are incorporated, and the power storage modules 802 as a whole function as one battery capable of charging and discharging.

Figure 45:
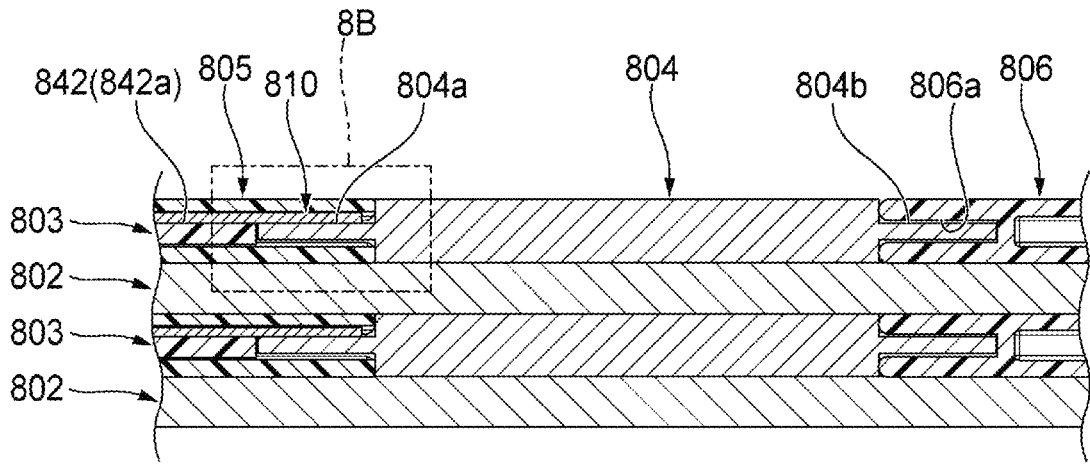
FIG. 45 is a cross-sectional view taken along a line 8A-8A in FIG. 44.
Figure 45:
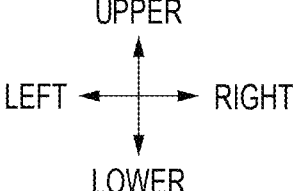
Figure 46:
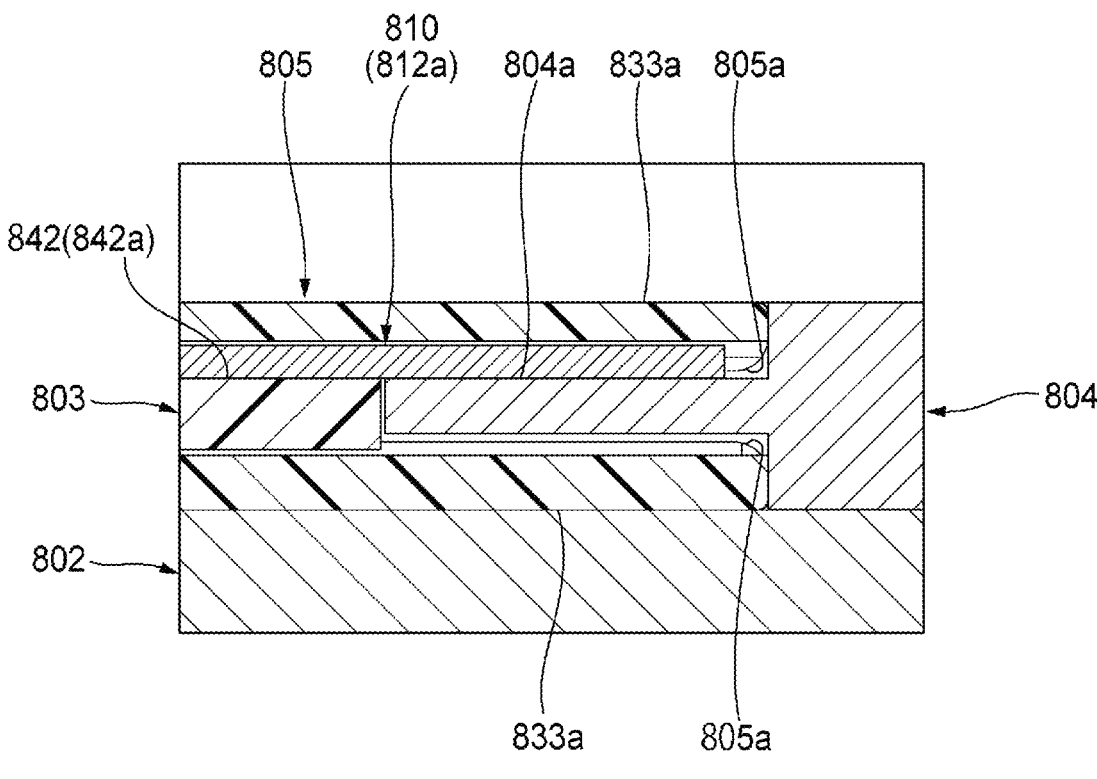
FIG. 46 is an enlarged view of a portion 8B in FIG. 45.
Figure 46:
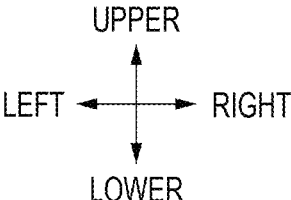

As illustrated in FIG. 44, each conductive module 803 is formed to have a rectangular thin board shape as a whole by a rectangular thin board-shaped conductive board 804 (the conductive board 804 also functions as a heat sink as described later), the rectangular thin board-shaped voltage detection unit 805 coupled to the left side of the conductive board 804, and a rectangular thin board-shaped facing unit 806 coupled to the right side of the conductive board 804. As illustrated in FIGS. 44 to 46 (in particular, see FIG. 45), the conductive board 804 and the voltage detection unit 805 are coupled to each other by fitting a flange 804a into a recess 805a. The flange 804a is provided on the left end face of the conductive board 804 and extends in the front-rear direction. The recess 805a is provided on the right end face of the voltage detection unit 805 and extends in the front-rear direction. The conductive board 804 and the facing unit 806 are coupled to each other by fitting a flange 804b into a recess 806a. The flange 804b is provided on the right end face of the conductive board 804 and extends in the front-rear direction. The recess 806a is provided on the left end face of the facing unit 806 and extends in the front-rear direction.

In each of the conductive modules 803 positioned between the power storage modules 802 adjacent to each other in the upper-lower direction, the conductive board 804 is in direct contact with the upper and lower power storage modules 802 as illustrated in FIG. 45. Thus, the conductive board 804 functions to perform conduction between a lower face of the upper power storage module 802 and an upper face of the lower power storage module 802, and functions as a heat sink that releases heat generated from the upper and lower power storage modules 802 to the outside.

In each of the conductive modules 803 located between the power storage modules 802 adjacent to each other in the upper-lower direction, the voltage detection unit 805 includes a voltage detection terminal 810 (see FIG. 45 and the like) in contact with the conductive board 804, which is to be described later. The voltage detection unit 805 has a function of outputting a signal indicating a voltage between the upper and lower power storage modules 802 (specifically, the potential of the upper face (output face) of the lower power storage module 802 relative to the zero potential as a reference) via an electric wire 820 (see FIG. 44, etc.) connected to the voltage detection terminal 810. The voltage detection unit 805 is disposed to the left of the conductive board 804 in FIGS. 44 to 46, but a voltage detection unit having the same function as the voltage detection unit 805 may be disposed to the right of the conductive board 804. In this case, a voltage detection unit obtained by reversing the entire configuration of the voltage detection unit 805 in the left-right direction (that is, a mirror component of the voltage detection unit 805) is used as the voltage detection unit having the same function as that of the voltage detection unit 805.

Any one of a voltage detection unit, a dummy unit, and a temperature detection unit, which will be described later, is applied as the facing unit 806 to each of the conductive modules 803 positioned between the power storage modules 802 adjacent to each other in the upper-lower direction, according to the specification of the power storage device 801.

If the facing unit 806 is a voltage detection unit, a voltage detection unit obtained by reversing the entire configuration of the voltage detection unit 805 in the left-right direction (that is, a mirror component of the voltage detection unit 805 described above) is used as the facing unit 806. In this case, the voltage detection unit 805 is disposed to the left of the conductive board 804, and the mirror component of the voltage detection unit 805 is disposed to the right of the conductive board 804. The facing unit 806 (a mirror component of the voltage detection unit 805) has the same function as that of the voltage detection unit 805.

If the facing unit 806 is a dummy unit, a simple resin board having a recess 806a (see FIG. 45) extending in the front-rear direction is used as the facing unit 806. In this case, the facing unit 806 performs only the function of filling the gap between the upper and lower power storage modules 802.

If the facing unit 806 is a temperature detection unit, the facing unit 806 has a structure in which a temperature sensor 807 (thermistor) is incorporated in a resin board used as a dummy unit as illustrated in FIG. 44. In this case, the facing unit 806 has a function of outputting a signal indicating the temperature of the upper and lower power storage modules 802 via an electric wire 807a (see FIG. 44) connected to the temperature sensor 807.

Figure 47:
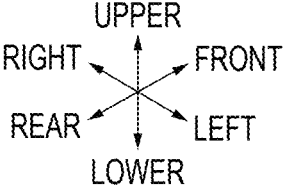
FIG. 47 is an exploded perspective view of the voltage detection unit illustrated in FIG. 44.

Hereinafter, a specific configuration of the voltage detection unit 805 according to the eighth embodiment will be described with reference to FIGS. 47 to 55. As illustrated in FIG. 47, the voltage detection unit 805 includes a housing 840, a voltage detection terminal 810 accommodated in the housing 840, an electric wire 820 connected to the voltage detection terminal 810 and accommodated in the housing 840, and a cover 830 mounted to the housing 840.

The voltage detection terminal 810 is accommodated in a terminal accommodating recess 842 (see FIG. 47) formed in the housing 840, which is to be described later. The electric wire 820 is accommodated in an electric wire accommodating recess 846 (see FIG. 47) formed in the housing 840, which is to be described later. The cover 830 is mounted in a cover mounting recess 841 (see FIG. 47) formed in the housing 840, which is to be described later. Hereinafter, the members constituting the voltage detection unit 805 will be described in order.

First, the voltage detection terminal 810 will be described. The voltage detection terminal 810 made of metal is formed by one metal board being subjected to processing such as a pressing process. The voltage detection terminal 810 is accommodated in the terminal accommodating recess 842 of the housing 840 from above. As illustrated in FIG. 47, the voltage detection terminal 810 includes a rectangular flat plate-shaped first portion 811 extending in the front-rear direction and a rectangular flat plate-shaped second portion 812 extending rightward from the rear end of the first portion 811, and has a substantially L-shaped flat plate shape as a whole when viewed in the upper-lower direction.

Figure 49:
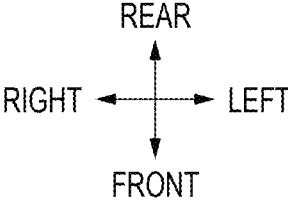
FIG. 49 is a bottom view illustrating the cover and the housing accommodating the voltage detection terminal and the electric wire.

One end of the electric wire 820 is fixed to the lower face of the tip portion 811*a* (that is, the end closer to the front end) of the first portion 811 so as to be electrically connected thereto (see FIG. 49). The other end of the electric wire 820 is to be connected to a voltage measuring device (not illustrated) outside the power storage device 801. A part of the flange 804*a* of the conductive board 804 is to be fixed to the lower face of a tip portion 812*a* of the second portion 812 (that is, the end closer to the right end) by a method such as ultrasonic joining or welding (see FIG. 46).

The rear end edge of the second portion 812 is formed with a projection 813 projecting rearward. When the voltage detection terminal 810 is accommodated in the housing 840, the projection 813 is to be locked in a locking groove 845 (see FIG. 48) formed in the housing 840.

Next, the cover 830 will be described. The cover 830 is a resin molded article and is mounted to the cover mounting recess 841 of the housing 840 from the left. The cover 830 includes a facing portion 831 and an extension portion 832 extending forward from the facing portion 831. The facing portion 831 mainly functions to cover and protect the voltage detection terminal 810, and the extension portion 832 mainly functions to cover and protect the electric wire 820.

The facing portion 831 includes a pair of flat plates 833 and facing each other at an interval in the upper-lower direction, and a coupling portion 834 that couples the left end edges of the pair of flat plates 833 extending in the front-rear direction in the upper-lower direction over the entire region in the front-rear direction. The facing portion 831 has a substantially U-shape opening rightward when viewed in the front-rear direction. The right end edge of each flat plate 833 has a stepped shape inclined in a direction of moving leftward toward the front. The extension portion 832 extends forward from the front end edge of the upper flat plate 833 of the pair of flat plates 833 constituting the facing portion 831 in a flush and continuous manner, and has a substantially rectangular flat plate shape. In this example, the right end edge constituted by the upper flat plate 833 and the extension portion 832 (an upper right end edge 830*b* of the cover 830) has four end faces a1 to a4 facing the right (extending in the front-rear direction) at different positions in the left-right direction (see FIG. 48), and the right end edge constituted by the lower flat plate 833 (a lower right end edge 830*b* of the cover 830) has five end faces b1 to b5 facing the right (extending in the front-rear direction) at different positions in the left-right direction (see FIG. 49).

The extension portion 832 is integrally formed with two electric wire holding pieces 835 extending in the left-right direction, which are arranged at an interval in the front-rear direction. As can be understood from FIG. 49, each electric wire holding piece 835 protrudes downward from the lower face of the extension portion 832 and extends in the left-right direction, so as to project further rightward from the right end edge of the extension portion 832. When the cover 830 is mounted to the housing 840, the electric wire holding pieces 835 hold the electric wire 820 accommodated in the housing 840. Further, the front end of the extension portion 832 is formed with a wall-shaped push wall 858 extending downward from the front end edge of the extension portion 832 and extending in the left-right direction.

The lower flat plate 833 of the pair of flat plates 833 constituting the facing portion 831 is formed with a locking portion 836 projecting upward toward the upper flat plate 833 at a predetermined location (see FIGS. 50 to 55). The locking portion 836 functions to lock the cover 830 at a first temporary locking position (see FIG. 50), a second temporary locking position (see FIG. 52), and the final locking position (see FIG. 54) in cooperation with a first temporary locked portion 855, a second temporary locked portion 856, and a final locked portion 857 provided in the housing 840, which is to be described later.

Next, the housing 840 will be described. The housing 840 is a resin molded article and has a substantially thin rectangular board shape extending in the front-rear direction as illustrated in FIG. 44, etc. The right end face of the housing 840 is formed with a recess 805*a* recessed leftward and extending in the front-rear direction. The flange 804*a* of the conductive board 804 is to be fitted into the recess 805*a* (see FIG. 45).

Figure 48:
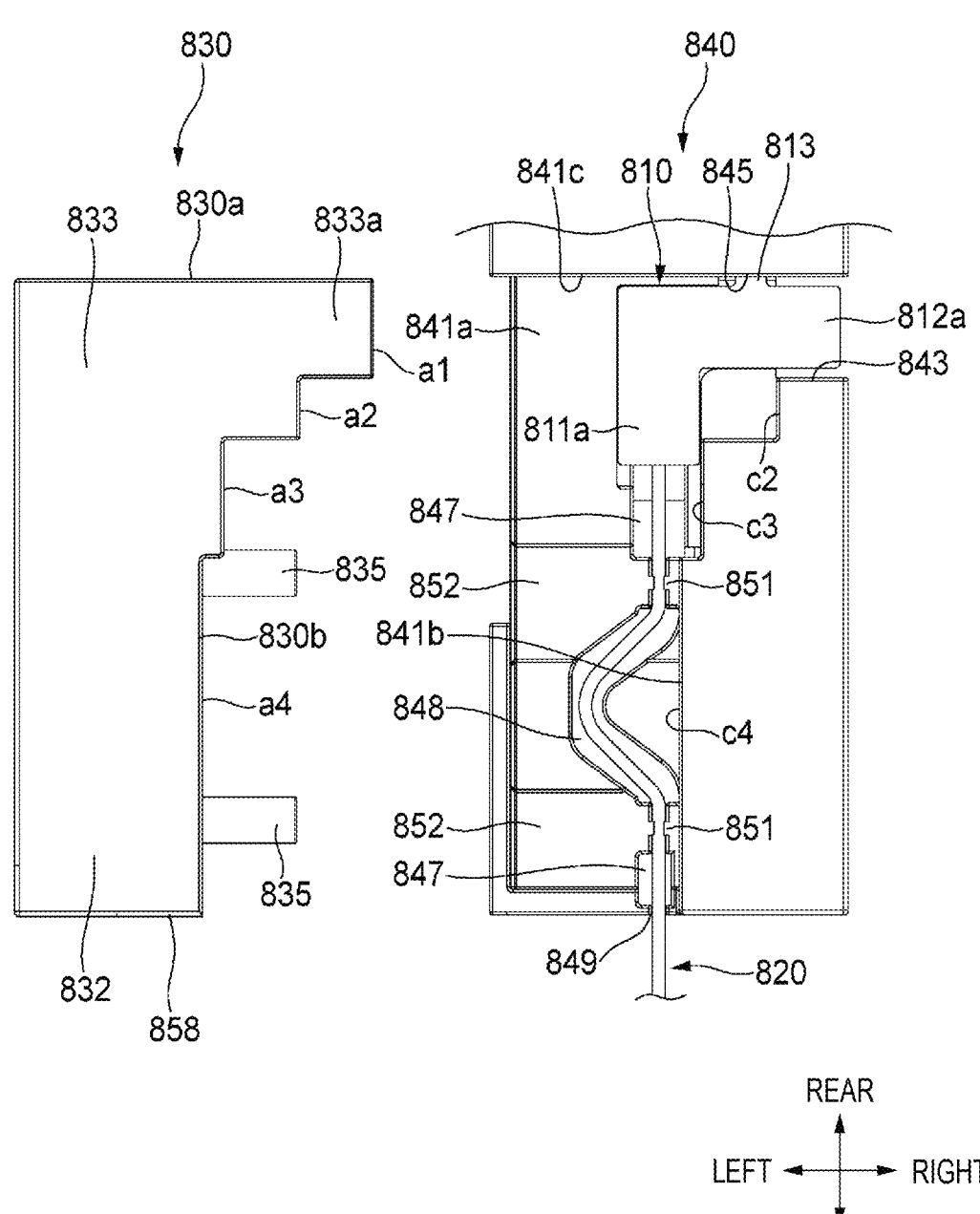
FIG. 48 is a top view illustrating the cover and the housing accommodating the voltage detection terminal and the electric wire.

The locations on the upper and lower faces of the housing 840 where the cover 830 is mounted are each formed with the cover mounting recess 841 recessed into a shape corresponding to the entire shape of the cover 830 (see FIGS. 47 to 49). Among right inner walls 841*b* defining the right ends of the pair of upper and lower cover mounting recesses 841, the upper right inner wall 841*b* has three end faces c2 to c4 facing the left (extending in the front-rear direction) at different positions in the left-right direction, so as to correspond to the three end faces a2 to a4 of the upper right end edge 830*b* of the cover 830 (see FIG. 48); and the lower right inner wall 841*b* has four end faces d2 to d5 facing the left (extending in the front-rear direction) at different positions in the left-right direction, so as to correspond to the four end faces b2 to b5 of the lower right end edge 830*b* of the cover 830 (see FIG. 49). The recess depth (depth in the upper-lower direction) of the cover mounting recess 841 is equal to the plate thickness of the resin material constituting the cover 830 (the facing portion 831+the extension portion 832). Thus, when the cover 830 is mounted to the housing 840, the face of the housing 840 is flush with the face of the cover 830 (see FIGS. 44 and 54).

The location where the voltage detection terminal 810 is accommodated on a bottom face 841*a* of the cover mounting recess 841 on the upper side of the housing 840 is formed with the terminal accommodating recess 842 further recessed into a shape corresponding to the entire shape of the voltage detection terminal 810 (see FIG. 47). The recess depth (depth in the upper-lower direction) of the terminal accommodating recess 842 is equal to the plate thickness of the voltage detection terminal 810. Thus, when the voltage detection terminal 810 is mounted to the housing 840, the upper face of the voltage detection terminal 810 is flush with the bottom face 841*a* of the cover mounting recess 841 (see FIGS. 51,53, and 55).

The position in the front-rear direction in the right end edge of the housing 840 where the tip portion 812*a* of the voltage detection terminal 810 is disposed is formed with a notch 843 recessed leftward into a substantially rectangular shape when viewed in the upper-lower direction. The recess 805*a* extending in the front-rear direction in the right end face of the housing 840 is divided by the notch 843. When the voltage detection terminal 810 is accommodated in the housing 840, the upper and lower faces of the tip portion 812*a* of the voltage detection terminal 810 are exposed by the notch 843 (see FIG. 53).

The location in the terminal accommodating recess 842 where the tip portion 811*a* of the voltage detection terminal 810 is disposed is formed with a through hole 844 extending in the front-rear direction and penetrating in the upper-lower direction (see FIG. 47, etc.). When the voltage detection terminal 810 is accommodated in the housing 840, the one end (contact point) of the electric wire 820 connected to the voltage detection terminal 810 enters the through hole 844 (see FIG. 49). In other words, the through hole 844 functions as a clearance for avoiding interference between the bottom face 842*a* of the terminal accommodating recess 842 and the one end of the electric wire 820.

The inner wall face of the location in the terminal accommodating recess 842 where the projection 813 (see FIG. 47) of the voltage detection terminal 810 is disposed is formed with a locking groove 845 recessed rearward and communicating with the recess 805*a*, so as to correspond to the projection 813 (see FIG. 48).

The location on the bottom face 841*a* of the cover mounting recess 841 on the upper side of the housing 840 where the electric wire 820 is accommodated is formed with an electric wire accommodating recess 846 having a shape corresponding to the wiring form of the electric wire 820 when the electric wire 820 is accommodated (see FIG. 47). The electric wire accommodating recess 846 is a continuous groove including a pair of straight portions 847 extending linearly in the front-rear direction and arranged at an interval in the front-rear direction, and a bent portion 848 connecting the pair of straight portions 847 and extending while being bent to project leftward. The rear end of the rear straight portion 847 of the pair of straight portions 847 communicates with the terminal accommodating recess 842, and the front end of the front straight portion 847 of the pair of straight portions 847 constitutes an electric wire outlet 849 from which the electric wire 820 extends from the front end edge of the housing 840. In this way, since the electric wire accommodating recess 846 has the bent portion 848, as compared with a case where the electric wire accommodating recess 846 is formed of only the straight portions 847, even if an unintended external force is applied to the electric wire 820 drawn out from the housing 840, the electric wire 820 can resist the external force due to the friction between the bent portion 848 and the electric wire 820. Thus, a large external force is hardly applied to the contact point between the voltage detection terminal 810 and the electric wire 820.

The location in each of the pair of straight portions 847 near the boundary with the bent portion 848 is provided with a narrow recess 851, which is a recess having a width (interval in the left-right direction) narrower than that of the straight portion 847. The width of the narrow recess 851 is slightly smaller than the outer diameter of the electric wire 820. Thus, the electric wire 820 is pinched while being pressed in the left-right direction. By pinching the electric wire 820 between the pair of narrow recesses 851, even if an unintended external force is applied to the electric wire 820 drawn out from the housing 840, it is possible to resist the external force by friction between the narrow recesses 851 and the electric wire 820. Thus, a large external force is hardly applied to the contact point between the voltage detection terminal 810 and the electric wire 820.

As illustrated in FIG. 47, the locations on the bottom face 841*a* of the cover mounting recess 841 on the upper side of the housing 840 at which the pair of electric wire holding pieces 835 of the cover 830 are arranged are formed with a pair of electric wire holding piece recesses 852 extending in the left-right direction at an interval in the front-rear direction, so as to correspond to the pair of electric wire holding pieces 835. The pair of electric wire holding piece recesses 852 sandwich the bending vertex of the bent portion 848 of the electric wire accommodating recess 846 in the front-rear direction.

The electric wire holding piece recesses 852 extend in the left-right direction from the left end edge of the upper face of the housing 840 to the right inner wall 841*b* (see FIG. 47) of the upper cover mounting recess 841 across the electric wire accommodating recess 846. Each of the locations on the right inner wall 841*b* of the upper cover mounting recess 841 where the pair of electric wire holding piece recesses 852 are connected is formed with a storage hole 853 recessed rightward (see FIG. 47). When the cover 830 is mounted to the housing 840, the extension ends (that is, the right end) of the pair of electric wire holding pieces 835 of the cover 830 are inserted and stored in the pair of storage holes 853.

Figure 50:
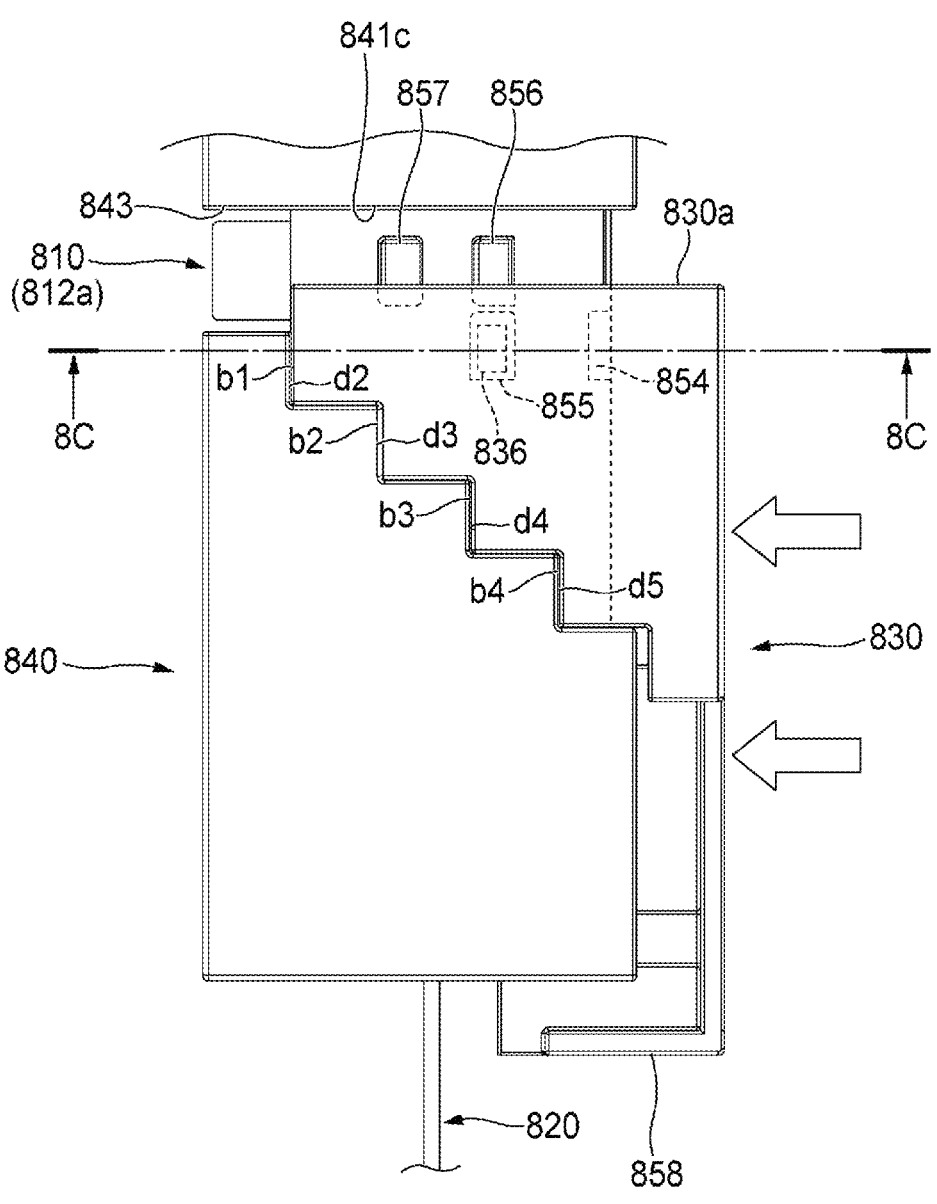
FIG. 50 is a bottom view illustrating a state in which the cover is locked to the housing at a first temporary locking position.
Figure 50:
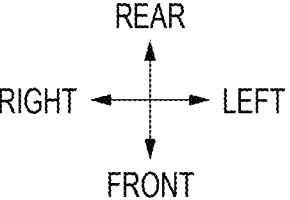
Figure 51:
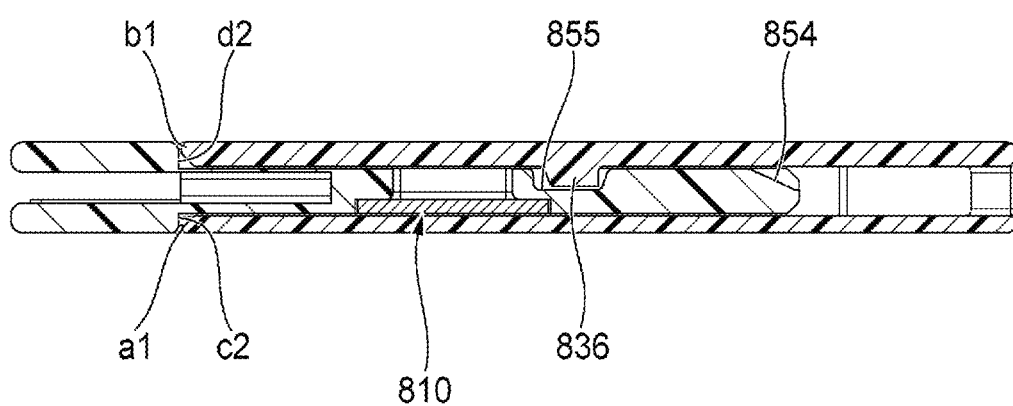
FIG. 51 is a cross-sectional view taken along a line 8C-8C in FIG. 50.
Figure 51:
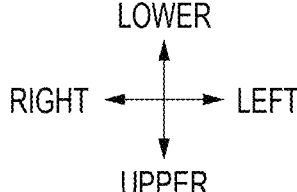
Figure 52:
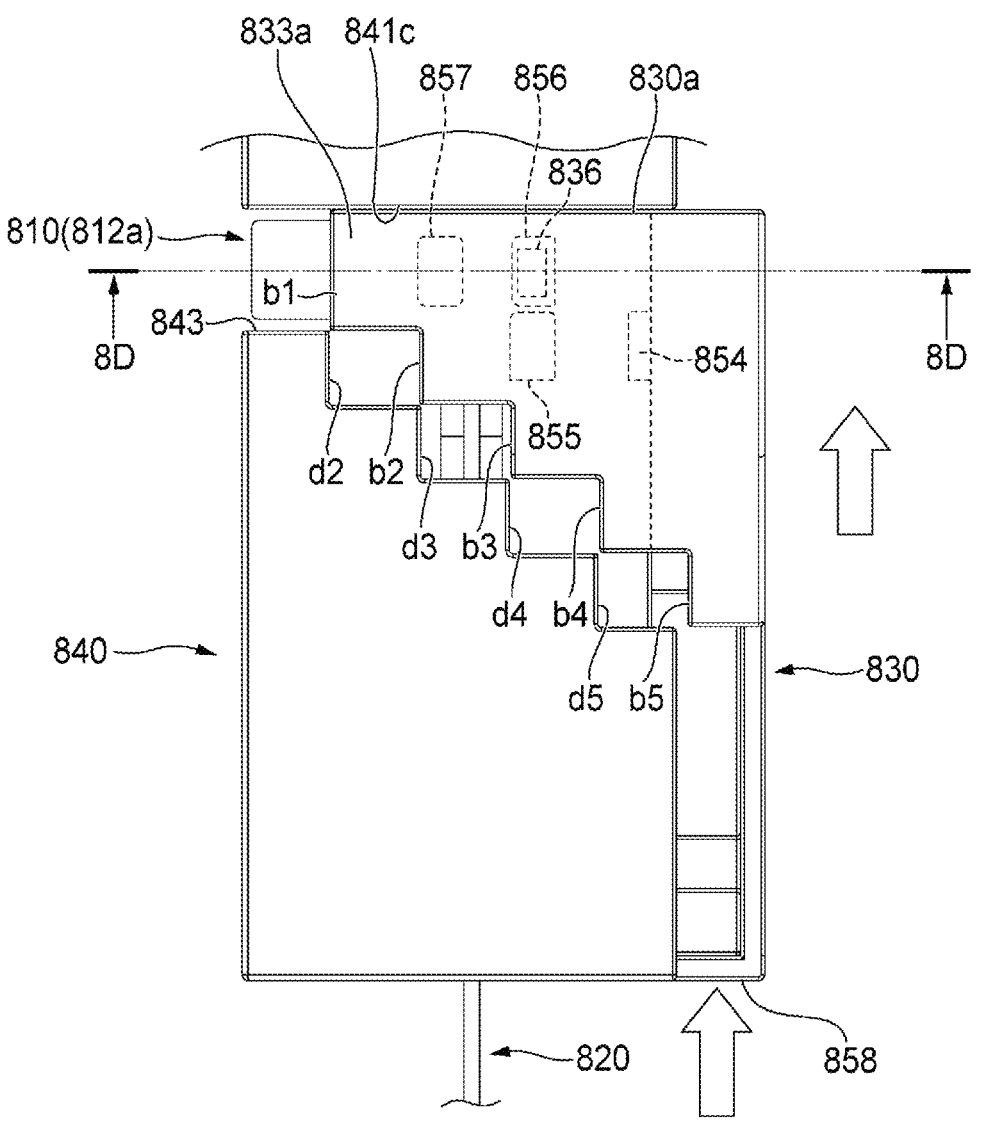
FIG. 52 is a bottom view illustrating a state in which the cover is locked to the housing at a second temporary locking position.
Figure 52:
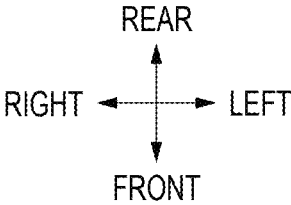
Figure 53:
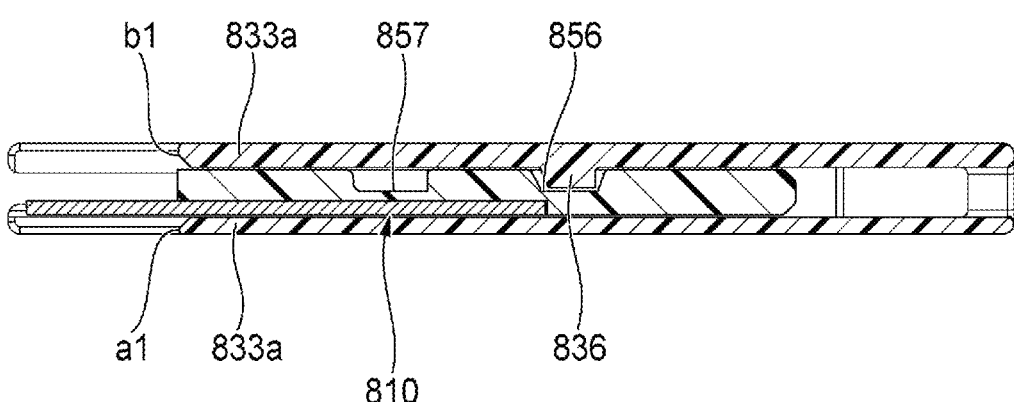
FIG. 53 is a cross-sectional view taken along a line 8D-8D in FIG. 52.
Figure 53:
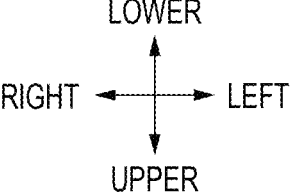
Figure 54:
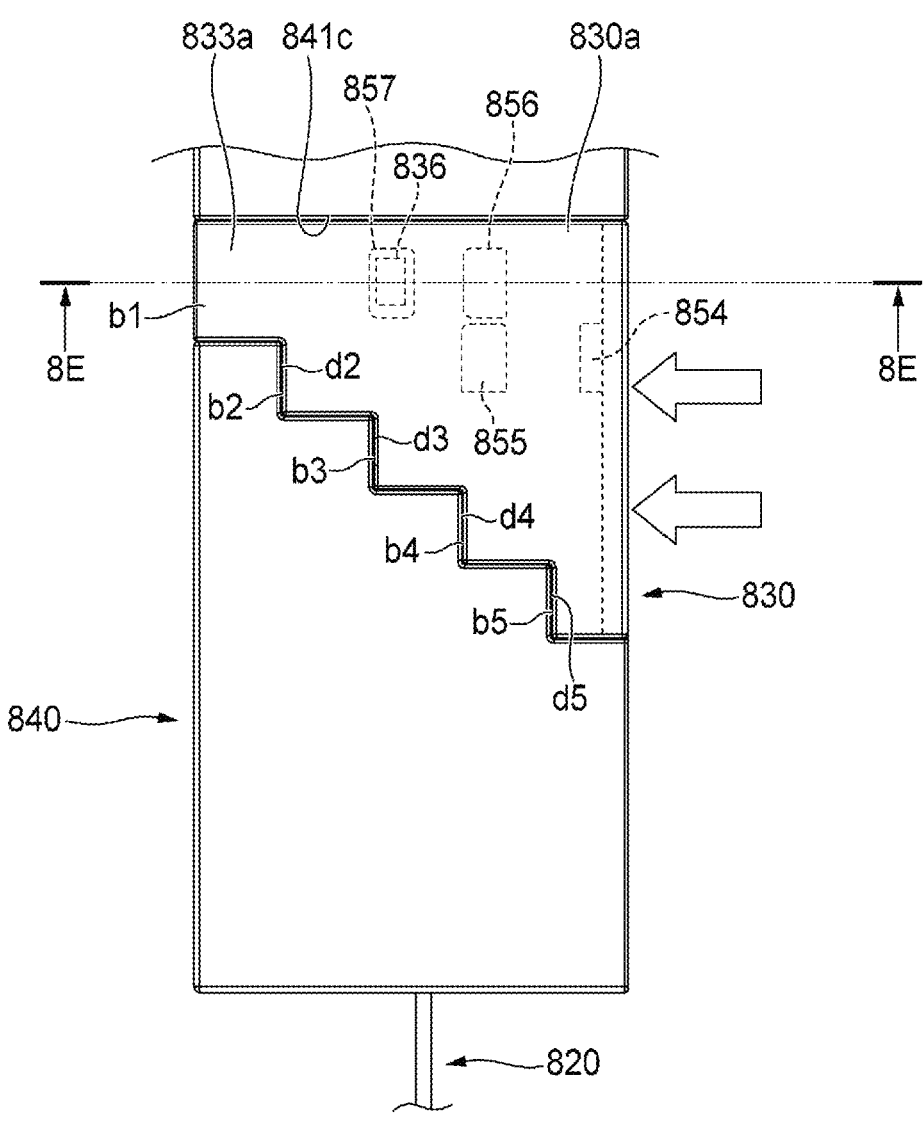
FIG. 54 is a bottom view illustrating a state in which the cover is locked to the housing at a final locking position.
Figure 54:
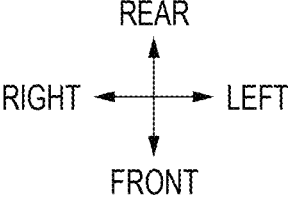
Figure 55:
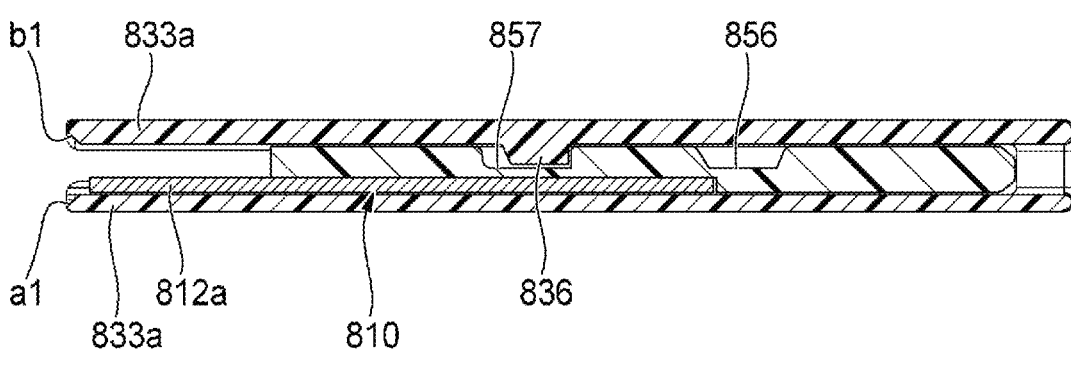
FIG. 55 is a cross-sectional view taken along a line 8E-8E in FIG. 54.
Figure 55:
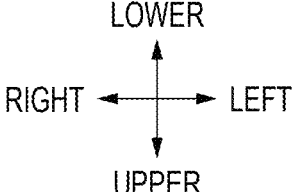

As illustrated in FIG. 49, the bottom face 841*a* of the lower cover mounting recess 841 of the housing 840 is formed with a guide portion 854, a first temporary locked portion 855, a second temporary locked portion 856, and a final locked portion 857 which are recesses recessed upward (see also FIGS. 51, 53, and 55). The first temporary locked portion 855, the second temporary locked portion 856, and the final locked portion 857 are provided at locations where the locking portion 836 of the cover 830 is located at the first temporary locking position (see FIG. 50), the second temporary locking position (see FIG. 52), and the final locking position (see FIG. 54), respectively. Specifically, the first temporary locked portion 855 and the second temporary locked portion 856 are aligned in the front-rear direction such that the second temporary locked portion 856 is positioned behind the first temporary locked portion 855, and the second temporary locked portion 856 and the final locked portion 857 are aligned in the left-right direction such that the final locked portion 857 is positioned to the right of the second temporary locked portion 856. The guide portion 854 is provided at the same position in the front-rear direction as the first temporary locked portion 855 at the left end of the housing 840. As illustrated in FIG. 51, the guide portion 854 is a recess continuous from the left end edge of the housing 840. The members constituting the voltage detection unit 805 have been described above.

Next, a procedure for assembling the voltage detection terminal 810 and the cover 830 to the housing 840 will be described. First, the voltage detection terminal 810, which is connected to the electric wire 820 in advance by a method such as ultrasonic joining or welding, is accommodated in the terminal accommodating recess 842 of the housing 840. Thus, the voltage detection terminal 810 is fitted into the terminal accommodating recess 842 of the housing 840 from above such that the projection 813 enters the locking groove 845 and the one end (contact point) of the electric wire 820 enters the through hole 844. In a state in which the voltage detection terminal 810 is completely accommodated in the housing 840, the upper and lower faces of the tip portion 812*a* of the voltage detection terminal 810 are exposed by the notch 843 (see FIG. 53).

Next, the electric wire 820 extending from the voltage detection terminal 810 accommodated in the housing 840 is accommodated in the electric wire accommodating recess 846 of the housing 840. Thus, the electric wire 820 is fitted from above along the electric wire accommodating recess 846 constituted by the pair of straight portions 847 and the bent portion 848. At this time, a pair of portions of the electric wire 820 positioned at the upper portions of the pair of narrow recesses 851 are pushed downward, so that the pair of portions of the electric wire 820 are accommodated in the pair of narrow recesses 851. In a state in which the electric wire 820 is completely accommodated in the housing 840, the electric wire 820 extends forward from the electric wire outlet 849 to the outside of the housing 840.

Next, the cover 830 is mounted to the housing 840 by being locked to the housing 840 at the first temporary locking position (see FIG. 50). For this purpose, first, the cover 830 is disposed from the left side relative to the housing 840 so that the locking portion 836 of the cover 830 is engaged with the guide portion 854 of the housing 840. As a result, the position of the locking portion 836 of the cover 830 in the front-rear direction coincides with the position of the first temporary locked portion 855 of the housing 840 in the front-rear direction. In other words, the guide portion 854 functions to guide the locking portion 836 of the cover 830 to the first temporary locked portion 855 of the housing 840. Next, the cover 830 is pushed rightward, such that the facing portion 831 of the cover 830 sandwiches the upper and lower cover mounting recesses 841 of the housing 840 in the upper-lower direction, the extension portion 832 of the cover 830 covers the upper cover mounting recesses 841 of the housing 840, and the pair of electric wire holding pieces 835 of the cover 830 cover the pair of electric wire holding piece recesses 852 of the housing 840 (see the white arrows in FIG. 50).

In the process in which the cover 830 moves rightward relative to the housing 840, the locking portion 836 of the cover 830 goes beyond the guide portion 854 and slides on the bottom face 841a of the cover mounting recess 841. Thereafter, the locking portion 836 enters the inside of the first temporary locked portion 855 and is engaged with the first temporary locked portion 855, and the upper and lower right end edges 830b of the cover 830 come into contact with the upper and lower right inner walls 841b of the housing 840, respectively. More specifically, the upper end faces a1 and a2 of the cover 830 respectively come into contact with the upper end faces c2 and c3 of the housing 840, and the lower end faces b1, b2, b3, and b4 of the cover 830 respectively come into contact with the lower end faces d2, d3, d4, and d5 of the housing 840 (see FIG. 50). As described above, when the locking portion 836 is moved from the guide portion 854 to the first temporary locked portion 855 (that is, when the cover 830 is moved to the first temporary locking position), the right end edge 830b of the cover 830 comes into contact with the right inner wall 841b of the housing 840, which prevents excessive movement of the cover 830 beyond the first temporary locking position. As described above, the cover 830 is locked to the housing 840 at the first temporary locking position, and the cover 830 is completely mounted to the housing 840 (see FIGS. 50 and 51) to obtain the voltage detection unit 805 (see FIG. 44). As described later, the voltage detection unit 805 obtained after the cover 830 is completely mounted to the housing 840 (in a state in which the cover 830 is locked at the first temporary locking position) is used for assembling the conductive module 803 (see FIG. 44).

In a state in which the cover 830 is locked at the first temporary locking position, as illustrated in FIG. 50, the facing portion 831 of the cover 830 (more specifically, the right end 833a of the pair of upper and lower flat plates 833) does not cover the tip portion 812a of the voltage detection terminal 810. Thus, the upper and lower faces of the tip portion 812a of the voltage detection terminal 810 are also exposed by the notch 843.

Further, the pair of electric wire holding pieces 835 of the cover 830 are arranged above the opening of a part of the straight portions 847 and the bent portion 848 of the electric wire accommodating recess 846. This prevents the electric wire 820 from coming out of the electric wire accommodating recess 846. Further, the extension ends of the pair of electric wire holding pieces 835 are received in the pair of storage holes 853. Accordingly, it is possible to prevent unintended deformation such as misalignment of the pair of electric wire holding pieces 835 or separation of the pair of electric wire holding pieces 835 from the electric wire accommodating recess 846. Further, the extension portion 832 of the cover 830 is disposed above the opening of the bending vertex of the bent portion 848 of the electric wire accommodating recess 846. Accordingly, it is possible to strongly prevent the electric wire 820 from being wired in a manner coming out of the electric wire accommodating recess 846 and straddling the bent portion 848 (that is, shortcutting the bent portion 848). In this way, it is possible to reduce the possibility of occurrence of a specific failure caused by the electric wire 820 coming out of the bent portion 848 of the electric wire accommodating recess 846.

Hereinafter, a procedure for moving the cover 830 locked at the first temporary locking position (see FIG. 50) to the final locking position (see FIG. 54) will be described. The cover 830 at the first temporary locking position is moved to the final locking position via the second temporary locking position (see FIG. 52). Specifically, first, the cover 830 locked at the first temporary locking position is pushed rearward by applying a rearward external force to the push wall 858 (see the white arrow in FIG. 52). In the process in which the cover 830 moves rearward relative to the housing 840, the locking portion 836 of the cover 830 goes beyond the first temporary locked portion 855 and slides on the bottom face 841a of the cover mounting recess 841. Thereafter, the locking portion 836 enters the inside of the second temporary locked portion 856 and is engaged with the second temporary locked portion 856, and a pair of upper and lower rear end edges 830a extending in the left-right direction of the cover 830 come into contact with a pair of upper and lower rear inner walls 841c extending in the left-right direction and defining the rear ends of the pair of upper and lower cover mounting recesses 841 of the housing 840, respectively. Thus, the cover 830 is locked to the housing 840 at the second temporary locking position (see FIGS. 52 and 53).

In a state in which the cover 830 is locked at the second temporary locking position as well, as illustrated in FIG. 52, the facing portion 831 of the cover 830 (more specifically, the right end 833a of the pair of upper and lower flat plates 833) does not cover the tip portion 812a of the voltage detection terminal 810. As described above, when the locking portion 836 is moved from the first temporary locked portion 855 to the second temporary locked portion 856 (that is, when the cover 830 is moved from the first temporary locking position to the second temporary locking position), the rear end edge 830a of the cover 830 comes into contact with the rear inner wall 841c of the housing 840, which prevents excessive movement of the cover 830 beyond the second locking position. As described above, even if the cover 830 is moved in multiple stages in the order of the first temporary locking position, the second temporary locking position, and the final locking position, the cover 830 can be easily and appropriately disposed at the first temporary locking position and the second temporary locking position by the action of the right inner wall 841*b* and the rear inner wall 841*c* of the housing 840.

Next, the cover 830 locked at the second temporary locking position is pushed rightward (see the white arrow in FIG. 54). In the process in which the cover 830 moves rightward relative to the housing 840, the extension ends of the pair of electric wire holding pieces 835 of the cover 830 further enter and are stored in the pair of storage holes 853. Simultaneously, the locking portion 836 of the cover 830 goes beyond the second temporary locked portion 856 and slides on the bottom face 841*a* of the cover mounting recess 841. Thereafter, the locking portion 836 enters the inside of the final locked portion 857 and is engaged with the final locked portion 857, and the upper and lower right end edges 830*b* of the cover 830 come into contact with the upper and lower right inner walls 841*b* of the housing 840, respectively. More specifically, the upper end faces a2, a3, and a4 of the cover 830 respectively come into contact with the upper end faces c2, c3, and c4 of the housing 840, and the lower end faces b2, b3, b4, and b5 of the cover 830 respectively come into contact with the lower end faces d2, d3, d4, and d5 of the housing 840 (see FIG. 54). Thus, the cover 830 is locked to the housing 840 at the final locking position (see FIGS. 54 and 55).

In a state in which the cover 830 is locked at the final locking position, as illustrated in FIG. 54, the entire cover mounting recess 841 is covered with the cover 830 without a gap, and thus the entire electric wire accommodating recess 846 is covered with the extension portion 832 of the cover 830. This prevents the electric wire 820 from coming out of the electric wire accommodating recess 846. Further, as illustrated in FIG. 55, the facing portion 831 of the cover 830 (more specifically, the right end 833*a* of the pair of upper and lower flat plates 833) covers the upper and lower faces of the tip portion 812*a* of the voltage detection terminal 810. Accordingly, the entire voltage detection terminal 810 is covered with the facing portion 831 of the cover 830, so that the voltage detection terminal 810 can be reliably protected.

As described above, the voltage detection unit 805 obtained after the cover 830 is completely mounted to the housing 840 (in a state in which the cover 830 is locked at the first temporary locking position) is used for assembling the conductive module 803 (see FIG. 44). Specifically, first, as illustrated in FIG. 45, the flange 804*a* of the conductive board 804 is fitted into the recess 805*a* of the voltage detection unit 805, so that the voltage detection unit 805 is coupled to the left side of the conductive board 804.

In this state, as can be understood from FIG. 46, a part of the flange 804*a* of the conductive board 804 overlaps the lower side of the tip portion 812*a* of the voltage detection terminal 810, and the upper face of the tip portion 812*a* of the voltage detection terminal 810 is exposed upward and the lower face of a part of the flange 804*a* of the conductive board 804 is exposed downward due to the presence of the notch 843 of the housing 840.

Next, the upper face of the tip portion 812*a* of the voltage detection terminal 810 exposed upward and the lower face of a part of the flange 804*a* of the conductive board 804 exposed downward are used to fix the tip portion 812*a* of the voltage detection terminal 810 and the part of the flange

804*a* of the conductive board 804 by a method such as ultrasonic joining or welding. Thereafter, the cover 830 is moved from the first temporary locking position to the final locking position via the second temporary locking position, and the voltage detection unit 805 is completely assembled to the conductive board 804.

Next, the flange 804*b* of the conductive board 804 is fitted into the recess 806*a* of the facing unit 806, so that the facing unit 806 is coupled to the right side of the conductive board 804 to which the voltage detection unit 805 is assembled (see FIG. 45, etc.). Thus, the conductive module 803 is completely assembled.

The conductive module 803 thus obtained is used for assembling the power storage device 801 illustrated in FIG. 44. Specifically, the power storage modules 802 and the conductive modules 803 are alternately stacked in the upper-lower direction, and the stacked body is fixed by a predetermined fitting or the like, thereby obtaining the power storage device 801.

As described above, according to the voltage detection unit 805 and the power storage device 801 using the voltage detection unit 805 according to the eighth embodiment, the cover 830 can be locked to the housing 840 while accommodating the voltage detection terminal 810 whose tip portion 811*a* is connected to the electric wire 820 in the terminal accommodating recess 842 of the housing 840 and exposing the tip portion 812*a* of the voltage detection terminal 810. Therefore, when the voltage detection unit 805 is electrically connected to the conductive board 804 (the conductive board 804 of the stacked power storage device 801), for example, after the voltage detection unit 805 is assembled to the conductive board 804, the exposed tip portion 812*a* of the voltage detection terminal 810 can be fixed to the conductive board 804 using a method such as ultrasonic joining or welding. This does not require another component for connection as compared to typical bolt fastening or the like, and can easily align the two components and reduce the contact resistance at the contact point as compared to the connection methods of the related art described above. Further, by disposing the cover 830 at the final locking position after the connection between the conductive board 804 and the voltage detection terminal 810, the tip portion 812*a* of the voltage detection terminal 810 (that is, the contact point therebetween) can be covered and protected by the cover 830.

To attach the cover 830 to the housing 840, in the voltage detection unit 805 of the eighth embodiment, for example, the cover 830 is disposed at the first temporary locking position via the guide portion 854 from the outside of the housing 840, and the conductive board 804 and the voltage detection terminal 810 are connected in a state in which the cover 830 is at the first temporary locking position. Thereafter, the cover 830 can be moved from the first temporary locking position to the final locking position. Here, when the cover 830 is moved from the guide portion 854 to the first temporary locking position, the cover 830 comes into contact with the right inner wall 841*b* of the housing 840, which prevents excessive movement of the cover 830 beyond the first temporary locking position. As a result, for example, it is possible to prevent the cover 830 to be arranged at the first temporary locking position from being erroneously moved to the final locking position, thereby preventing the cover 830 from interfering with the connection between the conductive board 804 and the voltage detection terminal 810.

Further, the cover 830 is moved from the first temporary locking position to the final locking position via the second temporary locking position. By providing a plurality of positions at which the cover 830 can be temporary locked, for example, the cover 830 can be temporary locked at an optimum position according to the specification or the like required for the voltage detection unit 805. Further, when the cover 830 is moved from the first temporary locking position to the second temporary locking position, the cover 830 comes into contact with the rear inner wall 841c of the housing 840, which prevents excessive movement of the cover 830 beyond the second temporary locking position. Accordingly, even if the cover 830 is moved in multiple stages (that is, in the order of the first temporary locking position, the second temporary locking position, and the final locking position), the cover 830 can be easily and appropriately disposed at the first temporary locking position and the second temporary locking position by the action of the right inner wall 841b and the rear inner wall 841c.

Further, when the cover 830 moves from the second temporary locking position toward the final locking position, the cover 830 is to come into contact with the right inner wall 841b when the cover 830 reaches the final locking position. The cover 830 comes into contact with the right inner wall 841b of the housing 840, which prevents excessive movement of the cover 830 beyond the final locking position. Accordingly, the cover 830 can be easily and appropriately disposed at the final locking position. Further, the right inner wall 841b for arranging the cover 830 at the first temporary locking position is also used for arranging the cover 830 at the final locking position, so that the housing 840 can be downsized.

The invention embodied as the eighth embodiment is not limited to the eighth embodiment, and various modifications can be adopted within the scope of the invention. For example, the present invention is not limited to the eighth embodiment, and modifications, improvements, and the like can be made appropriately. In addition, materials, shapes, sizes, numbers, arrangement positions, and the like of components in the eighth embodiment are freely selected and are not limited as long as the present invention can be implemented.

Here, features of the embodiment of the voltage detection unit 805 according to the present invention described above are briefly summarized and listed in the following [8-1] to [8-4].

[8-1]

A voltage detection unit (805) including:

a voltage detection terminal (810) having a first location (812a) configured to be conductively connected to a detection target (804);

a board-shaped housing (840) having a terminal accommodating recess (842) accommodating the voltage detection terminal (810);

a cover (830) configured to be locked to the housing (840) at a first temporary locking position where the first location (812a) of the voltage detection terminal (810) accommodated in the terminal accommodating recess (842) is not covered and a final locking position where the first location (812a) is covered; and an electric wire (820) conductively connected to a second location (811a) of the voltage detection terminal (810) and drawn out toward the outside of the housing (840), in which the housing (840) includes a guide portion (854) configured to guide the cover (830) from the outside toward the first temporary locking position, and a first wall (841b) configured to come into contact with the cover (830) when the cover (830) is in the first temporary locking position in a moving direction in which the cover (830) is moved from the guide portion (854) toward the first temporary locking position.

According to the voltage detection unit having the configuration of the above [8-1], the cover can be locked to the housing while accommodating the voltage detection terminal whose second location is connected to the electric wire in the terminal accommodating recess of the housing and exposing the first location of the voltage detection terminal. Therefore, when the voltage detection unit is electrically connected to a detection target (for example, a conductive board or the like used in a stacked power storage device), for example, after the voltage detection unit is assembled to the detection target, the exposed first location of the voltage detection terminal can be fixed to the detection target using a method such as ultrasonic joining or welding. This does not require another component for connection as compared to typical bolt fastening or the like, and can easily align the two components and reduce the contact resistance at the contact point as compared to the connection methods of the related art described above. Further, by disposing the cover at the final locking position after the detection target and the voltage detection terminal are connected, the first location of the voltage detection terminal (that is, the contact point therebetween) can be covered and protected by the cover.

To attach the cover to the housing, in the voltage detection unit of the present configuration, for example, the cover can be moved from the outside of the housing toward the first temporary locking position via the guide portion to be locked at the first temporary locking position, and the detection target and the voltage detection terminal are connected in a state in which the cover is at the first temporary locking position. Thereafter, the cover can be moved to the final locking position. Here, when the cover is guided by the guide portion and moves toward the first temporary locking position, the cover is to come into contact with the first wall when the cover reaches the first temporary locking position. The cover comes into contact with the first wall of the housing, which prevents excessive movement of the cover beyond the first temporary locking position. As a result, for example, it is possible to prevent the cover to be arranged at the first temporary locking position from being erroneously moved to another position (for example, the final locking position), thereby preventing the cover from interfering with the connection between the detection target and the voltage detection terminal.

Accordingly, the voltage detection unit of the present configuration is excellent in workability for conductively connecting to the detection target. Furthermore, the voltage detection unit of the present configuration is less likely to cause variation in contact resistance at the contact point between the detection target and the voltage detection terminal due to the manufacturing tolerance thereof, and thus is also excellent in voltage detection accuracy, as compared to the above-described power storage device of the related art.

[8-2]

The voltage detection unit (805) according to the above [8-1], in which the cover (830) can be locked to the housing (840) at a second temporary locking position that is different from the first temporary locking position and does not cover the first location (812a), and the housing (840) includes a second wall (841c) configured to come into contact with the cover (830) when the cover (830) is at the second temporary locking position in a moving direction when the cover (830) is moved from the first temporary locking position toward the second temporary locking position.

According to the voltage detection unit having the configuration of the above [8-2], for example, the cover can be moved to the first temporary locking position, the second temporary locking position, and the final locking position in this order. By providing a plurality of locations at which the cover can be temporary locked, for example, the cover can be temporary locked at an optimum position according to the specification or the like required for the voltage detection unit. Further, when the cover moves from the first temporary locking position toward the second temporary locking position, the cover is to come into contact with the second wall when the cover reaches the second temporary locking position. The cover comes into contact with the second wall of the housing, which prevents excessive movement of the cover beyond the second temporary locking position. Accordingly, even if the cover is moved in multiple stages (that is, in the order of the first temporary locking position, the second temporary locking position, and the final locking position), the cover can be easily and appropriately disposed at the first temporary locking position and the second temporary locking position by the action of the first wall and the second wall.

[8-3]

The voltage detection unit (805) according to the above [8-2], in which the housing (840) is configured such that the cover (830) can come into contact with the first wall (841b) when the cover (830) is at the final locking position in a moving direction when the cover (830) is moved from the second temporary locking position toward the final locking position.

According to the voltage detection unit having the configuration of the above [8-3], when the cover moves from the second temporary locking position toward the final locking position, the cover is to come into contact with the first wall when the cover reaches the final locking position. The cover comes into contact with the first wall of the housing, which prevents excessive movement of the cover beyond the final locking position. Thus, the cover can be easily and appropriately disposed at the final locking position. Further, the first wall for arranging the cover at the first temporary locking position is also used for arranging the cover at the final locking position, so that the housing can be downsized.

[8-4]

A power storage device (801) including:

a board-shaped conductive module (803) including the voltage detection unit (805) according to any one of the above [8-1] to [8-3] and a conductive board (804) as the detection target to which the voltage detection terminal (810) is conductively connected; and a power storage module (802) configured to be charged and discharged, on which the conductive module (803) is stacked.

In the power storage device having the configuration of the above [8-4], the voltage detection unit used in the power storage device is configured such that the cover can be locked to the housing while accommodating the voltage detection terminal whose second location is connected to the electric wire in the terminal accommodating recess of the housing and exposing the first location of the voltage detection terminal. Therefore, when the voltage detection unit is electrically connected to a detection target (for example, a conductive board or the like used in a stacked power storage device), for example, after the voltage detection unit is assembled to the detection target, the exposed first location of the voltage detection terminal can be fixed to the detection target using a method such as ultrasonic joining or welding. This does not require another component for connection as compared to typical bolt fastening or the like, and can easily align the two components and reduce the contact resistance at the contact point as compared to the connection methods of the related art described above. Further, by disposing the cover at the final locking position after the detection target and the voltage detection terminal are connected, the first location of the voltage detection terminal (that is, the contact point therebetween) can be covered and protected by the cover.

To attach the cover to the housing, in the above-described voltage detection unit, for example, the cover can be moved from the outside of the housing toward the first temporary locking position via the guide portion to be locked at the first temporary locking position, and the detection target and the voltage detection terminal are connected in a state in which the cover is at the first temporary locking position. Thereafter, the cover can be moved to the final locking position. Here, when the cover is guided by the guide portion and moves toward the first temporary locking position, the cover is to come into contact with the first wall when the cover reaches the first temporary locking position. The cover comes into contact with the first wall of the housing, which prevents excessive movement of the cover beyond the first temporary locking position. As a result, for example, it is possible to prevent the cover to be arranged at the first temporary locking position from being erroneously moved to another position (for example, the final locking position), thereby preventing the cover from interfering with the connection between the detection target and the voltage detection terminal.

Accordingly, the power storage device of the present configuration is excellent in workability for conductively connecting to the detection target. Furthermore, the power storage device of the present configuration is less likely to cause variation in contact resistance at the contact point between the detection target and the voltage detection terminal due to the manufacturing tolerance thereof, and thus is also excellent in voltage detection accuracy, as compared to the above-described power storage device of the related art.

Ninth Embodiment

The invention embodied as a ninth embodiment relates to a voltage detection unit and a power storage device configured such that a voltage detection terminal to be conductively connected to a detection target is accommodated in a board-shaped housing.

The related art has proposed a stacked power storage device in which a plurality of chargeable and dischargeable thin power storage modules are connected in series via conductive boards by alternately arranging and repeatedly stacking the board-shaped power storage modules and the conductive boards. The power storage modules used in this type of power storage device generally have a structure in which a plurality of battery cells are incorporated, and function as one battery capable of charging and discharging. In one of the power storage devices of the related arts, in order to monitor the output state of each power storage module (that is, the potential of the output face of each power storage module relative to the zero potential as a reference; hereinafter, simply referred to as "voltage of the power storage module"), a detection terminal such as a bus bar is connected to the conductive board in contact with the output face of the power storage module, and the voltage of the power storage module is measured through the detection terminal (for example, see JP2020-161340A).

However, when actually connecting the bus bar or the like to the conductive board in the power storage device having the above-described structure, since the power storage modules and the conductive boards have a thin plate shape, it is difficult to secure a space for installing the other components for connection (for example, bolts for bolt fastening or the like). Therefore, the power storage device of the related art described above is provided with an insertion hole for inserting the detection terminal in the side edge of each conductive board. The detection terminal is inserted into the insertion hole of the conductive board from the lateral side of the stacked body in which the power storage modules and the conductive boards are stacked, thereby connecting the conductive board and the detection terminal. However, according to this connection method of the related art, the positioning between the insertion hole of the conductive board and the detection terminal is complicated when inserting the detection terminal, which makes it difficult to improve the workability of connection work.

An object of the invention embodied as the ninth embodiment is to provide a voltage detection unit excellent in workability in a conductive connection with a detection target, and a power storage device using the voltage detection unit.

Figure 56:
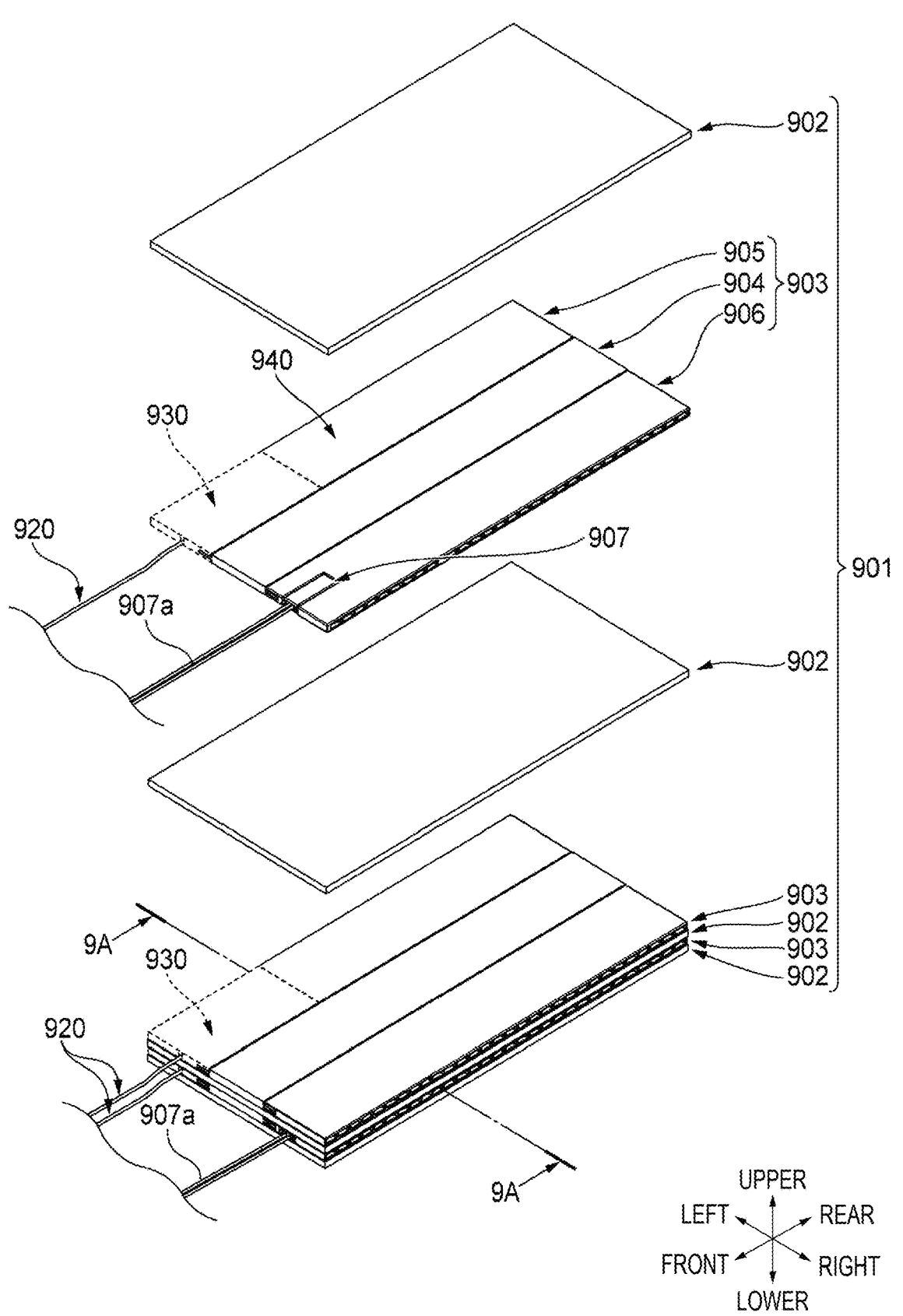
FIG. 56 is a partially exploded perspective view illustrating a stacked power storage device including a voltage detection unit according to a ninth embodiment.

Hereinafter, a voltage detection unit 905 and a power storage device 901 according to the ninth embodiment will be described with reference to FIGS. 56 to 66. Hereinafter, for convenience of description, "front", "rear", "upper", "lower", "left", "right", a "front-rear direction", a "left-right direction", and an "upper-lower direction" are defined as illustrated in FIG. 56. The "front-rear direction", the "left-right direction", and the "upper-lower direction" are orthogonal to one another.

The voltage detection unit 905 is typically used in a stacked power storage device 901 illustrated in FIG. 56. The power storage device 901 is formed by alternately stacking, in the upper-lower direction, thin rectangular board-shaped power storage modules 902 capable of charging and discharging and rectangular thin board-shaped conductive modules 903 capable of electrically connecting adjacent power storage modules 902. In the power storage device 901, a plurality of power storage modules 902 are electrically connected in series via the conductive modules 903. Each power storage module 902 has a structure in which a plurality of battery cells (not illustrated) are incorporated, and the power storage modules 902 as a whole function as one battery capable of charging and discharging.

Figure 57:
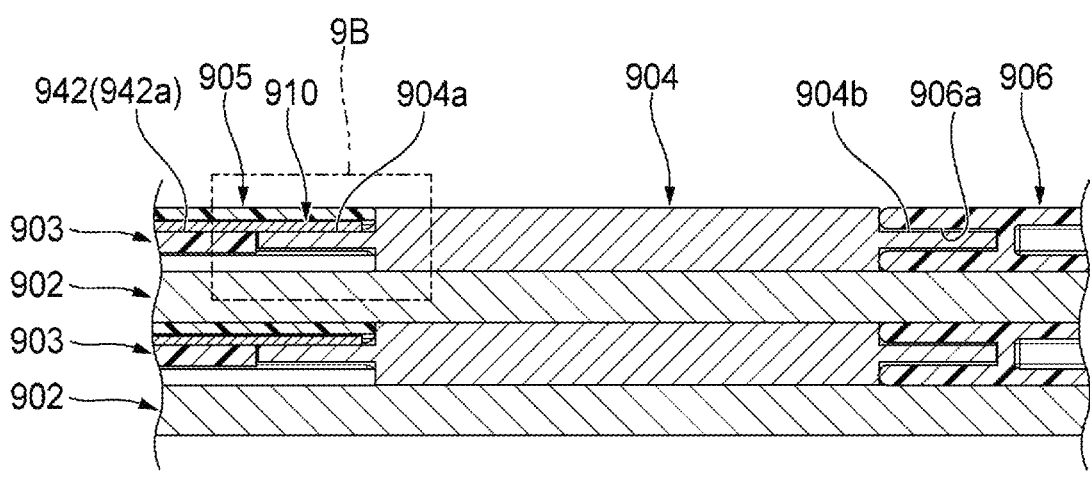
FIG. 57 is a cross-sectional view taken along a line 9A-9A in FIG. 56.
Figure 57:
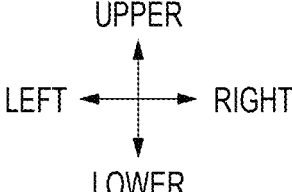
Figure 58:
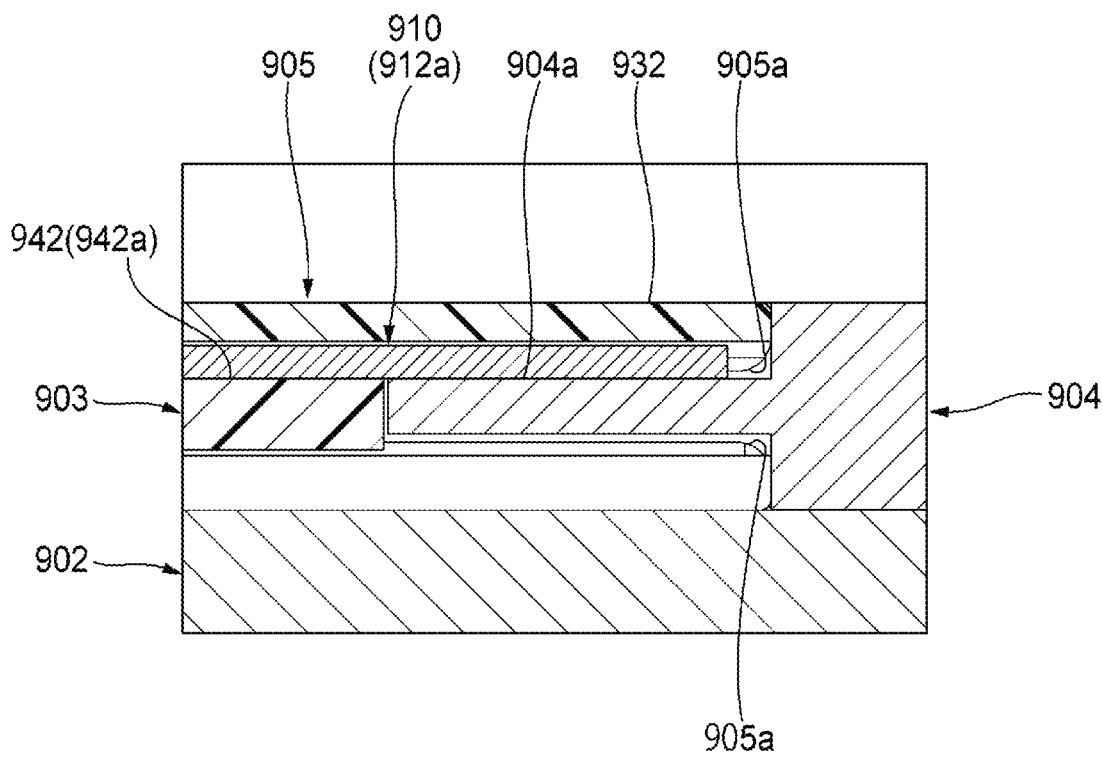
FIG. 58 is an enlarged view of a portion 9B in FIG. 57.
Figure 58:
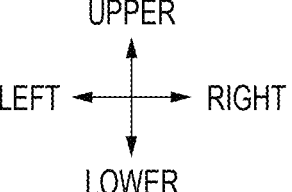

As illustrated in FIG. 56, each conductive module 903 is formed to have a rectangular thin board shape as a whole by a rectangular thin board-shaped conductive board 904 (the conductive board 904 also functions as a heat sink as described later), the rectangular thin board-shaped voltage detection unit 905 coupled to the left side of the conductive board 904, and a rectangular thin board-shaped facing unit 906 coupled to the right side of the conductive board 904. As illustrated in FIGS. 56 to 58 (in particular, see FIG. 57), the conductive board 904 and the voltage detection unit 905 are coupled to each other by fitting a flange 904a into a recess 905a. The flange 904a is provided on the left end face of the conductive board 904 and extends in the front-rear direction. The recess 905a is provided on the right end face of the voltage detection unit 905 and extends in the front-rear direction. The conductive board 904 and the facing unit 906 are coupled to each other by fitting a flange 904b into a recess 906a. The flange 904b is provided on the right end face of the conductive board 904 and extends in the front-rear direction. The recess 906a is provided on the left end face of the facing unit 906 and extends in the front-rear direction.

In each of the conductive modules 903 positioned between the power storage modules 902 adjacent to each other in the upper-lower direction, the conductive board 904 is in direct contact with the upper and lower power storage modules 902 as illustrated in FIG. 57. Thus, the conductive board 904 functions to perform conduction between a lower face of the upper power storage module 902 and an upper face of the lower power storage module 902, and functions as a heat sink that releases heat generated from the upper and lower power storage modules 902 to the outside.

In each of the conductive modules 903 located between the power storage modules 902 adjacent to each other in the upper-lower direction, the voltage detection unit 905 includes a voltage detection terminal 910 (see FIG. 57 and the like) in contact with the conductive board 904, which is to be described later. The voltage detection unit 905 has a function of outputting a signal indicating a voltage between the upper and lower power storage modules 902 (specifically, the potential of the upper face (output face) of the lower power storage module 902 relative to the zero potential as a reference) via an electric wire 920 (see FIG. 56, etc.) connected to the voltage detection terminal 910. The voltage detection unit 905 is disposed to the left of the conductive board 904 in FIGS. 56 to 58, but a voltage detection unit having the same function as the voltage detection unit 905 may be disposed to the right of the conductive board 904. In this case, a voltage detection unit obtained by reversing the entire configuration of the voltage detection unit 905 in the left-right direction (that is, a mirror component of the voltage detection unit 905) is used as the voltage detection unit having the same function as that of the voltage detection unit 905.

Any one of a voltage detection unit, a dummy unit, and a temperature detection unit, which will be described later, is applied as the facing unit 906 to each of the conductive modules 903 positioned between the power storage modules 902 adjacent to each other in the upper-lower direction, according to the specification of the power storage device 901.

If the facing unit 906 is a voltage detection unit, a voltage detection unit obtained by reversing the entire configuration of the voltage detection unit 905 in the left-right direction (that is, a mirror component of the voltage detection unit 905 described above) is used as the facing unit 906. In this case, the voltage detection unit 905 is disposed to the left of the conductive board 904, and the mirror component of the voltage detection unit 905 is disposed to the right of the conductive board 904. The facing unit 906 (a mirror component of the voltage detection unit 905) has the same function as that of the voltage detection unit 905.

If the facing unit 906 is a dummy unit, a simple resin board having a recess 906a (see FIG. 57) extending in the front-rear direction is used as the facing unit 906. In this case, the facing unit 906 performs only the function of filling the gap between the upper and lower power storage modules 902.

If the facing unit 906 is a temperature detection unit, the facing unit 906 has a structure in which a temperature sensor 907 (thermistor) is incorporated in a resin board used as a dummy unit as illustrated in FIG. 56. In this case, the facing unit 906 has a function of outputting a signal indicating the temperature of the upper and lower power storage modules 902 via an electric wire 907*a* (see FIG. 56) connected to the temperature sensor 907.

Figure 59:
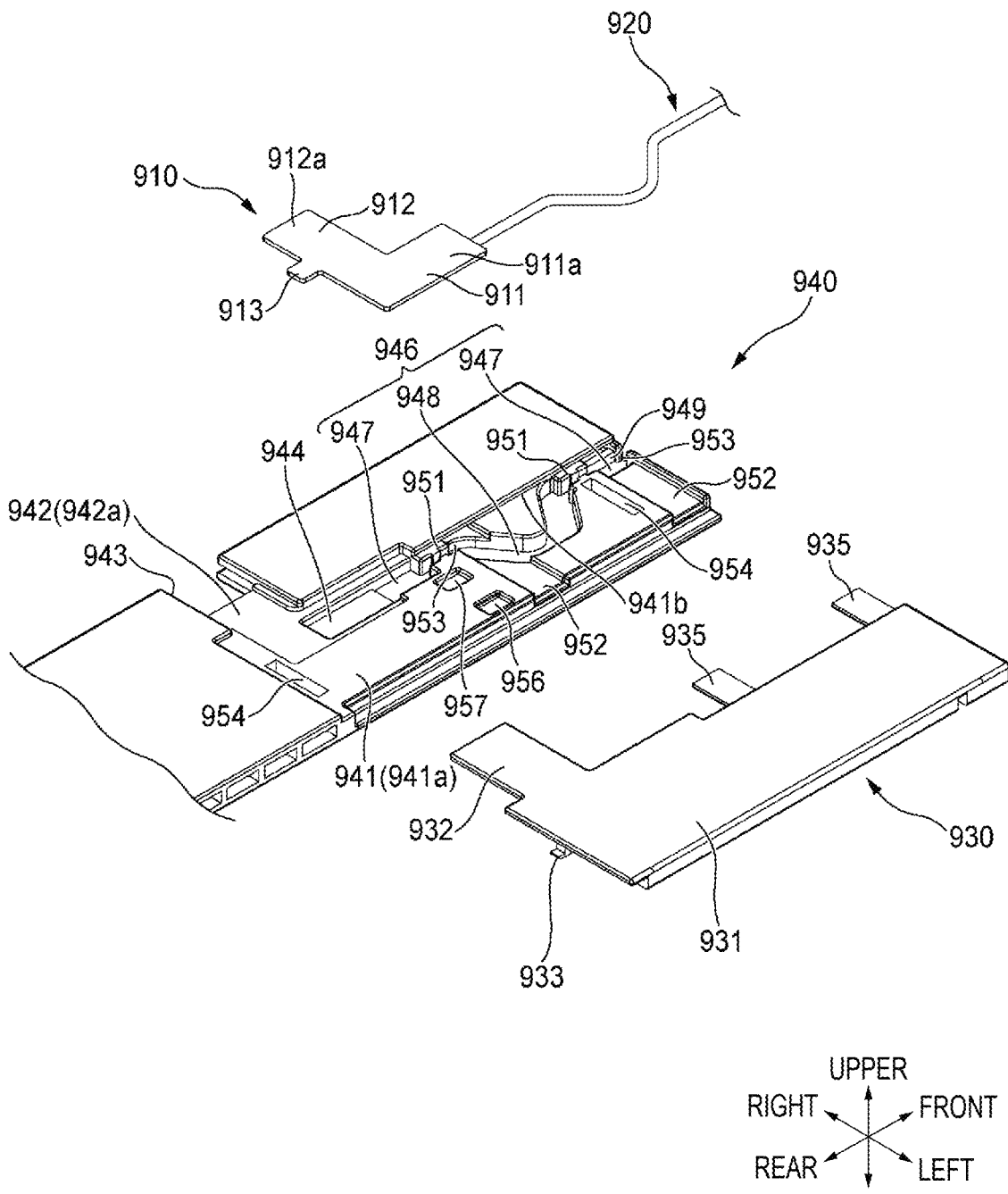
FIG. 59 is an exploded perspective view of the voltage detection unit illustrated in FIG. 56.

Hereinafter, a specific configuration of the voltage detection unit 905 according to the ninth embodiment will be described with reference to FIGS. 59 to 66. As illustrated in FIG. 59, the voltage detection unit 905 includes a housing 940, a voltage detection terminal 910 accommodated in the housing 940, an electric wire 920 connected to the voltage detection terminal 910 and accommodated in the housing 940, and a cover 930 mounted to the housing 940.

The voltage detection terminal 910 is accommodated in a terminal accommodating recess 942 (see FIG. 59) formed in the housing 940, which is to be described later. The electric wire 920 is accommodated in an electric wire accommodating recess 946 (see FIG. 59) formed in the housing 940, which is to be described later. The cover 930 is mounted in a cover mounting recess 941 (see FIG. 59) formed in the housing 940, which is to be described later. Hereinafter, the members constituting the voltage detection unit 905 will be described in order.

First, the voltage detection terminal 910 will be described. The voltage detection terminal 910 made of metal is formed by one metal board being subjected to processing such as a pressing process. The voltage detection terminal 910 is accommodated in the terminal accommodating recess 942 of the housing 940 from above. As illustrated in FIG. 59, the voltage detection terminal 910 includes a rectangular flat plate-shaped first portion 911 extending in the front-rear direction and a rectangular flat plate-shaped second portion 912 extending rightward from the rear end of the first portion 911, and has a substantially L-shaped flat plate shape as a whole when viewed in the upper-lower direction.

One end of the electric wire 920 is fixed and electrically connected to the lower face of the tip portion 911*a* of the first portion 911 (that is, the end closer to the front end). The other end of the electric wire 920 is to be connected to a voltage measuring device (not illustrated) outside the power storage device 901. Apart of the flange 904*a* of the conductive board 904 is to be fixed to the lower face of a tip portion 912*a* of the second portion 912 (that is, the end closer to the right end) by a method such as ultrasonic joining or welding (see FIG. 58).

The rear end edge of the second portion 912 is formed with a projection 913 projecting rearward. When the voltage detection terminal 910 is accommodated in the housing 940, the projection 913 is to be locked in a locking groove (not illustrated) formed in the housing 940.

Next, the cover 930 will be described. The cover 930 is a resin molded article and is mounted to the cover mounting recess 941 of the housing 940 from above. The cover 930 includes a substantially rectangular flat plate-shaped body 931 extending in the front-rear direction, and a substantially rectangular flat plate-shaped extension portion 932 extending rightward from the right end edge of the rear end of the body 931 in a flush and continuous manner. The body 931 mainly functions to cover and protect the electric wire 920, and the extension portion 932 mainly functions to cover and protect the voltage detection terminal 910.

The body 931 is integrally formed with two electric wire holding pieces 935 extending in the left-right direction, which are arranged at an interval in the front-rear direction. As can be understood from FIG. 60, each electric wire holding piece 935 protrudes downward from the lower face of the body 931 and extends in the left-right direction, so as to project further rightward from the right end edge of the body 931. When the cover 930 is mounted to the housing

940, the electric wire holding pieces 935 hold the electric wire 920 accommodated in the housing 940.

Figure 60:
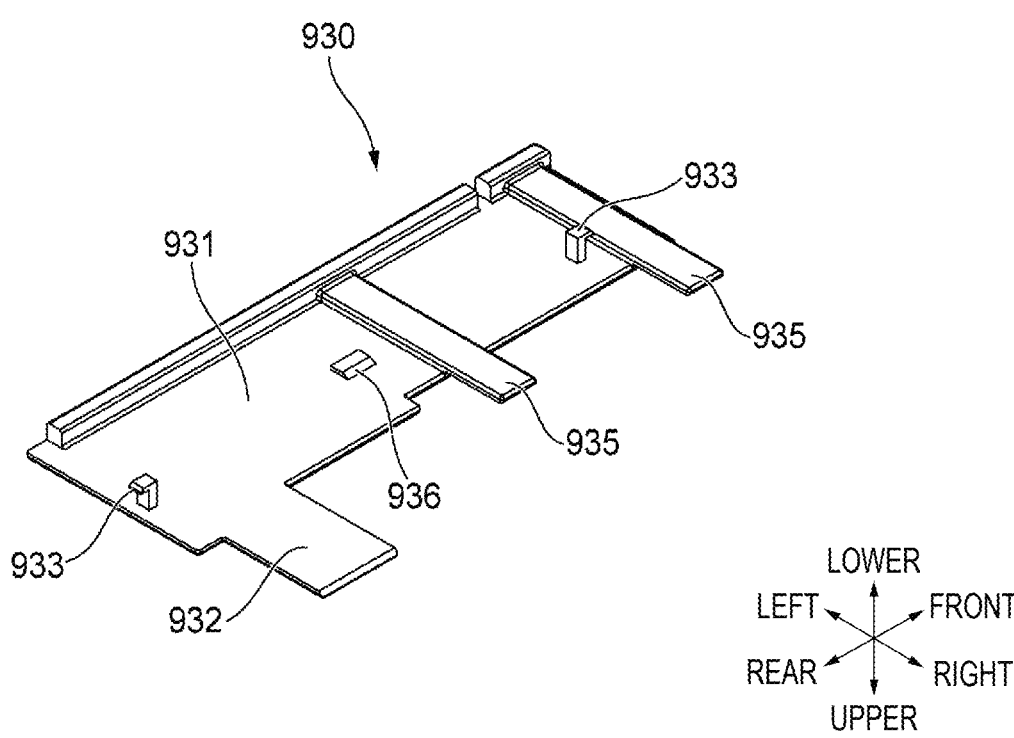
FIG. 60 is a perspective view of the cover as viewed from below.

As illustrated in FIG. 60, the lower face of the body 931 is formed with a locking portion 936 projecting downward at a predetermined location (see FIG. 60, etc.). The locking portion 936 functions to lock the cover 930 to the temporary locking position (see FIGS. 61 and 62) and the final locking position (see FIG. 65) in cooperation with a temporary locked portion 956 and a final locked portion 957 (see FIG. 59) provided in the housing 940, which is to be described later. As illustrated in FIG. 60, the front and rear ends of the lower face of the body 931 are formed with a pair of front and rear engaging projections 933 projecting downward. The pair of front and rear engaging projections 933 support the cover 930 in cooperation with a pair of front and rear engaging holes 954 (see FIG. 59), which is to be described later, provided in the housing 940 so that the cover 930 can move in the left-right direction between the temporary locking position and the final locking position (see FIG. 65) and cannot be separated upward from the housing 940.

Next, the housing 940 will be described. The housing 940 is a resin molded article and has a substantially thin rectangular board shape extending in the front-rear direction as illustrated in FIG. 56, etc. The right end face of the housing 940 is formed with a recess 905*a* recessed leftward and extending in the front-rear direction. The flange 904*a* of the conductive board 904 is to be fitted into the recess 905*a* (see FIG. 57).

The location on the upper face of the housing 940 where the cover 930 is mounted is formed with the cover mounting recess 941 recessed into a shape corresponding to the entire shape of the cover 930 (see FIG. 59). The recess depth (depth in the upper-lower direction) of the cover mounting recess 941 is equal to the plate thickness of the resin material constituting the cover 930 (the body 931+the extension portion 932). Thus, when the cover 930 is mounted to the housing 940, the upper face of the housing 940 is flush with the upper face of the cover 930 (see FIGS. 56 and 65).

The location where the voltage detection terminal 910 is accommodated on a bottom face 941*a* of the cover mounting recess 941 of the housing 940 is formed with a terminal accommodating recess 942 further recessed into a shape corresponding to the entire shape of the voltage detection terminal 910 (see FIG. 59). The recess depth (depth in the upper-lower direction) of the terminal accommodating recess 942 is equal to the plate thickness of the voltage detection terminal 910. Thus, when the voltage detection terminal 910 is mounted to the housing 940, the upper face of the voltage detection terminal 910 is flush with the bottom face 941*a* of the cover mounting recess 941.

The position in the front-rear direction in the right end edge of the housing 940 where the tip portion 912*a* of the voltage detection terminal 910 is disposed is formed with a notch 943 recessed leftward into a substantially rectangular shape when viewed in the upper-lower direction. The recess 905*a* extending in the front-rear direction in the right end face of the housing 940 is divided by the notch 943. When the voltage detection terminal 910 is accommodated in the housing 940, the upper and lower faces of the tip portion 912*a* of the voltage detection terminal 910 are to be exposed by the notch 943 (see FIGS. 61 and 62).

The location in the terminal accommodating recess 942 where the tip portion 911*a* of the voltage detection terminal 910 is disposed is formed with a through hole 944 extending in the front-rear direction and penetrating in the upper-lower direction (see FIG. 59, etc.). When the voltage detection terminal 910 is accommodated in the housing 940, the one end (contact point) of the electric wire 920 connected to the voltage detection terminal 910 enters the through hole 944. In other words, the through hole 944 functions as a clearance for avoiding interference between the bottom face 942*a* of the terminal accommodating recess 942 and the one end of the electric wire 920.

The inner wall face of the location in the terminal accommodating recess 942 where the projection 913 (see FIG. 59) of the voltage detection terminal 910 is disposed is formed with a locking groove (not illustrated) recessed rearward and communicating with the recess 905*a*, so as to correspond to the projection 913.

The location on the bottom face 941*a* of the cover mounting recess 941 of the housing 940 where the electric wire 920 is accommodated is formed with an electric wire accommodating recess 946 having a shape corresponding to the wiring form of the electric wire 920 when the electric wire 920 is accommodated (see FIG. 59). The electric wire accommodating recess 946 is a continuous groove including a pair of straight portions 947 extending linearly in the front-rear direction and arranged at an interval in the front-rear direction, and a bent portion 948 connecting the pair of straight portions 947 and extending while being bent to project leftward. The rear end of the rear straight portion 947 of the pair of straight portions 947 communicates with the terminal accommodating recess 942, and the front end of the front straight portion 947 of the pair of straight portions 947 constitutes an electric wire outlet 949 from which the electric wire 920 extends from the front end edge of the housing 940. In this way, since the electric wire accommodating recess 946 has the bent portion 948, as compared with a case where the electric wire accommodating recess 946 is formed of only the straight portions 947, even if an unintended external force is applied to the electric wire 920 drawn out from the housing 940, the electric wire 920 can resist the external force due to the friction between the bent portion 948 and the electric wire 920. Thus, a large external force is hardly applied to the contact point between the voltage detection terminal 910 and the electric wire 920.

The location in each of the pair of straight portions 947 near the boundary with the bent portion 948 is provided with a narrow recess 951, which is a recess having a width (interval in the left-right direction) narrower than that of the straight portion 947. The width of the narrow recess 951 is slightly smaller than the outer diameter of the electric wire 920. Thus, the electric wire 920 is pinched while being pressed in the left-right direction. By pinching the electric wire 920 between the pair of narrow recesses 951, even if an unintended external force is applied to the electric wire 920 drawn out from the housing 940, it is possible to resist the external force by the friction between the narrow recesses 951 and the electric wire 920. Thus, a large external force is hardly applied to the contact point between the voltage detection terminal 910 and the electric wire 920.

As illustrated in FIG. 59, the locations on the bottom face 941*a* of the cover mounting recess 941 of the housing 940 at which the pair of electric wire holding pieces 935 of the cover 930 are arranged are formed with a pair of electric wire holding piece recesses 952 extending in the left-right direction at an interval in the front-rear direction, so as to correspond to the pair of electric wire holding pieces 935. The pair of electric wire holding piece recesses 952 sandwich the bending vertex of the bent portion 948 of the electric wire accommodating recess 946 in the front-rear direction.

The electric wire holding piece recesses 952 extend in the left-right direction from the left end edge of the upper face of the housing 940 to the right inner wall 941*b* (see FIG. 59) of the cover mounting recess 941 across the electric wire accommodating recess 946. Each of the locations on the right inner wall 941*b* of the cover mounting recess 941 where the pair of electric wire holding piece recesses 952 are connected is formed with a storage hole 953 recessed rightward (see FIG. 59). When the cover 930 is mounted to the housing 940, the extension ends (that is, the right end) of the pair of electric wire holding pieces 935 of the cover 930 are inserted and stored in the pair of storage holes 953.

Figure 64:
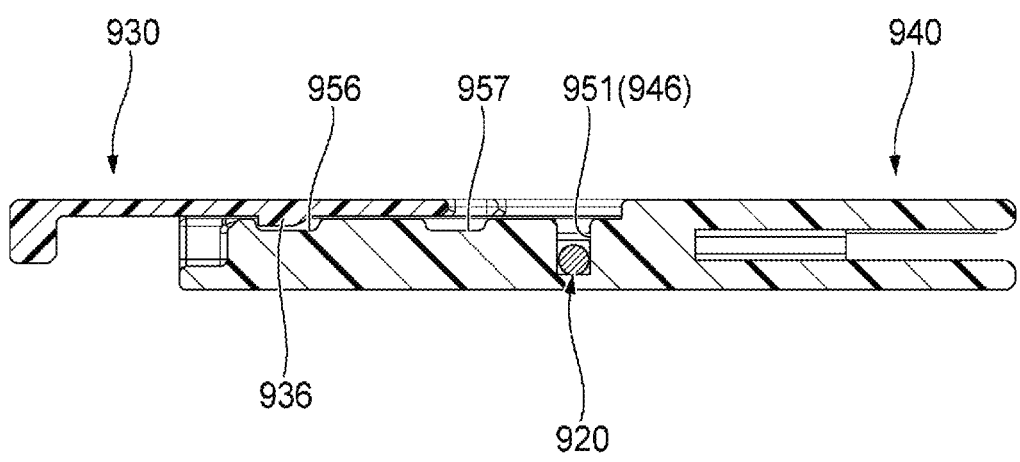
FIG. 64 is a cross-sectional view taken along a line 9D-9D in FIG. 62.
Figure 64:
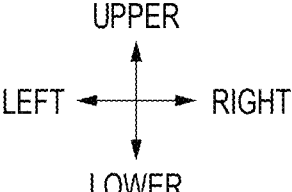
Figure 65:
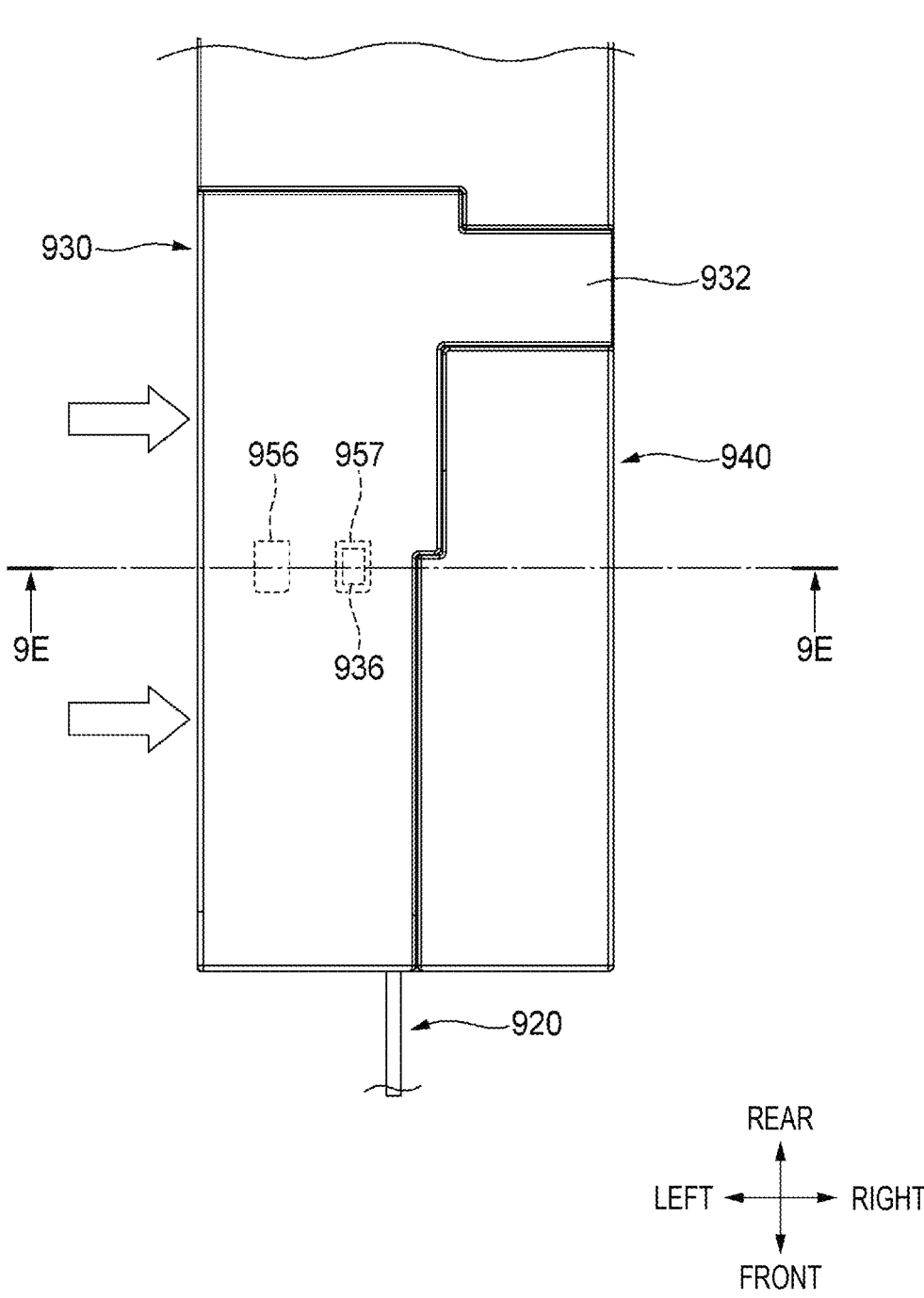
FIG. 65 is a top view illustrating a state in which the cover is locked to the housing at the final locking position.
Figure 66:
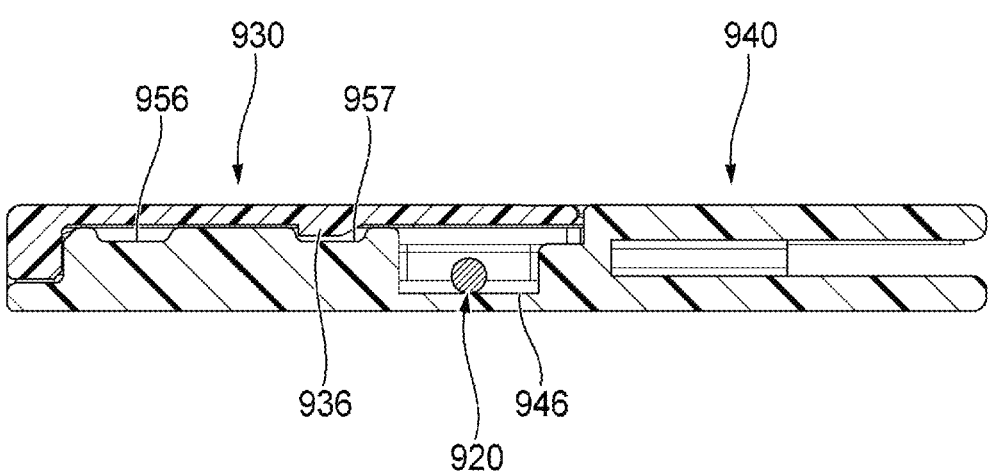
FIG. 66 is a cross-sectional view taken along a line 9E-9E of FIG. 65.
Figure 66:
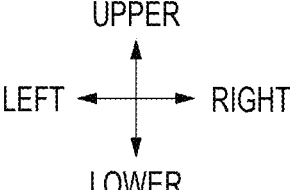

As illustrated in FIG. 59, the bottom face 941*a* of the cover mounting recess 941 of the housing 940 is formed with a temporary locked portion 956 and a final locked portion 957 which are recesses recessed downward (see FIGS. 64 and 66). The temporary locked portions 956 and the final locked portions 957 are provided at locations where the locking portion 936 of the cover 930 is located at the temporary locking position (see FIG. 62) and the final locking position (see FIG. 65), respectively. Specifically, the temporary locked portion 956 and the final locked portion 957 are aligned in the left-right direction such that the final locked portion 957 is positioned to the right of the temporary locked portion 956.

As illustrated in FIG. 59, the bottom face 941*a* of the cover mounting recess 941 of the housing 940 is formed with a pair of front and rear engaging holes 954, so as to correspond to the pair of front and rear engaging projections 933 of the cover 930. Each engaging hole 954 is a through hole penetrating in the upper-lower direction, and has an elongated hole shape extending in the left-right direction so that the engaging projection 933 inserted into and engaged with the engaging hole 954 is movable in the left-right direction. The members constituting the voltage detection unit 905 have been described above.

Next, a procedure for assembling the voltage detection terminal 910 and the cover 930 to the housing 940 will be described. First, the voltage detection terminal 910, which is connected to the electric wire 920 in advance by a method such as ultrasonic joining or welding, is accommodated in the terminal accommodating recess 942 of the housing 940. Thus, the voltage detection terminal 910 is fitted into the terminal accommodating recess 942 of the housing 940 from above such that the projection 913 enters the locking groove (not illustrated) and the one end (contact point) of the electric wire 920 enters the through hole 944. In a state in which the voltage detection terminal 910 is completely accommodated in the housing 940, the upper and lower faces of the tip portion 912*a* of the voltage detection terminal 910 are exposed by the notch 943 (see FIGS. 61 and 62).

Next, the electric wire 920 extending from the voltage detection terminal 910 accommodated in the housing 940 is accommodated in the electric wire accommodating recess 946 of the housing 940. Thus, the electric wire 920 is fitted from above along the electric wire accommodating recess 946 constituted by the pair of straight portions 947 and the bent portion 948. At this time, a pair of portions of the electric wire 920 positioned at the upper portions of the pair of narrow recesses 951 are pushed downward, so that the pair of portions of the electric wire 920 are accommodated in the pair of narrow recesses 951. In a state in which the electric wire 920 is completely accommodated in the housing 940, the electric wire 920 extends forward from the electric wire outlet 949 to the outside of the housing 940.

Figure 61:
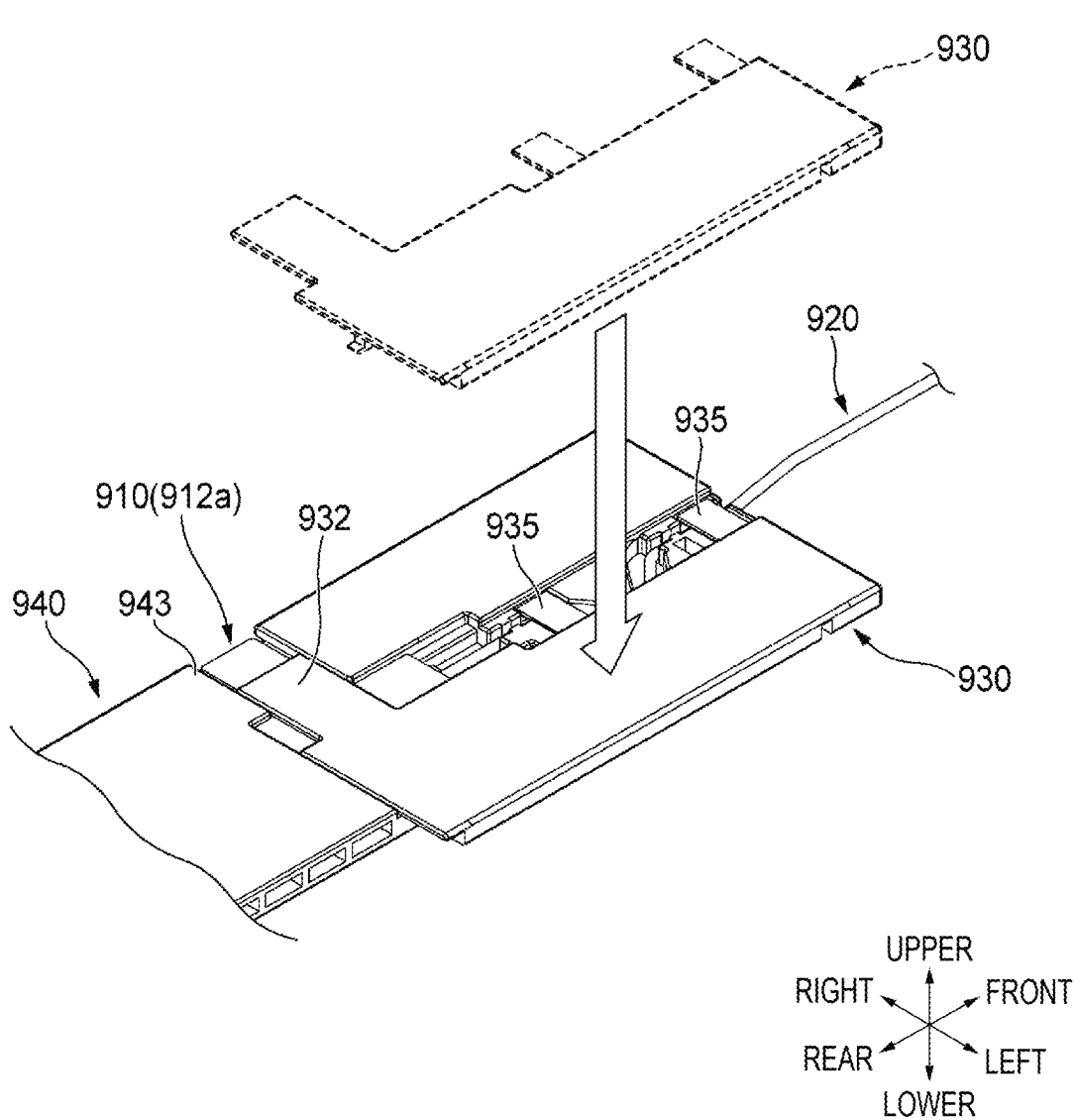
FIG. 61 is a perspective view illustrating a state in which the cover is locked to the housing at a temporary locking position.
Figure 62:
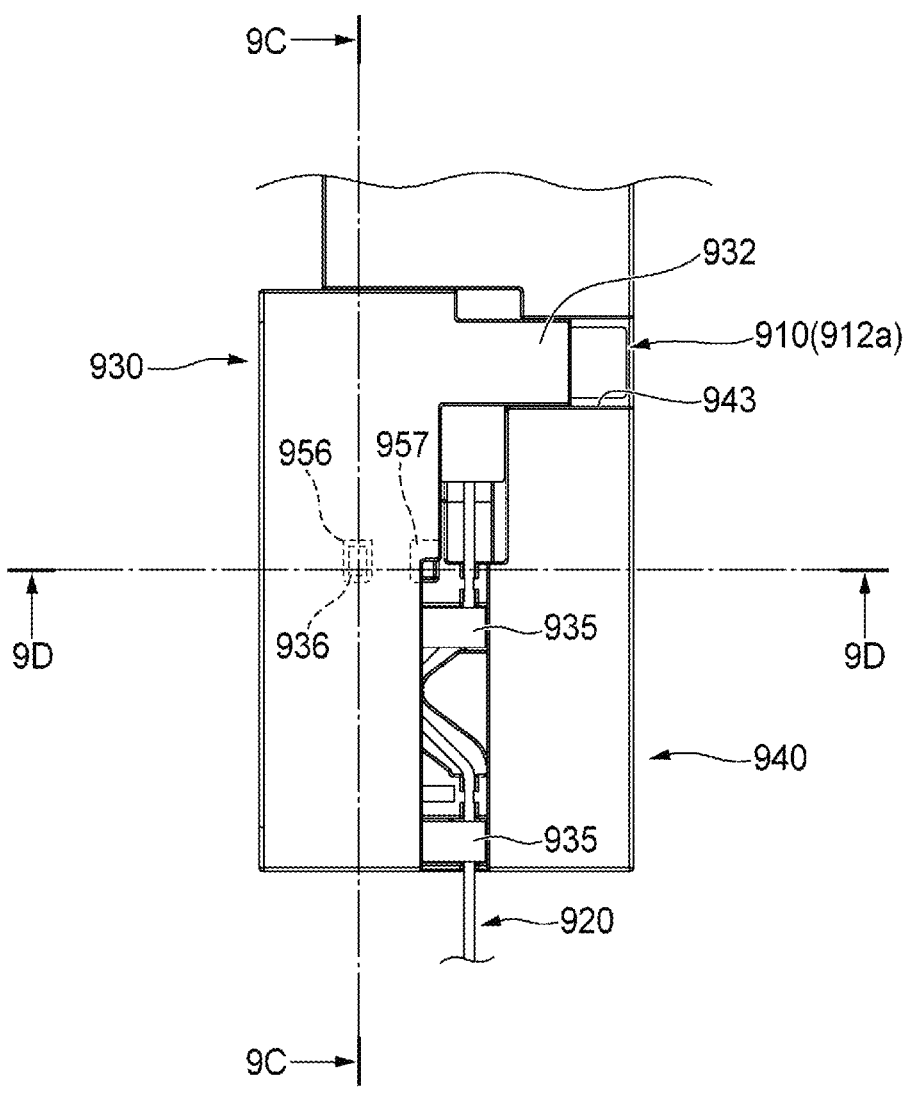
FIG. 62 is a top view illustrating a state in which the cover is locked to the housing at the temporary locking position.
Figure 62:
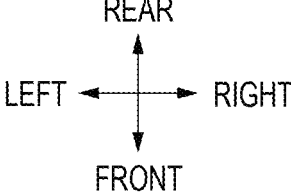

Next, the cover 930 is mounted to the housing 940 by being locked to the housing 940 at the temporary locking position (see FIGS. 61 and 62). Thus, first, as indicated by the broken line in FIG. 61, the cover 930 is disposed above the cover mounting recess 941 of the housing 940. Next, the cover 930 is pushed downward (in the plate thickness direction of the cover 930 and the housing 940) relative to the housing 940 (see the white arrow in FIG. 61) such that the pair of electric wire holding pieces 935 of the cover 930 cover the pair of electric wire holding piece recesses 952 of the housing 940, the locking portion 936 of the cover 930 enters the temporary locked portion 956 of the housing 940, and the pair of front and rear engaging projections 933 of the cover 930 are inserted into and engaged with the pair of front and rear engaging holes 954 of the housing 940.

As described above, the cover 930 is locked to the housing 940 at the temporary locking position, the cover 930 is completely mounted to the housing 940 (see FIGS. 62 to 64) to obtain the voltage detection unit 905 (see FIG. 56). As described later, the voltage detection unit 905 obtained after the cover 930 is completely mounted to the housing 940 (in a state in which the cover 930 is locked at the temporary locking position) is used for assembling the conductive module 903 (see FIG. 56).

Figure 63:
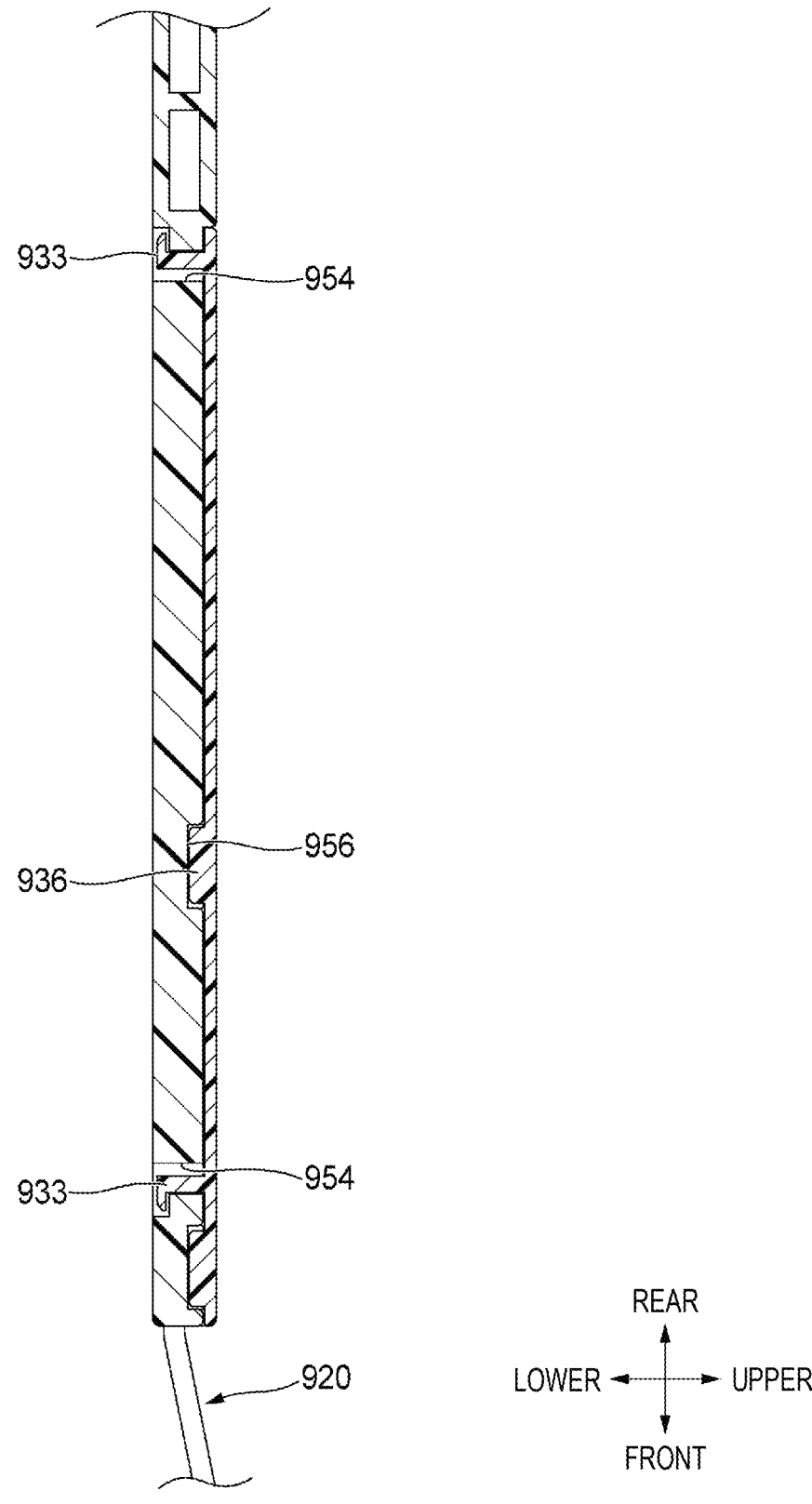
FIG. 63 is a cross-sectional view taken along a line 9C-9C in FIG. 62.

In a state in which the cover 930 is locked at the temporary locking position, the cover 930 is supported so as not to be separable upward from the housing 940 due to the engagement of the pair of front and rear engaging projections 933 and the pair of front and rear engaging holes 954 (see FIG. 63). In a state in which the cover 930 is locked at the temporary locking position, as illustrated in FIGS. 61 and 62, the cover 930 (more specifically, the extension portion 932) does not cover the tip portion 912a of the voltage detection terminal 910. Thus, the upper and lower faces of the tip portion 912a of the voltage detection terminal 910 are also exposed by the notch 943.

In a state in which the cover 930 is locked at the temporary locking position, the pair of electric wire holding pieces 935 of the cover 930 are arranged above the opening of a part of the straight portions 947 and the bent portion 948 of the electric wire accommodating recess 946. This prevents the electric wire 920 from coming out of the electric wire accommodating recess 946. Further, the body 931 of the cover 930 is disposed above the opening of the bending vertex of the bent portion 948 of the electric wire accommodating recess 946 (see FIG. 61). Accordingly, it is possible to strongly prevent the electric wire 920 from being wired in a manner coming out of the electric wire accommodating recess 946 and straddling the bent portion 948 (that is, shortcutting the bent portion 948). In this way, it is possible to reduce the possibility of occurrence of a specific failure caused by the electric wire 920 coming out of the bent portion 948 of the electric wire accommodating recess 946.

In order to move the cover 930 locked at the temporary locking position to the final locking position (see FIG. 65), the cover 930 is pushed rightward (in the board face direction of the cover 930 and the housing 940) relative to the housing 940 (see the white arrows in FIG. 65). In the process in which the cover 930 moves rightward relative to the housing 940, the pair of front and rear engaging projections 933 move rightward in the pair of front and rear engaging holes 954, and the extension ends of the pair of electric wire holding pieces 935 of the cover 930 enter and are stored in the pair of storage holes 953 of the housing 940. Simultaneously, the locking portion 936 of the cover 930 goes beyond the temporary locked portion 956, slides on the bottom face 941a of the cover mounting recess 941, and then enters the inside of the final locked portion 957 to be engaged with the final locked portion 957. Thus, the cover

930 is locked to the housing 940 at the final locking position (see FIGS. 65 and 66). Here, the plate thickness direction of the housing 940 (upper-lower direction) in which the cover 930 is moved from the outside to the temporary locking position is different from the board face direction of the housing 940 (left-right direction) in which the cover 930 is moved from the temporary locking position to the final locking position. As a result, for example, it is possible to prevent the cover 930 to be disposed at the temporary locking position from being erroneously moved to the final locking position.

In a state in which the cover 930 is locked at the final locking position, the cover 930 is maintained in a state of being supported so as not to be separable upward from the housing 940 due to the engagement of the pair of front and rear engaging projections 933 and the pair of front and rear engaging holes 954. In a state in which the cover 930 is locked at the final locking position, as illustrated in FIG. 65, the entire cover mounting recess 941 is covered with the cover 930 without a gap, and thus the entire electric wire accommodating recess 946 is covered with the body 931 of the cover 930. This prevents the electric wire 920 from coming out of the electric wire accommodating recess 946. Further, as illustrated in FIG. 65, the extension portion 932 of the cover 930 covers the upper face of the tip portion 912a of the voltage detection terminal 910. Accordingly, the entire voltage detection terminal 910 is covered with the body 931 and the extension portion 932 of the cover 930, so that the voltage detection terminal 910 can be reliably protected.

As described above, the voltage detection unit 905 obtained after the cover 930 is completely mounted to the housing 940 (in a state in which the cover 930 is locked at the temporary locking position) is used for assembling the conductive module 903 (see FIG. 56). Specifically, first, as illustrated in FIG. 57, the flange 904a of the conductive board 904 is fitted into the recess 905a of the voltage detection unit 905, so that the voltage detection unit 905 is coupled to the left side of the conductive board 904.

In this state, as can be understood from FIG. 58, a part of the flange 904a of the conductive board 904 overlaps the lower side of the tip portion 912a of the voltage detection terminal 910, and the upper face of the tip portion 912a of the voltage detection terminal 910 is exposed upward and the lower face of a part of the flange 904a of the conductive board 904 is exposed downward due to the presence of the notch 943 of the housing 940.

Next, the upper face of the tip portion 912a of the voltage detection terminal 910 exposed upward and the lower face of a part of the flange 904a of the conductive board 904 exposed downward are used to fix the tip portion 912a of the voltage detection terminal 910 and the part of the flange 904a of the conductive board 904 by a method such as ultrasonic joining or welding. Thereafter, the cover 930 is moved from the temporary locking position to the final locking position, and the voltage detection unit 905 is completely assembled to the conductive board 904.

Next, the flange 904b of the conductive board 904 is fitted into the recess 906a of the facing unit 906, so that the facing unit 906 is coupled to the right side of the conductive board 904 to which the voltage detection unit 905 is assembled (see FIG. 57, etc.). Thus, the conductive module 903 is completely assembled.

The conductive module 903 thus obtained is used for assembling the power storage device 901 illustrated in FIG. 56. Specifically, the power storage modules 902 and the conductive modules 903 are alternately stacked in the upper-lower direction, and the stacked body is fixed by a predetermined fitting or the like, thereby obtaining the power storage device 901.

As described above, according to the voltage detection unit 905 according to the ninth embodiment, the cover 930 can be locked to the housing 940 while connecting the voltage detection terminal 910 accommodating the electric wire 920 to the tip portion 911*a* in the terminal accommodating recess 942 of the housing 940 and exposing the tip portion 912*a* of the voltage detection terminal 910. Therefore, when the voltage detection unit 905 is electrically connected to the conductive board 904 (the conductive board 904 of the stacked power storage device 901), for example, after the voltage detection unit 905 is assembled to the conductive board 904, the exposed tip portion 912*a* of the voltage detection terminal 910 can be fixed to the conductive board 904 using a method such as ultrasonic joining or welding. This does not require another component for connection as compared to typical bolt fastening or the like, and can easily align the two components and reduce the contact resistance at the contact point as compared to the connection methods of the related art described above. Further, by disposing the cover 930 at the final locking position after the connection between the conductive board 904 and the voltage detection terminal 910, the tip portion 912*a* of the voltage detection terminal 910 (that is, the contact point therebetween) can be covered and protected by the cover 930.

To attach the cover 930 to the housing 940, in the voltage detection unit 905 of the ninth embodiment, for example, the cover 930 is disposed at the temporary locking position from the outside of the housing 940, and the conductive board 904 and the voltage detection terminal 910 are connected in a state in which the cover 930 is at the temporary locking position. Thereafter, the cover 930 can be moved from the temporary locking position to the final locking position. Here, the plate thickness direction of the housing 940 in which the cover 930 is moved from the outside to the temporary locking position is different from the board face direction of the housing 940 in which the cover 930 is moved from the temporary locking position to the final locking position. As a result, for example, it is possible to prevent the cover 930 to be arranged at the temporary locking position from being erroneously moved to the final locking position, thereby preventing the cover 930 from interfering with the connection between the conductive board 904 and the voltage detection terminal 910.

The invention embodied as the ninth embodiment is not limited to the ninth embodiment, and various modifications can be adopted within the scope of the invention. For example, the present invention is not limited to the ninth embodiment, and modifications, improvements, and the like can be made appropriately. In addition, materials, shapes, sizes, numbers, arrangement positions, and the like of components in the ninth embodiment are freely selected and are not limited as long as the present invention can be implemented.

Here, the features of the embodiment of the voltage detection unit 905 and the power storage device 901 described above are briefly summarized and listed in the following [9-1] to [9-2].

[9-1]

A voltage detection unit (905) including:

a voltage detection terminal (910) having a first location (912*a*) configured to be conductively connected to a detection target (904);

a board-shaped housing (940) having a terminal accommodating recess (942) accommodating the voltage detection terminal (910);

a cover (930) configured to be locked to the housing (940) at a temporary locking position where the first location (912*a*) of the voltage detection terminal (910) accommodated in the terminal accommodating recess (942) is not covered and a final locking position where the first location (912*a*) is covered; and an electric wire (920) conductively connected to a second location (911*a*) of the voltage detection terminal (910) and drawn out toward the outside of the housing (940), in which the housing (940) includes an engaging portion (954) provided to penetrate the housing in a plate thickness direction of the housing (940), the cover (930) includes a projection (933) configured to be inserted into the engaging portion (954) and engaged with the engaging portion (954), and the cover (930) is configured to be moved in the plate thickness direction from the outside such that the projection (933) is inserted into the engaging portion (954) and the cover (930) is arranged at the temporary locking position, and to be moved from the temporary locking position in a board face direction along the board face of the housing (940) such that the cover (930) is arranged at the final locking position.

According to the voltage detection unit having the configuration of the above [9-1], the cover can be locked to the housing while accommodating the voltage detection terminal whose second location is connected to the electric wire in the terminal accommodating recess of the housing and exposing the first location of the voltage detection terminal. Therefore, when the voltage detection unit is electrically connected to a detection target (for example, a conductive board or the like used in a stacked power storage device), for example, after the voltage detection unit is assembled to the detection target, the exposed first location of the voltage detection terminal can be fixed to the detection target using a method such as ultrasonic joining or welding. This does not require another component for connection as compared to typical bolt fastening or the like, and can easily align the two components and reduce the contact resistance at the contact point as compared to the connection methods of the related art described above. Further, by disposing the cover at the final locking position after the detection target and the voltage detection terminal are connected, the first location of the voltage detection terminal (that is, the contact point therebetween) can be covered and protected by the cover.

To attach the cover to the housing, in the voltage detection unit of the present configuration, for example, the cover can be moved from the outside of the housing in the plate thickness direction to be locked at the temporary locking position, and the detection target and the voltage detection terminal are connected in a state in which the cover is at the temporary locking position. Thereafter, the cover can be moved in the board face direction from the temporary locking position to the final locking position. Here, the plate thickness direction in which the cover is moved from the outside to the temporary locking position is different from the board face direction in which the cover is moved from the temporary locking position to the final locking position. As a result, for example, it is possible to prevent the cover to be arranged at the temporary locking position from being erroneously moved to the final locking position, thereby preventing the cover from interfering with the connection between the detection target and the voltage detection terminal.

Accordingly, the voltage detection unit of the present configuration is excellent in workability for conductively connecting to the detection target. Furthermore, the voltage detection unit of the present configuration is less likely to cause variation in contact resistance at the contact point between the detection target and the voltage detection terminal due to the manufacturing tolerance thereof, and thus is also excellent in voltage detection accuracy, as compared to the above-described power storage device of the related art.

[9-2]

A power storage device (901) including:

a board-shaped conductive module (903) including the voltage detection unit (905) according to the above [9-1] and a conductive board (904) as the detection target to which the voltage detection terminal (910) is conductively connected; and a power storage module (902) configured to be charged and discharged, on which the conductive module (903) is stacked.

In the power storage device having the configuration of the above [9-2], the voltage detection unit used in the power storage device is configured such that the cover can be locked to the housing while accommodating the voltage detection terminal whose second location is connected to the electric wire in the terminal accommodating recess of the housing and exposing the first location of the voltage detection terminal. Therefore, when the voltage detection unit is electrically connected to a detection target (for example, a conductive board or the like used in a stacked power storage device), for example, after the voltage detection unit is assembled to the detection target, the exposed first location of the voltage detection terminal can be fixed to the detection target using a method such as ultrasonic joining or welding. This does not require another component for connection as compared to typical bolt fastening or the like, and can easily align the two components and reduce the contact resistance at the contact point as compared to the connection methods of the related art described above. Further, by disposing the cover at the final locking position after the detection target and the voltage detection terminal are connected, the first location of the voltage detection terminal (that is, the contact point therebetween) can be covered and protected by the cover.

To attach the cover to the housing, in the voltage detection unit of the present configuration, for example, the cover can be moved from the outside of the housing in the plate thickness direction to be locked at the temporary locking position, and the detection target and the voltage detection terminal are connected in a state in which the cover is at the temporary locking position. Thereafter, the cover can be moved in the board face direction from the temporary locking position to the final locking position. Here, the plate thickness direction in which the cover is moved from the outside to the temporary locking position is different from the board face direction in which the cover is moved from the temporary locking position to the final locking position. As a result, for example, it is possible to prevent the cover to be arranged at the temporary locking position from being erroneously moved to the final locking position, thereby preventing the cover from interfering with the connection between the detection target and the voltage detection terminal.

Accordingly, the power storage device of the present configuration is excellent in workability for conductively connecting to the detection target. Furthermore, the power storage device of the present configuration is less likely to cause variation in contact resistance at the contact point between the detection target and the voltage detection terminal due to the manufacturing tolerance thereof, and thus is also excellent in voltage detection accuracy, as compared to the above-described power storage device of the related art.

Tenth Embodiment

The invention embodied as a tenth embodiment relates to a voltage detection unit and a power storage device configured such that a voltage detection terminal to be conductively connected to a detection target is accommodated in a board-shaped housing.

The related art has proposed a stacked power storage device in which a plurality of chargeable and dischargeable thin power storage modules are connected in series via conductive boards by alternately arranging and repeatedly stacking the board-shaped power storage modules and the conductive boards. The power storage modules used in this type of power storage device generally have a structure in which a plurality of battery cells are incorporated, and function as one battery capable of charging and discharging. In one of the power storage devices of the related arts, in order to monitor the output state of each power storage module (that is, the potential of the output face of each power storage module relative to the zero potential as a reference; hereinafter, simply referred to as "voltage of the power storage module"), a detection terminal such as a bus bar is connected to the conductive board in contact with the output face of the power storage module, and the voltage of the power storage module is measured through the detection terminal (for example, see JP2020-161340A).

However, when actually connecting the bus bar or the like to the conductive board in the power storage device having the above-described structure, since the power storage modules and the conductive boards have a thin plate shape, it is difficult to secure a space for installing the other components for connection (for example, bolts for bolt fastening or the like). Therefore, the power storage device of the related art described above is provided with an insertion hole for inserting the detection terminal in the side edge of each conductive board. The detection terminal is inserted into the insertion hole of the conductive board from the lateral side of the stacked body in which the power storage modules and the conductive boards are stacked, thereby connecting the conductive board and the detection terminal. However, according to this connection method of the related art, the positioning between the insertion hole of the conductive board and the detection terminal is complicated when inserting the detection terminal, which makes it difficult to improve the workability of connection work.

An object of the invention embodied as the tenth embodiment is to provide a voltage detection unit excellent in workability in a conductive connection with a detection target, and a power storage device using the voltage detection unit.

Figure 67:
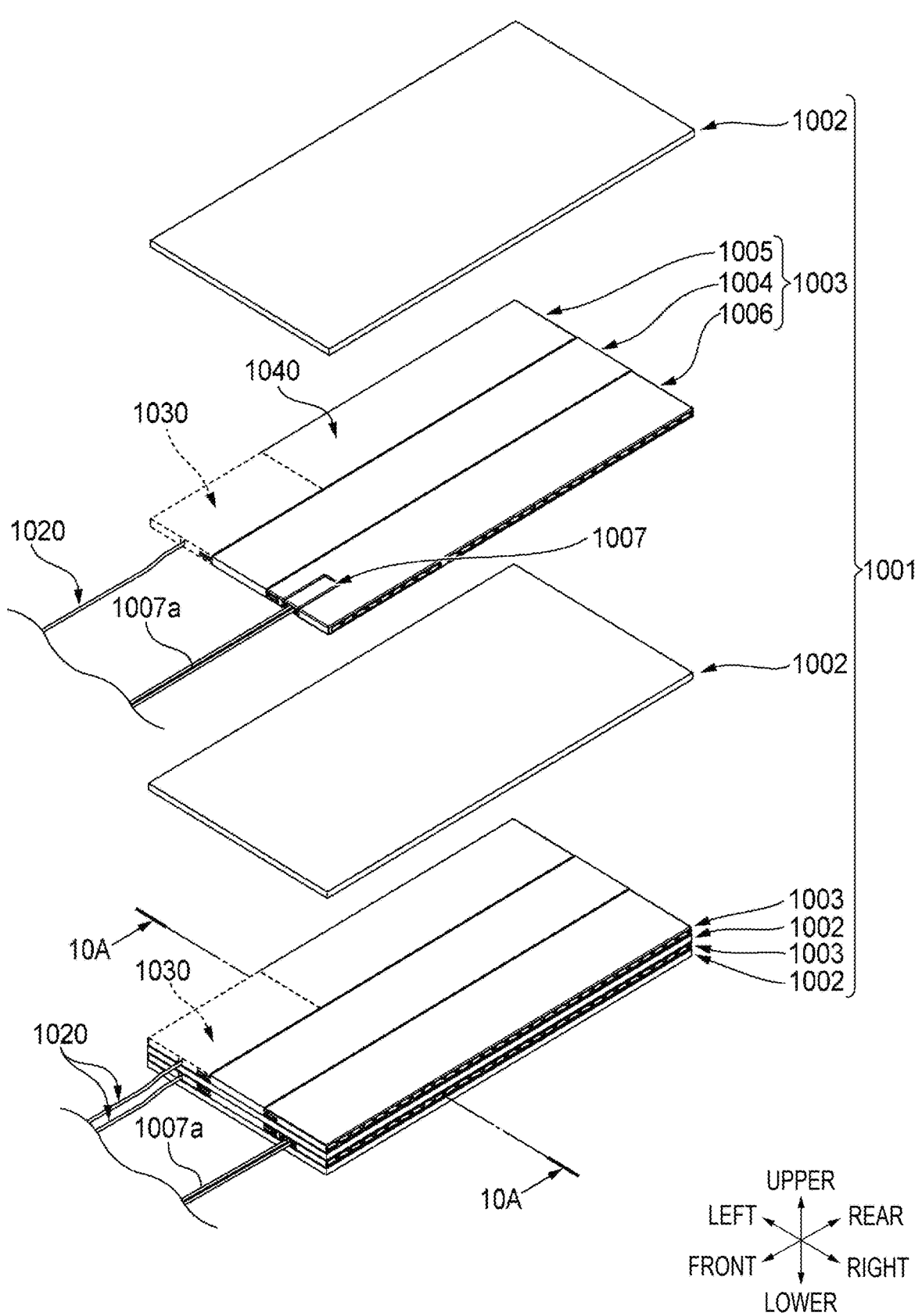
FIG. 67 is a partially exploded perspective view illustrating a stacked power storage device including a voltage detection unit according to a tenth embodiment.

Hereinafter, a voltage detection unit 1005 and a power storage device 1001 according to the tenth embodiment will be described with reference to FIGS. 67 to 75. Hereinafter, for convenience of description, "front", "rear", "upper", "lower", "left", "right", a "front-rear direction", a "left-right direction", and an "upper-lower direction" are defined as illustrated in FIG. 67. The "front-rear direction", the "left-right direction", and the "upper-lower direction" are orthogonal to one another.

The voltage detection unit 1005 is typically used in a stacked power storage device 1001 illustrated in FIG. 67. The power storage device 1001 is formed by alternately stacking, in the upper-lower direction, thin rectangular board-shaped power storage modules 1002 capable of charging and discharging and rectangular thin board-shaped conductive modules 1003 capable of electrically connecting adjacent power storage modules 1002. In the power storage device 1001, a plurality of power storage modules 1002 are electrically connected in series via the conductive modules 1003. Each power storage module 1002 has a structure in which a plurality of battery cells (not illustrated) are incorporated, and the power storage modules 1002 as a whole function as one battery capable of charging and discharging.

Figure 68:
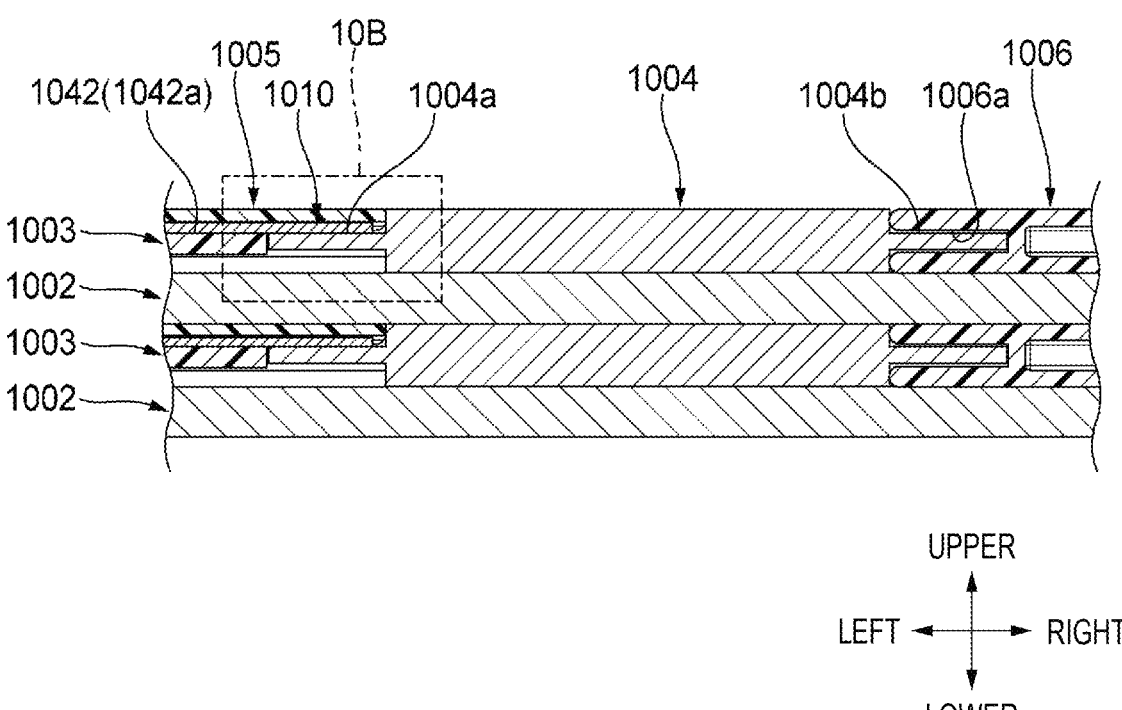
FIG. 68 is a cross-sectional view taken along a line 10A-10A in FIG. 67.
Figure 69:
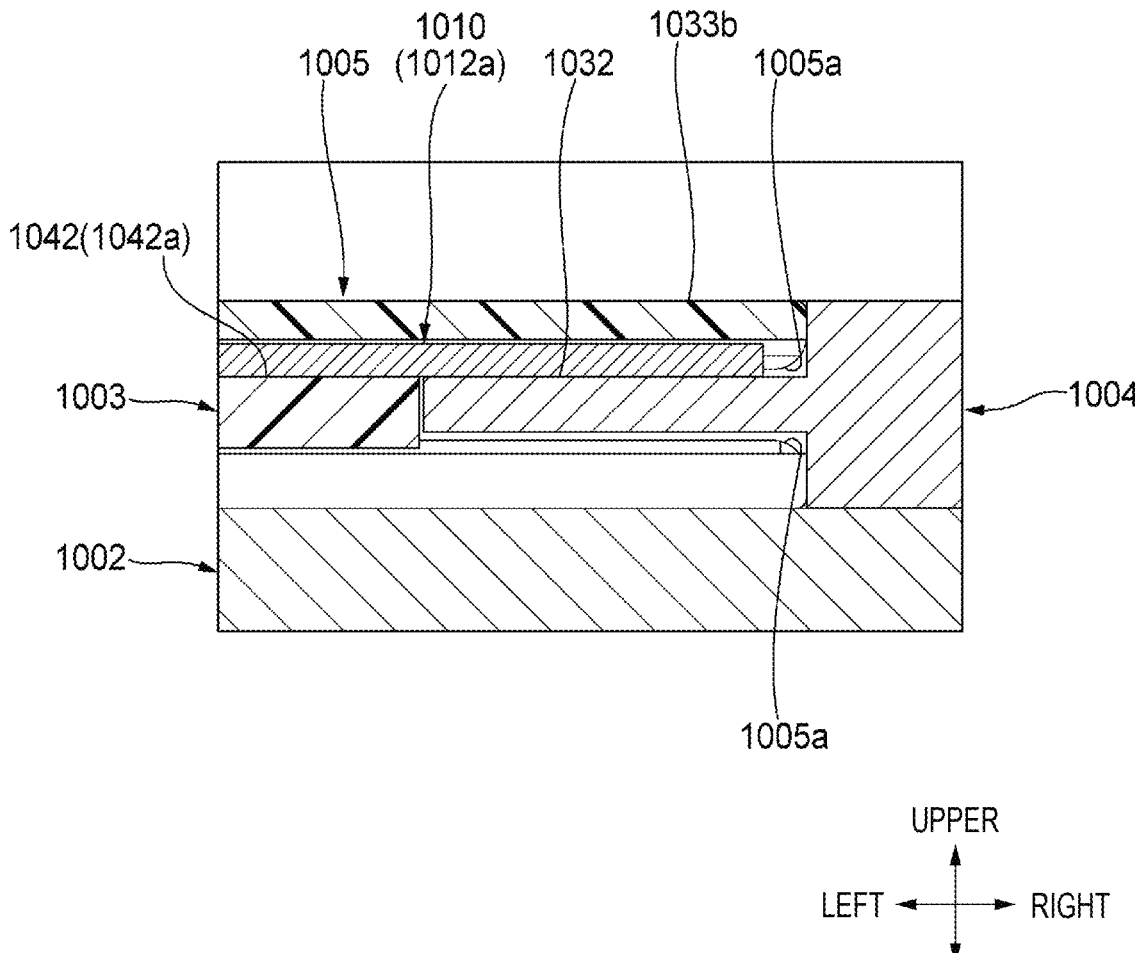
FIG. 69 is an enlarged view of a portion 10B in FIG. 68.

As illustrated in FIG. 67, each conductive module 1003 is formed to have a rectangular thin board shape as a whole by a rectangular thin board-shaped conductive board 1004 (the conductive board 1004 also functions as a heat sink as described later), the rectangular thin board-shaped voltage detection unit 1005 coupled to the left side of the conductive board 1004, and a rectangular thin board-shaped facing unit 1006 coupled to the right side of the conductive board 1004. As illustrated in FIGS. 67 to 69 (in particular, see FIG. 68), the conductive board 1004 and the voltage detection unit 1005 are coupled to each other by fitting a flange 1004a into a recess 1005a. The flange 1004a is provided on the left end face of the conductive board 1004 and extends in the front-rear direction. The recess 1005a is provided on the right end face of the voltage detection unit 1005 and extends in the front-rear direction. The conductive board 1004 and the facing unit 1006 are coupled to each other by fitting a flange 1004b into a recess 1006a. The flange 1004b is provided on the right end face of the conductive board 1004 and extends in the front-rear direction. The recess 1006a is provided on the left end face of the facing unit 1006 and extends in the front-rear direction.

In each of the conductive modules 1003 positioned between the power storage modules 1002 adjacent to each other in the upper-lower direction, the conductive board 1004 is in direct contact with the upper and lower power storage modules 1002 as illustrated in FIG. 68. Thus, the conductive board 1004 functions to perform conduction between a lower face of the upper power storage module 1002 and an upper face of the lower power storage module 1002, and functions as a heat sink that releases heat generated from the upper and lower power storage modules 1002 to the outside.

In each of the conductive modules 1003 located between the power storage modules 1002 adjacent to each other in the upper-lower direction, the voltage detection unit 1005 includes a voltage detection terminal 1010 (see FIG. 68 and the like) in contact with the conductive board 1004, which is to be described later. The voltage detection unit 1005 has a function of outputting a signal indicating a voltage between the upper and lower power storage modules 1002 (specifically, the potential of the upper face (output face) of the lower power storage module 1002 relative to the zero potential as a reference) via an electric wire 1020 (see FIG. 67, etc.) connected to the voltage detection terminal 1010. The voltage detection unit 1005 is disposed to the left of the conductive board 1004 in FIGS. 67 to 69, but a voltage detection unit having the same function as the voltage detection unit 1005 may be disposed to the right of the conductive board 1004. In this case, a voltage detection unit obtained by reversing the entire configuration of the voltage detection unit 1005 in the left-right direction (that is, a mirror component of the voltage detection unit 1005) is used as the voltage detection unit having the same function as that of the voltage detection unit 1005.

Any one of a voltage detection unit, a dummy unit, and a temperature detection unit, which will be described later, is applied as the facing unit 1006 to each of the conductive modules 1003 positioned between the power storage modules 1002 adjacent to each other in the upper-lower direction, according to the specification of the power storage device 1001.

If the facing unit 1006 is a voltage detection unit, a voltage detection unit obtained by reversing the entire configuration of the voltage detection unit 1005 in the left-right direction (that is, a mirror component of the voltage detection unit 1005 described above) is used as the facing unit 1006. In this case, the voltage detection unit 1005 is disposed to the left of the conductive board 1004, and the mirror component of the voltage detection unit 1005 is disposed to the right of the conductive board 1004. The facing unit 1006 (a mirror component of the voltage detection unit 1005) has the same function as that of the voltage detection unit 1005.

If the facing unit 1006 is a dummy unit, a simple resin board having a recess 1006a (see FIG. 68) extending in the front-rear direction is used as the facing unit 1006. In this case, the facing unit 1006 performs only the function of filling the gap between the upper and lower power storage modules 1002.

If the facing unit 1006 is a temperature detection unit, the facing unit 1006 has a structure in which a temperature sensor 1007 (thermistor) is incorporated in a resin board used as a dummy unit as illustrated in FIG. 67. In this case, the facing unit 1006 has a function of outputting a signal indicating the temperature of the upper and lower power storage modules 1002 via an electric wire 1007a (see FIG. 67) connected to the temperature sensor 1007.

Figure 70:
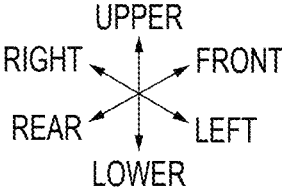
FIG. 70 is an exploded perspective view of the voltage detection unit illustrated in FIG. 67.
Figure 71:
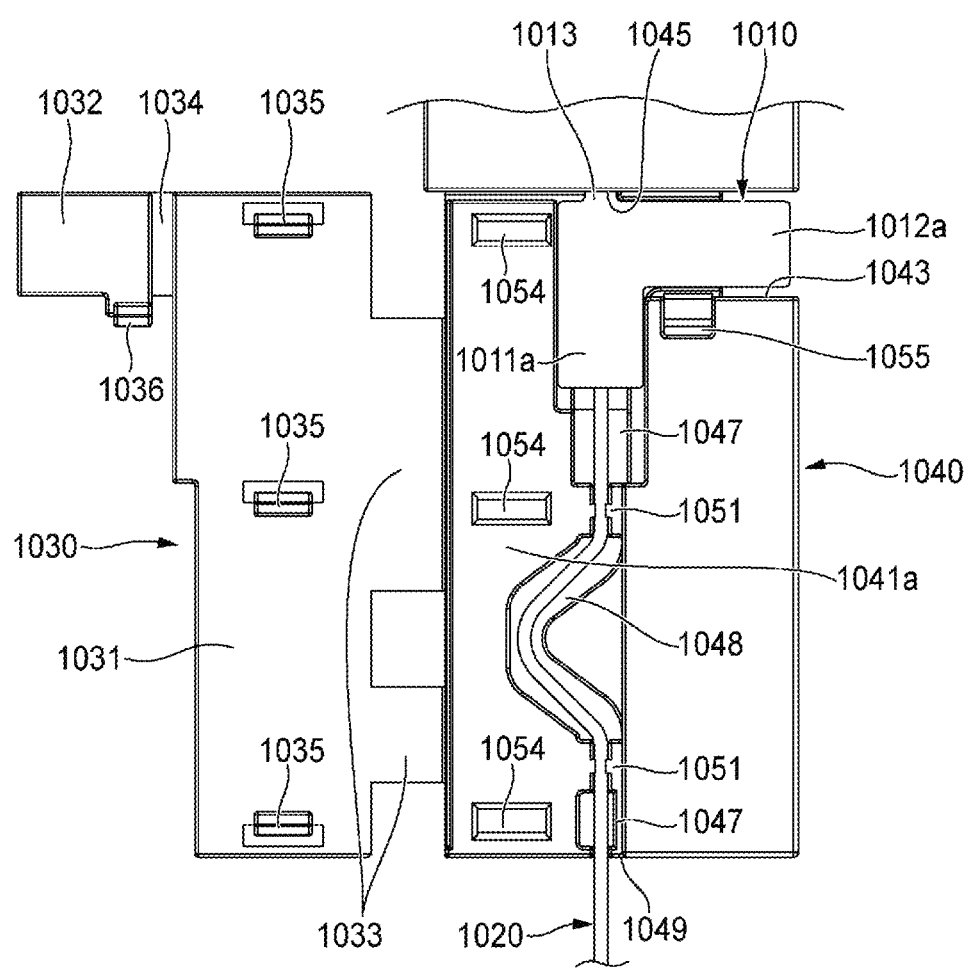
FIG. 71 is a top view illustrating a state in which the entire cover is opened.
Figure 71:
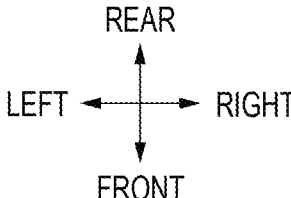

Hereinafter, a specific configuration of the voltage detection unit 1005 according to the tenth embodiment will be described with reference to FIGS. 70 to 75. As illustrated in FIG. 70, the voltage detection unit 1005 includes a housing 1040, a voltage detection terminal 1010 accommodated in the housing 1040, an electric wire 1020 connected to the voltage detection terminal 1010 and accommodated in the housing 1040, and a cover 1030 mounted to the housing 1040.

The voltage detection terminal 1010 is accommodated in a terminal accommodating recess 1042 (see FIG. 70) formed in the housing 1040, which is to be described later. The electric wire 1020 is accommodated in an electric wire accommodating recess 1046 (see FIG. 70) formed in the housing 1040, which is to be described later. The cover 1030 is mounted in a cover mounting recess 1041 (see FIG. 70) formed in the housing 1040, which is to be described later. Hereinafter, the members constituting the voltage detection unit 1005 will be described in order.

First, the voltage detection terminal 1010 will be described. The voltage detection terminal 1010 made of metal is formed by one metal board being subjected to processing such as a pressing process. The voltage detection terminal 1010 is accommodated in the terminal accommodating recess 1042 of the housing 1040 from above. As illustrated in FIG. 70, the voltage detection terminal 1010 includes a rectangular flat plate-shaped first cover portion 1011 extending in the front-rear direction and a rectangular flat plate-shaped second cover portion 1012 extending rightward from the rear end of the first cover portion 1011, and has a substantially L-shaped flat plate shape as a whole when viewed in the upper-lower direction.

One end of the electric wire 1020 is fixed and electrically connected to the lower face of the tip portion 1011a of the first cover portion 1011 (that is, end closer to the front end). The other end of the electric wire 1020 is to be connected to a voltage measuring device (not illustrated) outside the power storage device 1001. A part of the flange 1004a of the conductive board 1004 is to be fixed to the lower face of a tip portion 1012a of the second cover portion 1012 (that is, the end closer to the right end) by a method such as ultrasonic joining or welding (see FIG. 69).

The rear end edge of the second cover portion 1012 is formed with a projection 1013 projecting rearward. When the voltage detection terminal 1010 is accommodated in the housing 1040, the projection 1013 is to be locked in a locking groove 1045 (see FIG. 71) formed in the housing 1040.

Next, the cover 1030 will be described. The cover 1030 is a resin molded article and is mounted to the cover mounting recess 1041 of the housing 1040. The cover 1030 includes a first cover portion 1031 coupled to the left end edge of the housing 940 extending in the front-rear direction via a first coupling portion 1033 that can be curved in a hinge shape, and a second cover portion 1032 coupled to the first cover portion 1031 via a second coupling portion 1034 that can be curved in a hinge shape. Hereinafter, for convenience of description, the state of the cover 1030 illustrated in FIG. 70 is referred to as a "state in which the cover 1030 is open".

In a state in which the cover 1030 is open, the first cover portion 1031 has a substantially rectangular flat plate shape extending leftward from the left end edge of the housing 1040 via the first coupling portion 1033 and elongated in the front-rear direction, and the second cover portion 1032 has a substantially rectangular flat plate shape extending leftward from the left end edge of the rear end of the first cover portion 1031 via the second coupling portion 1034. The first cover portion 1031 mainly functions to cover and protect the electric wire 1020, and the second cover portion 1032 mainly functions to cover and protect the voltage detection terminal 1010.

In a state in which the cover 1030 is open, as illustrated in FIG. 70, the upper face of the first cover portion 1031 is formed with three temporary locking portions 1035 projecting upward at an interval in the front-rear direction. The three temporary locking portions 1035 function to lock the first cover portion 1031 of the cover 1030 to the housing 1040 to place the cover 1030 in the temporary locking state (see FIGS. 72 and 73) in cooperation with three temporary locked portions 1054 (see FIG. 70) provided in the housing 1040, which is to be described later. Similarly, in a state in which the cover 1030 is open, as illustrated in FIG. 70, the upper face of the second cover portion 1032 is formed with a final locking portion 1036 projecting upward. The final locking portion 1036 functions to lock the second cover portion 1032 of the cover 1030 to the housing 1040 to place the cover 1030 in the final locking state (see FIGS. 74 and 75) in cooperation with a final locked portion 1055 (see FIG. 70) provided in the housing 1040, which is to be described later.

Next, the housing 1040 will be described. The housing 1040 is a resin molded article and has a substantially thin rectangular board shape extending in the front-rear direction as illustrated in FIG. 67 and the like. The right end face of the housing 1040 is formed with a recess 1005a recessed leftward and extending in the front-rear direction. The flange 1004a of the conductive board 1004 is to be fitted into the recess 1005a (see FIG. 68).

The location on the upper face of the housing 1040 where the cover 1030 is mounted is formed with the cover mounting recess 1041 recessed into a shape corresponding to the entire shape of the cover 1030 (see FIG. 70). The recess depth (depth in the upper-lower direction) of the cover mounting recess 1041 is equal to the plate thickness of the resin material constituting the cover 1030 (the first cover portion 1031+the second cover portion 1032). Thus, when the cover 1030 is mounted to the housing 1040, the upper face of the housing 1040 is flush with the upper face of the cover 1030 (see FIGS. 67 and 74).

The location where the voltage detection terminal 1010 is accommodated on a bottom face 1041a of the cover mounting recess 1041 of the housing 1040 is formed with a terminal accommodating recess 1042 further recessed into a shape corresponding to the entire shape of the voltage detection terminal 1010 (see FIG. 70). The recess depth (depth in the upper-lower direction) of the terminal accommodating recess 1042 is equal to the plate thickness of the voltage detection terminal 1010. Thus, when the voltage detection terminal 1010 is mounted to the housing 1040, the upper face of the voltage detection terminal 1010 is flush with the bottom face 1041a of the cover mounting recess 1041.

The position in the front-rear direction in the right end edge of the housing 1040 where the tip portion 1012a of the voltage detection terminal 1010 is disposed is formed with a notch 1043 recessed leftward into a substantially rectangular shape when viewed in the upper-lower direction. The recess 1005a extending in the front-rear direction in the right end face of the housing 1040 is divided by the notch 1043. When the voltage detection terminal 1010 is accommodated in the housing 1040, the upper and lower faces of the tip portion 1012a of the voltage detection terminal 1010 are to be exposed by the notch 1043 (see FIGS. 71 and 72).

The location in the terminal accommodating recess 1042 where the tip portion 1011a of the voltage detection terminal 1010 is disposed is formed with a through hole 1044 extending in the front-rear direction and penetrating in the upper-lower direction (see FIG. 70). When the voltage detection terminal 1010 is accommodated in the housing 1040, the one end (contact point) of the electric wire 1020 connected to the voltage detection terminal 1010 enters the through hole 1044. In other words, the through hole 1044 functions as a clearance for avoiding interference between the bottom face 1042a of the terminal accommodating recess 1042 and the one end of the electric wire 1020.

The inner wall face of the location in the terminal accommodating recess 1042 where the projection 1013 (see FIG. 70) of the voltage detection terminal 1010 is disposed is formed with a locking groove 1045 (see FIG. 71) recessed rearward and communicating with the recess 1005a, so as to correspond to the projection 1013.

The location on the bottom face 1041a of the cover mounting recess 1041 of the housing 1040 where the electric wire 1020 is accommodated is formed with an electric wire accommodating recess 1046 having a shape corresponding to the wiring form of the electric wire 1020 when the electric wire 1020 is accommodated (see FIG. 70). The electric wire accommodating recess 1046 is a continuous groove including a pair of straight portions 1047 extending linearly in the front-rear direction and arranged at an interval in the front-rear direction, and a bent portion 1048 connecting the pair of straight portions 1047 and extending while being bent to project leftward. The rear end of the rear straight portion 1047 of the pair of straight portions 1047 communicates with the terminal accommodating recess 1042, and the front end of the front straight portion 1047 of the pair of straight portions 1047 constitutes an electric wire outlet 1049 from which the electric wire 1020 extends from the front end edge of the housing 1040. In this way, since the electric wire accommodating recess 1046 has the bent portion 1048, as compared with a case where the electric wire accommodating recess 1046 is formed of only the straight portions 1047, even if an unintended external force is applied to the electric wire 1020 drawn out from the housing 1040, the electric wire 1020 can resist the external force due to the friction between the bent portion 1048 and the electric wire 1020. Thus, a large external force is hardly applied to the contact point between the voltage detection terminal 1010 and the electric wire 1020.

The location in each of the pair of straight portions 1047 near the boundary with the bent portion 1048 is provided with a narrow recess 1051, which is a recess having a width (interval in the left-right direction) narrower than that of the straight portion 1047. The width of the narrow recess 1051 is slightly smaller than the outer diameter of the electric wire 1020. Thus, the electric wire 1020 is pinched while being pressed in the left-right direction. By pinching the electric wire 1020 between the pair of narrow recesses 1051, even if an unintended external force is applied to the electric wire 1020 drawn out from the housing 1040, it is possible to resist the external force by friction between the narrow recesses 1051 and the electric wire 1020. Thus, a large external force is hardly applied to the contact point between the voltage detection terminal 1010 and the electric wire 1020.

As illustrated in FIG. 70, the bottom face 1041*a* of the cover mounting recess 1041 of the housing 1040 is formed with three temporary locked portions 1054, which are recesses recessed downward, at an interval in the front-rear direction, so as to correspond to the three temporary locking portions 1035 of the cover 1030. Similarly, the final locked portion 1055, which is a recess recessed downward, is formed to correspond to the final locking portion 1036 of the cover 1030. The members constituting the voltage detection unit 1005 have been described above.

Next, a procedure for assembling the voltage detection terminal 1010 and the cover 1030 to the housing 1040 will be described. First, the voltage detection terminal 1010, which is connected to the electric wire 1020 in advance by a method such as ultrasonic joining or welding, is accommodated in the terminal accommodating recess 1042 of the housing 1040. Thus, the voltage detection terminal 1010 is fitted into the terminal accommodating recess 1042 of the housing 1040 from above such that the projection 1013 enters the locking groove 1045 (see FIG. 71) and the one end (contact point) of the electric wire 1020 enters the through hole 1044. In a state in which the voltage detection terminal 1010 is completely accommodated in the housing 1040, the upper and lower faces of the tip portion 1012*a* of the voltage detection terminal 1010 are exposed by the notch 1043 (see FIGS. 71 and 72).

Next, the electric wire 1020 extending from the voltage detection terminal 1010 accommodated in the housing 1040 is accommodated in the electric wire accommodating recess 1046 of the housing 1040. Thus, the electric wire 1020 is fitted from above along the electric wire accommodating recess 1046 constituted by the pair of straight portions 1047 and the bent portion 1048. At this time, a pair of portions of the electric wire 1020 positioned at the upper portions of the pair of narrow recesses 1051 are pushed downward, so that the pair of portions of the electric wire 1020 are accommodated in the pair of narrow recesses 1051. In a state in which the electric wire 1020 is completely accommodated in the housing 1040, the electric wire 1020 extends forward from the electric wire outlet 1049 to the outside of the housing 1040.

Figure 72:
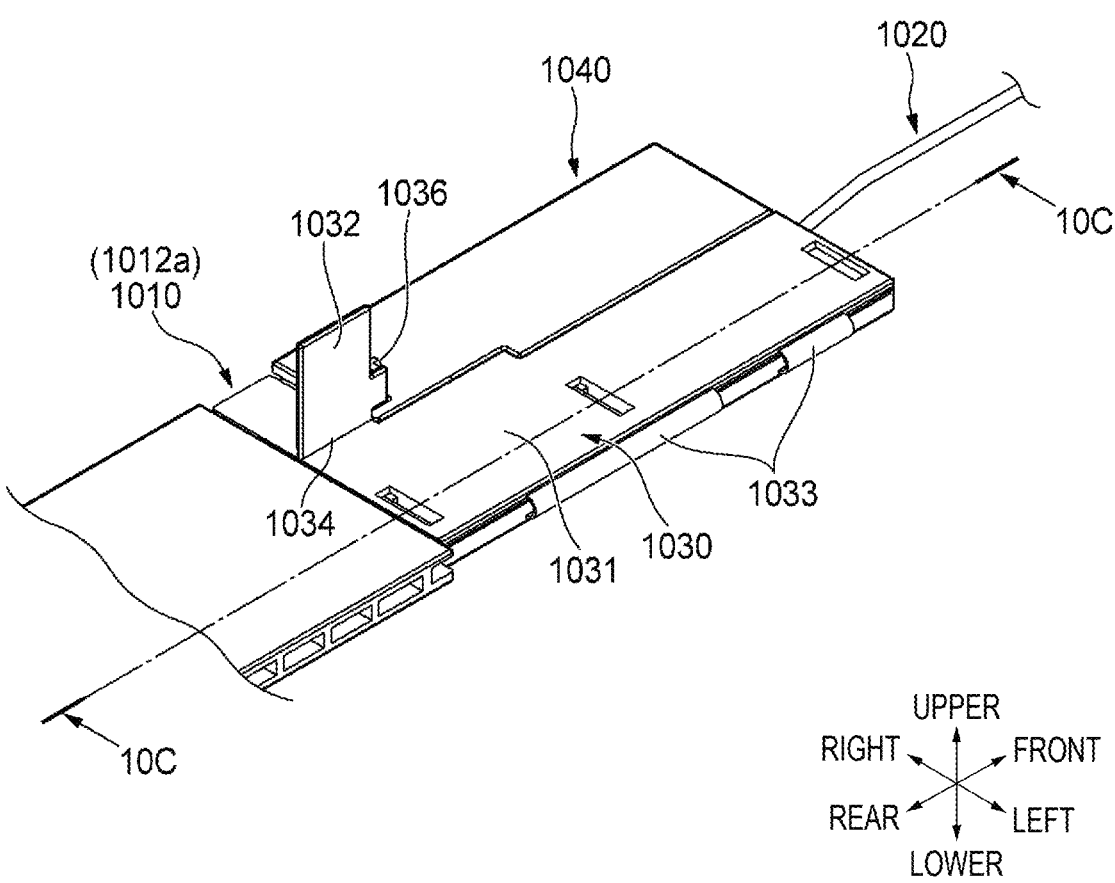
FIG. 72 is a perspective view illustrating a temporary locking state of the cover.
Figure 73:
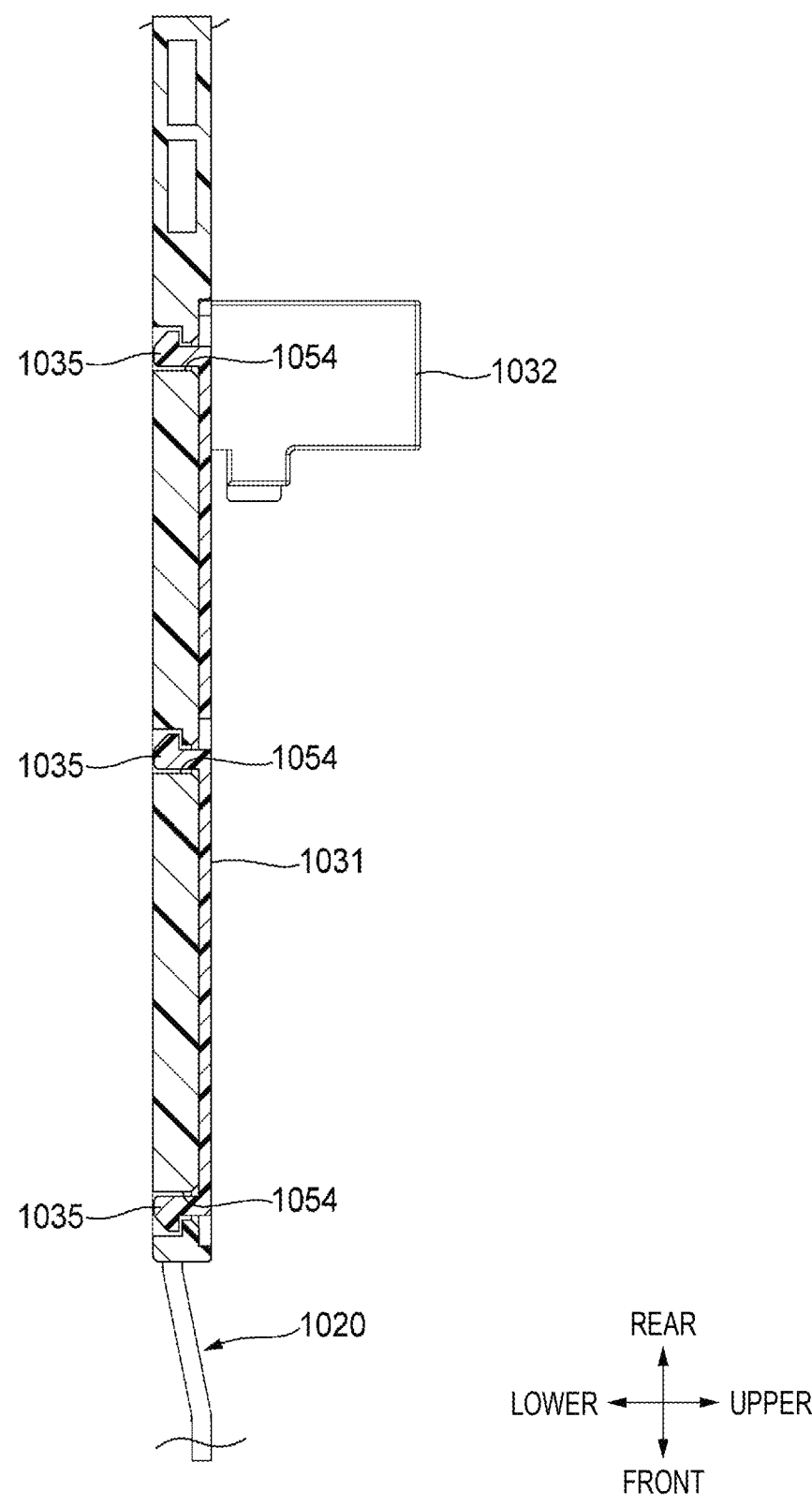
FIG. 73 is a cross-sectional view taken along a line 10C-10C in FIG. 72.

Next, the cover 1030 is brought into the temporary locking state (FIGS. 72 and 73). Thus, when the first cover portion 1031 of the cover 1030 is folded upward by curving the first coupling portion 1033 from the state in which the cover 1030 is open, the first cover portion 1031 is positioned above the cover mounting recess 1041 of the housing 1040. Next, the first cover portion 1031 of the cover 1030 is pushed downward relative to the housing 1040 so that the three temporary locking portions 1035 of the cover 1030 enter the three temporary locked portions 1054 of the housing 1040.

As described above, when the first cover portion 1031 of the cover 1030 is locked to the housing 1040, the cover 1030 is in the temporary locking state (see FIGS. 72 and 73). In the temporary locking state of the cover 1030, the second cover portion 1032 of the cover 1030 is not locked to the housing 1040. Accordingly, the orientation of the second cover portion 1032 relative to the housing 1040 can be adjusted freely by curving the second coupling portion 1034. In the example illustrated in FIG. 72, the second cover portion 1032 stands substantially upward. When the cover 1030 is in the temporary locking state, the cover 1030 is completely mounted to the housing 1040 to obtain the voltage detection unit 1005 (see FIG. 67). As described later, the voltage detection unit 1005 obtained after the cover 1030 is completely mounted to the housing 1040 and the cover 1030 is in the temporary locking state is to be used for assembling the conductive module 1003 (see FIG. 67).

In the temporary locking state of the cover 1030, as illustrated in FIG. 72, the cover 1030 (more specifically, the second cover portion 1032) does not cover the tip portion 1012*a* of the voltage detection terminal 1010. Thus, the upper and lower faces of the tip portion 1012*a* of the voltage detection terminal 1010 are also exposed by the notch 1043.

In the temporary locking state of the cover 1030, the first cover portion 1031 of the cover 1030 is disposed above the opening of the bending vertex of the bent portion 1048 of the electric wire accommodating recess 1046 (see FIG. 72). Accordingly, it is possible to strongly prevent the electric wire 1020 from being wired in a manner coming out of the electric wire accommodating recess 1046 and straddling the bent portion 1048 (that is, shortcutting the bent portion 1048). In this way, it is possible to reduce the possibility of occurrence of a specific failure caused by the electric wire 1020 coming out of the bent portion 1048 of the electric wire accommodating recess 1046.

In order to shift the cover 1030 in the temporary locking state to the final locking state (see FIG. 74), the second cover portion 1032 of the cover 1030 is pushed downward relative to the housing 1040 so that the final locking portion 1036 of the cover 1030 enters the inside of the final locked portion 1055 of the housing 1040. Accordingly, when the second cover portion 1032 of the cover 1030 is locked to the housing 1040, the cover 1030 is in the final locking state (see FIGS. 74 and 75). As described above, since the cover 1030 is attached to the housing 1040 through multiple stages (that is, the temporary locking state and the final locking state), for example, it is possible to prevent the cover 1030 to be arranged in the temporary locking state from erroneously coming into the final locking state.

Figure 74:
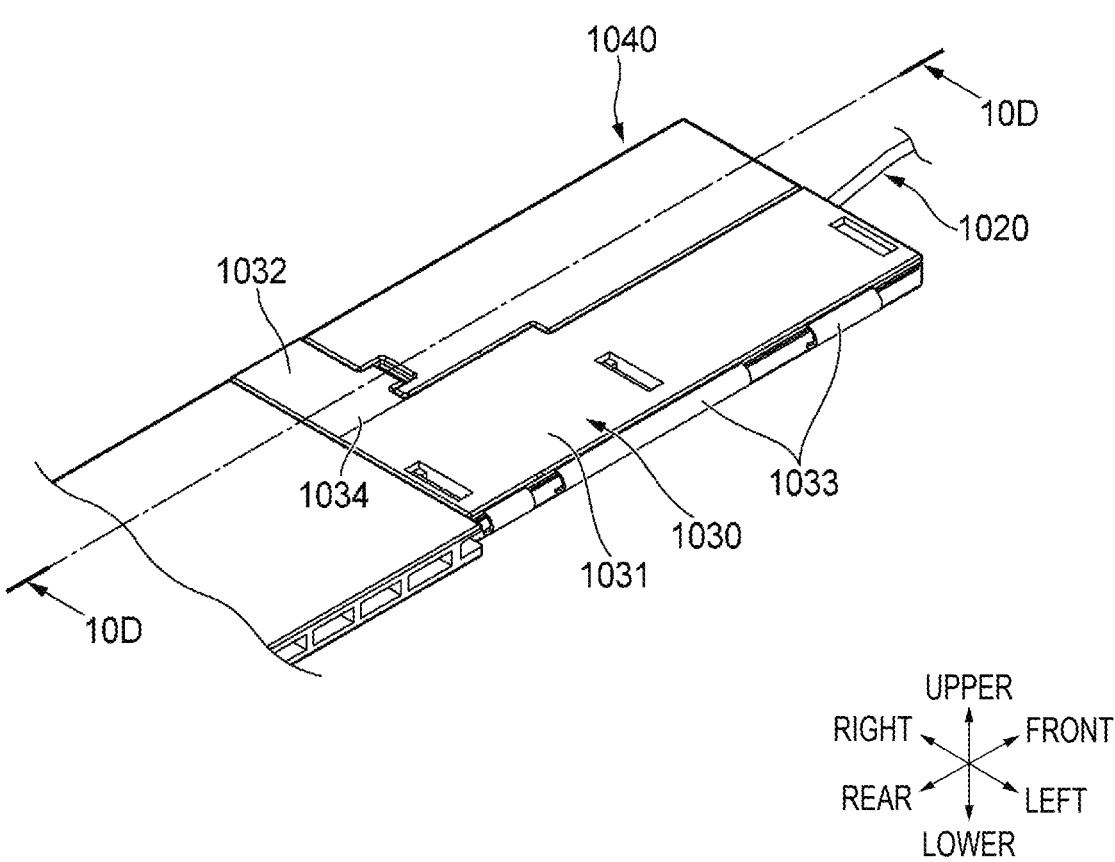
FIG. 74 is a perspective view illustrating a final locking state of the cover.
Figure 75:
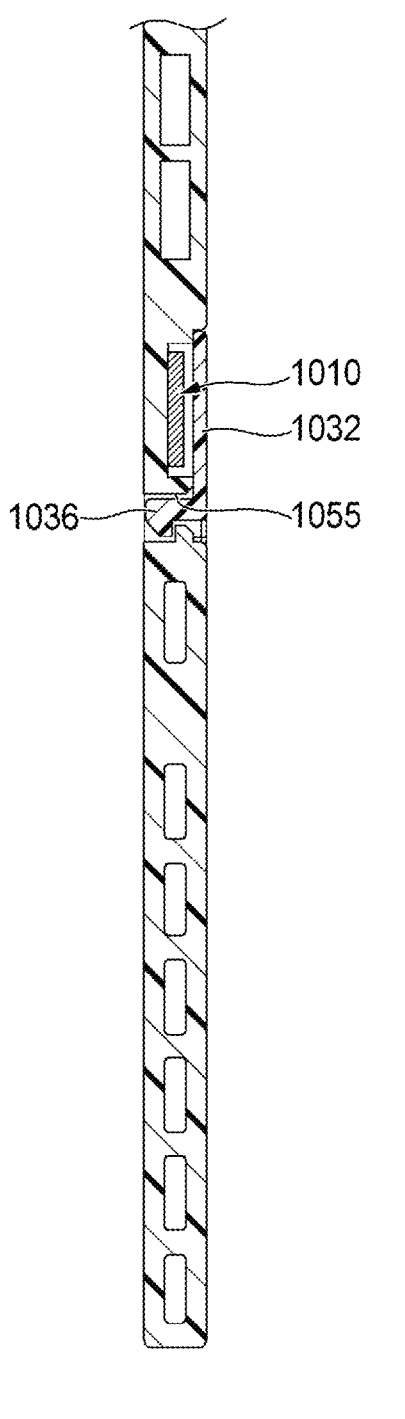
FIG. 75 is a cross-sectional view taken along a line 10D-10D in FIG. 74.
Figure 75:
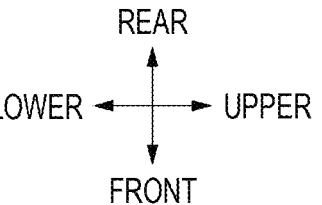

In the final locking state of the cover 1030, as illustrated in FIG. 74, the entire cover mounting recess 1041 is covered with the cover 1030 without a gap, so that the entire electric wire accommodating recess 1046 is covered with the cover 1030. This prevents the electric wire 1020 from coming out of the electric wire accommodating recess 1046. Further, as illustrated in FIGS. 74 and 75, the second cover portion 1032 of the cover 1030 covers the upper face of the tip portion 1012*a* of the voltage detection terminal 1010. Accordingly, the entire voltage detection terminal 1010 is covered with the first cover portion 1031 and the second cover portion 1032 of the cover 1030, so that the voltage detection terminal 1010 can be reliably protected.

As described above, the voltage detection unit 1005 obtained after the cover 1030 is completely mounted to the housing 1040 and the cover 1030 is in the temporary locking state is used for assembling the conductive module 1003 (see FIG. 67). Specifically, first, as illustrated in FIG. 68, the flange 1004*a* of the conductive board 1004 is fitted into the recess 1005*a* of the voltage detection unit 1005, so that the voltage detection unit 1005 is coupled to the left side of the conductive board 1004.

In this state, as can be understood from FIG. 69, a part of the flange 1004*a* of the conductive board 1004 overlaps the lower side of the tip portion 1012*a* of the voltage detection terminal 1010, and the upper face of the tip portion 1012*a* of the voltage detection terminal 1010 is exposed upward and the lower face of a part of the flange 1004*a* of the conductive board 1004 is exposed downward due to the presence of the notch 1043 of the housing 1040.

Next, the upper face of the tip portion 1012*a* of the voltage detection terminal 1010 exposed upward and the lower face of a part of the flange 1004*a* of the conductive board 1004 exposed downward are used to fix the tip portion 1012*a* of the voltage detection terminal 1010 and the part of the flange 1004*a* of the conductive board 1004 by a method such as ultrasonic joining or welding. Thereafter, the cover 1030 is shifted from the temporary locking state to the final locking state, and the voltage detection unit 1005 is completely assembled to the conductive board 1004.

Next, the flange 1004*b* of the conductive board 1004 is fitted into the recess 1006*a* of the facing unit 1006, so that the facing unit 1006 is coupled to the right side of the conductive board 1004 to which the voltage detection unit 1005 is assembled (see FIG. 68, etc.). Thus, the conductive module 1003 is completely assembled.

The conductive module 1003 thus obtained is used for assembling the power storage device 1001 illustrated in FIG. 67. Specifically, the power storage modules 1002 and the conductive modules 1003 are alternately stacked in the upper-lower direction, and the stacked body is fixed by a predetermined fitting or the like, thereby obtaining the power storage device 1001.

As described above, according to the voltage detection unit 1005 according to the tenth embodiment, the cover 1030 can be locked to the housing 1040 while connecting the voltage detection terminal 1010 accommodating the electric wire 1020 to the tip portion 1011*a* in the terminal accommodating recess 1042 of the housing 1040 and exposing the tip portion 1012*a* of the voltage detection terminal 1010. Therefore, when the voltage detection unit 1005 is electrically connected to the conductive board 1004 (the conductive board 1004 of the stacked power storage device 1001), for example, after the voltage detection unit 1005 is assembled to the conductive board 1004, the exposed tip portion 1012*a* of the voltage detection terminal 1010 can be fixed to the conductive board 1004 using a method such as ultrasonic joining or welding. This does not require another component for connection as compared to typical bolt fastening or the like, and can easily align the two components and reduce the contact resistance at the contact point as compared to the connection methods of the related art described above. Furthermore, by disposing the cover 1030 in the final locking state after the connection between the conductive board 1004 and the voltage detection terminal 1010, the tip portion 1012*a* of the voltage detection terminal 1010 (that is, the contact point therebetween) can be covered and protected by the cover 1030.

To attach the cover 1030 to the housing 1040, according to the voltage detection unit 1005 of the tenth embodiment, for example, the first cover portion 1031 of the cover 1030 can be curved in a hinge shape at the first coupling portion 1033 to be locked to the housing 1040 in the temporary locking state. After the conductive board 1004 and the voltage detection terminal 1010 are connected when the cover 1030 is in the temporary locking state, the second cover portion 1032 of the cover 1030 can be curved in a hinge shape at the second coupling portion 1034 to be locked to the housing 1040 in the final locking state. Here, since the cover 1030 is attached to the housing 1040 through multiple stages (that is, the temporary locking state and the final locking state), for example, it is possible to prevent the cover 1030 to be arranged in the temporary locking state from erroneously coming into the final locking state, thereby preventing the cover 1030 from interfering with the connection between the conductive board 1004 and the voltage detection terminal 1010.

The invention embodied as the tenth embodiment is not limited to the tenth embodiment, and various modifications can be adopted within the scope of the invention. For example, the present invention is not limited to the tenth embodiment, and modifications, improvements, and the like can be made appropriately. In addition, materials, shapes, sizes, numbers, arrangement positions, and the like of components in the tenth embodiment are freely selected and are not limited as long as the present invention can be implemented.

Here, the features of the embodiment of the voltage detection unit 1005 and the power storage device 1001 described above are briefly summarized and listed in the following [10-1] to [10-2].

[10-1]

A voltage detection unit (1005) including:

a voltage detection terminal (1010) having a first location (1012*a*) configured to be conductively connected to a detection target (1004);

a board-shaped housing (1040) having a terminal accommodating recess (1042) accommodating the voltage detection terminal (1010);

a cover (1030) configured to be locked to the housing (1040) in a temporary locking state in which the first location (1012*a*) of the voltage detection terminal (1010) accommodated in the terminal accommodating recess (1042) is not covered and a final locking state in which the first location (1012*a*) is covered; and an electric wire (1020) conductively connected to the second location (1011*a*) of the voltage detection terminal (1010) and drawn out toward the outside of the housing (1040), in which the cover (1030) includes a first cover portion (1031) coupled to the housing (1040) via a first coupling portion (1033) configured to be curved in a hinge shape, and a second cover portion (1032) coupled to the first cover portion (1031) via a second coupling portion (1034) configured to be curved in a hinge shape, and the cover (1030) is configured to bring the first cover portion (1031) into the temporary locking state by locking the first cover portion (1031) to the housing (1040) while curving the first coupling portion (1033), and bring the second cover portion (1032) of the cover (1030) into the final locking state by locking the second cover portion (1032) to the housing (1040) while curving the second coupling portion (1034).

According to the voltage detection unit having the configuration of the above [10-1], the cover can be locked to the housing while accommodating the voltage detection terminal whose second location is connected to the electric wire in the terminal accommodating recess of the housing and exposing the first location of the voltage detection terminal. Therefore, when the voltage detection unit is electrically connected to a detection target (for example, a conductive board or the like used in a stacked power storage device), for example, after the voltage detection unit is assembled to the detection target, the exposed first location of the voltage detection terminal can be fixed to the detection target using a method such as ultrasonic joining or welding. This does not require another component for connection as compared to typical bolt fastening or the like, and can easily align the two components and reduce the contact resistance at the contact point as compared to the connection methods of the related art described above. Further, by disposing the cover in the final locking state after the detection target and the voltage detection terminal are connected, the first location of the voltage detection terminal (that is, the contact point therebetween) can be covered and protected by the cover.

To attach the cover to the housing, according to the voltage detection unit of the present configuration, for example, the first cover portion of the cover is curved in a hinge shape at the first coupling portion and locked to the housing in the temporary locking state. After the detection object and the voltage detection terminal are connected when the cover is in the temporary locking state, the second cover portion of the cover can be curved in a hinge shape at the second coupling portion and locked to the housing in the final locking state. Here, to attach the cover to the housing to reach the final locking state through the temporary locking state, the first cover portion and the second cover portion are connected to each other by the second coupling portion that can be curved, which prevents locking the second cover portion to the housing by mistake when locking the first cover portion to the housing. In other words, since the first cover portion and the second cover portion can be locked to the housing independently of each other, for example, it is possible to prevent the cover to be arranged in the temporary locking state from erroneously coming into the final locking state, thereby preventing the cover from interfering with the connection between the detection target and the voltage detection terminal.

Accordingly, the voltage detection unit of the present configuration is excellent in workability for conductively connecting to the detection target. Furthermore, the voltage detection unit of the present configuration is less likely to cause variation in contact resistance at the contact point between the detection target and the voltage detection terminal due to the manufacturing tolerance thereof, and thus is also excellent in voltage detection accuracy, as compared to the above-described power storage device of the related art.

[10-2]

A power storage device (1001) including:

a board-shaped conductive module (1003) including the voltage detection unit (1005) according to the above [10-1] and a conductive board (1004) as the detection target to which the voltage detection terminal (1010) is conductively connected; and a power storage module (1002) configured to be charged and discharged, on which the conductive module (1003) is stacked.

In the power storage device having the configuration of the above [10-2], the voltage detection unit used in the power storage device is configured such that the cover can be locked to the housing while accommodating the voltage detection terminal whose second location is connected to the electric wire in the terminal accommodating recess of the housing and exposing the first location of the voltage detection terminal. Therefore, when the voltage detection unit is electrically connected to a detection target (for example, a conductive board or the like used in a stacked power storage device), for example, after the voltage detection unit is assembled to the detection target, the exposed first location of the voltage detection terminal can be fixed to the detection target using a method such as ultrasonic joining or welding. This does not require another component for connection as compared to typical bolt fastening or the like, and can easily align the two components and reduce the contact resistance at the contact point as compared to the connection methods of the related art described above. Further, by disposing the cover in the final locking state after the detection target and the voltage detection terminal are connected, the first location of the voltage detection terminal (that is, the contact point therebetween) can be covered and protected by the cover.

To attach the cover to the housing, according to the voltage detection unit of the present configuration, for example, the first cover portion of the cover is curved in a hinge shape at the first coupling portion and locked to the housing in the temporary locking state. After the detection object and the voltage detection terminal are connected when the cover is in the temporary locking state, the second cover portion of the cover can be curved in a hinge shape at the second coupling portion and locked to the housing in the final locking state. Here, to attach the cover to the housing to reach the final locking state through the temporary locking state, the first cover portion and the second cover portion are connected to each other by the second coupling portion that can be curved, which prevents locking the second cover portion to the housing by mistake when locking the first cover portion to the housing. In other words, since the first cover portion and the second cover portion can be locked to the housing independently of each other, for example, it is possible to prevent the cover to be arranged in the temporary locking state from erroneously coming into the final locking state, thereby preventing the cover from interfering with the connection between the detection target and the voltage detection terminal.

Accordingly, the power storage device of the present configuration is excellent in workability for conductively connecting to the detection target. Furthermore, the power storage device of the present configuration is less likely to cause variation in contact resistance at the contact point between the detection target and the voltage detection terminal due to the manufacturing tolerance thereof, and thus is also excellent in voltage detection accuracy, as compared to the above-described power storage device of the related art.

Eleventh Embodiment

Figure 76:
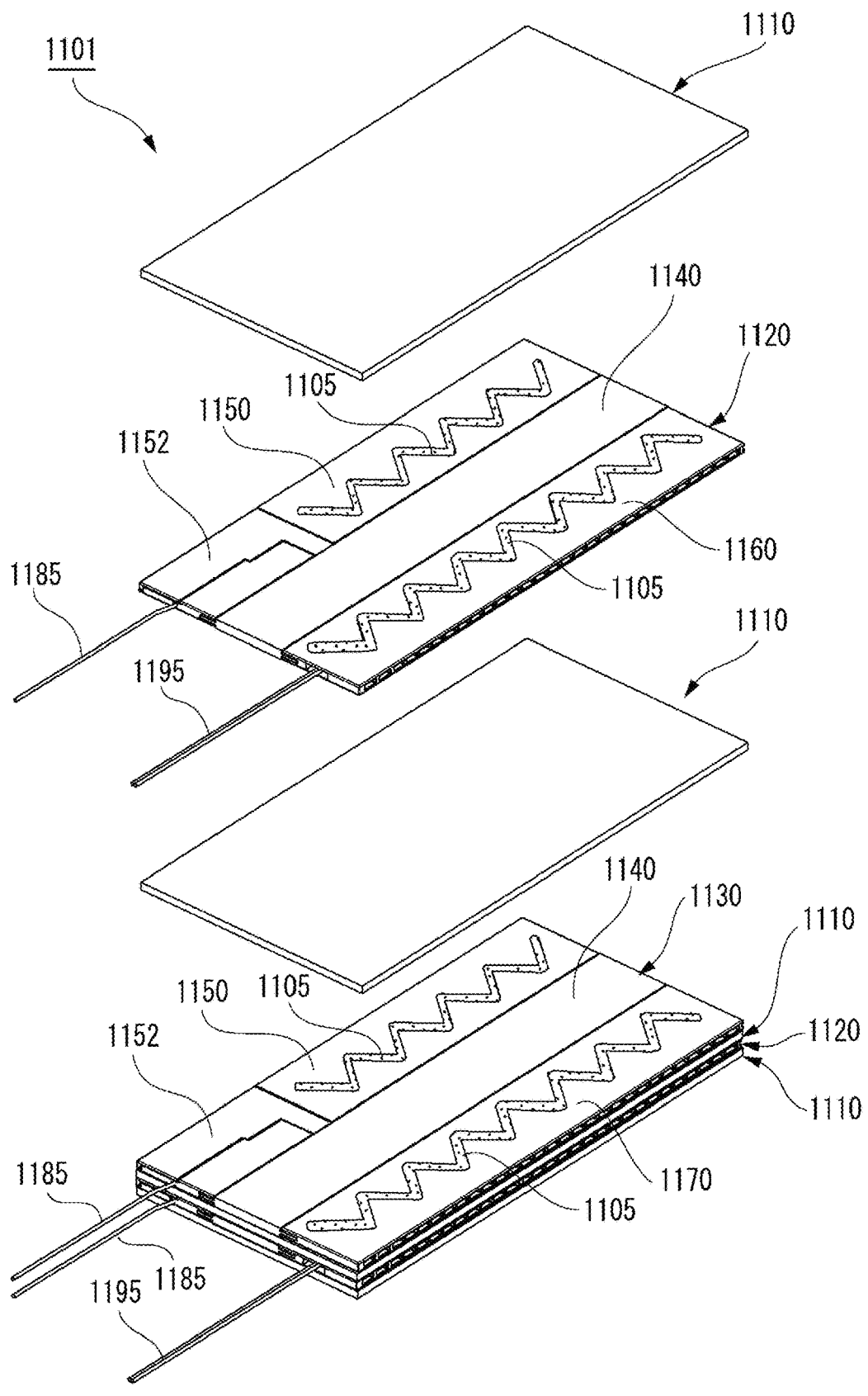
FIG. 76 is an exploded perspective view of a main part of a battery stack according to an eleventh embodiment.
Figure 77:
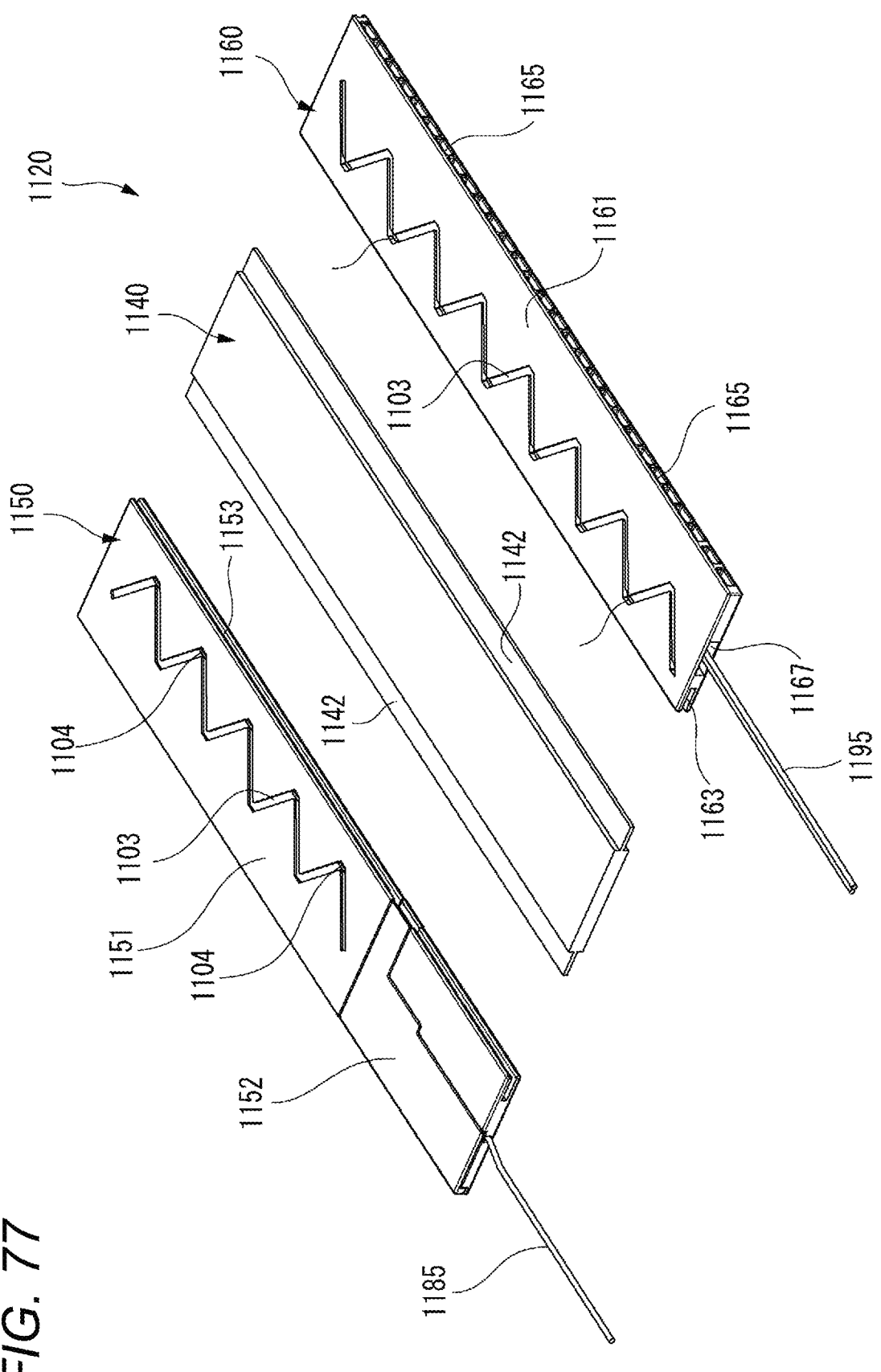
FIG. 77 is an exploded perspective view of a first board-shaped member illustrated in FIG. 76.
Figure 78:
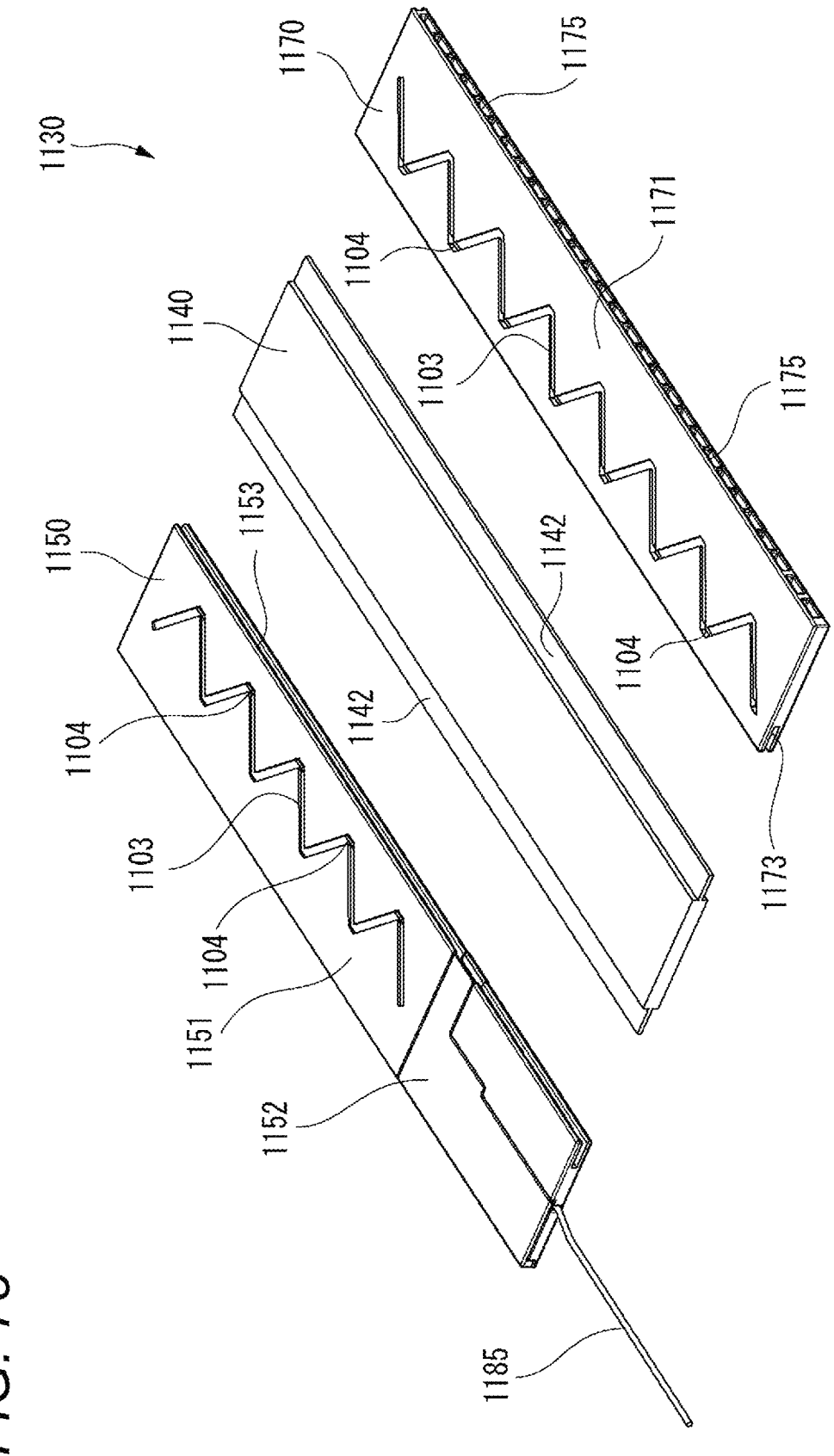
FIG. 78 is an exploded perspective view of a second board-shaped member illustrated in FIG. 76.

The invention embodied as an eleventh embodiment relates to a board-shaped member and a battery stack. FIG. 76 is an exploded perspective view of a main part of a battery stack 1101 according to an eleventh embodiment. FIG. 77 is an exploded perspective view of a first board-shaped member 1120 illustrated in FIG. 76. FIG. 78 is an exploded perspective view of a second board-shaped member 1130 illustrated in FIG. 76.

As illustrated in FIG. 76, a battery stack 1101 according to the eleventh embodiment includes a plurality of (four in the eleventh embodiment) stacked power storage modules 1110, and first and second board-shaped members (board-shaped members) 1120 and 1130 disposed between the plurality of power storage modules 1110. The battery stack 1101 is disposed between a pair of insulating plates (not illustrated), and is configured in a substantially rectangular parallelepiped shape by a restraining tool (not illustrated).

The power storage modules 1110 are configured in a rectangular flat plate shape including, for example, a plurality of battery cells, a plurality of current collector plates, and a resin frame. The battery cell includes a positive electrode mixture layer made of, for example, nickel hydroxide, a negative electrode mixture layer made of, for example, a hydrogen-adsorbing alloy, a separator made of, for example, a porous film made of a polyolefin-based resin, and an electrolyte.

Each power storage module 1110 may be configured with a single battery cell. The configuration of the battery cell is not limited to the above-described configuration, and various known battery configurations may be adopted, as a matter of course.

As illustrated in FIGS. 76 and 77, the first board-shaped member 1120 of the eleventh embodiment is configured in a rectangular flat plate shape including a conductive plate 1140, and a battery stack plate 1150 and a battery stack plate 1160 fitted to both side edges 1142 of the conductive plate 1140, respectively.

As illustrated in FIG. 78, the second board-shaped member 1130 of the eleventh embodiment is configured in a rectangular flat plate shape including a conductive plate 1140, and a battery stack plate 1150 and a battery stack plate 1170 fitted with both side edges 1142 of the conductive plate 1140, respectively.

The conductive plate 1140 is formed in an elongated rectangular board shape from a conductive metal such as an aluminum alloy or copper, and both side edges 1142 in the longitudinal direction thereof are formed in a convex piece shape having a thin plate thickness. Both the side edges 1142 of the conductive plate 1140 are respectively fitted into fitting grooves 1153, 1163, and 1173 of the battery stack plates 1150, 1160, and 1170.

Further, the conductive plate 1140 is a conductive portion that electrically conducts the adjacent power storage modules 1110, and also serves as a heat sink (cooling plate) for cooling the adjacent power storage modules 1110.

Figure 79:
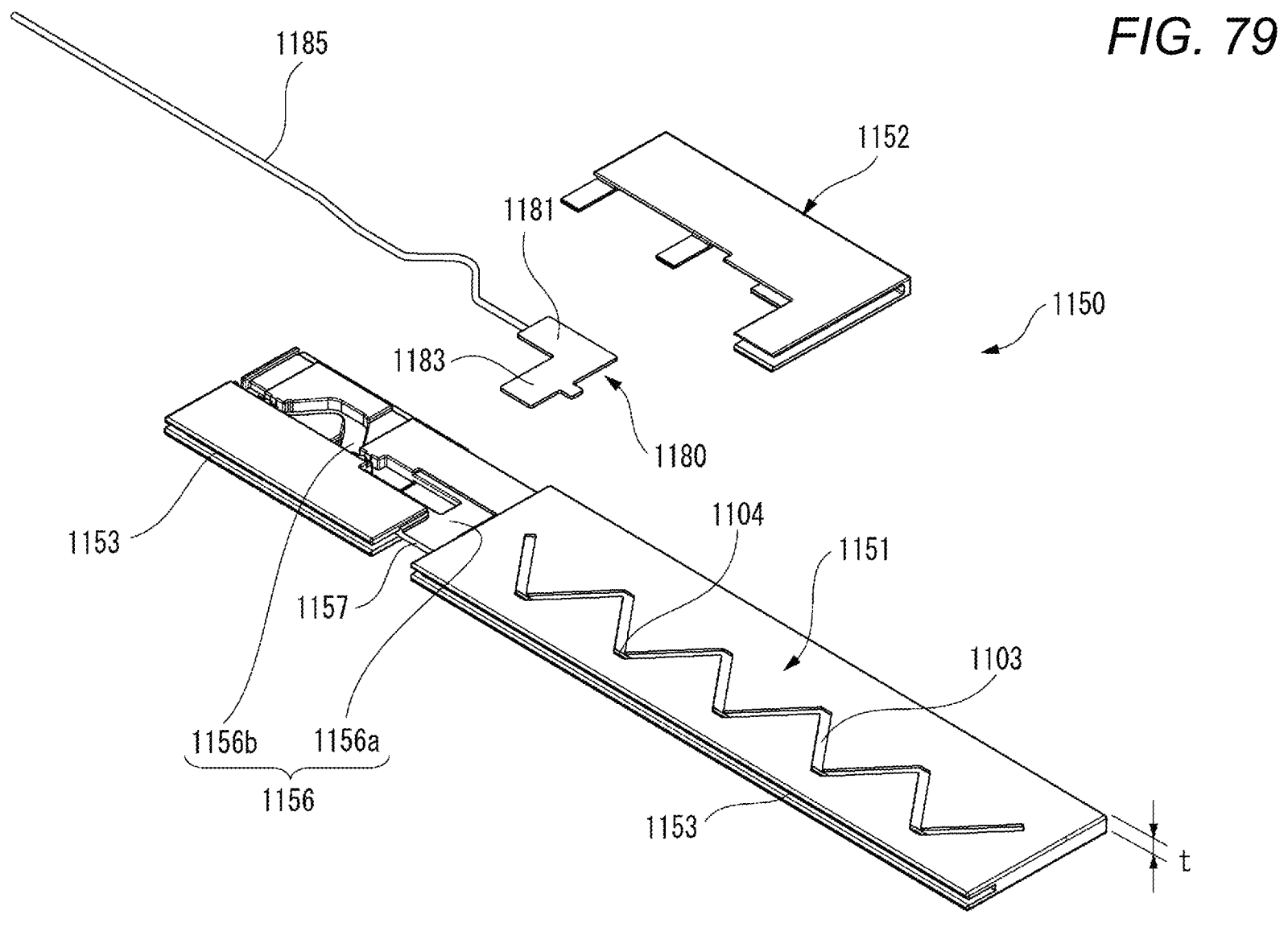
Figure 80:
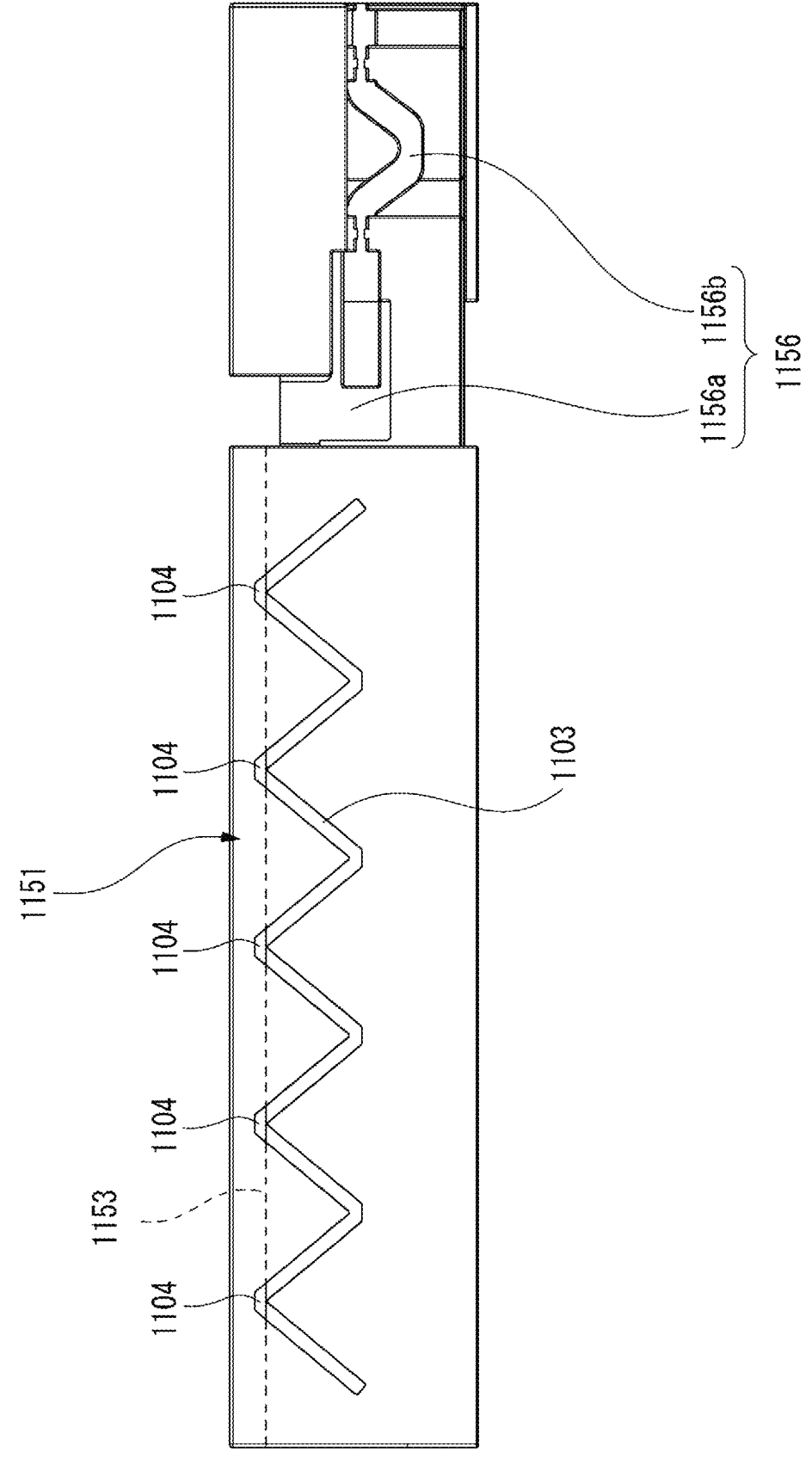
FIG. 80 is a plan view of an insulating housing illustrated in FIG. 79.

FIG. 79 is an exploded perspective view of the battery stack plate 1150 having a connection terminal 1180 illustrated in FIGS. 77 and 78. FIG. 80 is a plan view of an insulating housing 1151 illustrated in FIG. 79.

As illustrated in FIG. 79, the battery stack plate 1150 according to the eleventh embodiment includes the elongated rectangular board-shaped insulating housing 1151, the connection terminal 1180, an electric wire 1185 whose one end is connected to the connection terminal 1180, and an insulating cover 1152.

The connection terminal 1180 is made of a conductive metal material such as copper or a copper alloy, and is formed in an L-shaped plate shape. The connection terminal 1180 has an electric wire connection portion 1181 at one end of the L shape and an electric connection portion 1183 at the other end of the L shape.

One end of the electric wire 1185 is electrically connected to the electric wire connection portion 1181 by welding or the like. The other end of the electric wire 1185 is electrically connected to a temperature detection circuit (not illustrated) via a connector or the like. The electric connection portion 1183 is electrically connected to the side edge 1142 of the conductive plate 1140 by welding or the like.

The insulating housing 1151 is formed by injection molding an insulating resin material into an elongated rectangular board shape having a predetermined plate thickness t.

As illustrated in FIGS. 79 and 80, one board side face along the longitudinal direction of the insulating housing 1151 has a recessed fitting groove 1153 for fitting with the side edge 1142 of the conductive plate 1140. After the fitting groove 1153 is fitted with the side edge 1142 of the conductive plate 1140, the face of the board face of the insulating housing 1151 is flush with the face of the board face of the conductive plate 1140.

As illustrated in FIG. 79, the face of the board face on one end side in the longitudinal direction of the insulating housing 1151 (upper face in FIG. 79) is provided with an accommodating recess 1156 for accommodating the one end of the electric wire 1185 and the connection terminal 1180. The accommodating recess 1156 includes a terminal accommodating portion 1156a for accommodating the connection terminal 1180 and an electric wire accommodating portion 1156b for accommodating the one end of the electric wire 1185.

The terminal accommodating portion 1156a is formed with a notch 1157 for bringing the electric connection portion 1183 of the connection terminal 1180 into contact with the side edge 1142 of the conductive plate 1140 fitted into the fitting groove 1153. When the connection terminal 1180 is accommodated in the terminal accommodating portion 1156a, the electric connection portion 1183 comes into contact with the side edge 1142 of the conductive plate 1140, which facilitates the welding work.

By accommodating the one end of the electric wire 1185 bent in a V shape in the electric wire accommodating portion 1156b, when a tensile force acts on the other end of the electric wire 1185, it is possible to prevent the tensile force from acting on the connection portion with the electric wire connection portion 1181.

Further, as illustrated in FIGS. 79 and 80, the front and back faces (upper and lower faces in FIG. 79) of the board faces of the insulating housing 1151 are provided with sealing material supply grooves 1103 along the extension direction of the fitting groove 1153. The sealing material supply groove 1103 is continuously formed in a manner meandering in a wave shape along the extension direction of the fitting groove 1153 (the left-right direction in FIG. 80) extending in the longitudinal direction of the insulating housing 1151.

Further, the sealing material supply grooves 1103 formed in the front and back faces of the insulating housing 1151 and the fitting groove 1153 formed in the one board side face communicate with each other through a plurality of through holes 1104. The plurality of through holes 1104 are respectively formed at the vertices of the corrugated sealing material supply grooves 1103 that are closer to the fitting groove 1153.

Figures 81A, 81B:
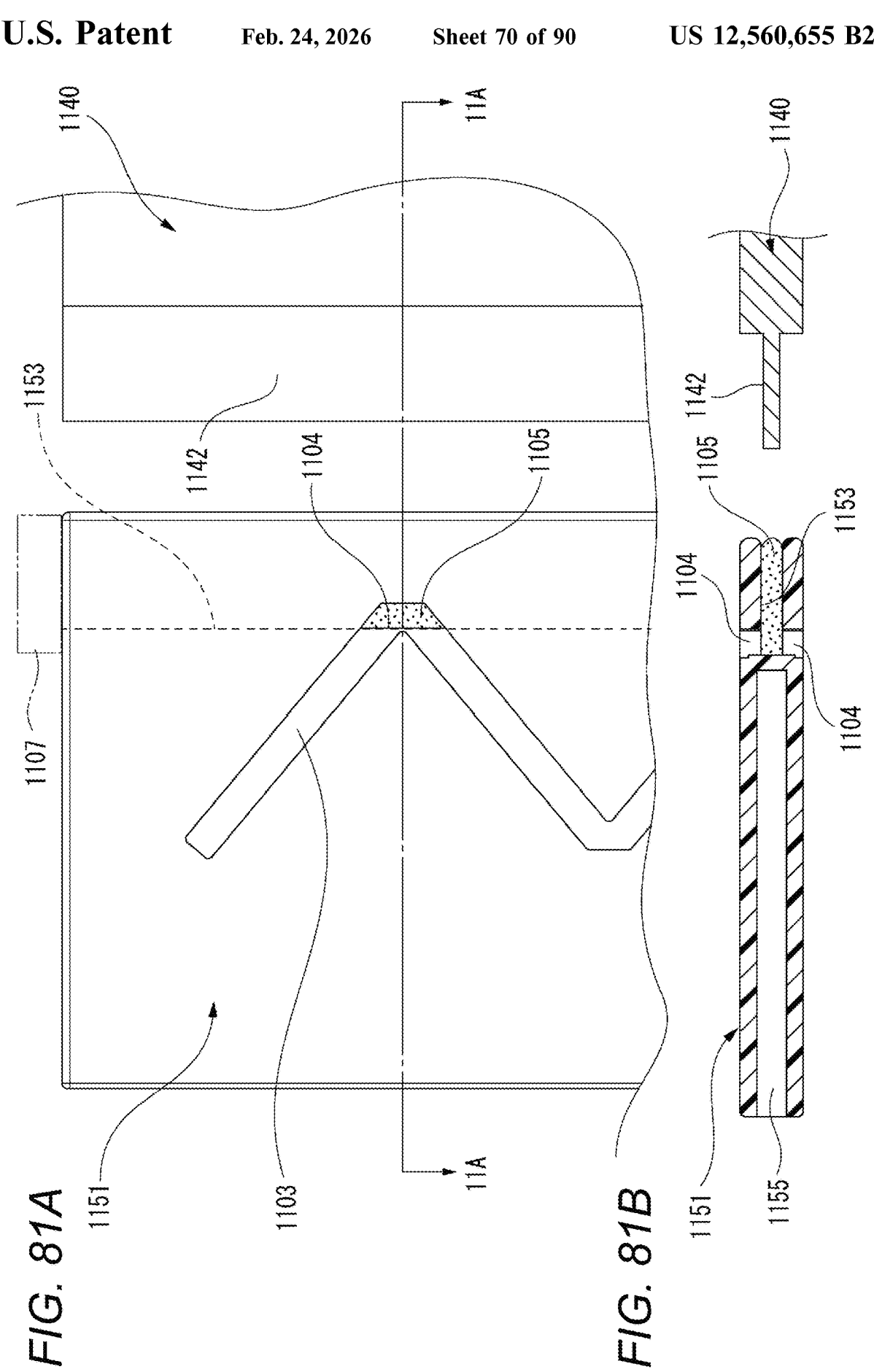
FIG. 81A is a main part enlarged plan view illustrating a state immediately before the insulating housing illustrated in FIG. 80 is assembled to the conductive plate.
FIG. 81B is a cross-sectional view taken along a line 11A-11A in FIG. 81A.

As illustrated in FIG. 81B, the other board side face (the lower board side face in FIG. 80) along the longitudinal direction of the insulating housing 1151 is formed with a plurality of thinned holes 1155 aligned from the other board side face in a direction orthogonal to the plate thickness direction (upward in FIG. 80). The plurality of thinned holes 1155 are bottomed holes having a predetermined opening width and formed in a substantially rectangular parallelepiped shape aligned with the other board side face at predetermined intervals.

As illustrated in FIGS. 77 to 79, the insulating cover 1152 injection-molded from an insulating resin material is mounted in a manner sandwiching the insulating housing 1151 in the plate thickness direction, thereby covering the one end of the electric wire 1185 and the connection terminal 1180 accommodated in the accommodating recess 1156. The insulating cover 1152 covers the accommodating recess 1156 while being flush with the face of the board face of the insulating housing 1151.

The insulating cover 1152 is mounted to the insulating housing 1151 in a manner movable between the temporary locking position and the final locking position relative to the insulating housing 1151. The insulating cover 1152 at the temporary locking position exposes, instead of covering, the electric connection portion 1183 of the connection terminal 1180 accommodated in the accommodating recess 1156. Further, the insulating cover 1152 at the final locking position completely covers the connection terminal 1180 accommodated in the accommodating recess 1156.

As illustrated in FIG. 77, the battery stack plate 1160 of the first board-shaped member 1120 of the eleventh embodiment includes an elongated rectangular board-shaped insulating housing 1161, a battery temperature sensor (not illustrated) accommodated in a sensor accommodating portion 1167 of the insulating housing 1161, and an electric wire 1195 whose one end is connected to the battery temperature sensor.

The battery temperature sensor is mounted on the insulating housing 1161 and interposed between the board faces of the adjacent power storage modules 1110 to detect the temperature of the power storage modules 1110. The other end of the electric wire 1195 whose one end is connected to the battery temperature sensor is electrically connected to a temperature detection circuit (not illustrated) via a connector or the like.

The insulating housing 1161 is formed by injection molding an insulating resin material into an elongated rectangular board shape having a predetermined plate thickness.

As illustrated in FIG. 77, one board side face along the longitudinal direction of the insulating housing 1161 has a recessed fitting groove 1163 for fitting with the side edge 1142 of the conductive plate 1140. After the fitting groove 1163 is fitted with the side edge 1142 of the conductive plate 1140, the face of the board face of the insulating housing 1161 is flush with the face of the board face of the conductive plate 1140.

Similarly to the insulating housing 1151, the front and back faces of the board faces of the insulating housing 1161 are provided with sealing material supply grooves 1103 along the extension direction of the fitting groove 1163. The sealing material supply groove 1103 is continuously formed in a manner meandering in a wave shape along the extension direction of the fitting groove 1163 extending in the longitudinal direction of the insulating housing 1161.

Further, the sealing material supply grooves 1103 formed in the front and back faces of the insulating housing 1161 and the fitting groove 1163 formed in the one board side face communicate with each other through a plurality of through holes 1104. The plurality of through holes 1104 are respectively formed at the vertices of the corrugated sealing material supply grooves 1103 that are closer to the fitting groove 1153.

As illustrated in FIG. 77, the other board side face along the longitudinal direction of the insulating housing 1161 is formed with a plurality of thinned holes 1165 aligned from the other board side face in a direction orthogonal to the plate thickness direction. The plurality of thinned holes 1165 are bottomed holes having a predetermined opening width and formed in a substantially rectangular parallelepiped shape aligned with the other board side face at predetermined intervals.

As illustrated in FIG. 78, the dummy battery stack plate 1170 according to the second board-shaped member 1130 of the eleventh embodiment includes an elongated rectangular board-shaped insulating housing 1171. The battery stack plate 1170 is a dummy plate interposed between the board faces of the adjacent power storage modules 1110 to maintain the interval between the power storage modules 1110 at a predetermined interval, and is not provided with functional components such as the connection terminal 1180 and the battery temperature sensor.

The insulating housing 1171 is formed by injection molding an insulating resin material into an elongated rectangular board shape having a predetermined plate thickness.

One board side face along the longitudinal direction of the insulating housing 1171 has a recessed fitting groove 1173 for fitting with the side edge 1142 of the conductive plate 1140. After the fitting groove 1173 is fitted with the side edge 1142 of the conductive plate 1140, the face of the board face of the insulating housing 1171 is flush with the face of the board face of the conductive plate 1140.

Similarly to the insulating housing 1151, the front and back faces of the board faces of the insulating housing 1161 are provided with sealing material supply grooves 1103 along the extension direction of the fitting groove 1163. The sealing material supply groove 1103 is continuously formed in a manner meandering in a wave shape along the extension direction of the fitting groove 1163 extending in the longitudinal direction of the insulating housing 1161.

Further, the sealing material supply grooves 1103 formed in the front and back faces of the insulating housing 1161 and the fitting groove 1163 formed in the one board side face communicate with each other through a plurality of through holes 1104. The plurality of through holes 1104 are respectively formed at the vertices of the corrugated sealing material supply grooves 1103 that are closer to the fitting groove 1153.

The other board side face along the longitudinal direction of the insulating housing 1171 is formed with a plurality of thinned holes 1175 aligned from the other board side face in a direction orthogonal to the plate thickness direction. The plurality of thinned holes 1175 are bottomed holes having a predetermined opening width and formed in a substantially rectangular parallelepiped shape aligned with the other board side face at predetermined intervals.

As described above, the front and back faces of the insulating housings 1151, 1161, 1171 of the battery stack plates 1150, 1160, 1170 of the eleventh embodiment are respectively provided with the sealing material supply grooves 1103. Further, the sealing material supply grooves 1103 and the fitting grooves 1153,1163, and 1173 communicate with each other through the plurality of through holes 1104.

The shape of the sealing material supply groove 1103 is not limited to the wave shape, and may be various shapes as long as the shape continuously extends along the extension direction of the fitting grooves 1153, 1163, and 1173 extending in the longitudinal direction of the insulating housings 1151, 1161, and 1171, as a matter of course.

Next, the operation of the sealing material supply grooves 1103 and the through holes 1104 will be described using the insulating housing 1151 of the battery stack plate 1150 according to the eleventh embodiment as an example.

FIGS. 81A to 83B are main part enlarged plan views and cross-sectional views illustrating the states in which the insulating housing 1151 is immediately before, being, and completely assembled to the conductive plate 1140.

When the insulating housing 1151 is assembled to the conductive plate 1140, as illustrated in FIGS. 81A and 81B, the fitting groove 1153 of the insulating housing 1151 immediately before being assembled to the conductive plate 1140 is filled with a sealing material 1105 (sealing material filling step). The sealing material 1105 has an appropriate degree of viscosity and can remain in the fitting groove 1153.

When the sealing material 1105 is filled, it is preferable to dispose blocking members 1107 for preventing leakage of the sealing material 1105 at both ends of the fitting groove 1153 in the longitudinal direction as necessary.

Figures 82A, 82B:
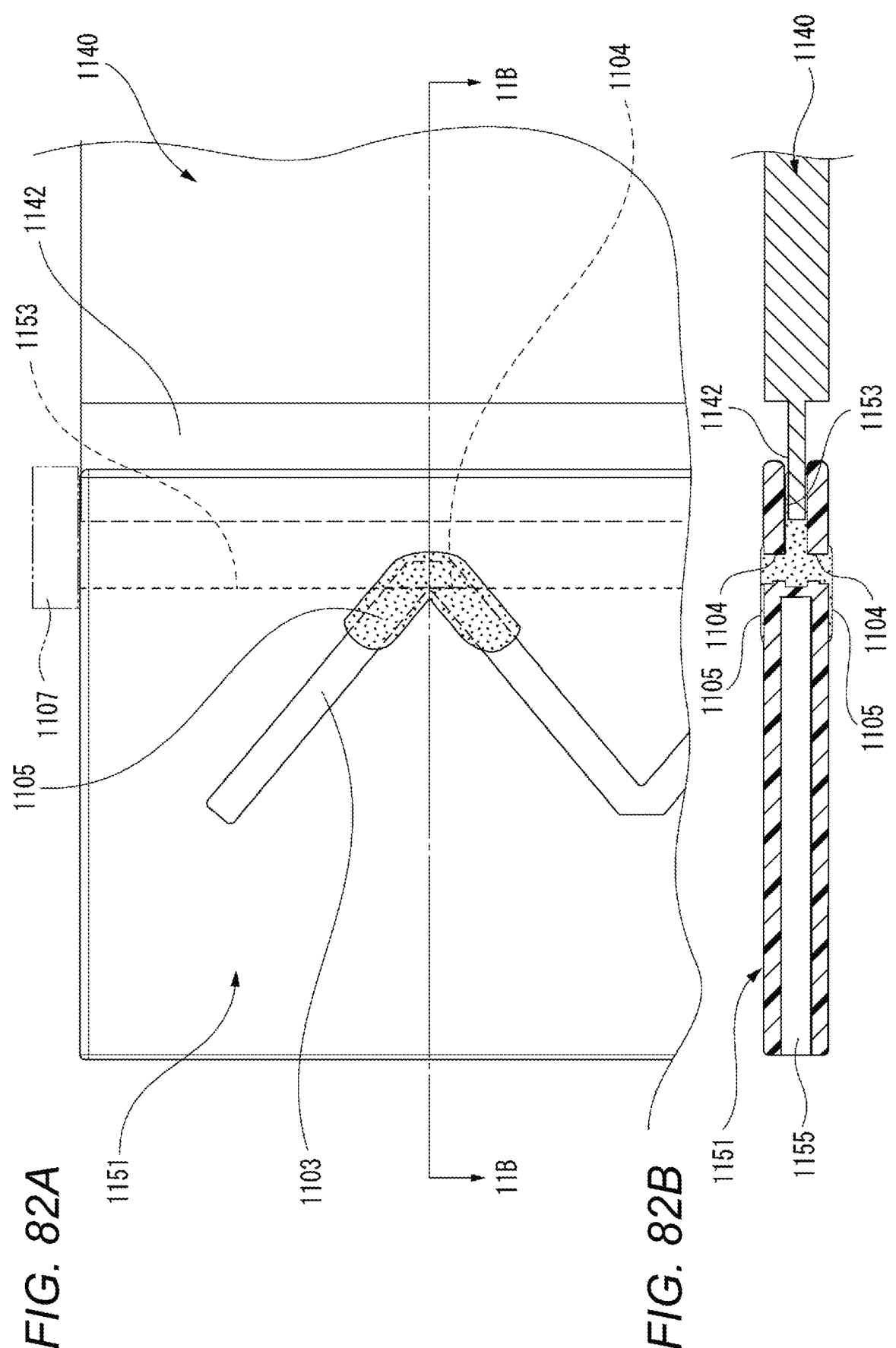
FIG. 82A is a main part enlarged plan view illustrating a state in which the insulating housing illustrated in FIG. 80 is being assembled to the conductive plate.
FIG. 82B is a cross-sectional view taken along a line 11B-11B in FIG. 82A.

Next, when one side edge 1142 of the conductive plate 1140 is fitted into the fitting groove 1153 of the insulating housing 1151 from above, as illustrated in FIGS. 82A and 82B, the sealing material 1105 pushed by the side edge 1142 is extruded from the fitting groove 1153 into the plurality of through holes 1104 (fitting step). The sealing material 1105 extruded from the plurality of through holes 1104 is extruded to the front and back faces of the insulating housing 1151.

Figures 83A, 83B:
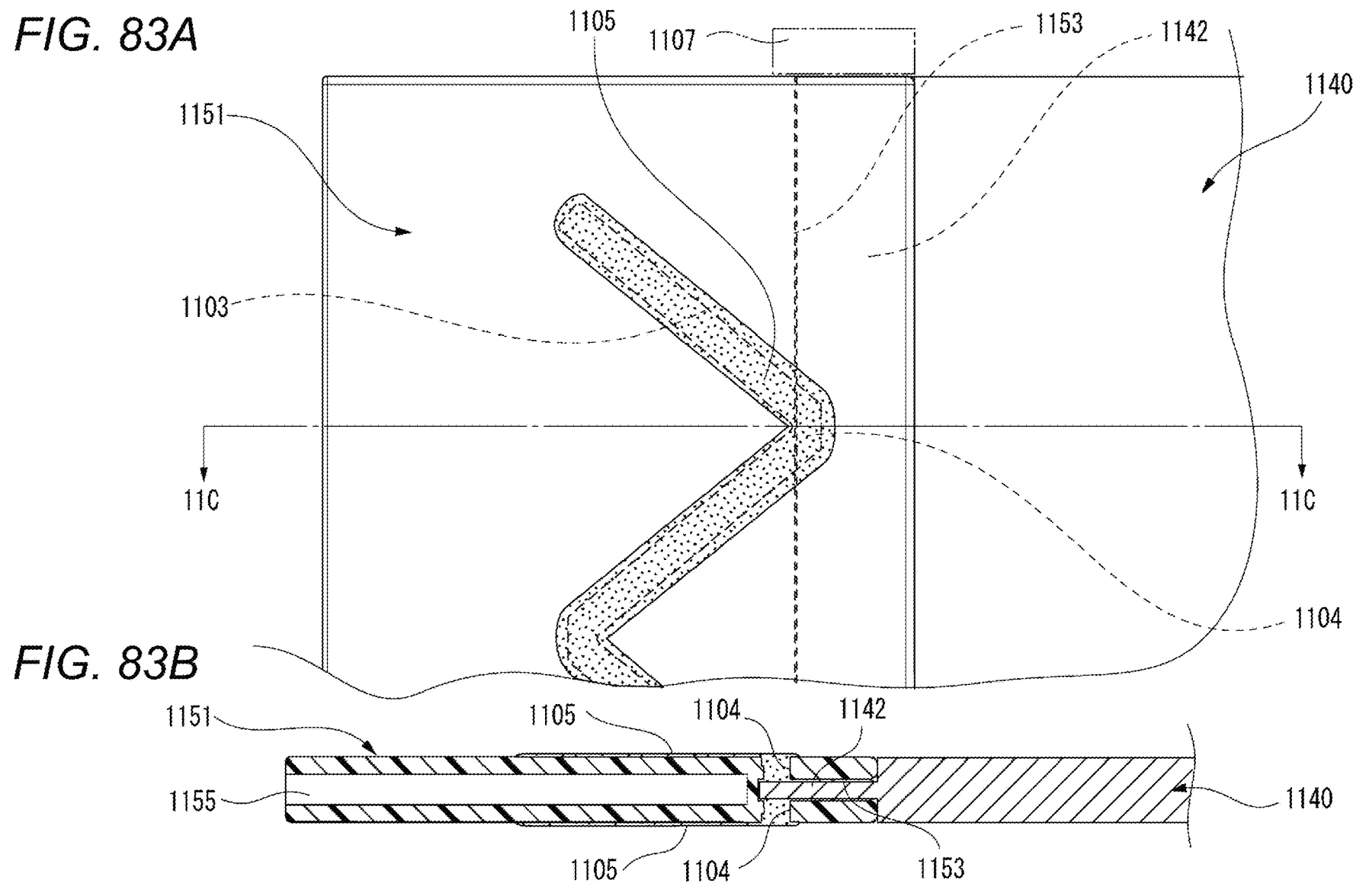

Further, in a state in which the conductive plate 1140 is completely assembled to the insulating housing 1151, as illustrated in FIGS. 83A and 83B, the sealing material 1105 extruded to the front and back faces of the insulating housing 1151 extends over the entire sealing material supply groove 1103. Therefore, the front and back faces of the insulating housing 1151 are continuously provided with the sealing material 1105 in a manner meandering in a wave shape along the longitudinal direction (see FIG. 76).

That is, after the sealing material 1105 is filled in advance into the fitting groove 1153 of the insulating housing 1151, the sealing material 1105 can be easily disposed while being guided in a predetermined range along the sealing material supply grooves 1103 provided in the front and back faces of the insulating housing 1151 by simply fitting the side edge 1142 of the conductive plate 1140 into the fitting groove 1153.

Then, after the sealing material 1105 is filled in advance into the fitting groove 1163 of the insulating housing 1161 of the battery stack plate 1160, the sealing material 1105 can be similarly disposed while being guided in a predetermined range along the sealing material supply grooves 1103 provided in the front and back faces of the insulating housing 1161 by fitting the other side edge 1142 of the conductive plate 1140 into the fitting groove 1163.

As a result, as illustrated in FIG. 76, it is possible to easily configure the first board-shaped member 1120 whose front and back faces of the battery stack plate 1150 and front and back faces of the battery stack plate 1160 are each provided with the sealing material 1105.

In addition, it is possible to similarly configure the second board-shaped member 1130 whose front and back faces of the battery stack plate 1150 and front and back faces of the battery stack plate 1170 are each provided with the sealing material 1105.

Accordingly, in the battery stack 1101 configured by stacking the first board-shaped member 1120, the second board-shaped member 1130, and the plurality of power storage modules 1110, the sealing material 1105 is favorably provided in each of the front and back faces of the first board-shaped member 1120 and the second board-shaped member 1130 to fill the gaps of the stacked body, so that cooling air can efficiently flow and foreign matters can be prevented from entering the surface of the power storage modules 1110.

Figure 84:
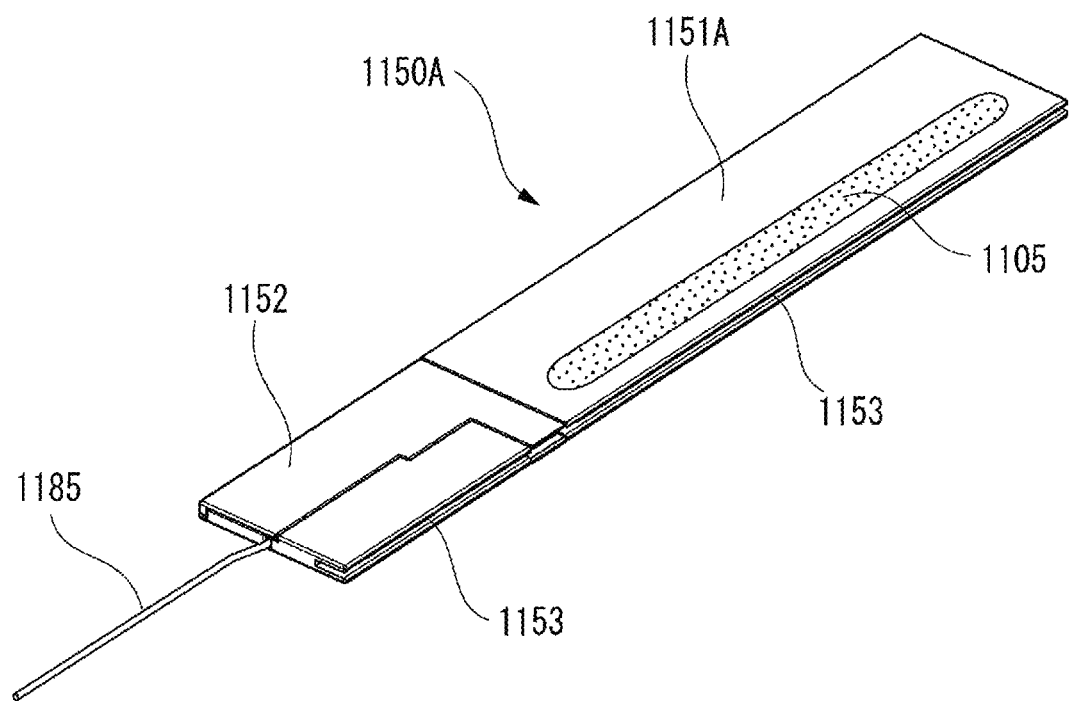
FIG. 84 is a perspective view of a battery stack plate according to a reference example.

FIG. 84 is a perspective view of a battery stack plate 1150A according to a reference example. The battery stack plate 1150A has the same configuration as the battery stack plate 1150 except for using an insulating housing 1151A instead of the insulating housing 1151. The same components are denoted by the same reference signs, and detailed description thereof is omitted.

As illustrated in FIG. 84, the front and back faces (upper and lower faces in FIG. 84) of the board face of the insulating housing 1151A are not provided with the sealing material supply grooves 1103, and are not provided with the through holes 1104 that allow the sealing material supply grooves 1103 to communicate with the fitting groove 1153.

Therefore, the sealing material 1105 needs to be directly applied by hand to a predetermined range on the front and back faces of the battery stack plate 1150A according to the reference example, which takes a long time.

In contrast, according to the first and second board-shaped members 1120 and 1130 and the battery stack 1101 of the eleventh embodiment described above, the sealing material 1105 can be easily provided on the front and back faces of the battery stack plates 1150, 1160, and 1170.

The invention embodied as the eleventh embodiment is not limited to the eleventh embodiment, and various modifications can be adopted within the scope of the invention. For example, the present invention is not limited to the eleventh embodiment, and modifications, improvements, and the like can be made appropriately. In addition, materials, shapes, sizes, numbers, arrangement positions, and the like of components in the eleventh embodiment are freely selected and are not limited as long as the present invention can be implemented.

Here, the features of the embodiment of the board-shaped member and the battery stack according to the eleventh embodiment described above are briefly summarized and listed in the following [11-1] to [11-4].

[11-1]

A board-shaped member (first board-shaped member 1120, second board-shaped member 1130) configured to be sandwiched between a plurality of stacked power storage modules (1110), the board-shaped member including:

a conductive plate (1140) configured to be disposed between the plurality of power storage modules (1110);

a battery stack plate (1150, 1160, 1170) including a board-shaped insulating housing (1151, 1161, 1171) whose board side face has a recessed fitting groove (1153, 1163, 1173) for fitting with a side edge (1142) of the conductive plate (1140);

sealing material supply grooves (1103) respectively provided in front and back faces of the insulating housing (1151, 1161, 1171) along an extension direction of the fitting groove (1153, 1163, 1173);

through holes (1104) configured to allow the sealing material supply grooves (1103) to communicate with the fitting groove (1153); and a sealing material (1105) filled in advance into the fitting groove (1153, 1163, 1173) and configured to be extruded from the fitting groove (1153, 1163, 1173) to the front and back faces of the insulating housing (1151, 1161, 1171) through the through holes (1104) and the sealing material supply grooves (1103) when the side edge (1142) of the conductive plate (1140) is fitted into the fitting groove (1153, 1163, 1173).

[11-2]

The board-shaped member (first board-shaped member 1120 and second board-shaped member 1130) according to the above [11-1], in which the sealing material supply groove (1103) is continuously formed in a manner meandering in a wave shape along an extension direction of the fitting groove (1153, 1163, 1173).

[11-3]

The board-shaped member (first board-shaped member 1120 and second board-shaped member 1130) according to the above [11-2], in which the through hole (1104) is formed at each vertex on the fitting groove (1153) side of the sealing material supply groove (1103) formed in a wave shape.

[11-4]

A battery stack (1101) including the board-shaped member (the first board-shaped member 1120 and the second board-shaped member 1130) according to any one of the above [11-1] to [11-3].

[11-5]

A sealing material supply method for supplying a sealing material (1105) to front and back faces of a battery stack plate (1150), the battery stack plate (1150) includes a conductive plate (1140) disposed between a plurality of stacked power storage modules (1110), a board-shaped insulating housing (1151) in which a fitting groove (1153) for fitting into a side edge (1142) of the conductive plate (1140) is recessed on a board side face, a sealing material supply groove (1103) provided on the front and back faces of the insulating housing (1151) along an extension direction of the fitting groove (1153), and a through hole (1104) configured to allow the sealing material supply groove (1103) to communicate with the fitting groove (1153), the sealing material supply method including:

a sealing material filling step of filling the sealing material (1105) into the fitting groove (1153); and a fitting step of fitting the side edge (1142) of the conductive plate (1140) into the fitting groove (1153) after the sealing material filling step.

Twelfth Embodiment

Figure 85:
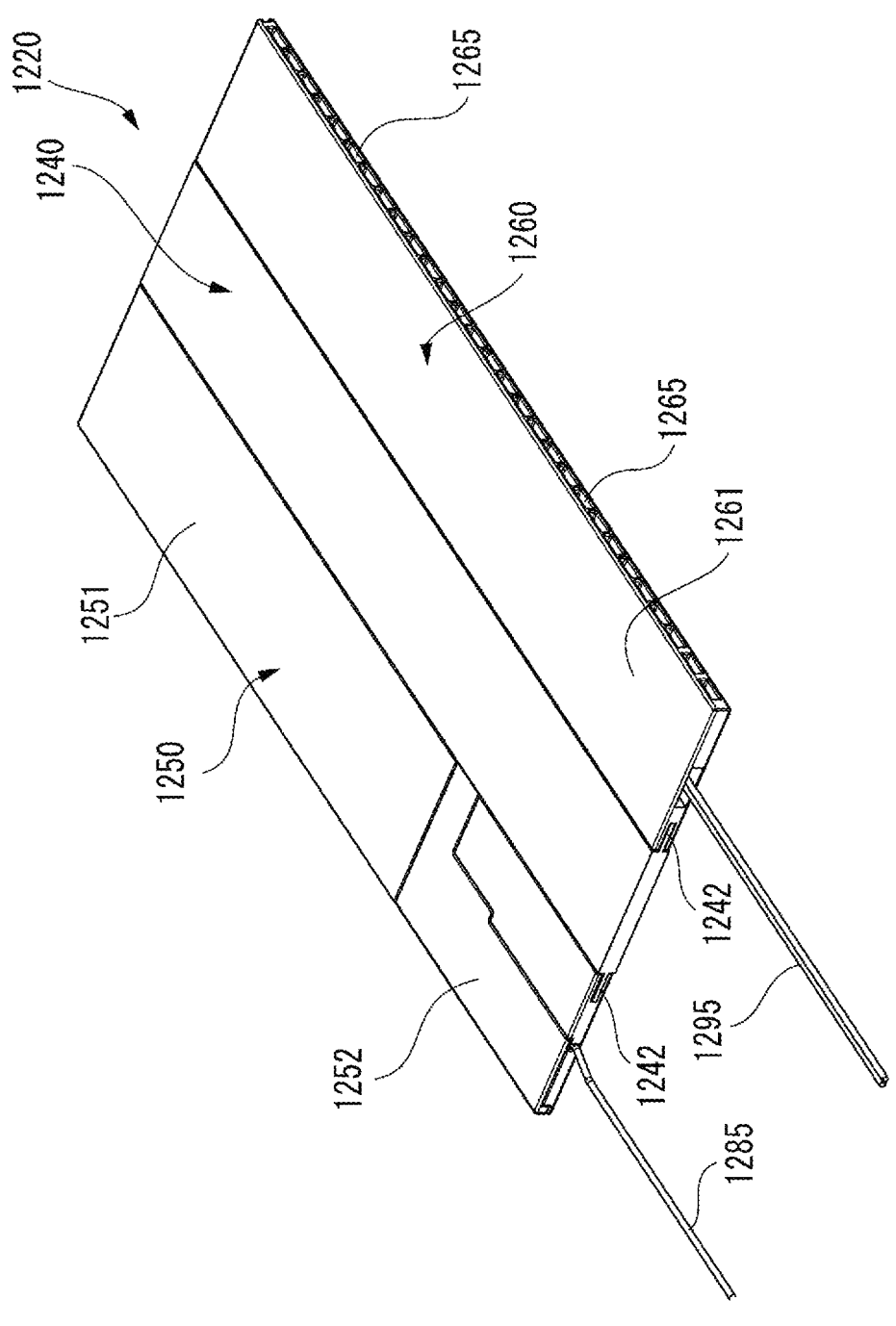
FIG. 85 is a perspective view of a first board-shaped member according to the twelfth embodiment.
Figure 86:
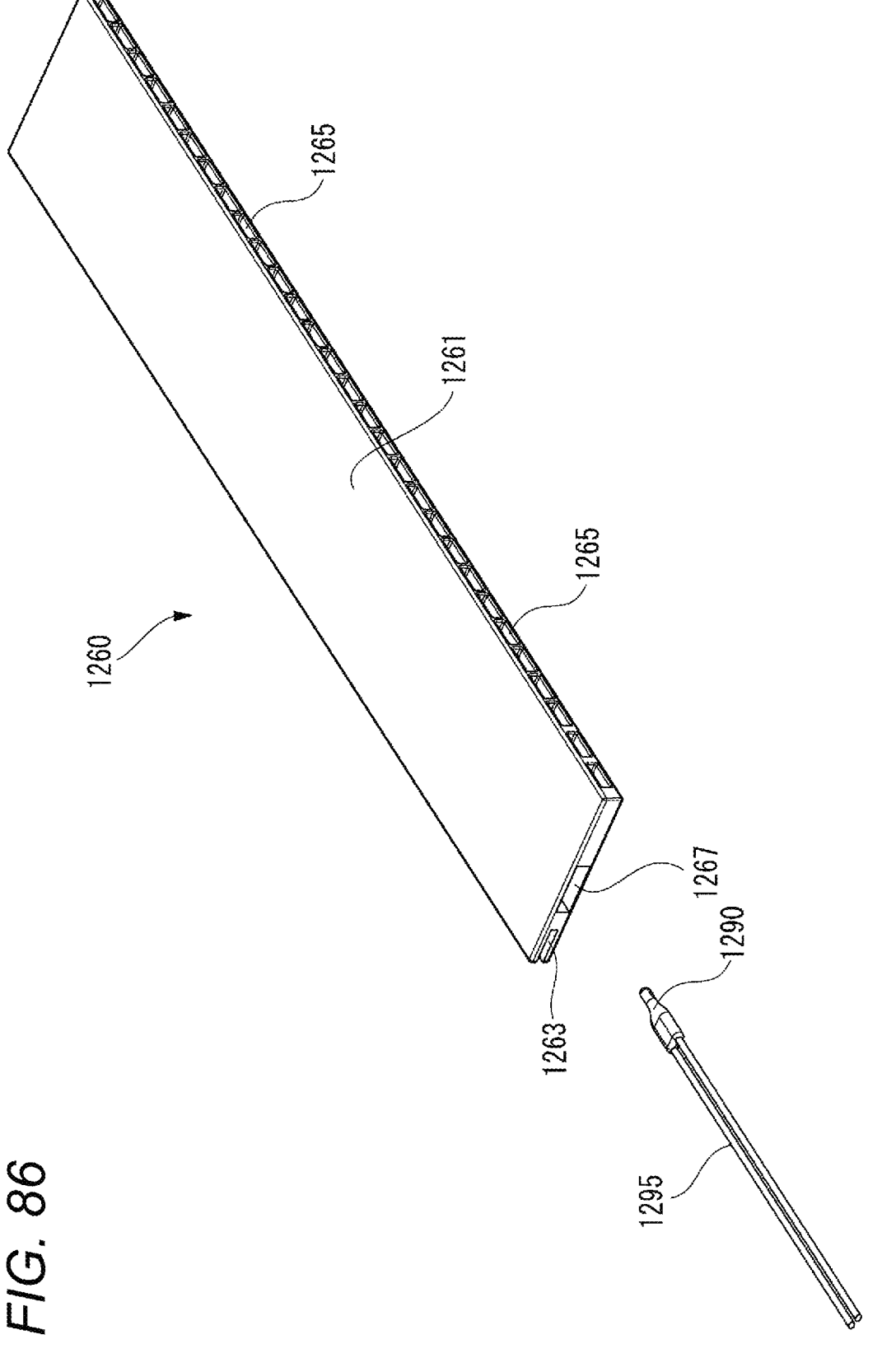
FIG. 86 is an exploded perspective view of a battery stack plate having a battery temperature sensor illustrated in FIG. 85.

The invention embodied as a twelfth embodiment relates to a battery stack plate. FIG. 85 is a perspective view of a first board-shaped member 1220 according to the twelfth embodiment. FIG. 86 is an exploded perspective view of a battery stack plate having a battery temperature sensor 1260 illustrated in FIG. 85.

As illustrated in FIG. 85, the first board-shaped member (board-shaped member) 1220 is configured in a rectangular flat plate shape including a conductive plate 1240, and a battery stack plate 1250 and the battery stack plate 1260 fitted with both side edges 1242 of the conductive plate 1240, respectively. Similarly to the first board-shaped member 1120 of the eleventh embodiment, the first board-shaped member 1220 is disposed between a plurality of stacked power storage modules (not illustrated) to constitute a power storage module.

Similarly to the conductive plate 1140 of the eleventh embodiment, the conductive plate 1240 is formed in an elongated rectangular board shape from a conductive metal such as an aluminum alloy or copper, and both side edges 1242 in the longitudinal direction thereof are formed in a convex piece shape having a thin plate thickness.

Similarly to the battery stack plate 1150 of the eleventh embodiment, the battery stack plate 1250 includes an elongated rectangular board-shaped insulating housing 1251, an electric wire 1285 whose one end is connected to a connection terminal (not illustrated), and an insulating cover 1252.

As illustrated in FIG. 86, a battery stack plate 1260 of the first board-shaped member 1220 of the twelfth embodiment includes an elongated rectangular board-shaped insulating housing 1261, a thermistor element 1290 as a battery temperature sensor accommodated in a sensor accommodating hole 1267 of the insulating housing 1261, and an electric wire 1295 whose one end is connected to the thermistor element 1290.

The thermistor element 1290 is mounted on the insulating housing 1261 and interposed between the board faces of the adjacent power storage modules (not illustrated) to detect the temperature of the power storage modules. The other end of the electric wire 1295 whose one end is connected to the thermistor element 1290 is electrically connected to a temperature detection circuit (not illustrated) via a connector or the like.

The insulating housing 1261 is formed by injection molding an insulating resin material into an elongated rectangular board shape having a predetermined plate thickness.

One board side face along the longitudinal direction of the insulating housing 1261 has a recessed fitting groove 1263 for fitting with the side edge 1242 of the conductive plate 1240. After the fitting groove 1263 is fitted with the side edge 1242 of the conductive plate 1240, the face of the board face of the insulating housing 1261 is flush with the face of the board face of the conductive plate 1240.

The other board side face along the longitudinal direction of the insulating housing 1261 is formed with a plurality of thinned holes 1265 aligned from the other board side face in a direction orthogonal to the plate thickness direction. The plurality of thinned holes 1265 are bottomed holes having a predetermined opening width and formed in a substantially rectangular parallelepiped shape aligned with the other board side face at predetermined intervals (see FIG. 87).

Figure 87:
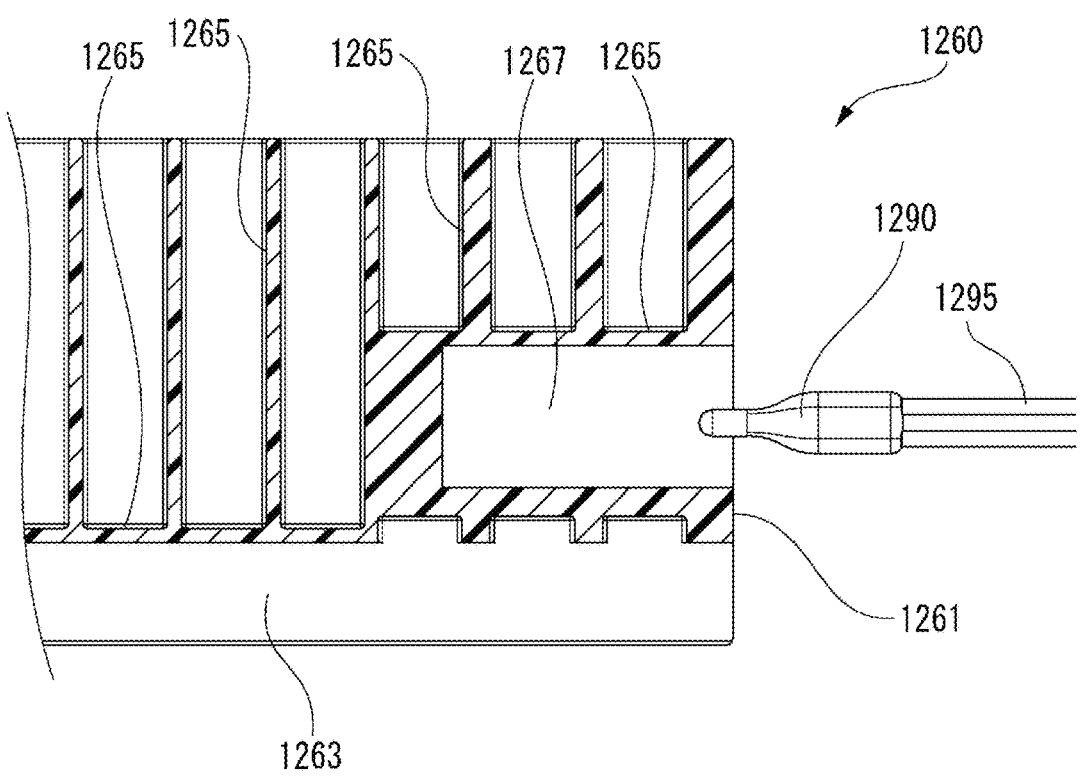
FIG. 87 is a main part enlarged horizontal cross-sectional view illustrating a state in which a thermistor element is being assembled to an insulating housing illustrated in FIG. 86.
Figure 88:
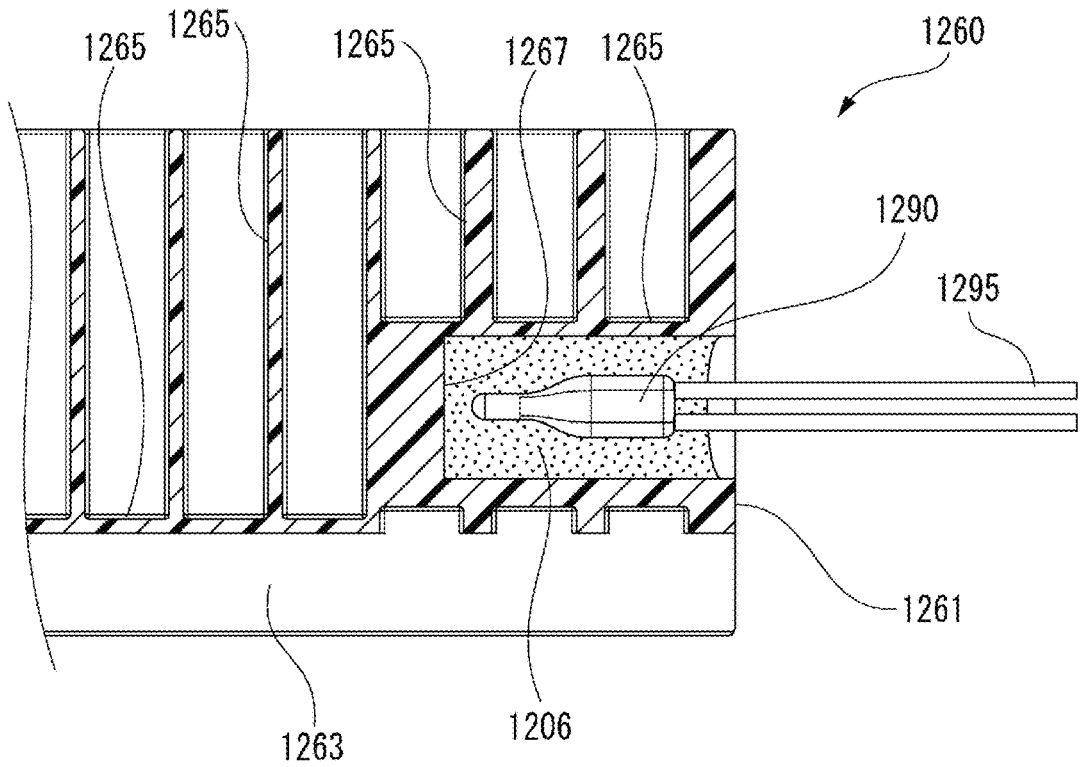
FIG. 88 is a main part enlarged horizontal cross-sectional view illustrating a state in which the thermistor element is potted in a sensor accommodating portion of the insulating housing illustrated in FIG. 87.

FIG. 87 is a main part enlarged horizontal cross-sectional view illustrating a state in which a thermistor element 1290 is being assembled to an insulating housing 1261 illustrated in FIG. 86. FIG. 88 is a main part enlarged horizontal cross-sectional view illustrating a state in which the thermistor element 1290 is potted in a sensor accommodating hole 1267 of the insulating housing 1261 illustrated in FIG. 87.

As illustrated in FIGS. 86 and 87, one board side face at the longitudinal ends (ends) of the insulating housing 1261 has a recessed sensor accommodating hole 1267 for accommodating the thermistor element 1290. The sensor accommodating hole 1267 is a bottomed hole formed in a substantially rectangular parallelepiped shape in the one board side face of the insulating housing 1261.

As illustrated in FIG. 87, the thermistor element 1290 is directly inserted into the sensor accommodating hole 1267 from the tip. Then, as illustrated in FIG. 88, the thermistor element 1290 is potted in the sensor accommodating hole 1267 by a potting material 1206 filled in the sensor accommodating hole 1267. The potting material 1206 may be, for example, epoxy resin or urethane resin.

According to the battery stack plate 1260 of the first board-shaped member 1220 of the twelfth embodiment, the thermistor element 1290 directly inserted into the sensor accommodating hole 1267 is potted to be directly fixed to the battery stack plate 1260. Therefore, the thermistor case accommodating the thermistor element 1290 can be eliminated, and the assembly process of the thermistor case can be eliminated.

As a result, it is possible to reduce the number of parts of the battery stack plate 1260, thereby reducing the cost and shortening the assembly work time of the battery temperature sensor.

Figure 89:
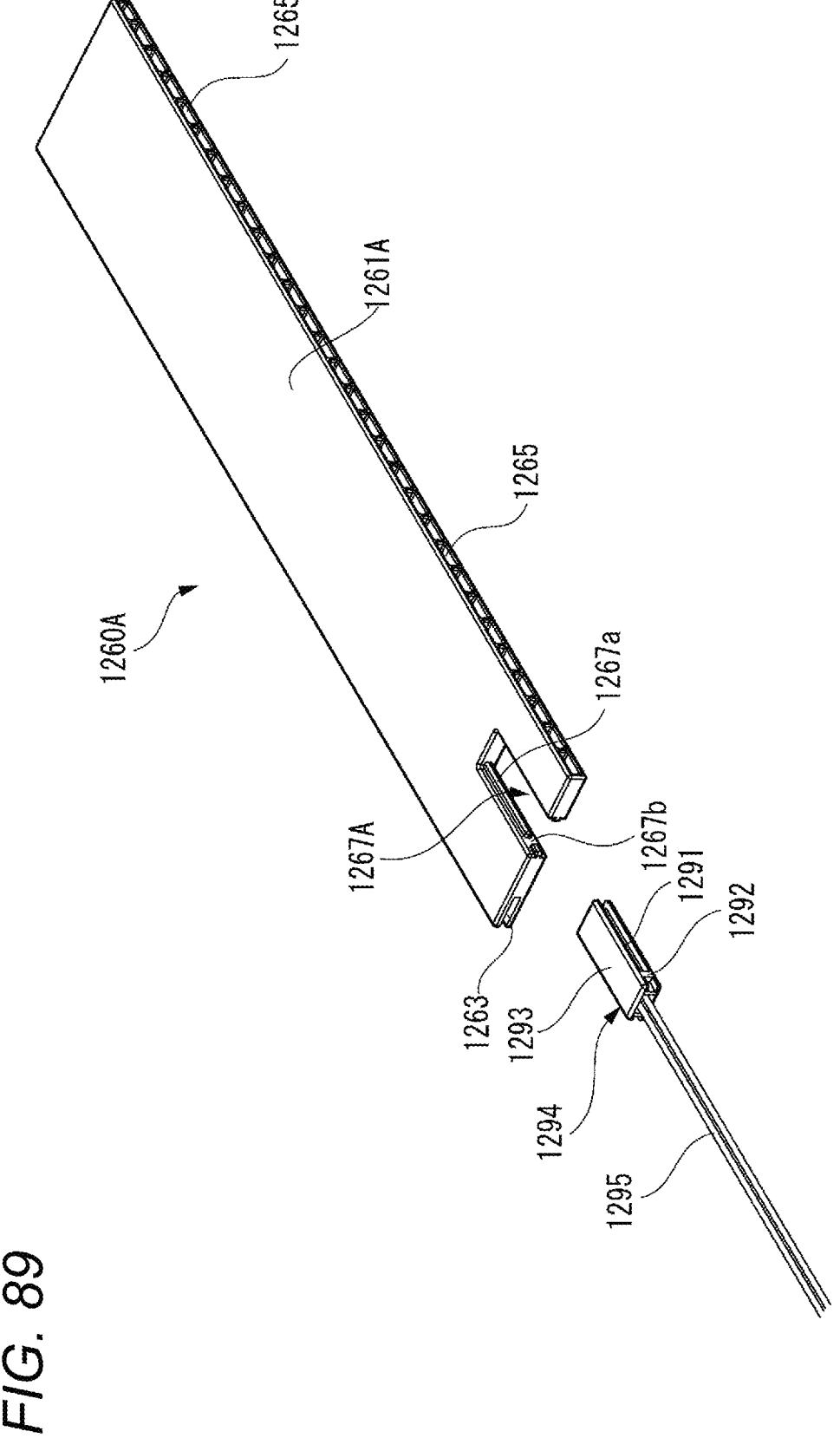
FIG. 89 is an exploded perspective view of a battery stack plate having a battery temperature sensor according to a reference example.
Figure 90:
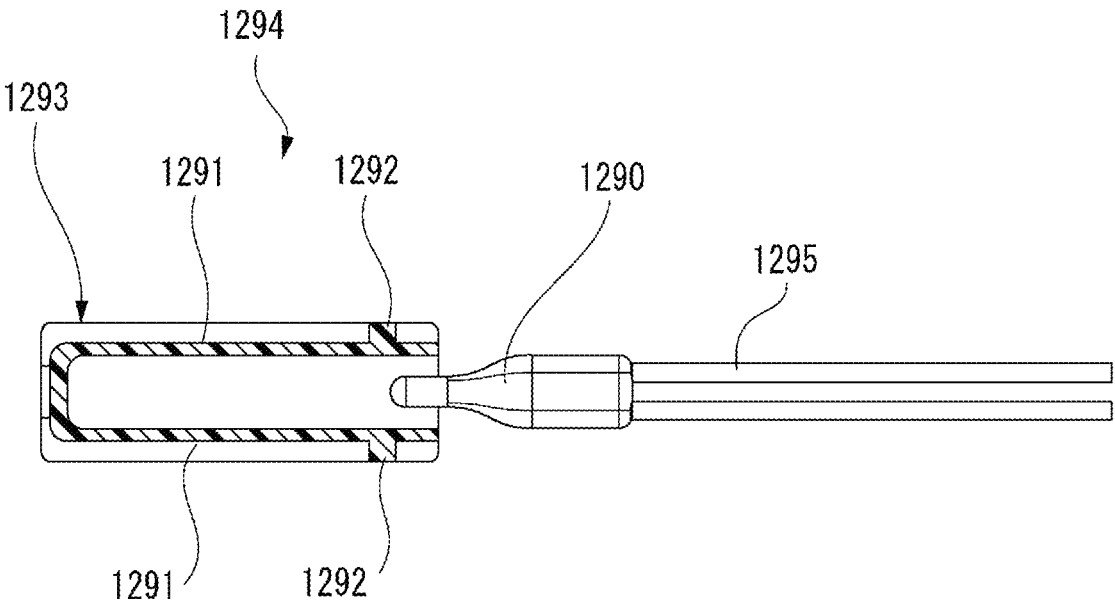
FIG. 90 is a horizontal cross-sectional view illustrating a state in which the thermistor element is being assembled to a thermistor case of the battery temperature sensor illustrated in FIG. 89.
Figure 91:
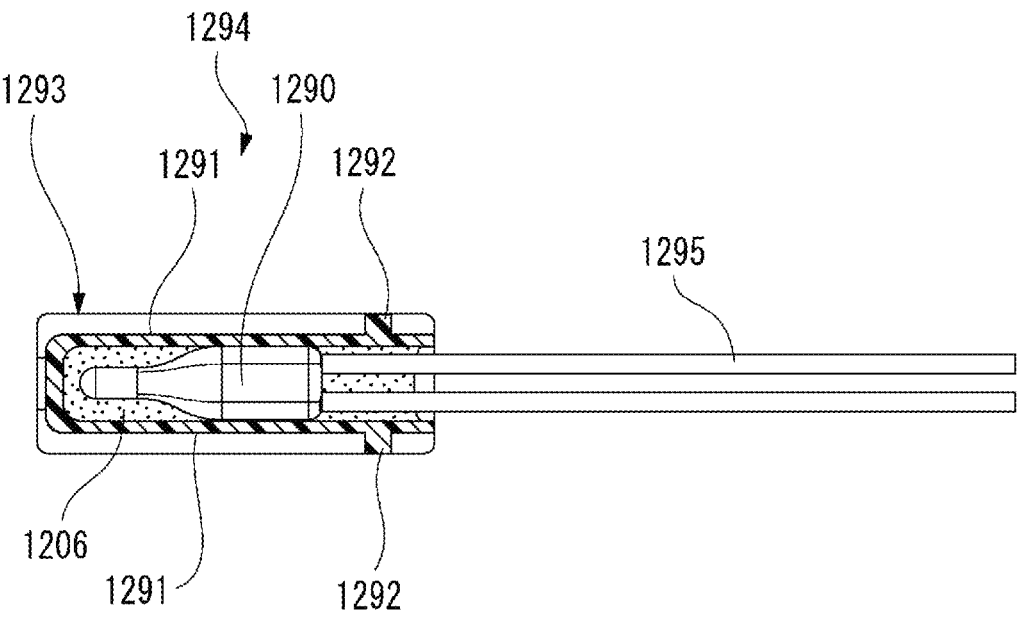
FIG. 91 is a horizontal cross-sectional view illustrating a state in which a thermistor element is potted in the thermistor case illustrated in FIG. 90.
Figure 92:
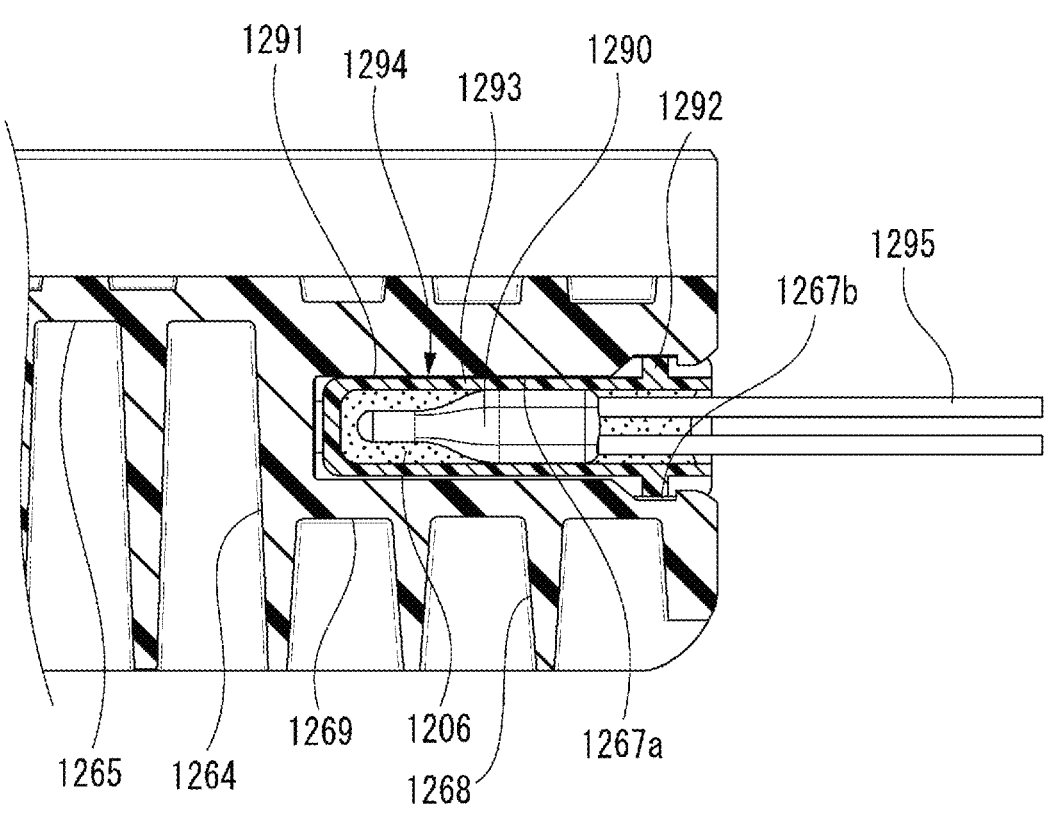
FIG. 92 is a horizontal cross-sectional view illustrating a state in which a battery temperature sensor illustrated in FIG. 91 is completely assembled to a sensor accommodating portion of an insulating housing.

FIG. 89 is an exploded perspective view of a battery stack plate having a battery temperature sensor 1260A according to a reference example. FIGS. 90 to 92 are horizontal cross-sectional views illustrating a procedure of assembling the thermistor case 1293, on which the thermistor element 1290 is potted, to the sensor accommodating portion 1267A of the insulating housing 1261. The battery stack plate 1260A has the same configuration as the battery stack plate 1260 except for using an insulating housing 1261A instead of the insulating housing 1261 and using a battery temperature sensor 1294 obtained by accommodating the thermistor element 1290 in the thermistor case 1293. The same components are denoted by the same reference signs, and detailed description thereof is omitted.

As illustrated in FIG. 89, one board side face at the longitudinal ends of the insulating housing 1261A has a recessed sensor accommodating portion 1267A for accommodating the battery temperature sensor 1294. The sensor accommodating portion 1267A is a recess formed by forming a notch in the one board side face to penetrate the insulating housing 1261A in the plate thickness direction. Both side walls of the sensor accommodating portion 1267A are provided with a guide rib 1267a and a locking recess 1267b.

As illustrated in FIG. 90, the thermistor element 1290 is inserted into the thermistor case 1293 from the tip. As illustrated in FIG. 91, the battery temperature sensor 1294 is configured by potting the thermistor element 1290 into the thermistor case 1293 with the potting material 1206 filled in the thermistor case 1293.

As illustrated in FIG. 92, the battery temperature sensor 1294 is inserted into the sensor accommodating portion 1267A of the insulating housing 1261. The guide grooves 1291 formed in both side faces of the thermistor case 1293 are inserted into and guided by the guide ribs 1267a projecting from both side walls of the sensor accommodating portion 1267A. Locking projections 1292 of the thermistor case 1293 are locked to the locking recesses 1267b, whereby the battery temperature sensor 1294 is held in the sensor accommodating portion 1267A.

As described above, the battery stack plate 1260A of the reference example has a structure in the related art, in which the battery temperature sensor 1294 obtained by potting the thermistor element 1290 into the thermistor case 1293 is assembled to the sensor accommodating portion 1267A of the insulating housing 1261.

This increases the number of parts of the battery stack plate 1260A, and thus increases the cost and elongates the assembly work time of the battery temperature sensor.

In contrast, the battery stack plate 1260 of the twelfth embodiment described above can reduce the number of parts, thereby reducing the cost and shortening the assembly work time of the battery temperature sensor.

The invention embodied as the twelfth embodiment is not limited to the twelfth embodiment, and various modifications can be adopted within the scope of the invention. For example, the present invention is not limited to the twelfth embodiment, and modifications, improvements, and the like can be made appropriately. In addition, materials, shapes, sizes, numbers, arrangement positions, and the like of components in the twelfth embodiment are freely selected and are not limited as long as the present invention can be implemented.

Here, the features of the embodiment of the battery stack plate according to the twelfth embodiment described above are briefly summarized and listed in the following [12-1].

[12-1]

A battery stack plate (1260) including:

a board-shaped insulating housing (1261);

a sensor accommodating hole (1267) recessed in a board side face of the insulating housing (1261);

a thermistor element (1290) configured to be connected to an end of an electric wire (1295) and directly inserted into the sensor accommodating hole (1267); and a potting material (1206) configured to pot the thermistor element (1290) into the sensor accommodating hole (1267).

Thirteenth Embodiment

Figure 93:
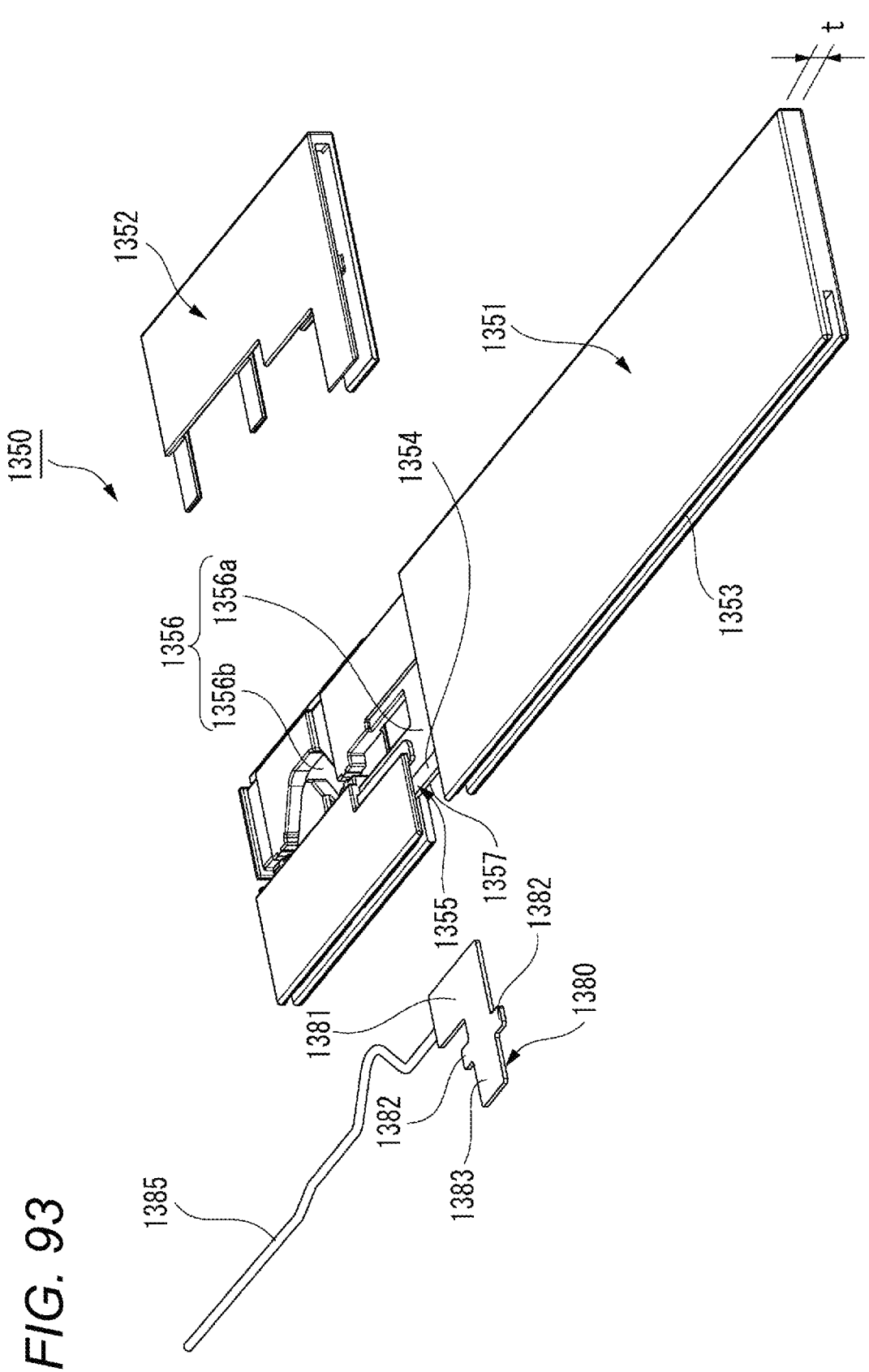
FIG. 93 is an exploded perspective view of a battery stack plate having a connection terminal according to a thirteenth embodiment.
Figure 94:
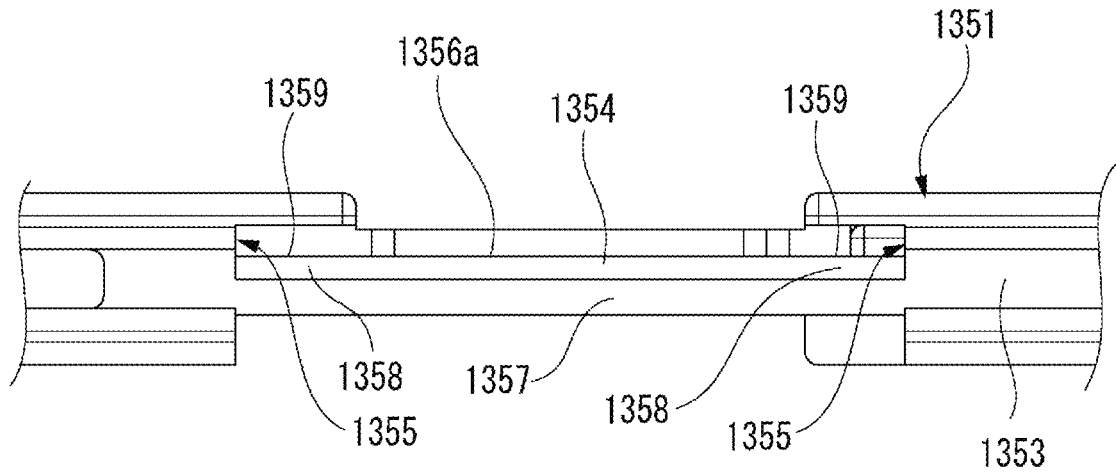
FIG. 94 is a main part enlarged front view of an insulating housing illustrated in FIG. 93.
Figure 95:
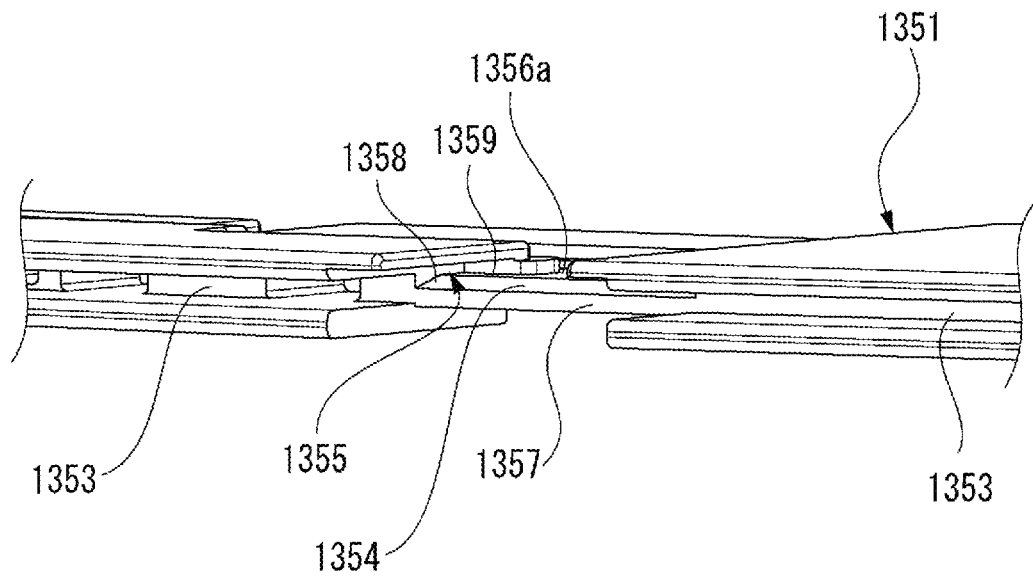
FIG. 95 is a main part enlarged perspective view of an insulating housing illustrated in FIG. 94.

The invention embodied as a thirteenth embodiment relates to a battery stack plate. FIG. 93 is an exploded perspective view of a battery stack plate 1350 having a connection terminal 1380 according to a thirteenth embodiment. FIGS. 94 and 95 are a main part enlarged front view and a main part enlarged perspective view of an insulating housing 1351 illustrated in FIG. 93.

As illustrated in FIG. 93, the battery stack plate 1350 according to the thirteenth embodiment includes the elongated rectangular board-shaped insulating housing 1351, the connection terminal 1380, an electric wire 1385 whose one end is connected to the connection terminal 1380, and an insulating cover 1352.

The connection terminal 1380 is made of a conductive metal material such as copper or a copper alloy, and is formed in an L-shaped plate shape. The connection terminal 1380 has an electric wire connection portion 1381 at one end of the L shape and an electric connection portion 1383 at the other end of the L shape.

One end of the electric wire 1385 is electrically connected to the electric wire connection portion 1381 by welding or the like. The other end of the electric wire 1385 is electrically connected to a temperature detection circuit (not illustrated) via a connector or the like.

The electric connection portion 1383 is electrically connected to the side edge 1142 of the conductive plate 1140 by welding or the like. Further, both side edges of the electric connection portion 1383 are provided with a pair of projection 1382 projecting in directions away from each other.

The insulating housing 1351 according to the thirteenth embodiment is formed by injection molding an insulating resin material into an elongated rectangular board shape having a predetermined plate thickness.

As illustrated in FIG. 93, one board side face along the longitudinal direction of the insulating housing 1351 has a recessed fitting groove 1353 for fitting with the side edge of the conductive plate (not illustrated). After the fitting groove 1353 is fitted with the side edge of the conductive plate, the face of the board face of the insulating housing 1351 is flush with the face of the board face of the conductive plate.

As illustrated in FIG. 93, the face of the board face on one end side in the longitudinal direction of the insulating housing 1351 is provided with an accommodating recess 1356 for accommodating the one end side of the electric wire 1385 and the connection terminal 1380. The accommodating recess 1356 includes a terminal accommodating portion 1356a for accommodating the connection terminal 1380 and an electric wire accommodating portion 1356b for accommodating the one end of the electric wire 1385.

By accommodating the one end of the electric wire 1385 bent in a V shape in the electric wire accommodating portion 1356b, when a tensile force acts on the other end of the electric wire 1385, it is possible to prevent the tensile force from acting on the connection portion with the electric wire connection portion 1381.

The terminal accommodating portion 1356a has a shape corresponding to the outer periphery shape of the L-shaped connection terminal 1380. The terminal accommodating portion 1356a is formed with a notch 1357 for bringing the electric connection portion 1383 of the connection terminal 1380 into contact with the side edge of the conductive plate fitted into the fitting groove 1353.

The notch 1357 is formed by notching from one board side face along the longitudinal direction of the insulating housing 1351 in a direction orthogonal to the plate thickness direction (rightward in FIG. 93). When the connection terminal 1380 is accommodated in the terminal accommodating portion 1356a, the electric connection portion 1383 comes into contact with the side edge (mating member) of the conductive plate, which facilitates the welding work.

Further, as illustrated in FIGS. 94 and 95, a pair of upright walls extending from both sides of the notch 1357 to the terminal accommodating portion 1356a are formed with a pair of terminal insertion grooves 1355 extending in the short direction (width direction) of the insulating housing 1351 and facing each other. The pair of terminal insertion grooves 1355 are guide grooves for respectively inserting and guiding the pair of projections 1382 projecting from the connection terminal 1380.

The opening width of the notch 1357 along the longitudinal direction of the insulating housing 1351 is slightly wider than the width of the electric connection portion 1383 of the connection terminal 1380 and narrower than the interval between the tips of the pair of projections 1382. Therefore, the connection terminal 1380 whose pair of projections 1382 are inserted into the pair of terminal insertion grooves 1355 is restricted from displacing upward and is prevented from falling off from the insulating housing 1351.

The end edge of the notch 1357 continuous with the bottom wall of the terminal accommodating portion 1356a is formed with a tapered face 1354 inclined to have a plate thickness decreasing toward the tip. As illustrated in FIG. 95, the lower face defining the terminal insertion groove 1355 is formed with a horizontal portion 1359 continuous with the bottom wall of the terminal accommodating portion 1356a and a tapered portion 1358 extending from the horizontal portion 1359 toward the tip.

As illustrated in FIG. 93, the insulating cover 1352 injection-molded from an insulating resin material is mounted in a manner sandwiching the insulating housing 1351 in the plate thickness direction, thereby covering the one end of the electric wire 1385 and the connection terminal 1380 accommodated in the accommodating recess 1356. The insulating cover 1352 covers the accommodating recess 1356 while being flush with the face of the board face of the insulating housing 1351.

The insulating cover 1352 is mounted to the insulating housing 1351 in a manner movable between the temporary locking position and the final locking position relative to the insulating housing 1351. The insulating cover 1352 at the temporary locking position exposes, instead of covering, the electric connection portion 1383 of the connection terminal 1380 accommodated in the accommodating recess 1356. Further, the insulating cover 1352 at the final locking position completely covers the connection terminal 1380 accommodated in the accommodating recess 1356.

Next, a procedure of assembling the connection terminal 1380 to the insulating housing 1351 of the battery stack plate 1350 according to the thirteenth embodiment will be described.

Figure 96:
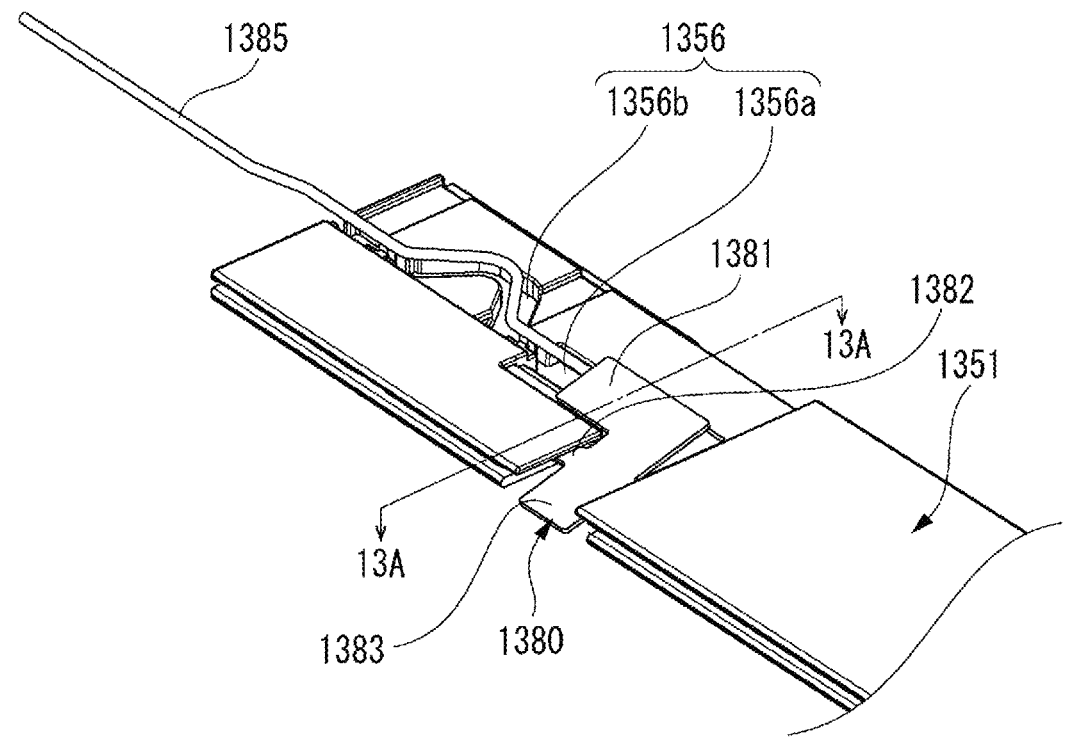
FIG. 96 is a main part enlarged perspective view illustrating a state in which the connection terminal is being assembled to the insulating housing illustrated in FIG. 93.
Figure 97:
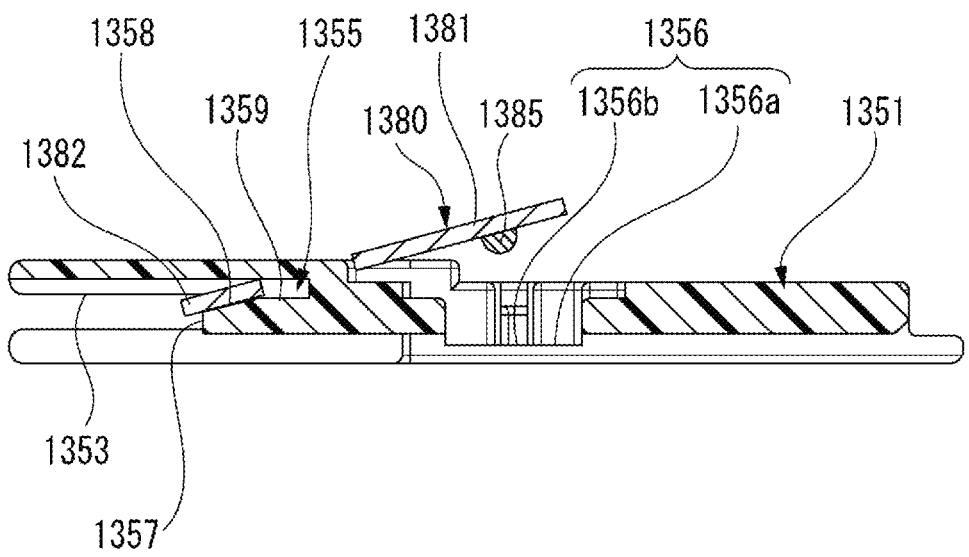
FIG. 97 is a cross-sectional view taken along a line 13A-13A in FIG. 96.
Figure 98:
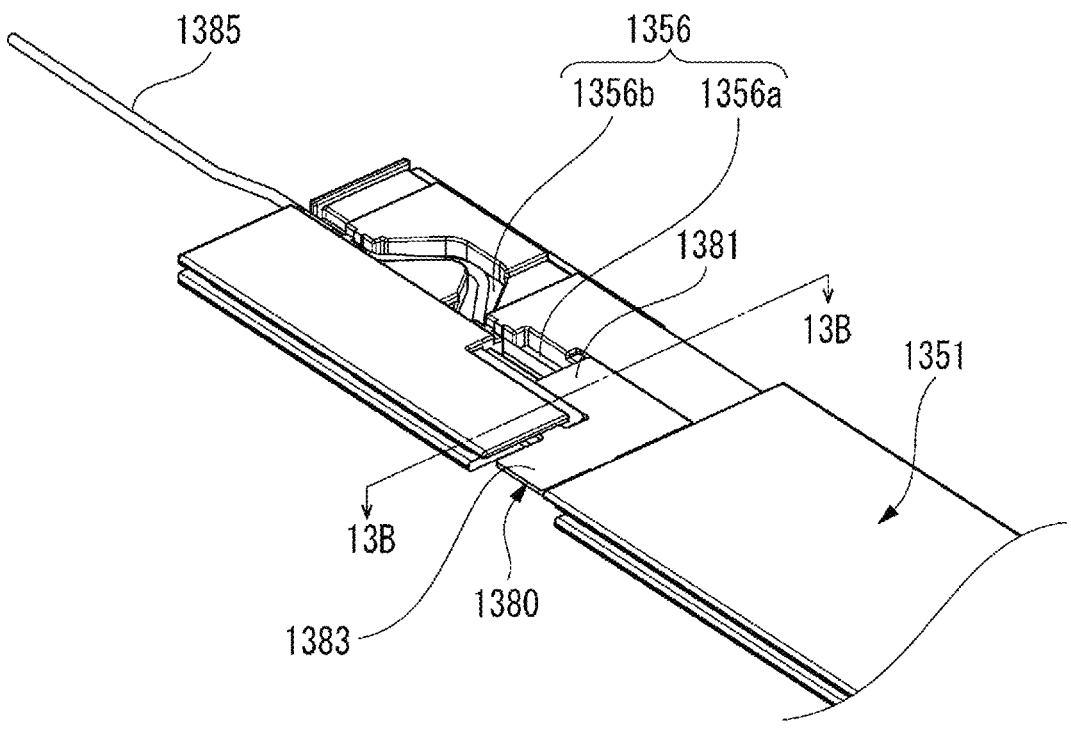
FIG. 98 is a main part enlarged perspective view illustrating a state in which the connection terminal is completely assembled to the insulating housing illustrated in FIG. 93.
Figure 99:
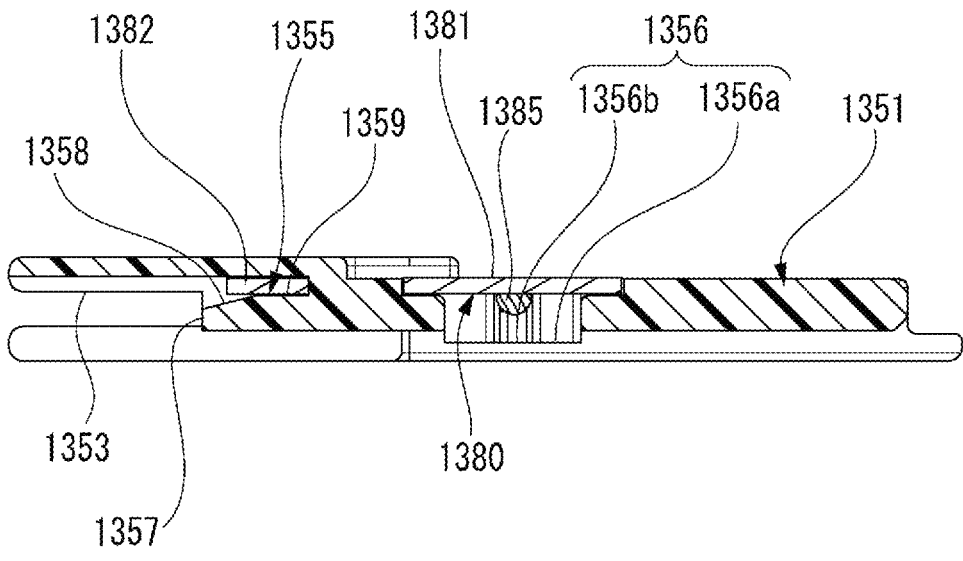
FIG. 99 is a cross-sectional view taken along a line 13B-13B in FIG. 98.

FIGS. 96 and 97 are a main part enlarged perspective view and a main part cross-sectional view illustrating a state in which the connection terminal 1380 is being assembled to the insulating housing 1351. FIG. 98 and FIG. 99 are a main part enlarged perspective view and a main part cross-sectional view illustrating a state in which the connection terminal 1380 is completely assembled to the insulating housing 1351.

When the connection terminal 1380 connected to the end of the electric wire 1385 is accommodated in the accommodating recess 1356 of the insulating housing 1351, the connection terminal 1380 is moved from one board side face side along the longitudinal direction of the insulating housing 1351 toward the accommodating recess 1356.

At this time, as illustrated in FIG. 96, in the connection terminal 1380 in which the electric wire connection portion 1381 side is slightly lifted and inclined, the electric wire connection portion 1381 passes over the face of the board face of the insulating housing 1351, and the pair of projections 1382 of the electric connection portion 1383 are respectively inserted into the pair of terminal insertion grooves 1355.

The connection terminal 1380 is guided to a normal position of the terminal accommodating portion 1356a by the pair of projections 1382 projecting in a direction away from each other on both side edges along the insertion direction of the electric connection portion 1383 being inserted into the pair of terminal insertion grooves 1355 disposed on both sides and caught by the tapered portion 1358.

When the connection terminal 1380 is further inserted, as illustrated in FIGS. 98 and 99, the pair of projections 1382 reach the horizontal portion 1359 and are restricted horizontal, so that the connection terminal 1380 can be restricted from inclination along the insertion direction. Therefore, the connection terminal 1380 that has reached the normal position of the terminal accommodating portion 1356a and is restricted from inclination is prevented from riding on the face of the board face of the insulating housing 1351.

According to the above-described battery stack plate 1360 of the thirteenth embodiment, when the connection terminal 1380 is assembled to the insulating housing 1351, it is possible to prevent the connection terminal 1380 from riding on the face of the board face of the insulating housing 1351. This eliminates the possibility that the connection terminal 1380 rides on the face of the board face of the insulating housing 1351 and cannot be assembled to the terminal accommodating portion 1356a.

The invention embodied as the thirteenth embodiment is not limited to the thirteenth embodiment, and various modifications can be adopted within the scope of the invention. For example, the present invention is not limited to the thirteenth embodiment, and modifications, improvements, and the like can be made appropriately. In addition, materials, shapes, sizes, numbers, arrangement positions, and the like of components in the thirteenth embodiment are freely selected and are not limited as long as the present invention can be implemented.

Here, the features of the embodiment of the battery stack plate according to the thirteenth embodiment described above are briefly summarized and listed in the following [13-1] to [13-3].

[13-1]

A battery stack plate (1360) including:

a board-shaped terminal (connection terminal 1380) configured to be connected to an electric wire (1385);

a board-shaped insulating housing (1351) having an accommodating recess (1356) accommodating the terminal (connection terminal 1380);

a notch (1357) formed continuously with the accommodating recess (1356) and configured to bring an electric connection portion (1383) of the terminal (connection terminal 1380) into contact with a mating member (side edge of a conductive plate);

a pair of terminal insertion grooves (1355) facing each other in a pair of upright walls extending on both sides of the notch (1357); and a pair of projections (1382) projecting in directions away from each other on both side edges of the electric connection portion (1383), in which when the terminal (connection terminal 1380) is accommodated in the accommodating recess (1356), the pair of projections (1382) are inserted into and guided by the pair of terminal insertion grooves (1355), respectively.

[13-2]

The battery stack plate (1360) according to the above [13-1], in which an end edge of the notch (1357) is formed with a tapered face (1354) inclined to have a plate thickness decreasing toward a tip end, and a lower face defining each of the terminal insertion grooves (1355) is formed with a horizontal portion (1359) continuous with a bottom wall of the accommodating recess (1356) and a tapered portion (1358) extending from the horizontal portion (1359) toward a tip end.

[13-3]

The battery stack plate (1360) according to the above [13-1] or [13-2], in which the terminal (connection terminal 1380) formed in an L-shaped plate shape has one end of the L-shape as an electric wire connection portion (1381) configured to be electrically connected to an end of the electric wire (1385), and the other end of the L-shape as an electric connection portion (1383) configured to be electrically connected to the mating member (side edge of the conductive plate), and the pair of projections (1382) are provided on both side edges of the electric connection portion (1383).

Fourteenth Embodiment

Figure 100:
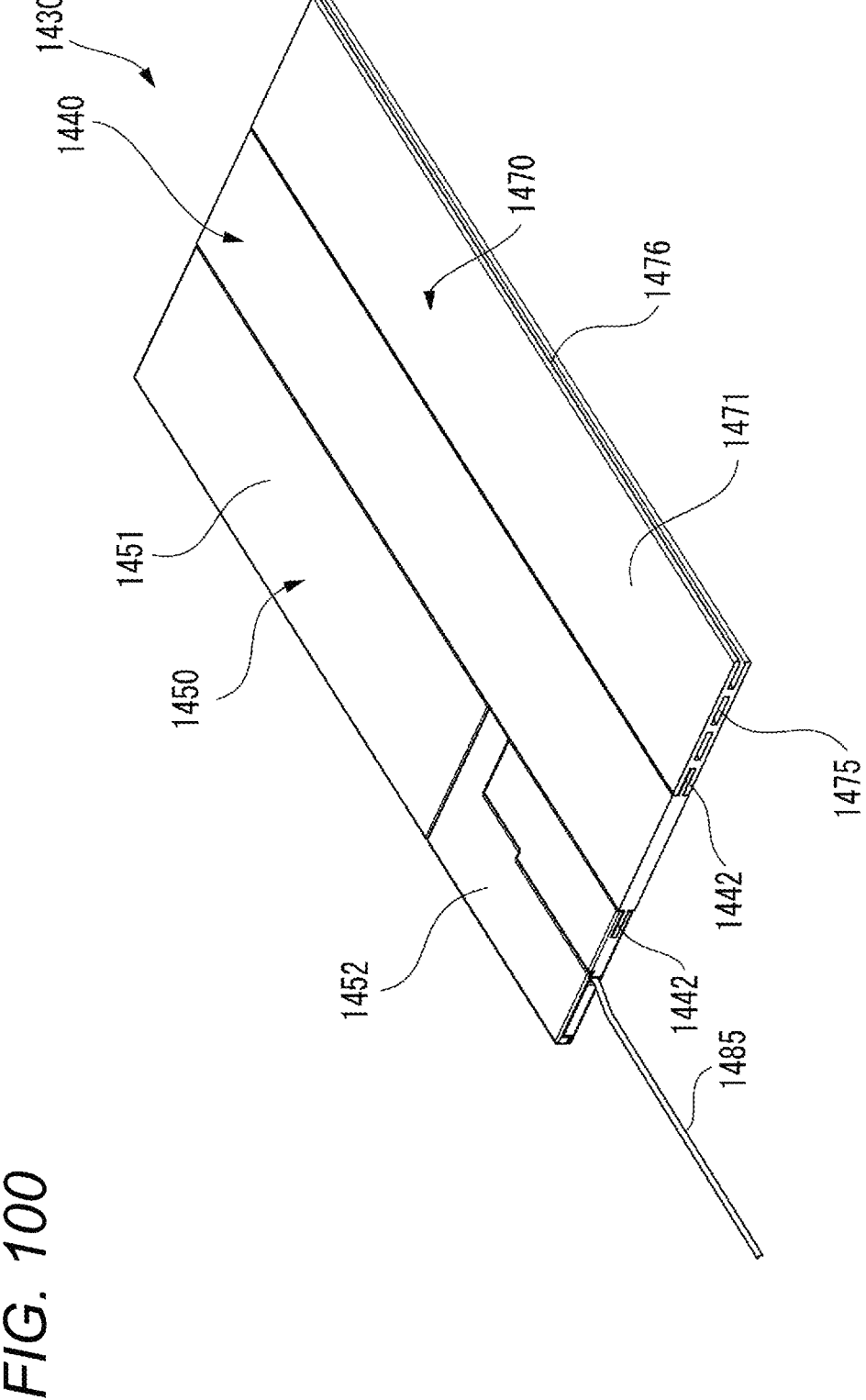
FIG. 100 is a perspective view of a second board-shaped member according to the fourteenth embodiment.
Figure 101:
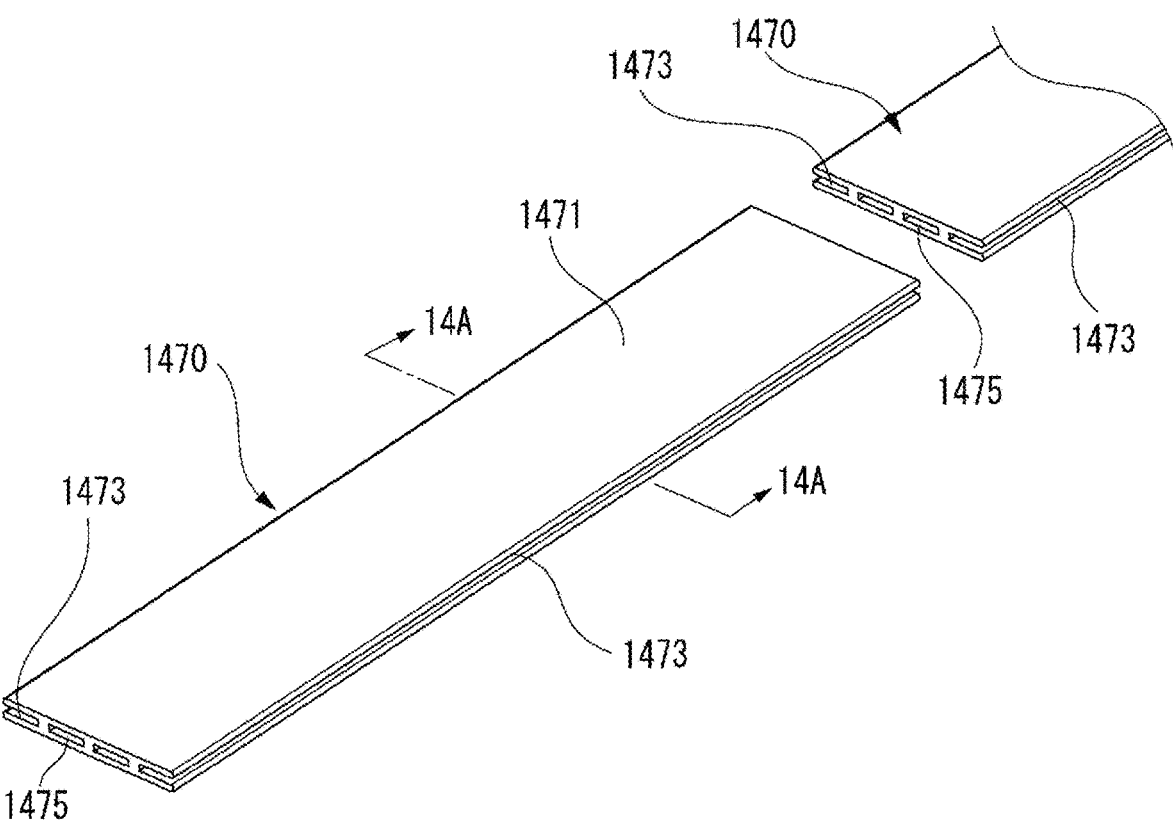
FIG. 101 is a perspective view illustrating a state in which an insulating housing in a dummy battery stack plate illustrated in FIG. 100 is formed by extrusion and cutting.
Figure 102:
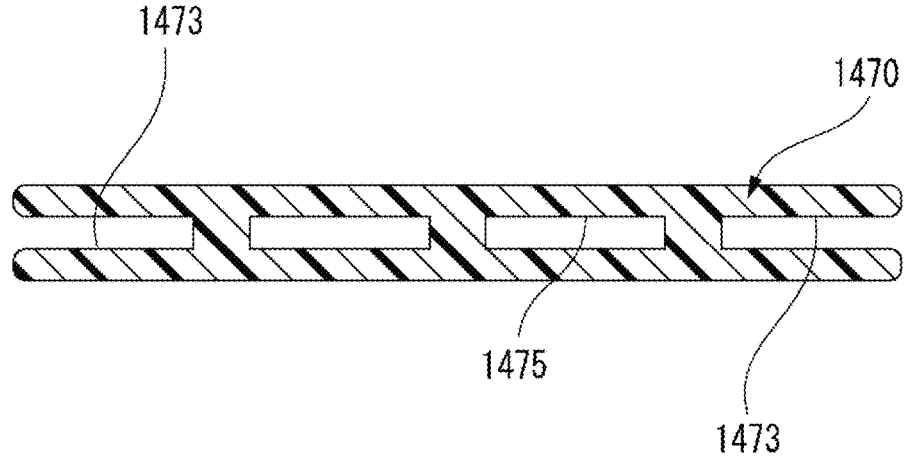
FIG. 102 is a cross-sectional view taken along a line 14A-14A in FIG. 101.

The invention embodied as a fourteenth embodiment relates to a battery stack plate. FIG. 100 is a perspective view of a second board-shaped member 1430 according to the fourteenth embodiment. FIG. 101 is a perspective view illustrating a state in which an insulating housing 1471 in a dummy battery stack plate 1470 illustrated in FIG. 100 is formed by extrusion and cutting. FIG. 102 is a cross-sectional view taken along a line 14A-14A in FIG. 101.

As illustrated in FIG. 100, the second board-shaped member (board-shaped member) 1430 is configured in a rectangular flat plate shape including a conductive plate 1440, and a battery stack plate 1450 and the battery stack plate 1470 fitted with both side edges 1442 of the conductive plate 1440, respectively. Similarly to the second board-shaped member 1130 of the eleventh embodiment, the second board-shaped member 1430 is disposed between a plurality of stacked power storage modules (not illustrated) to constitute a power storage module.

Similarly to the conductive plate 1140 of the eleventh embodiment, the conductive plate 1440 is formed in an elongated rectangular board shape from a conductive metal such as an aluminum alloy or copper, and both side edges 1442 in the longitudinal direction thereof are formed in a convex piece shape having a thin plate thickness.

Similarly to the battery stack plate 1150 of the eleventh embodiment, the battery stack plate 1450 includes an elongated rectangular board-shaped insulating housing 1451, an electric wire 1485 whose one end is connected to a connection terminal (not illustrated), and an insulating cover 1452.

The dummy battery stack plate 1470 according to the second board-shaped member 1430 of the fourteenth embodiment includes an elongated rectangular board-shaped insulating housing 1471. The battery stack plate 1470 is a dummy plate interposed between the board faces of the adjacent power storage modules to maintain the interval between the power storage modules at a predetermined interval, and is not provided with functional components such as connection terminals and battery temperature sensors.

As illustrated in FIG. 101, the insulating housing 1471 is formed by an insulating resin material being extruded into a long rectangular board shape having a predetermined plate thickness and then cut into a predetermined length.

As illustrated in FIG. 102, both board side faces along the longitudinal direction (board side faces in the left-right direction in FIG. 102) of the insulating housing 1471 have recessed fitting grooves 1473 for fitting with the side edges 1442 of the conductive plate 1440. Since the insulating housing 1471 has a right-left symmetrical structure, both the left and right fitting grooves 1473 can be fitted with the side edges 1442 of the conductive plate 1440.

As illustrated in FIG. 100, after the fitting grooves 1473 are fitted with the side edges 1442 of the conductive plate 1440, the face of the board face of the insulating housing 1471 is flush with the face of the board face of the conductive plate 1440.

Further, the extruded insulating housing 1471 is formed with a plurality of (two in the fourteenth embodiment) thinned holes 1475 aligned along the longitudinal direction. The thinned holes 1475 are a plurality of through holes having a predetermined opening width and formed in a substantially rectangular parallelepiped shape aligned in the short direction (left-right direction in FIG. 102) at predetermined intervals.

The fitting grooves 1473 and the thinned holes 1475 are formed simultaneously when the insulating housing 1471 is extruded. In addition, the long rectangular board shape having the fitting grooves 1473 and the thinned holes 1475 can be reduced in cross-sectional area, and thus can be cut with a low load when subjected to the cutting process. In addition, the insulating housing 1471 formed with the hollow thinned holes 1475 to reduce the cross-sectional area can be reduced in weight compared to an insulating housing of the related art.

Thus, according to the insulating housing 1471 of the battery stack plate 1470 of the fourteenth embodiment, it is possible to increase the production level compared to an insulating housing formed by injection molding of the related art.

The invention embodied as the fourteenth embodiment is not limited to the fourteenth embodiment, and various modifications can be adopted within the scope of the invention. For example, the present invention is not limited to the fourteenth embodiment, and modifications, improvements, and the like can be made appropriately. In addition, materials, shapes, sizes, numbers, arrangement positions, and the like of components in the fourteenth embodiment are freely selected and are not limited as long as the present invention can be implemented.

Here, the features of the embodiment of the battery stack plate according to the fourteenth embodiment described above are briefly summarized and listed in the following [14-1].

[14-1]

A battery stack plate (1470) including:

an insulating housing (1471) extruded into an elongated rectangular board shape;

fitting grooves (1473) recessed in both board side faces along a longitudinal direction of the insulating housing (1471) and configured to be fitted with side edges of conductive plates respectively disposed between a plurality of stacked power storage modules; and a through hole (thinned holes 1475) provided inside the insulating housing (1471) along the longitudinal direction.

Fifteenth Embodiment

Figure 103:
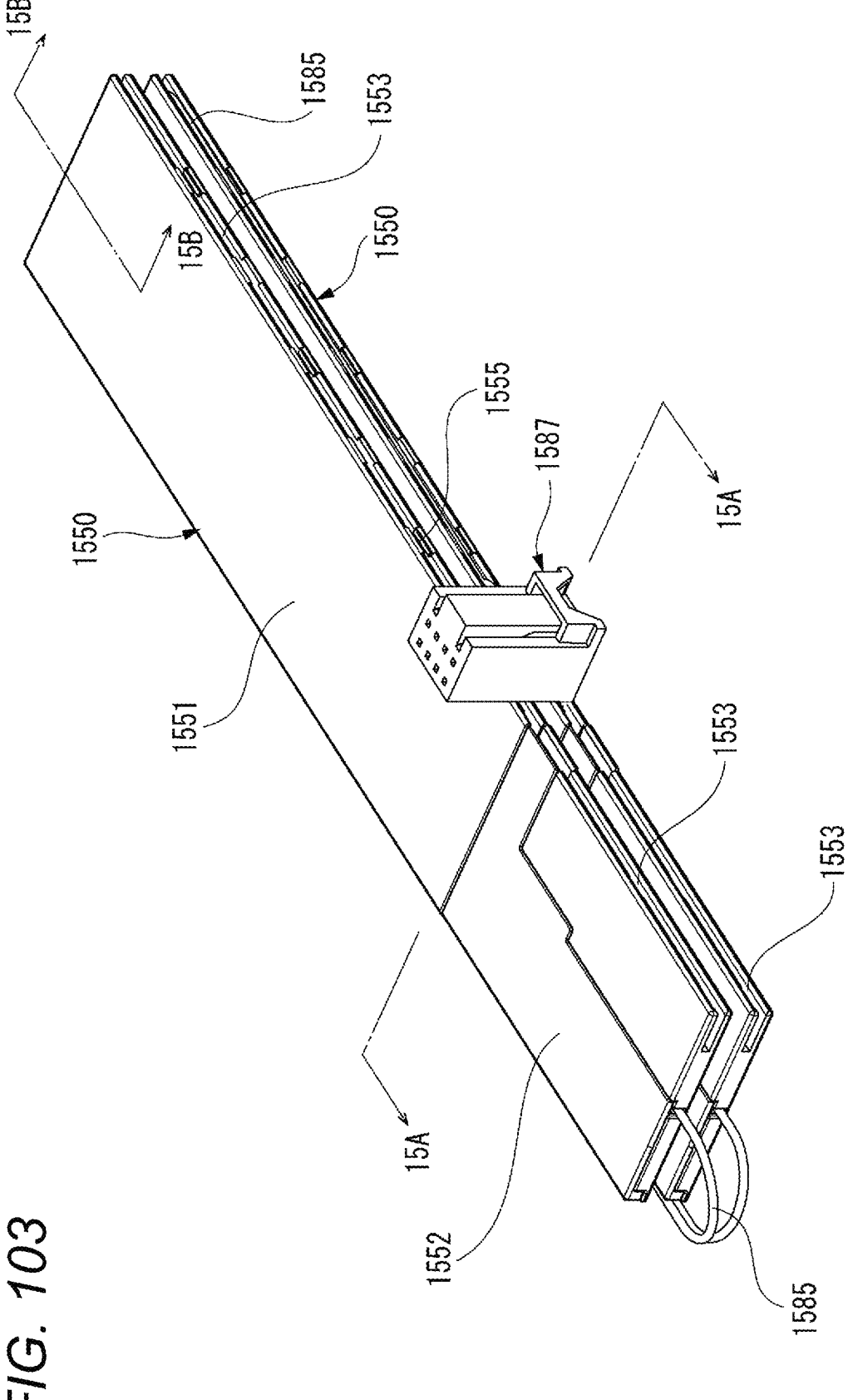
FIG. 103 is a perspective view for explaining a state of packing and transporting a battery stack plate having a connection terminal according to a fifteenth embodiment.
Figure 104:
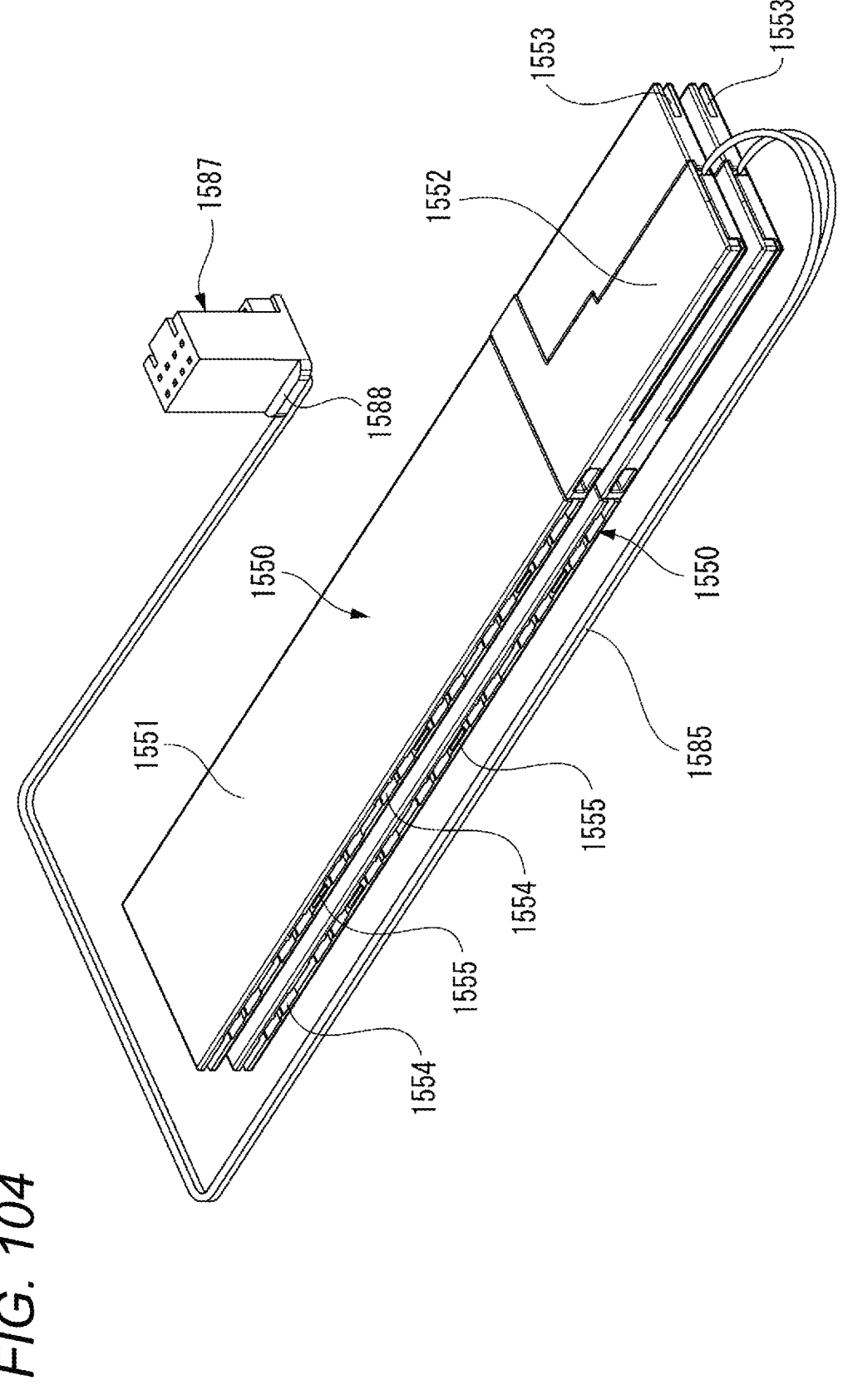
FIG. 104 is a perspective view of a state in which electric wires and a connector of the battery stack plate illustrated in FIG. 103 are removed from an insulating housing.
Figure 105:
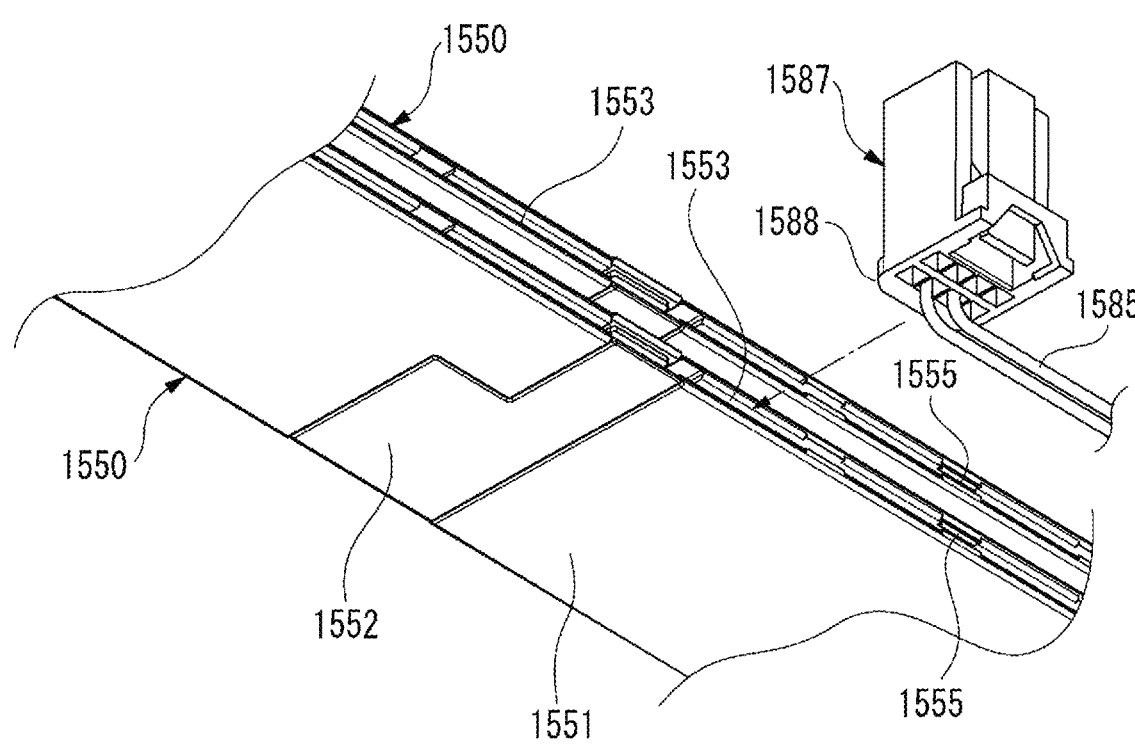
FIG. 105 is a perspective view of the connector of the battery stack plate illustrated in FIG. 104 viewed from below on the side opposite to the insulating housing.
Figure 106:
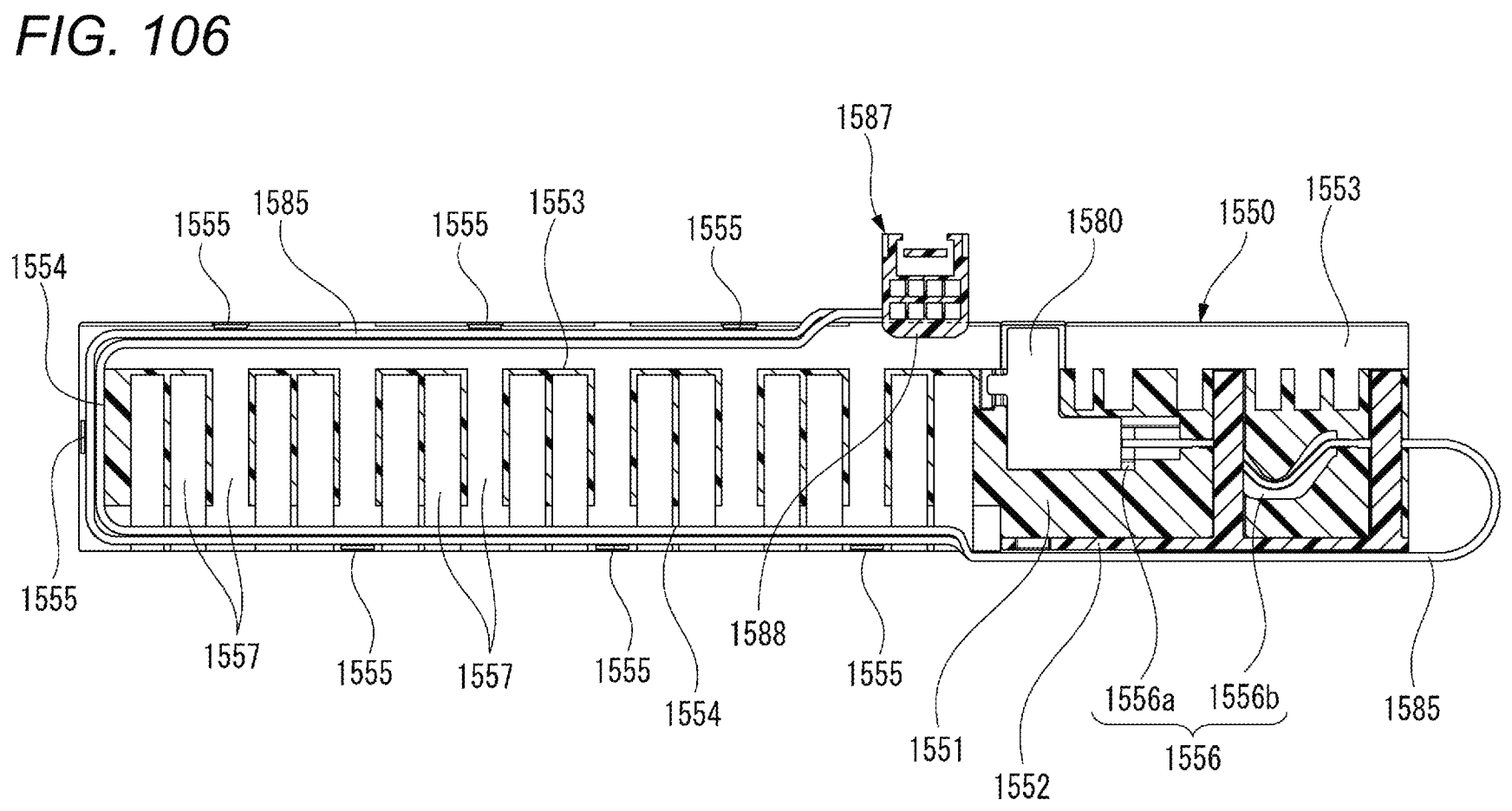

The invention embodied as a fifteenth embodiment relates to a battery stack plate. FIG. 103 is a perspective view for explaining a state of packing and transporting a battery stack plate 1550 having a connection terminal according to a fifteenth embodiment. FIG. 104 is a perspective view of a state in which electric wires 1585 and a connector 1587 of the battery stack plate 1550 illustrated in FIG. 103 are removed from an insulating housing 1551. FIG. 105 is a perspective view of the connector 1587 of the battery stack plate 1550 illustrated in FIG. 104 viewed from below on the side opposite to the insulating housing 1551. FIG. 106 is a horizontal cross-sectional view illustrating the electric wires 1585 accommodated in an electric wire accommodating grooves 1554 of the battery stack plate 1550.

As illustrated in FIGS. 103 and 104, the battery stack plate 1550 according to the fifteenth embodiment includes the elongated rectangular board-shaped insulating housing 1551, the connection terminal 1580, the electric wire 1585 whose one end is connected to the connection terminal 1580, the connector 1587 connected to the other end of the electric wire 1585, and an insulating cover 1552.

The insulating housing 1551 is formed by injection molding an insulating resin material into an elongated rectangular board shape having a predetermined plate thickness.

As illustrated in FIGS. 103 and 105, one board side face along the longitudinal direction of the insulating housing 1551 has a recessed fitting grooves 1553 for fitting with the side edge of the conductive plate (not illustrated).

The face of the board face on one end side in the longitudinal direction of the insulating housing 1551 is provided with an accommodating recess 1556 for accommodating the one end side of the electric wire 1585 and the connection terminal 1580, and is covered with an insulating cover 1552 injection-molded from an insulating resin material.

As illustrated in FIG. 106, the other board side face along the longitudinal direction of the insulating housing 1551 and the board face on the other end side in the longitudinal direction are provided with recessed electric wire accommodating grooves 1554. In the electric wire accommodating grooves 1554, the interval between the groove side walls facing each other is substantially the same size as the diameter of the electric wire 1585, and the depth of the groove bottom wall is twice or more the diameter of the electric wire 1585 (see FIG. 107).

In addition, the groove bottom walls of the electric wire accommodating grooves 1554 recessed in the other board side face along the longitudinal direction of the insulating housing 1551 are formed with a plurality of thinned holes 1557 aligned from the other board side face in a direction orthogonal to the plate thickness direction (upward in FIG. 106). The plurality of thinned holes 1557 include bottomed holes and through holes having a predetermined opening width and formed in a substantially rectangular parallelepiped shape aligned with the other board side face at predetermined intervals.

The opening ends of the groove side walls facing each other in the fitting grooves 1553 and the electric wire accommodating grooves 1554 are provided with a plurality of pairs of electric wire press fitting portions 1555 projecting in directions facing each other at predetermined intervals. The electric wire press fitting portions 1555 are rib projections having a semicircular cross section and extending by a predetermined length along the opening ends of the groove side walls.

Each pair of electric wire press fitting portions 1555 facing each other define a gap that is narrower than the diameter of the electric wire 1585 but allows the electric wire 1585 to be press-fitted therein. Therefore, the electric wires 1585 accommodated in the fitting grooves 1553 and the electric wire accommodating grooves 1554 do not easily come out.

As illustrated in FIG. 104, the connector 1587 is, for example, a connector for accommodating, in a resin housing, two connection terminals (not illustrated) connected to the other ends of the electric wires 1585 respectively led out from two battery stack plates 1550, and electrically connecting the connection terminals to respective mate terminals in the connector on the temperature detection circuit side. The resin housing of the connector 1587 is provided with a press fitting projection 1588 to be press-fitted into the electric wire accommodating grooves 1554. Then, as illustrated in FIG. 105, the connector 1587 can be held in the insulating housing 1551 by press fitting the press fitting projection 1588 into the locations of the electric wire accommodating grooves 1554 where the pair of electric wire press fitting portions 1555 are not provided.

The two battery stack plates 1550 in which the other ends of the electric wires 1585 are connected to the connector 1587 as described above are packed and transported in a set.

A procedure of accommodating and holding the two electric wires 1585 led out from the two battery stack plates 1550 in the electric wire accommodating grooves 1554 of the insulating housing 1551 at the time of shipment will be described.

Figure 107:
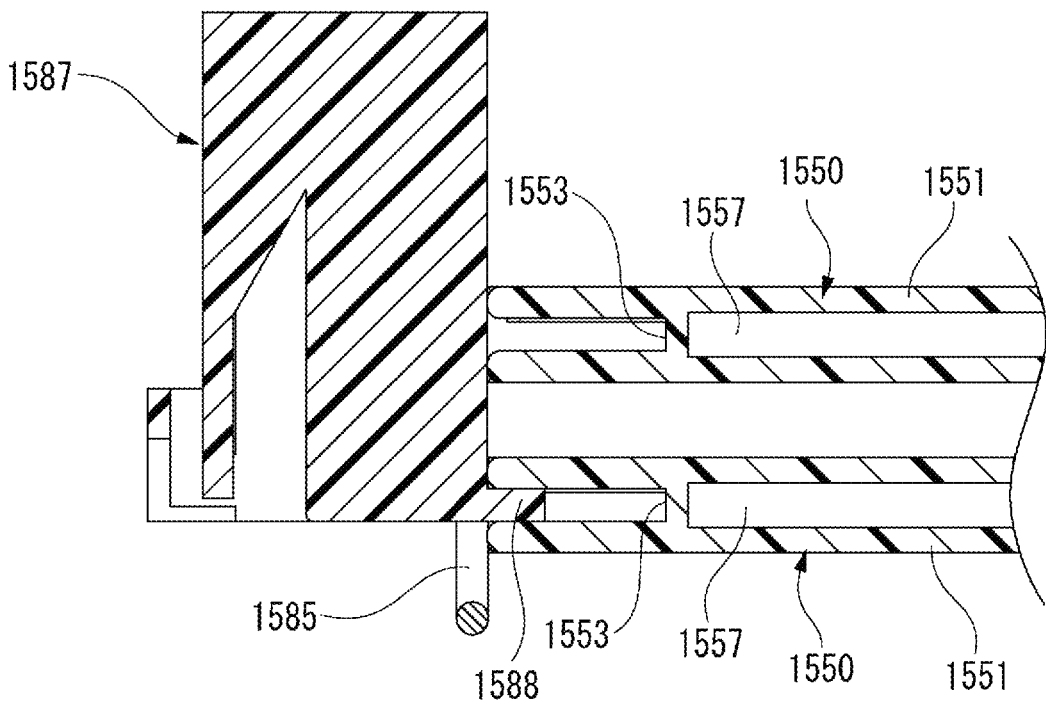
FIG. 107 is a cross-sectional view taken along a line 15A-15A in FIG. 103.
Figure 108:
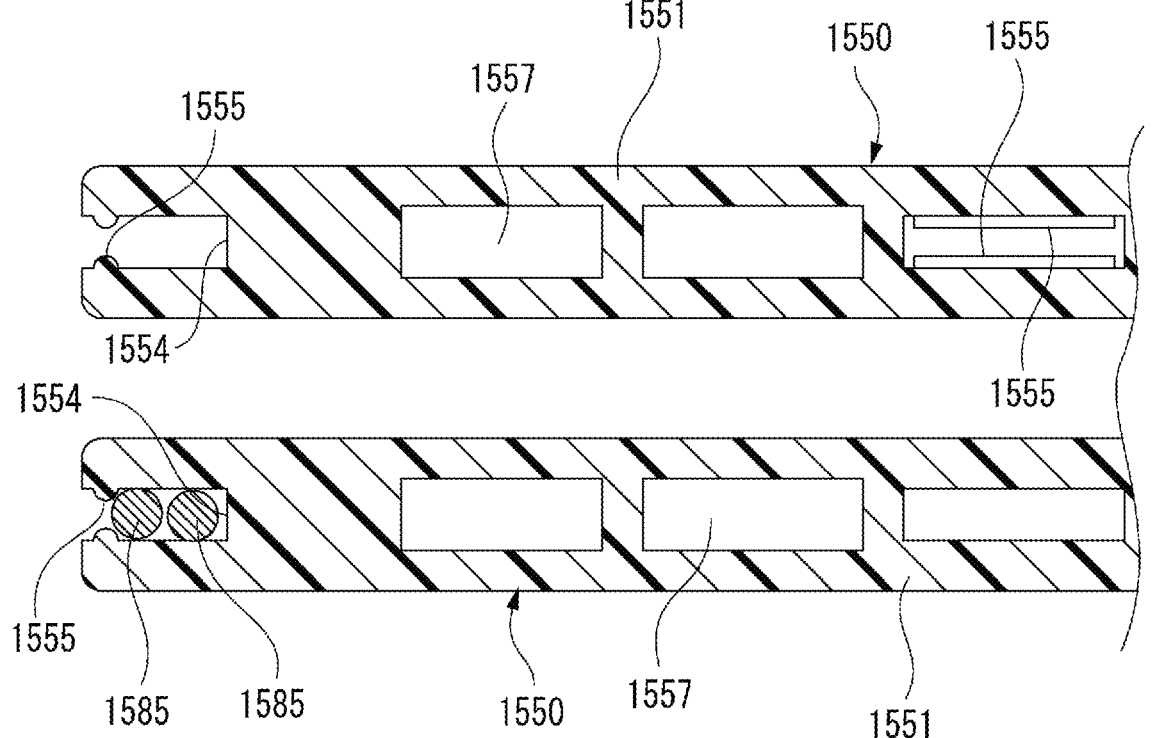
FIG. 108 is a cross-sectional view taken along a line 15B-15B in FIG. 103.

FIGS. 107 and 108 are a cross-sectional view taken along a line 15A-15A and a cross-sectional view taken along a line 15B-15B in FIG. 103.

First, as illustrated in FIG. 104, the two battery stack plates 1550 in which the other ends of the electric wires 1585 are connected to the connector 1587 are overlapped. Then, as illustrated in FIG. 106, the collected two electric wires 1585 are sequentially accommodated in the electric wire accommodating grooves 1554 of the lower battery stack plate 1550 from one end side.

At this time, the electric wires 1585 are inserted into the electric wire accommodating grooves 1554 of the insulating housing 1551 while being press-fitted between the pair of electric wire press fitting portions 1555. Therefore, the electric wires 1585 accommodated in the electric wire accommodating grooves 1554 are held by the pair of electric wire press fitting portions 1555, so as not to come out unintentionally.

As illustrated in FIG. 107, the two electric wires 1585 accommodated in the electric wire accommodating grooves 1554 are accommodated in the electric wire accommodating grooves 1554 while being aligned in the depth direction of the groove bottom wall (the left-right direction in FIG. 107).

After the two electric wires 1585 are completely accommodated in the electric wire accommodating grooves 1554 of the insulating housing 1551, as illustrated in FIG. 108, the press fitting projections 1588 are press-fitted into the electric wire accommodating grooves 1554, and the connector 1587 is held and fixed to the insulating housing 1551.

Thus, as illustrated in FIG. 103, the two electric wires 1585 are accommodated in the fitting grooves 1553 and the electric wire accommodating grooves 1554 of the insulating housing 1551 of the lower battery stack plate 1550 over substantially the entire length, and the electric wires 1585 do not come out unintentionally at the time of packing and transporting.

When the electric wire 1585 in the packed and transported state is removed during the assembly work of fitting the battery stack plate 1550 to the side edge of the conductive plate, the connector 1587 is first removed from the electric wire accommodating grooves 1554. Then, the two electric wires 1585 can be sequentially drawn out from the electric wire accommodating grooves 1554 from the other end side, so that the electric wires 1585 are not entangled.

By collectively accommodating the two electric wires 1585 in the electric wire accommodating grooves 1554 of one battery stack plate 1550 in this manner, the workability can be improved. That is, since the other ends of the two electric wires 1585 are connected to one connector 1587, the two electric wires 1585 can be easily accommodated if the two electric wires 1585 are collectively handled as a whole. In addition, in the operation of taking out the electric wires 1585 from the electric wire accommodating grooves 1554 of the battery stack plate 1550, the two electric wires 1585 accommodated together can be untied easily. For example, the electric wires 1585 can be accommodated one by one in an electric wire accommodating groove 1554 of the battery stack plates 1550, which, however, may require the work time for two or cause entangling with the other electric wire 1585 during the accommodation.

According to the battery stack plate 1550 according to the fifteenth embodiment described above, it is possible to prevent the electric wires 1585 from being entangled at the time of shipping or at the time of assembling work, thereby improving the workability.

The invention embodied as the fifteenth embodiment is not limited to the fifteenth embodiment, and various modifications can be adopted within the scope of the invention. For example, the present invention is not limited to the fifteenth embodiment, and modifications, improvements, and the like can be made appropriately. In addition, materials, shapes, sizes, numbers, arrangement positions, and the like of components in the fifteenth embodiment are freely selected and are not limited as long as the present invention can be implemented.

Here, the features of the embodiment of the battery stack plate according to the fifteenth embodiment described above are briefly summarized and listed in the following [15-1] to [15-2].

[15-1]

A battery stack plate (1550) including:

a board-shaped terminal (connection terminal 1580) configured to be connected to an electric wire (1585);

a rectangular board-shaped insulating housing (1351) provided with an accommodating recess (1556) accommodating the terminal (connection terminal 1580) on a face of a board face on one end side in a longitudinal direction;

a fitting groove (1553) recessed in one board side face along the longitudinal direction of the insulating housing (1551) and configured to be fitted with a side edge of a conductive plate;

a connector (1587) connected to an end of the electric wire (1585);

an electric wire accommodating groove (1554) recessed in the other board side face along the longitudinal direction of the insulating housing (1551) and a board face on the other end side in the longitudinal direction of the insulating housing (1551) and configured to accommodate the electric wire (1585); and a press fitting projection (1588) projecting from the connector (1587) and configured to press-fit into the electric wire accommodating groove (1554).

[15-2]

The battery stack plate (1550) according to the above [15-1], in which opening ends of groove side walls facing each other in the fitting groove (1553) and the electric wire accommodating groove (1554) are provided with a plurality of pairs of electric wire press fitting portions (1555) projecting in directions facing each other at predetermined intervals.

What is claimed is:

1. A voltage detection unit comprising:

a voltage detection terminal that has a first location being conductively connected to a detection target;

a board-shaped housing that has a terminal accommodating recess in which the voltage detection terminal is accommodated;

a cover that is locked to the housing at a first temporary locking position where the first location of the voltage detection terminal accommodated in the terminal accommodating recess is not covered and a final locking position where the first location is covered; and an electric wire that is conductively connected to a second location of the voltage detection terminal and drawn out toward the outside of the housing, wherein the housing includes a guide portion that guides the cover from the outside toward the first temporary locking position, and a first wall that comes into contact with the cover when the cover is positioned at the first temporary locking position in a moving direction in which the cover is guided and moves toward the first temporary locking position.

2. The voltage detection unit according to claim 1, wherein the cover is locked to the housing at a second temporary locking position that is different from the first temporary locking position and does not cover the first location, and the housing includes a second wall that comes into contact with the cover when the cover is positioned at the second temporary locking position in a moving direction when the cover is moved from the first temporary locking position toward the second temporary locking position.

3. The voltage detection unit according to claim 2, wherein the cover comes into contact with the first wall of the housing when the cover is positioned at the final locking position in a moving direction when the cover is moved from the second temporary locking position toward the final locking position.

4. A power storage device comprising:

a board-shaped conductive module that includes the voltage detection unit according to claim 1 and a conductive board as the detection target to which the voltage detection terminal is conductively connected; and a power storage module that is charged and discharged, on which the conductive module is stacked.

\*  \*  \*  \*  \*